US012082492B2

(12) United States Patent
Lee et al.

(10) Patent No.: US 12,082,492 B2
(45) Date of Patent: Sep. 3, 2024

(54) ORGANOMETALLIC COMPOUND AND ORGANIC LIGHT-EMITTING DEVICE INCLUDING THE SAME

(71) Applicant: Samsung Electronics Co., Ltd., Suwon-si (KR)

(72) Inventors: Kum Hee Lee, Suwon-si (KR); Ohyun Kwon, Yongin-si (KR); Kyuyoung Hwang, Anyang-si (KR); Yoonhyun Kwak, Seoul (KR); Hyeonho Choi, Seoul (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 406 days.

(21) Appl. No.: 17/356,785

(22) Filed: Jun. 24, 2021

(65) Prior Publication Data

US 2022/0123236 A1 Apr. 21, 2022

Related U.S. Application Data

(63) Continuation of application No. 14/953,091, filed on Nov. 27, 2015, now abandoned.

(30) Foreign Application Priority Data

Nov. 28, 2014 (KR) ........................ 10-2014-0169185
Jul. 21, 2015 (KR) ........................ 10-2015-0103013

(51) Int. Cl.
*H10K 85/40* (2023.01)
*C07F 15/00* (2006.01)
(Continued)

(52) U.S. Cl.
CPC ......... *H10K 85/40* (2023.02); *C07F 15/0033* (2013.01); *C09K 11/025* (2013.01);
(Continued)

(58) Field of Classification Search
CPC .. H10K 85/40; H10K 85/6572; C07F 15/0033
See application file for complete search history.

(56) References Cited

U.S. PATENT DOCUMENTS

2003/0068526 A1 4/2003 Kamatani et al.
2004/0065544 A1 4/2004 Igarashi et al.
(Continued)

FOREIGN PATENT DOCUMENTS

KR 1020030059288 A 7/2003
KR 1020130078591 7/2013
(Continued)

OTHER PUBLICATIONS

Chun Huang, et al., "High-efficiency solution processable electrophosphorescent iridium complexes bearing polyphenylphenyl dendron ligands", Journal of Organometallic Chemistry 694 (2009) 1317-1324.
(Continued)

*Primary Examiner* — Sadie White
(74) *Attorney, Agent, or Firm* — CANTOR COLBURN LLP

(57) ABSTRACT

An organometallic compound represented by Formula 1:

$$M(L_1)_{n1}(L_2)_{n2} \quad \text{Formula 1}$$

wherein in Formula 1, M, $L_1$, $L_2$, n1, and n2 are the same as described in the specification.

12 Claims, 1 Drawing Sheet

(51) Int. Cl.

| | |
|---|---|
| ***C09K 11/02*** | (2006.01) |
| ***C09K 11/06*** | (2006.01) |
| ***H10K 50/11*** | (2023.01) |
| ***H10K 85/60*** | (2023.01) |
| ***H10K 101/40*** | (2023.01) |

(52) U.S. Cl.

CPC .......... *C09K 11/06* (2013.01); *H10K 85/6572* (2023.02); *C09K 2211/1007* (2013.01); *C09K 2211/1011* (2013.01); *C09K 2211/1029* (2013.01); *C09K 2211/185* (2013.01); *H10K 50/11* (2023.02); *H10K 2101/40* (2023.02)

(56) References Cited

U.S. PATENT DOCUMENTS

| | | | | |
|---|---|---|---|---|
| 2008/0074033 | A1 | 3/2008 | Ionkin et al. | |
| 2009/0123720 | A1 | 5/2009 | Chen et al. | |
| 2010/0109515 | A1 | 5/2010 | Boerner et al. | |
| 2010/0127215 | A1* | 5/2010 | Boerner ............... | H10K 85/342 252/301.16 |
| 2011/0049497 | A1* | 3/2011 | Ise ....................... | H10K 85/342 546/10 |
| 2012/0208999 | A1 | 8/2012 | Konno | |
| 2012/0264936 | A1 | 10/2012 | Inoue et al. | |
| 2013/0026452 | A1 | 1/2013 | Kottas et al. | |
| 2013/0221331 | A1* | 8/2013 | Mizuki ................ | H10K 85/631 556/415 |
| 2013/0231489 | A1 | 9/2013 | Boerner et al. | |
| 2014/0008617 | A1 | 1/2014 | Beers et al. | |
| 2014/0158998 | A1 | 6/2014 | Noh et al. | |
| 2014/0203252 | A1* | 7/2014 | Kitamura ............. | H10K 85/654 544/333 |
| 2014/0319505 | A1 | 10/2014 | Nagayama et al. | |
| 2015/0021585 | A1 | 1/2015 | Yu et al. | |
| 2015/0073142 | A1 | 3/2015 | Ohsawa et al. | |
| 2015/0194614 | A1 | 7/2015 | Kravchuk et al. | |
| 2016/0028024 | A1 | 1/2016 | Das et al. | |
| 2016/0043330 | A1 | 2/2016 | Kim et al. | |
| 2016/0093814 | A1 | 3/2016 | Hwang et al. | |
| 2016/0118604 | A1 | 4/2016 | Choi et al. | |
| 2016/0141526 | A1 | 5/2016 | Lee et al. | |
| 2016/0155962 | A1 | 6/2016 | Hwang et al. | |
| 2016/0190484 | A1 | 6/2016 | Lee et al. | |
| 2016/0222044 | A1 | 8/2016 | Lee et al. | |

FOREIGN PATENT DOCUMENTS

| | | | |
|---|---|---|---|
| KR | 1020130110934 | A | 10/2013 |
| KR | 101344787 | B1 | 12/2013 |
| KR | 1020140117401 | A | 10/2014 |

OTHER PUBLICATIONS

Lee, et al., Synthetic Metals, 2012, vol. 162, pp. 1961-1967 (Year: 2012).

Machine translation of KR 2013-0110934 (Year: 2013).

English Abstract of KR 10-2013-0110934.

English Translation of Office Action dated Nov. 15, 2022, issued in corresponding KR Patent Application No. 10-2015-0103013, 4 pp.

Office Action dated Nov. 15, 2022, issued in corresponding KR Patent Application No. 10-2015-0103013, 5 pp.

English Translation of Office Action issued in KR Patent Application No. 10-2015-0103013, dated Jan. 13, 2022, 8 pp.

Office Action issued in KR Patent Application No. 10-2015-0103013, dated Jan. 13, 2022, 8 pp.

Xu, Hui et.al., "Recent progress in metal-organic complexes for optoelectronic applications," Chemical Society reviews, The Royal Society of Chemistry, Apr. 2014, vol. 43, No. 10, pp. 3259-3302.

* cited by examiner

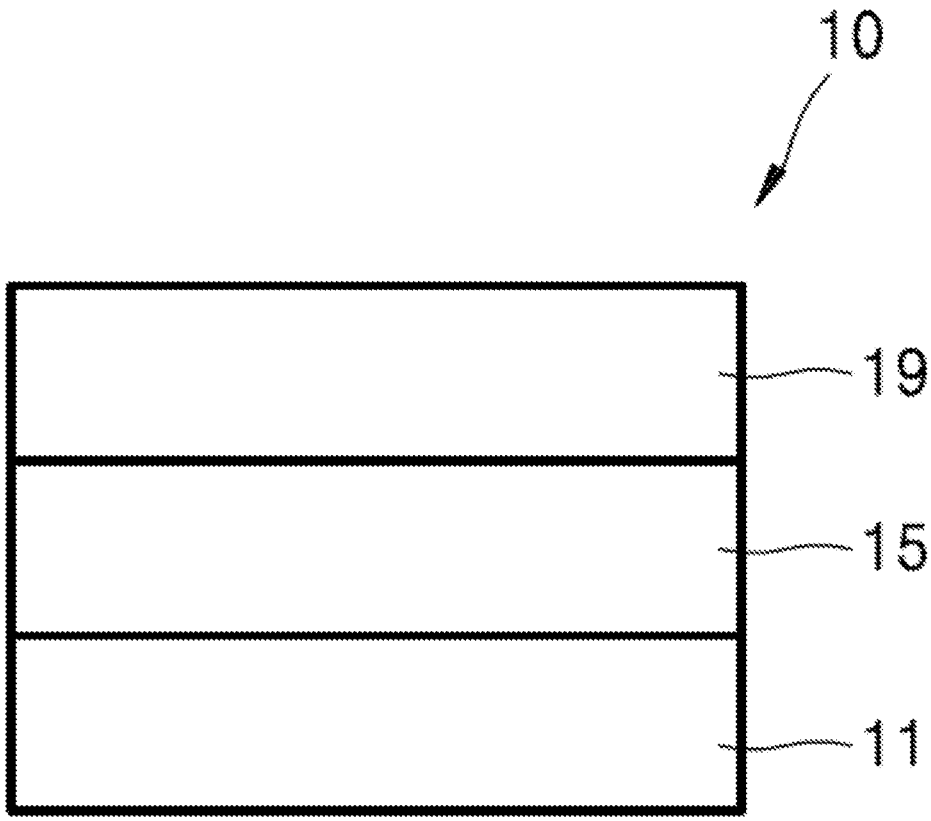
10
19
15
11

ORGANOMETALLIC COMPOUND AND ORGANIC LIGHT-EMITTING DEVICE INCLUDING THE SAME

CROSS-REFERENCE TO RELATED APPLICATION

This is a continuation application of U.S. application Ser. No. 14/953,091, filed Nov. 27, 2015 in the U.S. Patent Office, which claims priority to and the benefit of Korean Patent Applications No. 10-2014-0169185, filed on Nov. 28, 2014 and Korean Patent Applications No. 10-2015-0103013, filed on Jul. 21, 2015, in the Korean Intellectual Property Office, the contents of which are incorporated herein in their entirety by reference.

BACKGROUND

1. Field

The present disclosure relates to an organometallic compound and an organic light-emitting device including the same.

2. Description of the Related Art

Organic light-emitting devices (OLEDs) are self-emission devices that have wide viewing angles, high contrast ratios, and short response times. In addition, OLEDs exhibit excellent brightness, driving voltage, and response speed characteristics, and produce full-color images.

In an example, an organic light-emitting device includes an anode, a cathode, and an organic layer including an emission layer disposed between the anode and the cathode. A hole transport region may be disposed between the anode and the emission layer, and an electron transport region may be disposed between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons change from an excited state to a ground state, thereby generating light.

Different types of organic light emitting devices are known. However, there still remains a need in OLEDs having low driving voltage, high efficiency, high brightness, and long lifespan.

SUMMARY

Provided are a novel organometallic compound and an organic light-emitting device including the same.

Additional aspects will be set forth in part in the description which follows and, in part, will be apparent from the description, or may be learned by practice of the presented exemplary embodiments.

According to an aspect of an exemplary embodiment, an organometallic compound is represented by Formula 1:

$$M(L_1)_{n1}(L_2)_{n2}$$ Formula 1

Formula 2

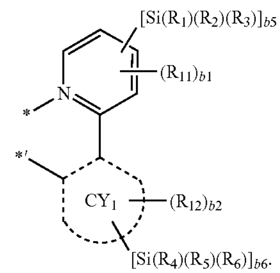

M in Formula 1 is selected from Ir, Pt, Os, Ti, Zr, Hf, Eu, Tb, Tm, and Rh, $L_1$ in Formula 1 is selected from ligands represented by Formula 2, n1 is 1, 2, or 3, provided that when n1 is 2 or greater, two or more groups $L_1$ are identical to or different from each other, $L_2$ in Formula 1 is selected from a monovalent organic ligand, a divalent organic ligand, a trivalent organic ligand, and a tetravalent organic ligand, n2 is 0, 1, 2, 3, or 4, provided that when n2 is 2 or greater, two or more groups $L_2$ are identical to or different from each other, $L_1$ and $L_2$ in Formula 1 are different from each other, $CY_1$ in Formula 2 is a C1-C18 condensed cyclic ring i) in which two to four unsaturated 6-membered rings are condensed to each other and ii) which optionally has N as a ring forming atom, $R_1$ to $R_6$, $R_{11}$, and $R_{12}$ in Formula 2 are each independently selected from hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$Si(Q_1)(Q_2)(Q_3)$, —$N(Q_4)(Q_5)$, —$B(Q_6)(Q_7)$, and —$P(=O)(Q_8)(Q_9)$, b1, b2, b5, and b6 in Formula 2 are each independently an integer selected from 0 to 4, provided that the sum of b5 and b6 is 1 or greater, each of * and *' in Formula 2 is a binding site to M in Formula, and at least one of substituents of the substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{11})(Q_{12})(Q_{13})$, —$N(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$Si(Q_{21})(Q_{22})(Q_{23})$, —$N(Q_{24})(Q_{25})$, —$B(Q_{26})(Q_{27})$ and —$P(=O)(Q_{28})(Q_{29})$; and —$Si(Q_{31})(Q_{32})(Q_{33})$, —$N(Q_{34})(Q_{35})$, —$B(Q_{36})(Q_{37})$, and —$P(=O)(Q_{38})(Q_{39})$, wherein $Q_1$ to $Q_9$, $Q_{11}$ to $Q_{19}$, $Q_{21}$ to $Q_{29}$, and $Q_{31}$ to $Q_{39}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

According to an aspect of another exemplary embodiment, an organic light-emitting device includes:

a first electrode;

a second electrode; and an organic layer disposed between the first electrode and the second electrode, wherein the organic layer includes an emission layer and at least one organometallic compound represented by Formula 1.

The emission layer may include the organometallic compound.

The organometallic compound included in the emission layer may act as a dopant and the emission layer may act as a host.

BRIEF DESCRIPTION OF THE DRAWING

These and/or other aspects will become apparent and more readily appreciated from the following description of the exemplary embodiments, taken in conjunction with FIG. 1 which is a schematic cross-sectional view of an organic light-emitting device according to an exemplary embodiment.

DETAILED DESCRIPTION

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the FIGURES, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

An organometallic compound according to an exemplary embodiment is represented by Formula 1:

$$M(L_1)_{n1}(L_2)_{n2}$$ Formula 1

M in Formula 1 may be selected from iridium (Ir), platinum (Pt), osmium (Os), titanium (Ti), zirconium (Zr), hafnium (Hf), europium (Eu), terbium (Tb), thulium (Tm), and rhodium (Rh).

For example, M in Formula 1 may be selected from iridium, platinum, osmium, and rhodium.

In an embodiment, M in Formula 1 may be selected from iridium and platinum, but is not limited thereto.

$L_1$ in Formula 1 may be selected from ligands represented by Formula 2, n1 is 1, 2, or 3, provided that when n1 is 2 or greater, two or more groups $L_1$ may be identical to or different from each other.

Formula 2

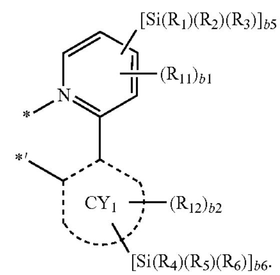

$L_2$ in Formula 1 may be selected from a monovalent organic ligand, a divalent organic ligand, a trivalent organic ligand, and a tetravalent organic ligand, n2 may be 0, 1, 2, 3, or 4, provided that when n2 is 2 or greater, two or more groups $L_2$ may be identical to or different from each other.

$L_1$ and $L_2$ in Formula 1 may be different from each other.

For example, n1 in Formula 1 may be 1 or 2, but is not limited thereto.

In some embodiments, the organometallic compound represented by Formula 1 may not be a salt consisting of an ion pair, but be neutral.

In an embodiment, M in Formula 1 may be Ir and the sum of n1 and n2 may be 3; or M is Pt, the sum of n1 and n2 may be 2, and the organometallic compound represented by Formula 1 may be neutral.

$CY_1$ in Formula 2 may be a $C_1$-$C_{18}$ condensed cyclic ring i) in which two to four unsaturated 6-membered rings are condensed to each other and ii) which optionally has nitrogen (N) as a ring forming atom.

For example, $CY_1$ in Formula 2 may be selected from a naphthalene, a phenanthrene, an anthracene, a triphenylene, a pyrene, a chrysene, a naphthacene, a tetraphene, a tetracene, a quinoline, an isoquinoline, a benzoquinoline, a phthalazine, a naphthyridine, a quinoxaline, a quinazoline, a cinnoline, a phenanthridine, an acridine, a phenanthroline, and a phenazine.

In an embodiment, $CY_1$ in Formula 2 may be selected from a naphthalene, a phenanthrene, an anthracene, a triphenylene, a pyrene, a chrysene, a naphthacene, a tetraphene, and a tetracene.

In some embodiments, $CY_1$ in Formula 2 may be a triphenylene, but is not limited thereto.

$R_1$ to $R_6$, $R_{11}$, and $R_{12}$ in Formula 2 may be each independently selected from hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_4$)($Q_5$), —B($Q_6$)($Q_7$), and —P(═O)($Q_8$)($Q_9$).

For example, $R_{11}$ and $R_{12}$ in Formula 2 may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, —$SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a cyclopentyl group, a cyclohexyl group, a cycloheptyl group, a cyclooctyl group, an adamantanyl (adamantyl) group, a norbornanyl (norbornyl) group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —B($Q_6$)($Q_7$) and —P(═O)($Q_8$)($Q_9$), wherein $Q_6$ to $Q_9$ are each independently selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group.

In some embodiments, $R_{11}$ and $R_{12}$ in Formula 2 may be each independently selected from hydrogen, deuterium, —F, a cyano group, a nitro group, —$SF_5$, a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group, each substituted with at least one selected from deuterium, —F, —$CD_3$, —$CD_2H$, —$CDH_2$, —$CF_3$, —$CF_2H$, —$CFH_2$, a cyano group, a nitro group, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group; and —$B(Q_6)(Q_7)$ and —$P(=O)(Q_8)(Q_9)$, wherein $Q_6$ to $Q_9$ are each independently selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group.

In some embodiments, $R_1$ to $R_6$ in Formula 2 may be each independently selected from a $C_1$-$C_{10}$ alkyl group, a phenyl group, and —$Si(Q_1)(Q_2)(Q_3)$; and a $C_1$-$C_{10}$ alkyl group and a phenyl group, each substituted with at least one selected from deuterium and a $C_1$-$C_{10}$ alkyl group, wherein $Q_1$ to $Q_3$ are each independently selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group.

In Formula 2, $R_1$ to $R_3$ may all be identical;

$R_1$ and $R_3$ may be identical to each other and $R_2$ and $R_1$ may be different from each other; or $R_1$ to $R_3$ may all be different, and $R_4$ to $R_6$ may all be identical;

$R_4$ and $R_6$ may be identical to each other and $R_5$ and $R_4$ may be different from each other; or $R_4$ to $R_6$ may all be different from each other.

In an embodiment, $R_{11}$ and $R_{12}$ in Formula 2 may be each independently selected from hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, groups represented by Formulae 9-1 to 9-19, and groups represented by Formulae 10-1 to 10-38, $R_1$ to $R_6$ in Formula 2 may be each independently selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group a tert-pentyl group, a phenyl group, and —$Si(Q_1)(Q_2)(Q_3)$; and an n-propyl group, an isopropyl group, an n-butyl group, an isobutyl group, a sec-butyl group, a tert-butyl group, an n-pentyl group, an isopentyl group, a sec-pentyl group a tert-pentyl group, and a phenyl group, each substituted with at least one selected from a deuterium and a $C_1$-$C_{10}$ alkyl group, wherein $Q_1$ to $Q_3$ are each independently selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group:

Formula 9-1

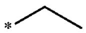

Formula 9-2

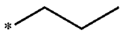

Formula 9-3

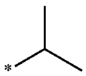

Formula 9-4

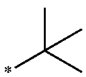

Formula 9-5

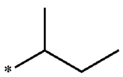

Formula 9-6

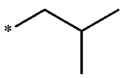

Formula 9-7

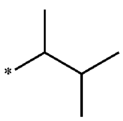

Formula 9-8

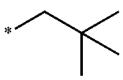

Formula 9-9

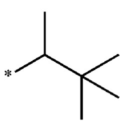

Formula 9-10

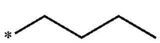

Formula 9-11

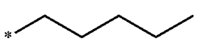

Formula 9-12

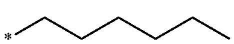

Formula 9-13

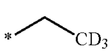

Formula 9-14

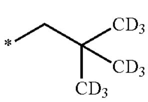

Formula 9-15

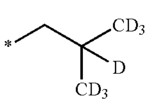

Formula 9-16

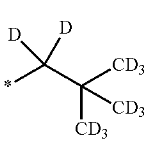

-continued

Formula 9-17

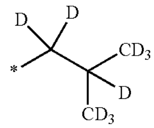

Formula 9-18

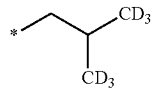

Formula 9-19

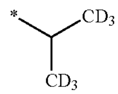

Formula 10-1

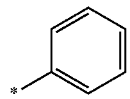

Formula 10-2

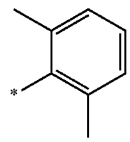

Formula 10-3

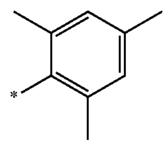

Formula 10-4

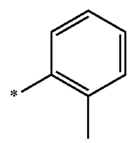

Formula 10-5

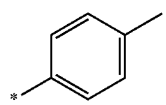

Formula 10-6

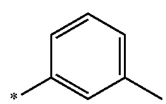

Formula 10-7

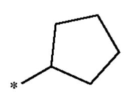

Formula 10-8

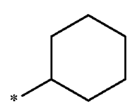

Formula 10-9

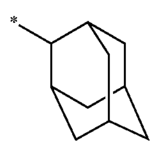

Formula 10-10

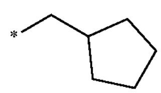

-continued
Formula 10-11
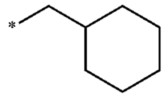
Formula 10-12
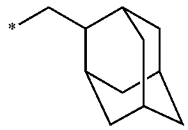
Formula 10-13
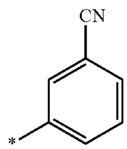
Formula 10-14
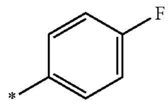
Formula 10-15
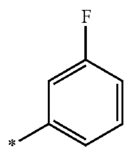
Formula 10-16
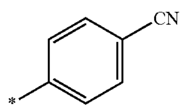
Formula 10-17
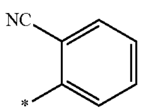
Formula 10-18
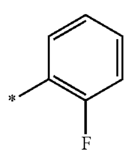
Formula 10-19
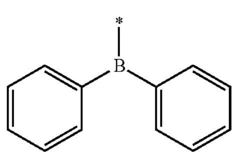
Formula 10-20
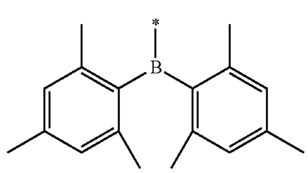
Formula 10-21
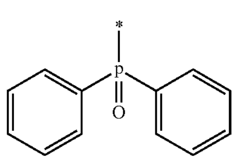
-continued
Formula 10-22
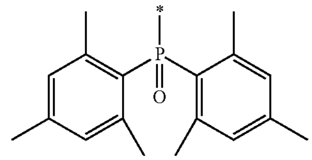
Formula 10-23
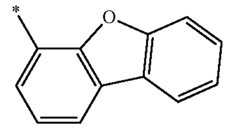
Formula 10-24
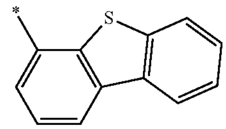
Formula 10-25
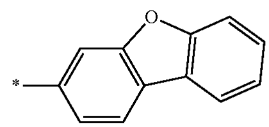
Formula 10-26
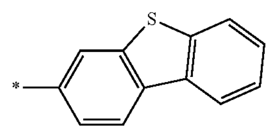
Formula 10-27
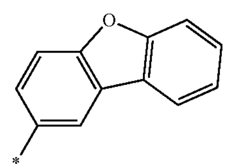
Formula 10-28
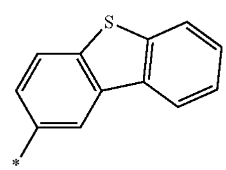
Formula 10-29
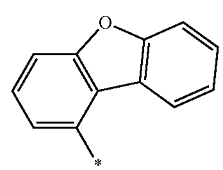
Formula 10-30
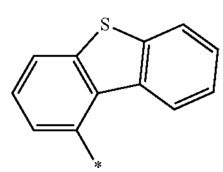
Formula 10-31
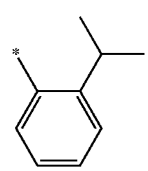

-continued

Formula 10-32

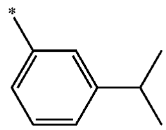

Formula 10-33

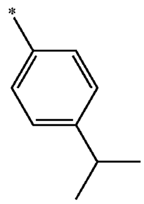

Formula 10-34

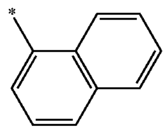

Formula 10-35

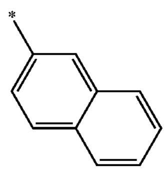

Formula 10-36

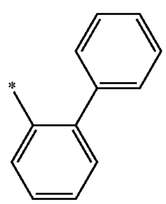

Formula 10-37

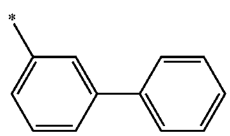

Formula 10-38

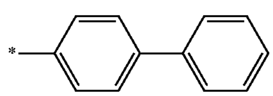

* in Formulae 9-1 to 9-19 and 10-1 to 10-38 is a binding site to a neighboring atom.

b1 in Formula 2 indicates the number of groups $R_{11}$, and is an integer selected from 0 to 4. When b1 is 2 or greater, two or more groups $R_{11}$ may be identical to or different from each other.

b2 in Formula 2 indicates the number of groups $R_{12}$, and is an integer selected from 0 to 4. When b2 is 2 or greater, two or more groups $R_{12}$ may be identical to or different from each other.

b5 in Formula 2 indicates the number of groups *—[Si(R1)($R_2$)($R_3$)], and is an integer selected from 0 to 4. When b5 is 2 or greater, two or more groups *—[Si(R1)($R_2$)($R_3$)] may be identical to or different from each other. For example, b5 may be 1, 2, or 3, or may be 1.

b6 in Formula 2 indicates the number of groups *—[Si($R_4$)($R_5$)($R_6$)], and is an integer selected from 0 to 4. When b6 is 2 or greater, two or more groups *—[Si($R_4$)($R_5$)($R_6$)] may be identical to or different from each other. For example, b6 may be 0, 1, or 2, or may be 0.

The sum of b5 and b6 in Formula 2 may be 1 or greater.

In an embodiment, in Formula 2, b5 may be 1 or 2 and b6 may be 0 or 1, but they are not limited thereto.

Each of * and *' in Formula 2 indicates a binding site to M in Formula 1.

In an embodiment, $L_1$ in Formula 1 may be selected from ligands represented by Formula 2(1):

Formula 2(1)

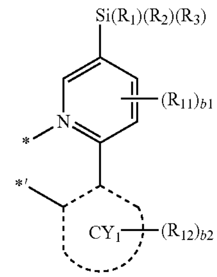

Descriptions of $CY_1$, $R_1$ to $R_3$, $R_{11}$, $R_{12}$, b1, and b2 in Formula 2(1) are the same as presented above, and each of * and *' indicates a binding site to M in Formula 1.

In some embodiments, $L_1$ in Formula 1 may be selected from ligands represented by Formulae 2-1 to 2-47:

Formula 2-1

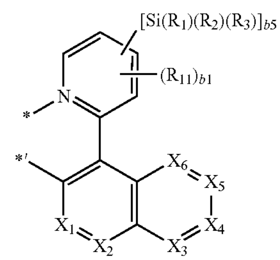

Formula 2-2

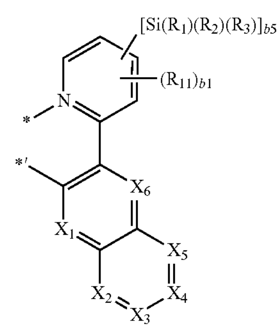

Formula 2-3

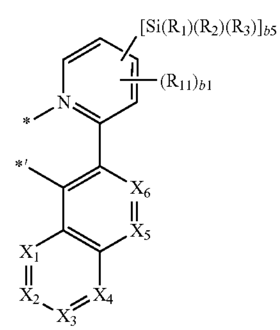

Formula 2-4
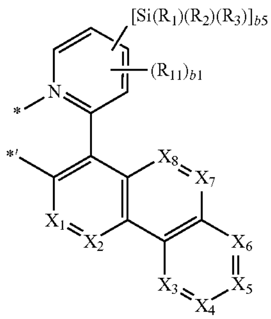
Formula 2-5
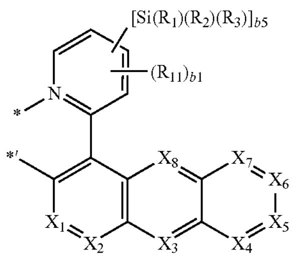
Formula 2-6
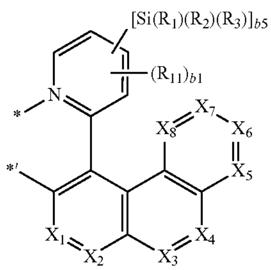
Formula 2-7
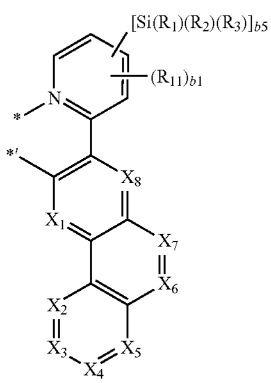
Formula 2-8
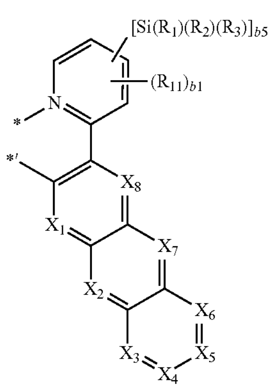
Formula 2-9
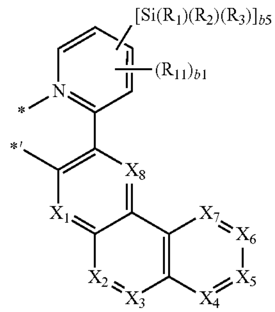
Formula 2-10
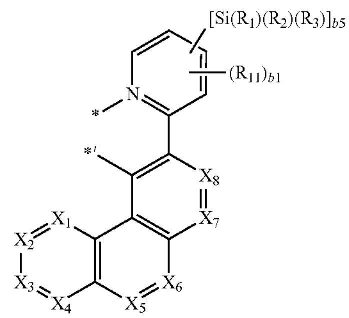
Formula 2-11
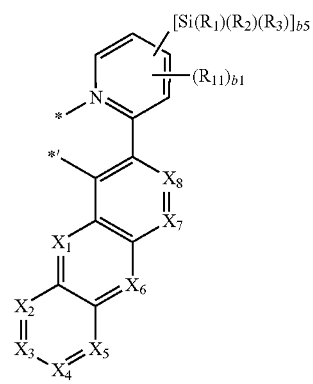
Formula 2-12
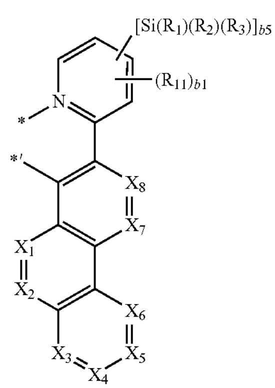

-continued
Formula 2-13
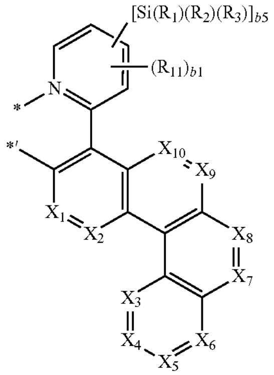
Formula 2-14
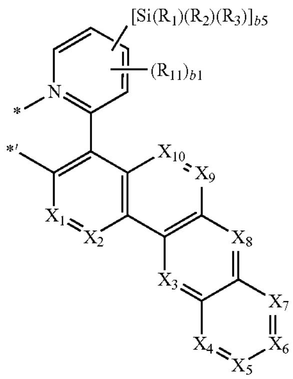
Formula 2-15
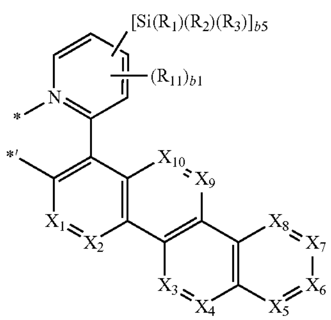
Formula 2-16
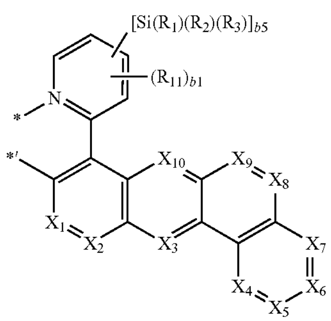
Formula 2-17
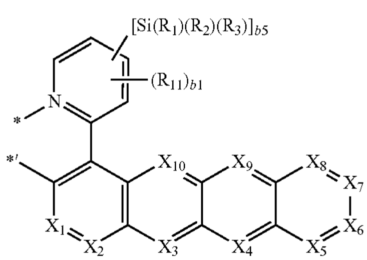
-continued
Formula 2-18
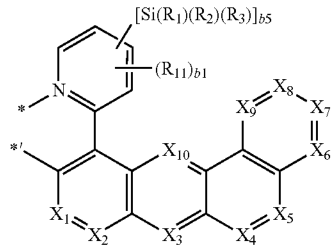
Formula 2-19
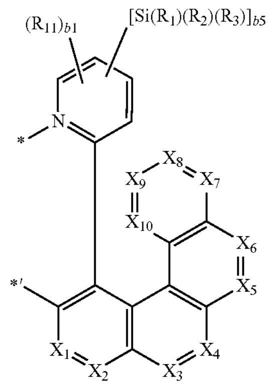
Formula 2-20
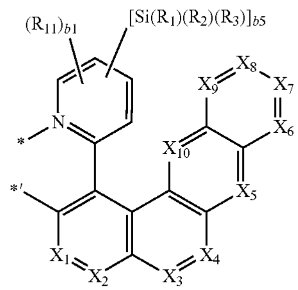
Formula 2-21
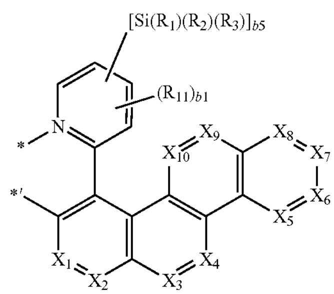
Formula 2-22
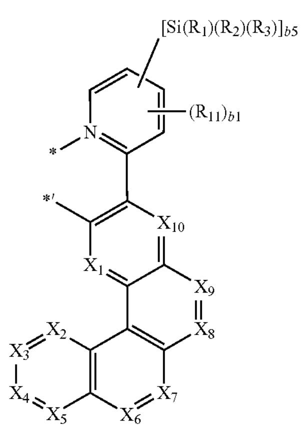

-continued
Formula 2-23
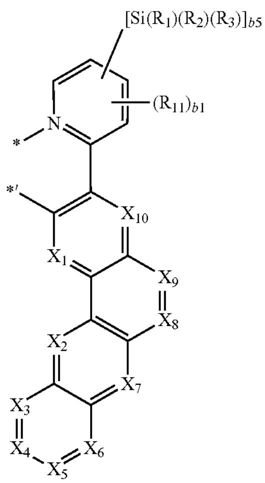
Formula 2-24
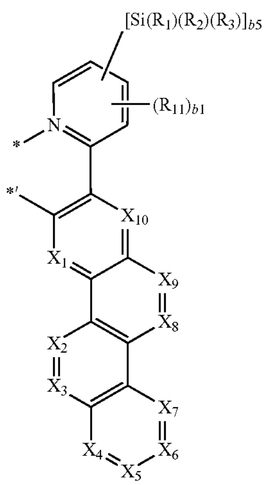
Formula 2-25
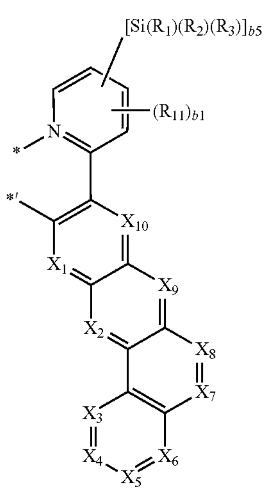
-continued
Formula 2-26
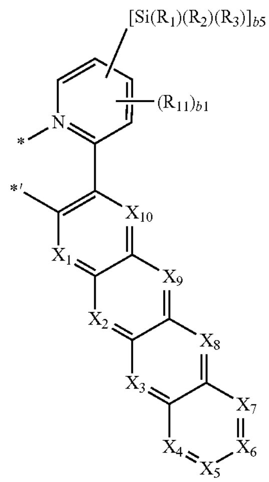
Formula 2-27
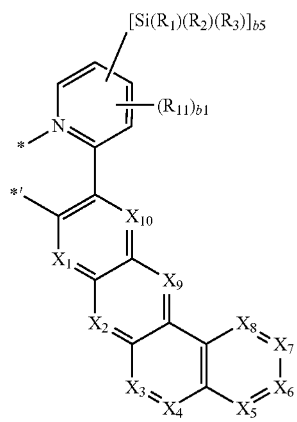
Formula 2-28
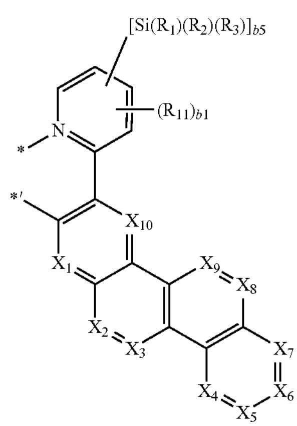

-continued
Formula 2-29
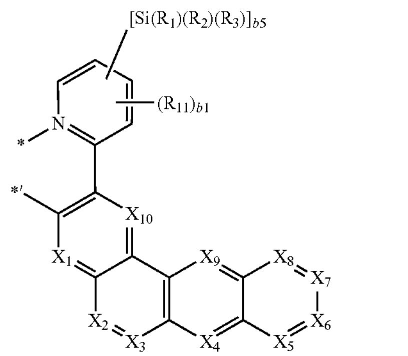
Formula 2-30
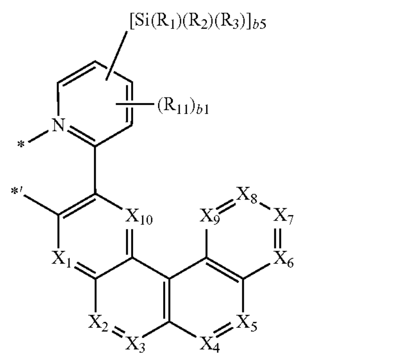
Formula 2-31
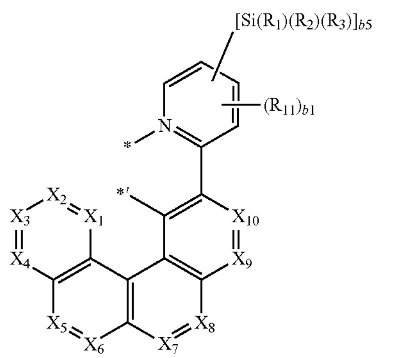
Formula 2-32
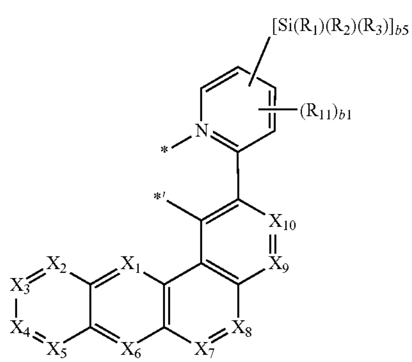
-continued
Formula 2-33
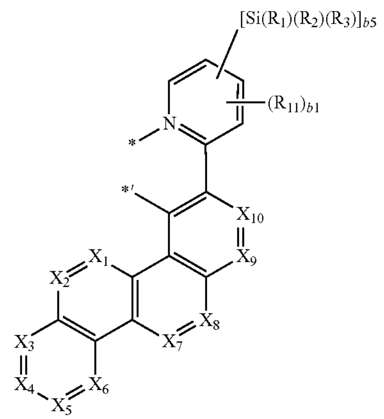
Formula 2-34
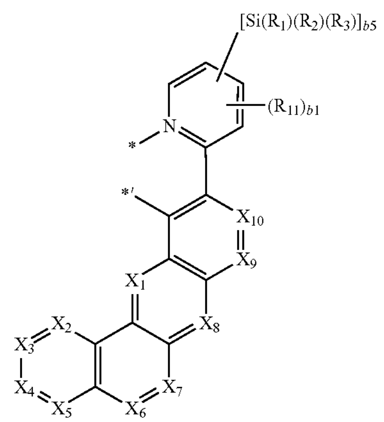
Formula 2-35
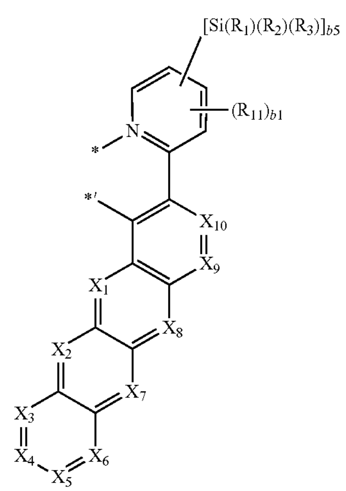

-continued
Formula 2-36
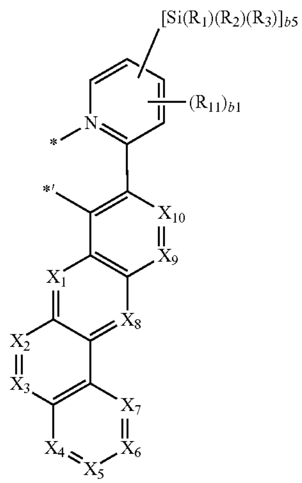
Formula 2-37
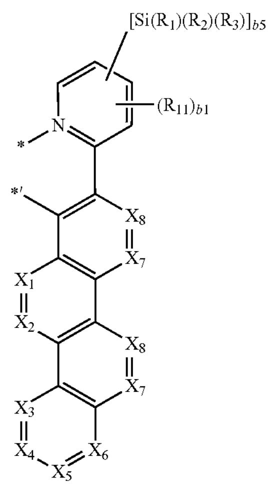
Formula 2-38
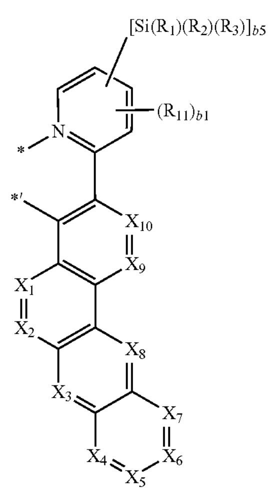
-continued
Formula 2-39
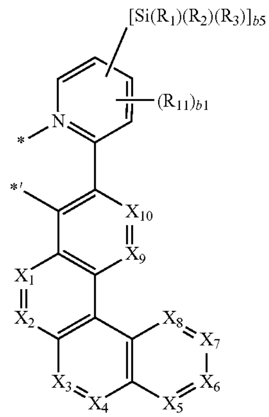
Formula 2-40
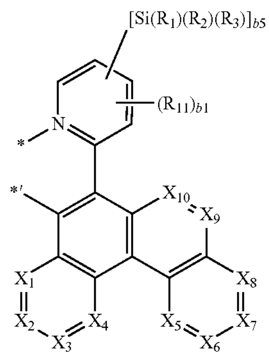
Formula 2-41
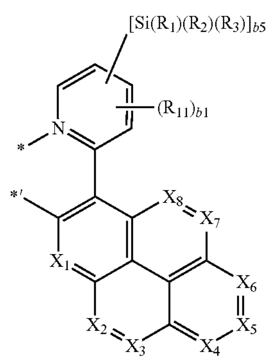
Formula 2-42
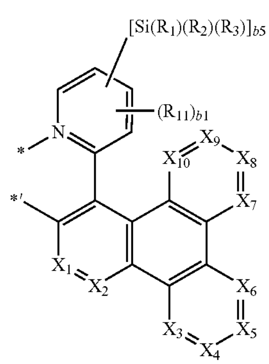

-continued

Formula 2-43

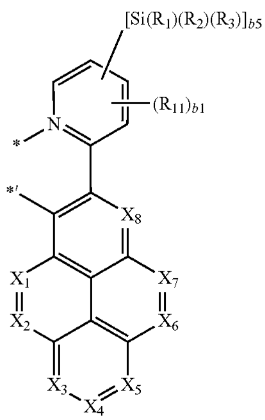

Formula 2-44

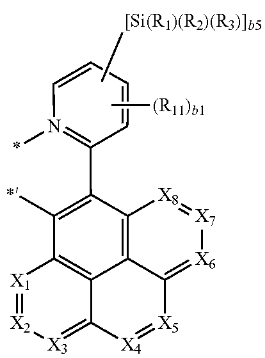

Formula 2-45

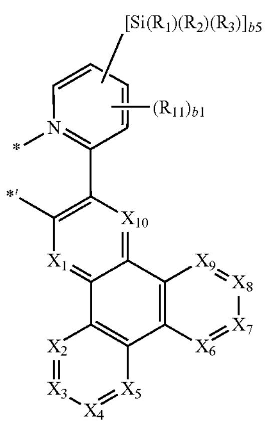

Formula 2-46

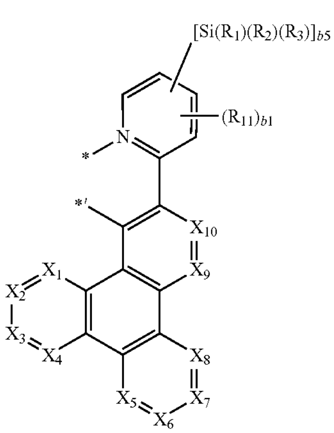

-continued

Formula 2-47

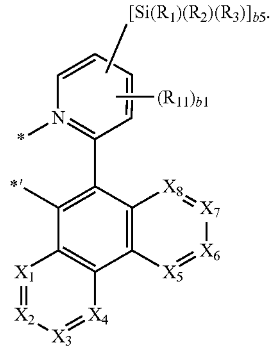

In Formulae 2-1 to 2-47, descriptions of $R_1$ to $R_3$, $R_{11}$, and b1 are the same as presented above, b5 may be 1, 2, or 3, $X_1$ may be N or $C(R_{21})$, $X_2$ may be N or $C(R_{22})$, $X_3$ may be N or $C(R_{23})$, $X_4$ may be N or $C(R_{24})$, $X_5$ may be N or $C(R_{25})$, $X_6$ may be N or $C(R_{26})$, $X_7$ may be N or $C(R_{27})$, $X_8$ may be N or $C(R_{28})$, $X_9$ may be N or $C(R_{29})$, $X_{10}$ may be N or $C(R_{30})$, descriptions of $R_{21}$ to $R_{30}$ are understood by referring to the descriptions of $R_{12}$, and each of * and *' indicates a binding site to M in Formula 1.

In an embodiment, in Formulae 2-1 to 2-47, $X_1$ may be $C(R_{21})$, $X_2$ may be $C(R_{22})$, $X_3$ may be $C(R_{23})$, $X_4$ may be $C(R_{24})$, $X_5$ may be $C(R_{25})$, $X_6$ may be $C(R_{26})$, $X_7$ may be $C(R_{27})$, $X_8$ may be $C(R_{28})$, $X_9$ may be $C(R_{29})$, and $X_{10}$ may be $C(R_{30})$.

For example, in Formulae 2-1 to 2-47, $R_{21}$ to $R_{30}$ may be each independently selected from a hydrogen, deuterium, —F, a cyano group, a nitro group, —$SF_5$, a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group, each substituted with at least one selected from deuterium, —F, —$CD_3$, —$CD_2H$, —$CDH_2$, —$CF_3$, —$CF_2H$, —$CFH_2$, a cyano group, a nitro group, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group; and —$B(Q_6)(Q_7)$ and —$P(=O)(Q_8)(Q_9)$, wherein $Q_6$ to $Q_9$ are each independently selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl.

In some embodiments, in Formulae 2-1 to 2-47, $R_{21}$ to $R_{30}$ may be each independently selected from hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, groups represented by Formulae 9-1 to 9-19, and groups represented by Formulae 10-1 to 10-38, and $R_1$ to $R_3$ may be each independently selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group a tert-pentyl group, a phenyl group, and —$Si(Q_1)(Q_2)(Q_3)$; and an n-propyl group, an isopropyl group, an n-butyl group, an isobutyl group, a sec-butyl group, a tert-butyl group, an n-pentyl group, an isopentyl group, a sec-pentyl group a tert-pentyl group, and a phenyl group, each substituted with at least one selected from deuterium and a $C_1$-$C_{10}$ alkyl group, wherein $Q_1$ to $Q_3$ are each independently selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group, but they are not limited thereto.

In some embodiments, $L_1$ in Formula 1 may be selected from ligands represented by Formula 2BA:

Formula 2BA

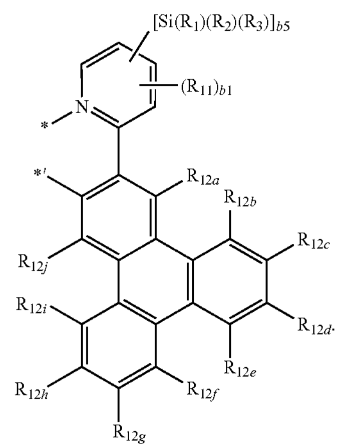

In Formula 2BA, descriptions of $R_1$ to $R_3$, $R_{11}$, and b1 are the same as presented above, b5 may be an integer selected from 1 to 4 (for example, b5 is 1 or 2), descriptions of $R_{12a}$ to $R_{12j}$ are the same as presented in connection with $R_{12}$, and each of * and *' indicates a binding site to M in Formula 1.

In some embodiments, $L_1$ in Formula 1 may be selected from ligands represented by Formula 2BA(1):

Formula 2BA(1)

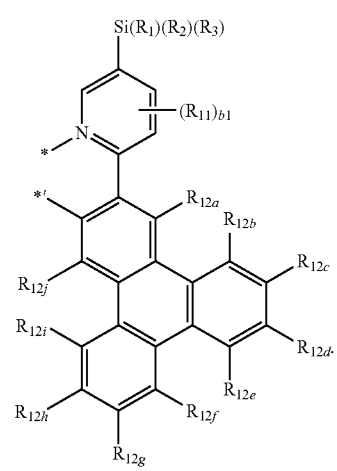

In Formula 2BA(1), descriptions of $R_1$ to $R_3$, $R_{11}$, and b1 are the same as described above, descriptions of $R_{12a}$ to $R_{12j}$ are the same as presented in connection with $R_{12}$, and each of * and *' indicates a binding site to M in Formula 1.

In some embodiments, $L_1$ in Formula 1 may be selected from ligands represented by Formulas 2BA-1 to 2BA-5, but is not limited thereto:

Formula 2BA-1

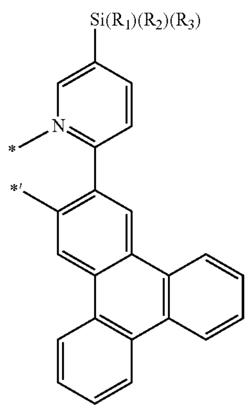

Formula 2BA-2

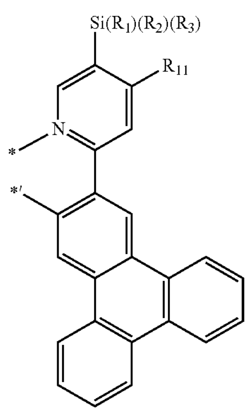

Formula 2BA-3

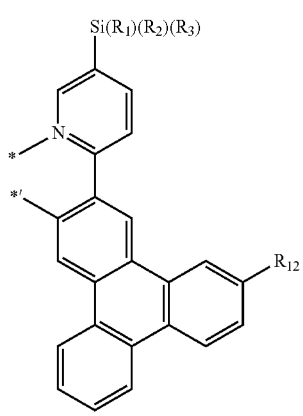

-continued

Formula 2BA-4

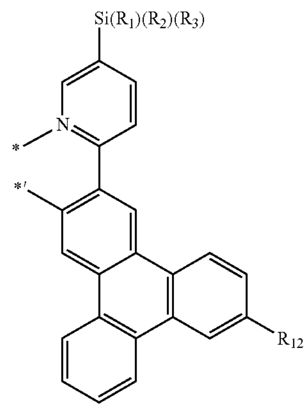

Formula 2BA-5

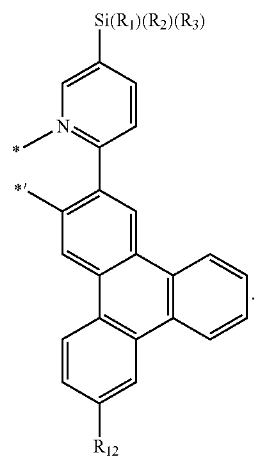

Descriptions of $R_1$ to $R_3$, $R_{11}$, and $R_{12}$ in Formulae 2BA-1 to 2BA-5 are the same as presented above, provided that each of $R_{11}$ and $R_{12}$ is not hydrogen and each of * and *' indicates a binding site to M in Formula 1.

For example, in Formulae 2BA-1 to 2BA-5, $R_{11}$ and $R_{12}$ are each independently selected from deuterium, —F, a cyano group, a nitro group, —$SF_5$, a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an iso-heptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group, each substituted with at least one selected from deuterium, —F, $—CD_3$, $—CD_2H$, $—CDH_2$, $—CF_3$, $—CF_2H$, $—CFH_2$, a cyano group, a nitro group, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group; and $—B(Q_6)(Q_7)$ and $—P(=O)(Q_8)(Q_9)$, $Q_6$ to $Q_9$ may be each independently selected from $—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, and $—CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group, $R_1$ to $R_3$ may be each independently selected from $—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, and $—CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group, and each of * and *' indicates a binding site to M in Formula 1.

$L_2$ in Formula 1 may be selected from ligands represented by Formulae 3A to 3G:

Formula 3A

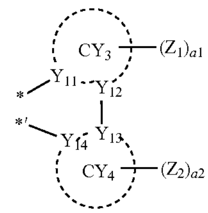

Formula 3B

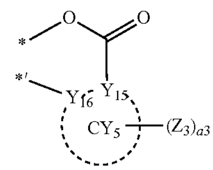

Formula 3C $$*—C\equiv C—R_{31}$$

Formula 3D

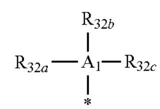

Formula 3E

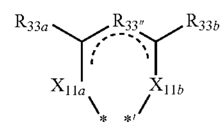

Formula 3F

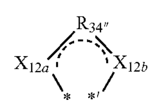

Formula 3G

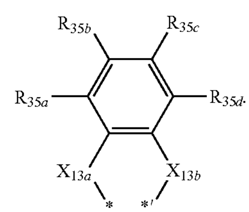

In Formulae 3A to 3G, $Y_{11}$ to $Y_{16}$ may be each independently carbon (C) or nitrogen (N), $Y_{11}$ and $Y_{12}$ may be connected to each other via a single bond or a double bond, $Y_{13}$ and $Y_{14}$ may be connected to each other via a single bond or a double bond, $Y_{15}$ and $Y_{16}$ may be connected to each other via a single bond or a double bond, $CY_3$ to $CY_5$ may be each independently selected from a $C_5$-$C_{60}$ carbocyclic group, and a $C_2$-$C_{60}$ heterocyclic group, a1 to a3 may be each independently an integer selected from 1 to 5, $A_1$ is P or As, $X_{11a}$, $X_{11b}$, $X_{12a}$, $X_{12b}$, $X_{13a}$, and $X_{13b}$ may be each independently selected from N, O, $N(R_{34})$, $P(R_{35})(R_{36})$, and $As(R_{37})(R_{38})$ (provided that $X_{12}a$, $X_{12b}$, $X_{13a}$, and $X_{13b}$ are neither N nor O), $R_{33''}$ and $R_{34''}$ may be each independently selected from a single bond, a double bond, a substituted or unsubstituted $C_1$-$C_5$ alkylene group, a substituted or unsubstituted $C_2$-$C_5$ alkenylene group, and a substituted or unsubstituted $C_6$-$C_{10}$ arylene group, $Z_1$ to $Z_3$, $R_{31}$, $R_{32a}$, $R_{32b}$, $R_{32c}$, $R_{33a}$, $R_{33b}$, $R_{34}$ to $R_{38}$, $R_{35a}$, $R_{35b}$, $R_{35c}$, and $R_{35d}$ may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_4$)($Q_5$), —B($Q_6$)($Q_7$), and —P(=O)($Q_8$)($Q_9$), each of * and *' indicates a binding site to M in Formula 1, and at least one of substituents of the substituted $C_1$-$C_5$ alkylene group, substituted $C_2$-$C_5$ alkenylene group, substituted $C_6$-$C_{10}$ arylene group, substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{14}$)($Q_{15}$), —B($Q_{16}$)($Q_{17}$), and —P(=O)($Q_{18}$)($Q_{19}$);

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{24}$)($Q_{25}$), —B($Q_{26}$)($Q_{27}$), and —P(=O)($Q_{28}$)($Q_{29}$); and —Si($Q_{31}$)($Q_{32}$)($Q_{33}$), —N($Q_{34}$)($Q_{35}$), —B($Q_{36}$)($Q_{37}$), and —P(=O)($Q_{38}$)($Q_{39}$), wherein $Q_1$ to $Q_9$, $Q_{11}$ to $Q_{19}$, $Q_{21}$ to $Q_{29}$, and $Q_{31}$ to $Q_{39}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

$CY_3$ to $CY_5$ in Formulae 3A and 3B may be each independently selected from a cyclopentadiene, a benzene, an indene, 1,2,3,4-tetrahydronaphthalene, a naphthalene, an azulene, a heptalene, an indacene, an acenaphthylene, a fluorene, a spiro-bifluorene, a benzofluorene, a dibenzofluorene, a phenalene, a phenanthrene, an anthracene, a fluoranthene, a triphenylene, a pyrene, a chrysene, a naphthacene, a picene, a perylene, a pentacene, a hexacene, a rubicene, a coronene, an ovalene, a pyrrole, an isoindole, an indole, an indazole, a pyrazole, an imidazole, a triazole, an oxazole, an isoxazole, an oxadiazole, a thiazole, an isothiazole, a thiadiazole, a purine, a pyridine, a pyrimidine, a pyrazine, a pyridazine, a triazine, a 5,6,7,8-tetrahydroquinoline, a 5,6,7,8-tetrahydroisoquinoline, a quinoline, an isoquinoline, a benzoquinoline, a phthalazine, a naphthyridine, a quinoxaline, a quinazoline, a cinnoline, a phenanthridine, an acridine, a phenanthroline, a phenazine, a benzoimidazole, a benzofuran, a benzothiophene, an isobenzothiazole, a benzoxazole, an isobenzoxazole, a benzocarbazole, a dibenzocarbazole, an imidazopyridine, an imidazopyrimidine, a dibenzofuran, a dibenzothiophene, a dibenzothiophene sulfone, a carbazole, a dibenzosilole, a benzofuropyridine, and a benzothienopyridine.

In an embodiment, $L_2$ in Formula 1 may be selected from ligands represented by Formula 3A, 3B, and 3F, $Y_{11}$ in Formula 3A may be nitrogen, $Y_{12}$ to $Y_{14}$ in Formula 3A may be carbon, $CY_3$ in Formula 3A may be selected from a pyridine, a 5,6,7,8-tetrahydroquinoline, a 5,6,7,8-tetrahydroisoquinoline, a quinoline, and an isoquinoline, $CY_4$ in Formula 3A may be selected from a benzene, 1,2,3,4-tetrahydronaphthalene, a naphthalene, a fluorene, a dibenzofuran, a dibenzothiophene, a benzofuropyridine, and a benzothienopyridine, $Y_{15}$ in Formula 3B may be carbon, $Y_{16}$ in Formula 3B may be nitrogen, $CY_5$ in Formula 3B may be a pyridine or a pyrimidine, $Z_1$ to $Z_3$ in Formulae 3A and 3B may be each independently selected from a hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, $—SF_5$, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, and $—Si(Q_1)(Q_2)(Q_3)$, $—N(Q_4)(Q_5)$, $—B(Q_6)(Q_7)$, and $—P(=O)(Q_8)(Q_9)$, a1 to a3 may be each independently an integer selected from 0 to 4, from among groups $Z_1$ in the number of a1, groups $Z_2$ in the number of a2, and groups $Z_3$ in the number of a3, two or more neighboring substituents may be optionally bonded to form a $C_5$-$C_{30}$ carbocyclic group or a $C_2$-$C_{30}$ heterocyclic group, and $Q_1$ to $Q_9$ may be each independently selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from a deuterium and a $C_1$-$C_{10}$ alkyl group;

$X_{12a}$ and $X_{12b}$ in Formula 3F may be O, and $R_{34}$ in Formula 3F may be selected from a $C_2$-$C_5$ alkenylene group; and a $C_2$-$C_5$ alkenylene group, substituted with at least one selected from deuterium, a $C_1$-$C_{10}$ alkyl group, a $C_1$-$C_{10}$ alkoxy group, and a phenyl group, but they are not limited thereto.

In some embodiments, $L_2$ in Formula 1 may be selected from ligands represented by Formulae 3-1 to 3-111:

Formula 3-1

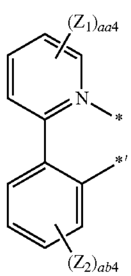

Formula 3-2

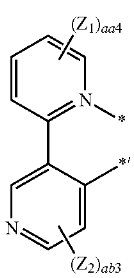

Formula 3-3

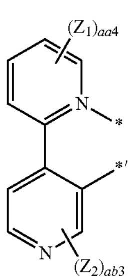

-continued

Formula 3-4

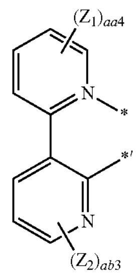

Formula 3-5

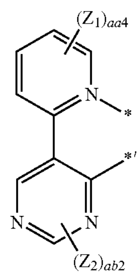

Formula 3-6

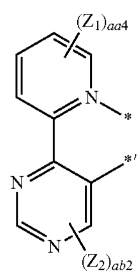

Formula 3-7

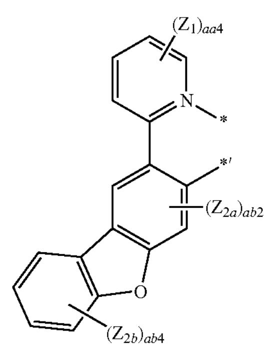

Formula 3-8

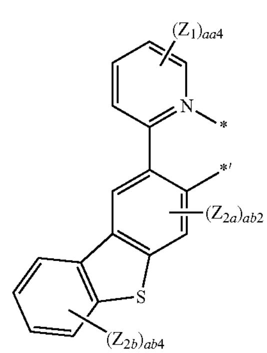

-continued
Formula 3-9
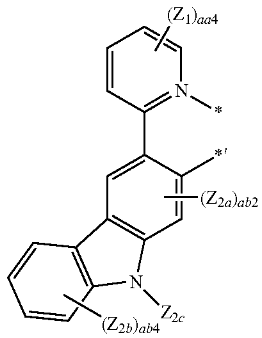
Formula 3-10
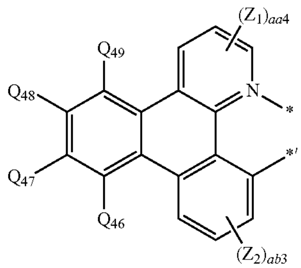
Formula 3-11
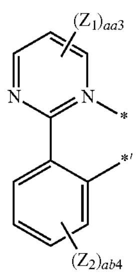
Formula 3-12
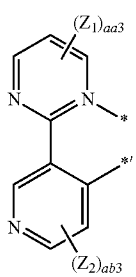
Formula 3-13
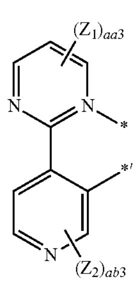
-continued
Formula 3-14
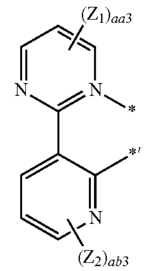
Formula 3-15
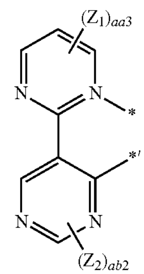
Formula 3-16
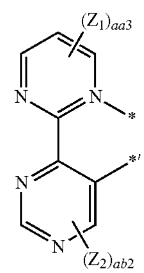
Formula 3-17
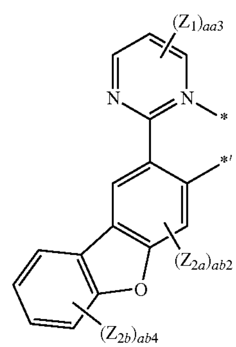
Formula 3-18
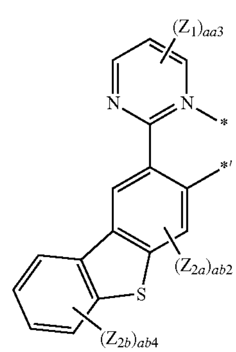

-continued
Formula 3-19
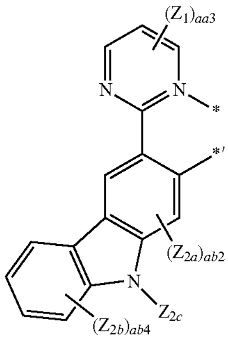
Formula 3-20
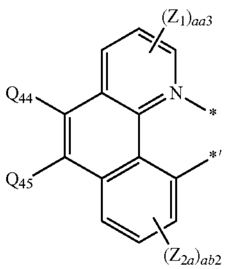
Formula 3-21
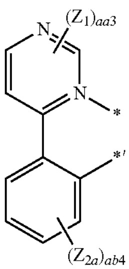
Formula 3-22
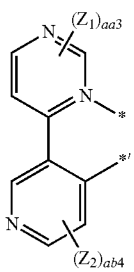
Formula 3-23
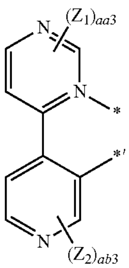
-continued
Formula 3-24
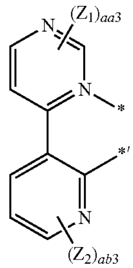
Formula 3-25
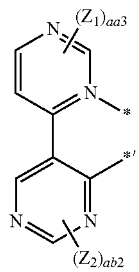
Formula 3-26
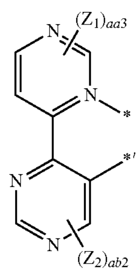
Formula 3-27
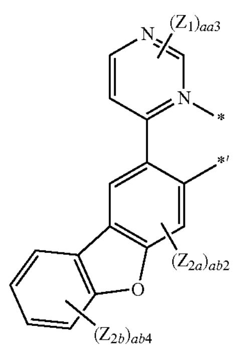
Formula 3-28
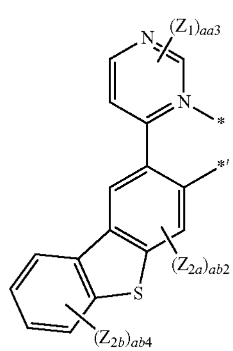

-continued
Formula 3-29
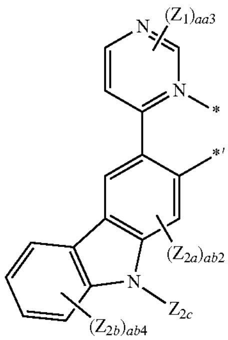
Formula 3-30
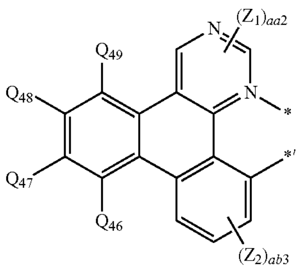
Formula 3-31
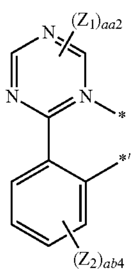
Formula 3-32
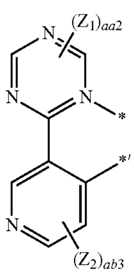
Formula 3-33
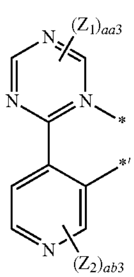
-continued
Formula 3-34
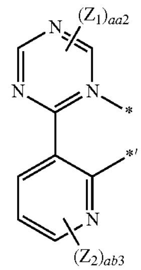
Formula 3-35
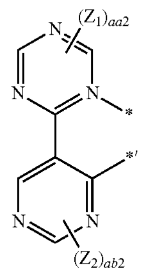
Formula 3-36
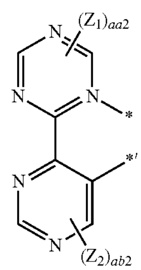
Formula 3-37
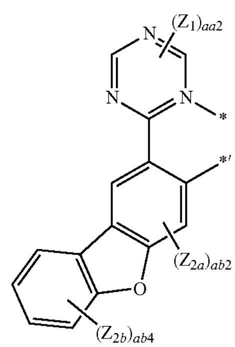
Formula 3-38
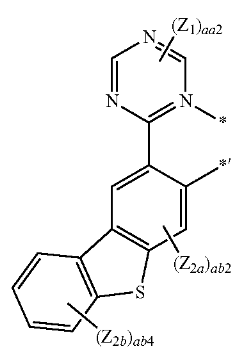

Formula 3-39
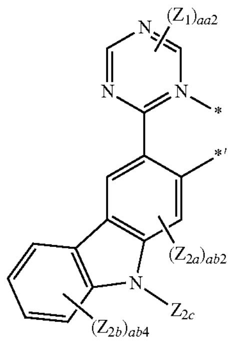
Formula 3-40
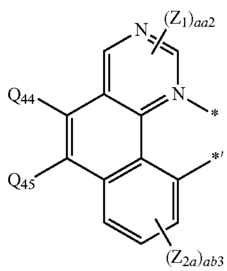
Formula 3-41
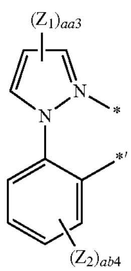
Formula 3-42
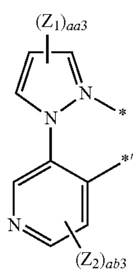
Formula 3-43
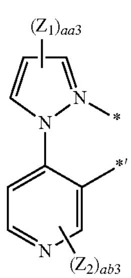
Formula 3-44
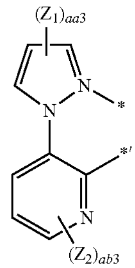
Formula 3-45
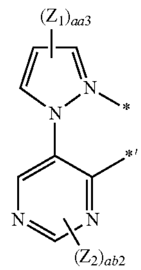
Formula 3-46
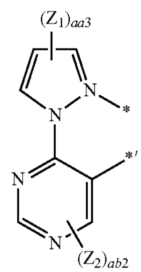
Formula 3-47
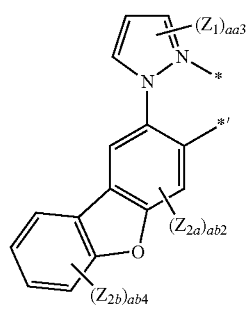
Formula 3-48
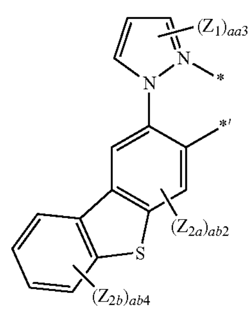

Formula 3-49
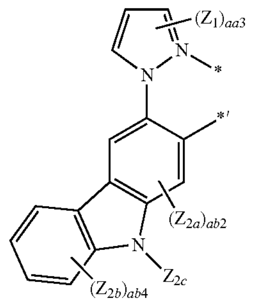
Formula 3-50
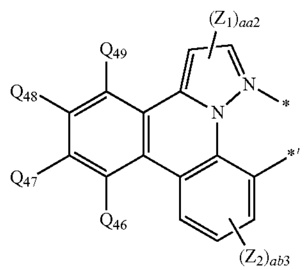
Formula 3-51
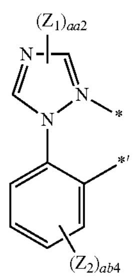
Formula 3-52
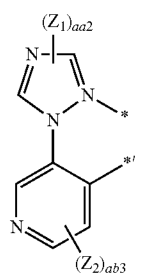
Formula 3-53
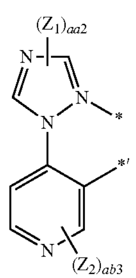
Formula 3-54
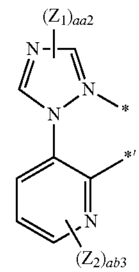
Formula 3-55
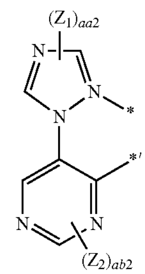
Formula 3-56
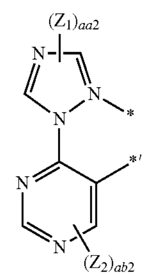
Formula 3-57
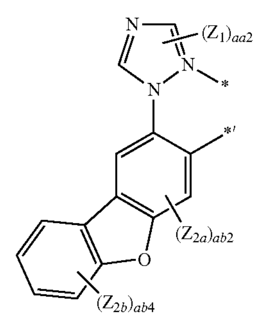
Formula 3-58
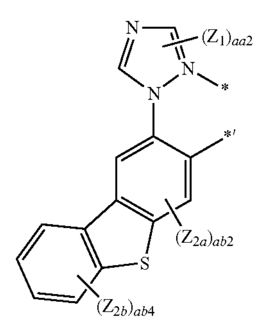

Formula 3-59
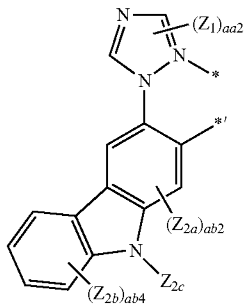
Formula 3-60
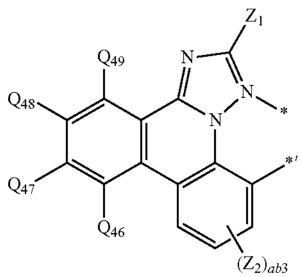
Formula 3-61
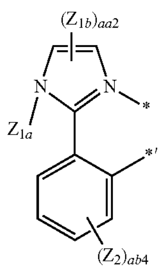
Formula 3-62
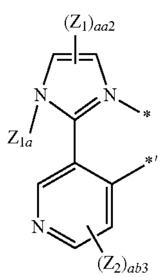
Formula 3-63
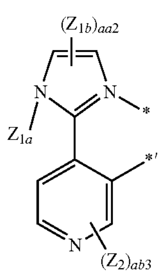
Formula 3-64
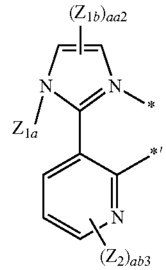
Formula 3-65
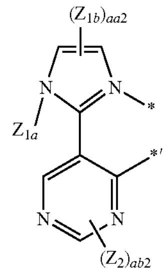
Formula 3-66
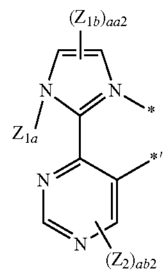
Formula 3-67
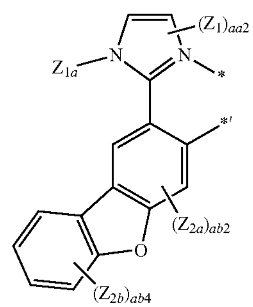
Formula 3-68
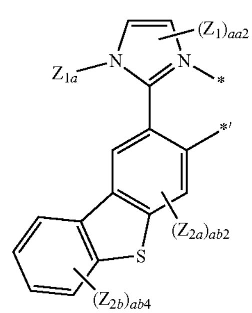

-continued
Formula 3-69
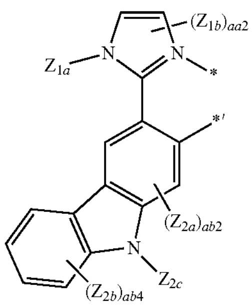
Formula 3-70
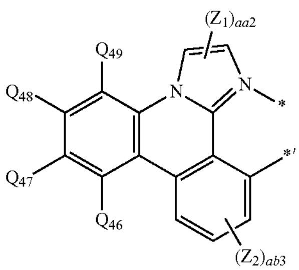
Formula 3-71
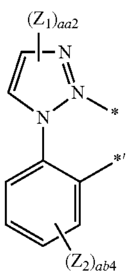
Formula 3-72
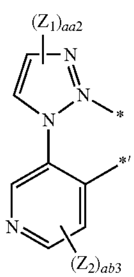
Formula 3-73
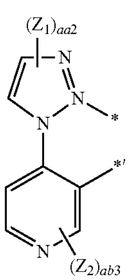
-continued
Formula 3-74
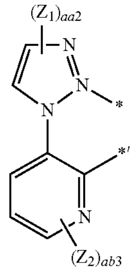
Formula 3-75
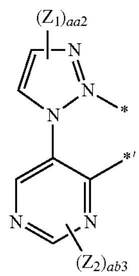
Formula 3-76
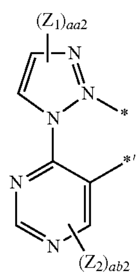
Formula 3-77
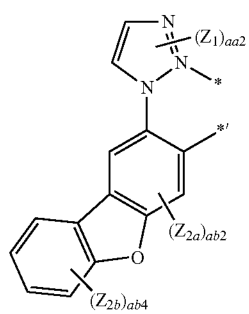
Formula 3-78
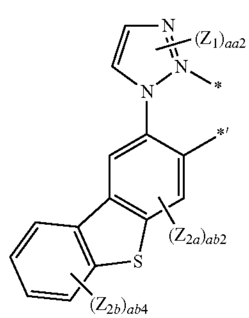

-continued
Formula 3-79
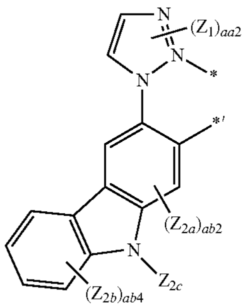
Formula 3-80
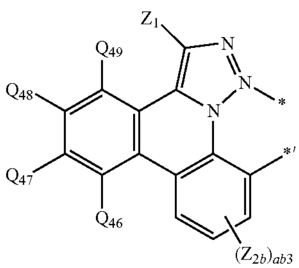
Formula 3-81
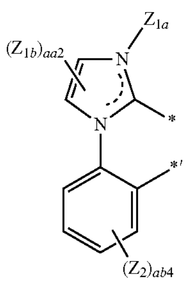
Formula 3-82
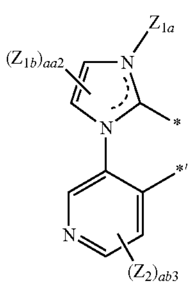
Formula 3-83
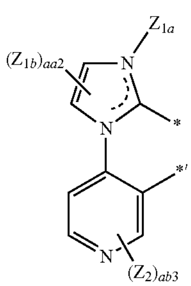
-continued
Formula 3-84
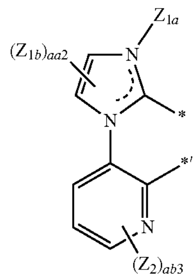
Formula 3-85
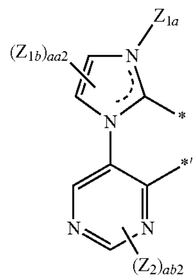
Formula 3-86
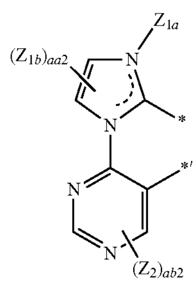
Formula 3-87
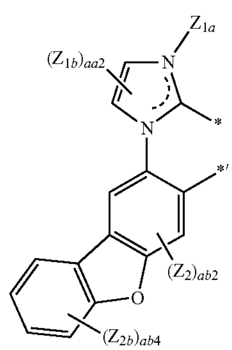
Formula 3-88
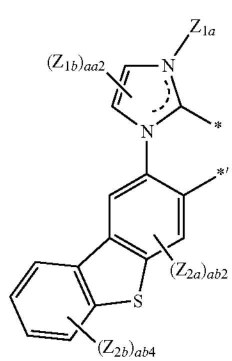

-continued
Formula 3-89
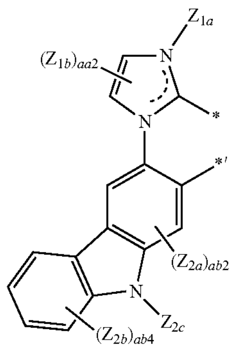
Formula 3-90
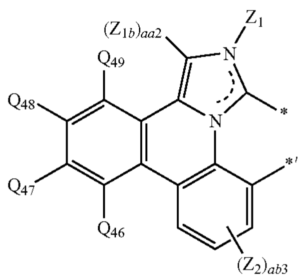
Formula 3-91
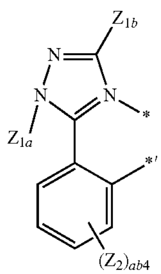
Formula 3-92
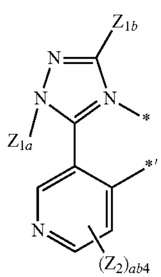
Formula 3-93
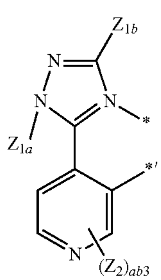
-continued
Formula 3-94
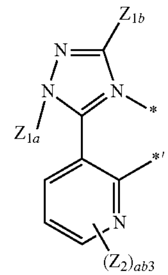
Formula 3-95
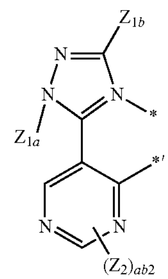
Formula 3-96
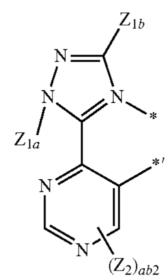
Formula 3-97
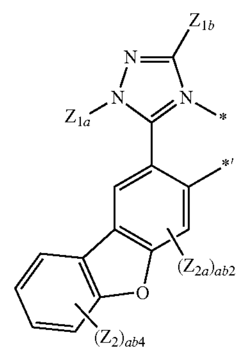
Formula 3-98
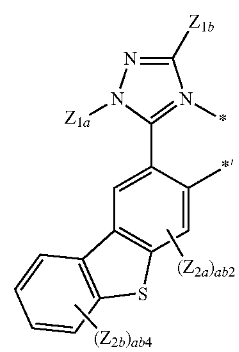

-continued
Formula 3-99
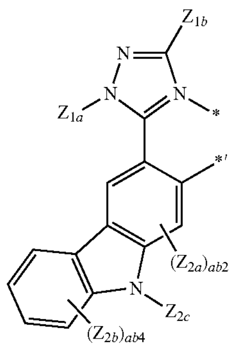
Formula 3-100
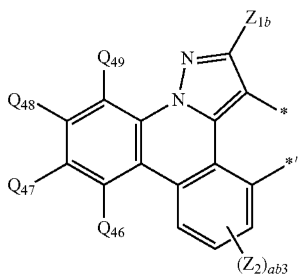
Formula 3-101
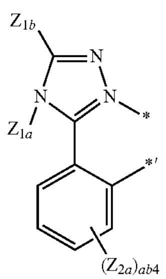
Formula 3-102
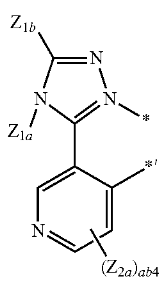
Formula 3-103
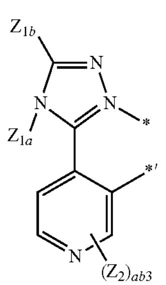
-continued
Formula 3-104
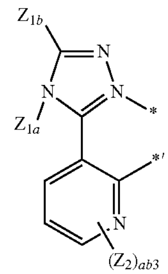
Formula 3-105
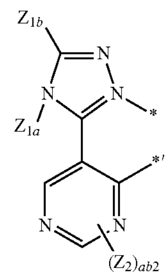
Formula 3-106
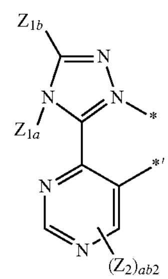
Formula 3-107
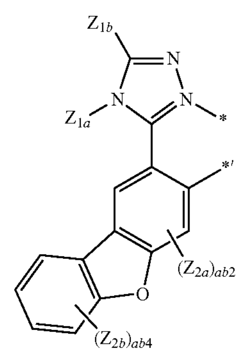
Formula 3-108
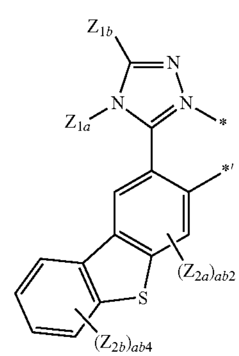

-continued

Formula 3-109

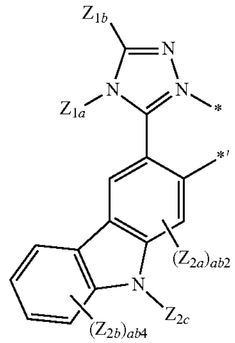

Formula 3-110

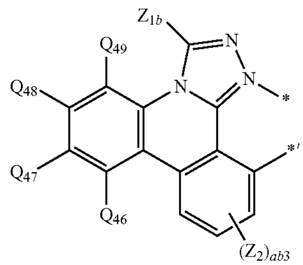

Formula 3-111

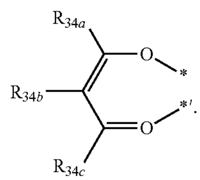

In Formulae 3-1 to 3-111, $Z_1$, $Z_2$, $Z_{1a}$, $Z_{1b}$, $Z_{2a}$, $Z_{2b}$, $Z_{2c}$, $R_{34a}$, $R_{34b}$, and $R_{34c}$ may be each independently selected from a hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, $—SF_5$, $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group; and —$Si(Q_1)(Q_2)(Q_3)$, —$N(Q_4)(Q_5)$, —$B(Q_6)(Q_7)$, and —$P(=O)(Q_8)(Q_9)$, from among $Z_1$, $Z_2$, $Z_{1a}$, $Z_{1b}$, $Z_{2a}$, $Z_{2b}$, $Z_{2c}$, $R_{34a}$, $R_{34b}$, and $R_{34c}$, two or more neighboring substituents may be optionally bonded to form a $C_5$-$C_{30}$ carbocyclic group or a $C_2$-$C_{30}$ heterocyclic group, $Q_1$ to $Q_9$ may be each independently selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from a deuterium, and a $C_1$-$C_{10}$ alkyl group;

aa2 and ab2 may be each independently 1 or 2, aa3 and ab3 may be each independently an integer selected from 1 to 3, aa4 and ab4 may be each independently an integer selected from 1 to 4, and each of * and *' indicates a binding site to M in Formula 1.

In some embodiments, $L_2$ in Formula 1 may be selected from ligands represented by Formulae 3-1(1) to 3-1(60), 3-1(61) to 3-1(69), 3-1(71) to 3-1(79), 3-1(81) to 3-1(88), 3-1(91) to 3-1(98), 3-111, and 3-112:

Formula 3-1(1)

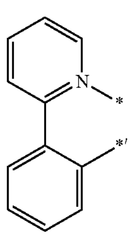

Formula 3-1(2)

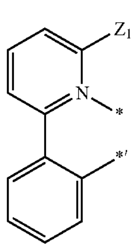

-continued

Formula 3-1(3)

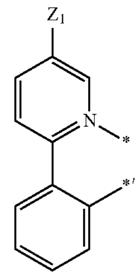

Formula 3-1(4)

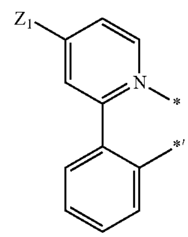

Formula 3-1(5)

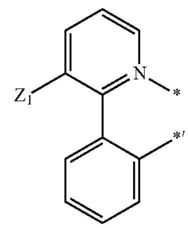

Formula 3-1(6)

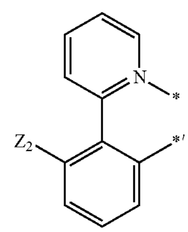

Formula 3-1(7)

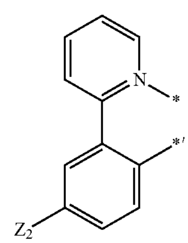

Formula 3-1(8)

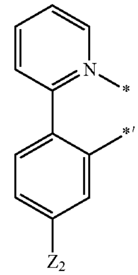

-continued
Formula 3-1(9)
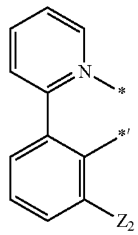
Formula 3-1(10)
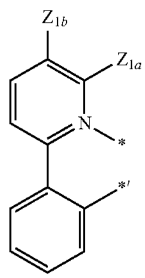
Formula 3-1(11)
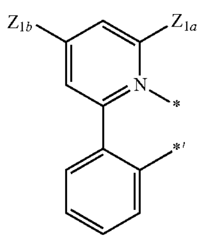
Formula 3-1(12)
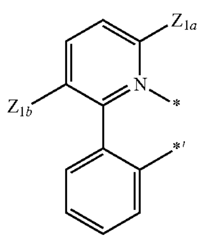
Formula 3-1(13)
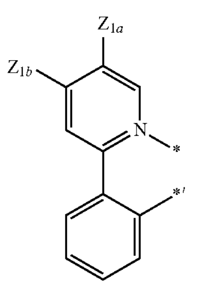
Formula 3-1(14)
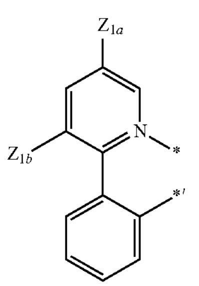
-continued
Formula 3-1(15)
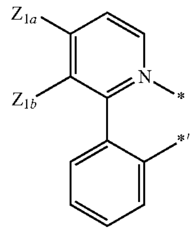
Formula 3-1(16)
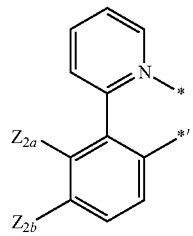
Formula 3-1(17)
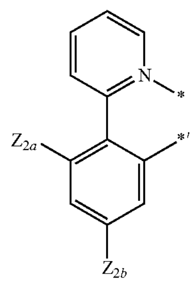
Formula 3-1(18)
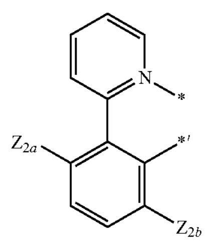
Formula 3-1(19)
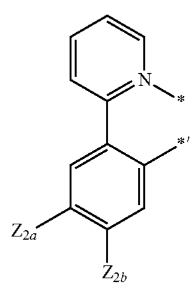
Formula 3-1(20)
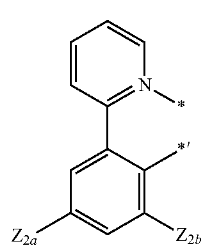

-continued
Formula 3-1(21)
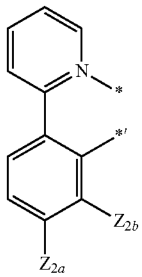
Formula 3-1(22)
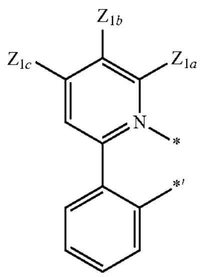
Formula 3-1(23)
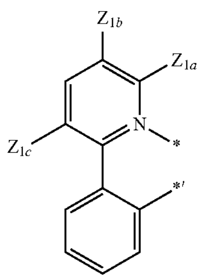
Formula 3-1(24)
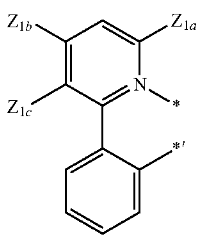
Formula 3-1(25)
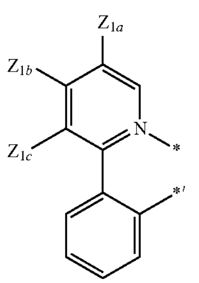
Formula 3-1(26)
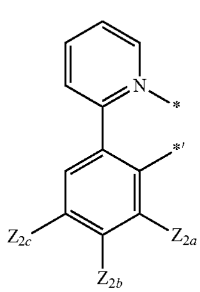
-continued
Formula 3-1(27)
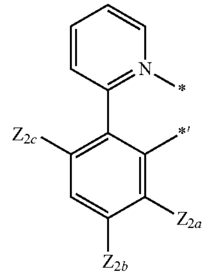
Formula 3-1(28)
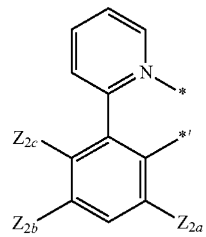
Formula 3-1(29)
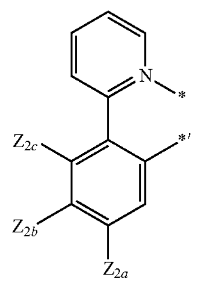
Formula 3-1(30)
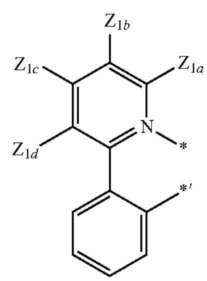
Formula 3-1(31)
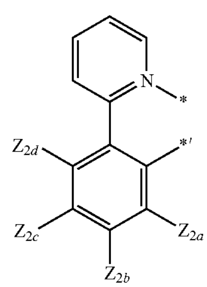
Formula 3-1(32)
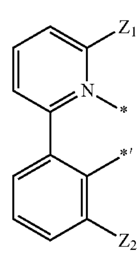

-continued
Formula 3-1(33)
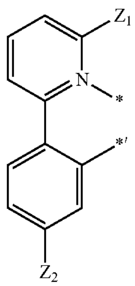
Formula 3-1(34)
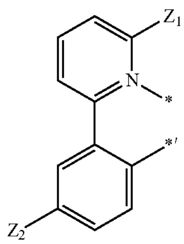
Formula 3-1(35)
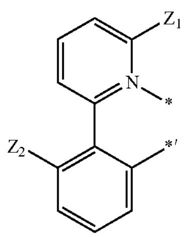
Formula 3-1(36)
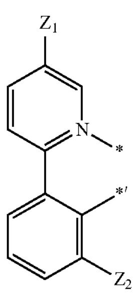
Formula 3-1(37)
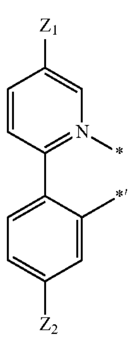
-continued
Formula 3-1(38)
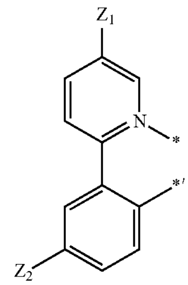
Formula 3-1(39)
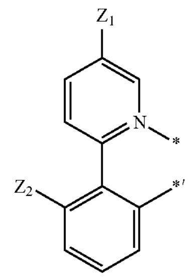
Formula 3-1(40)
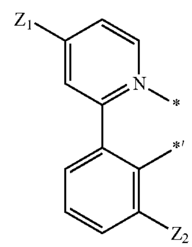
Formula 3-1(41)
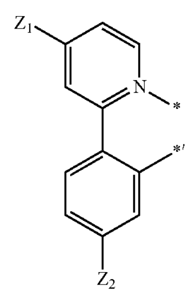
Formula 3-1(42)
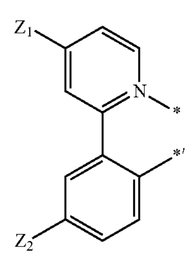
Formula 3-1(43)
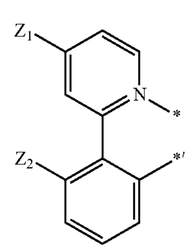

-continued
Formula 3-1(44)
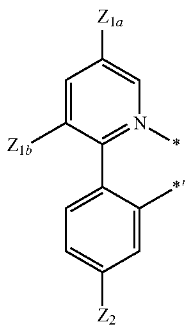
Formula 3-1(45)
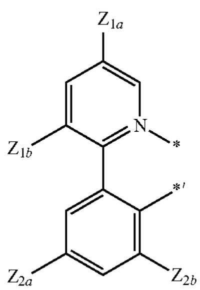
Formula 3-1(46)
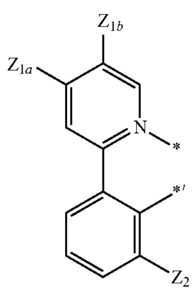
Formula 3-1(47)
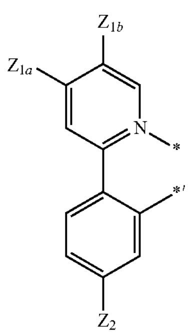
Formula 3-1(48)
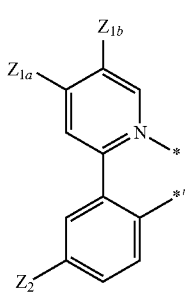
-continued
Formula 3-1(49)
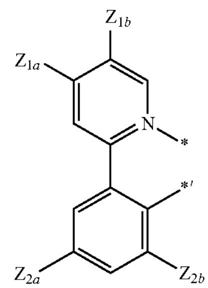
Formula 3-1(50)
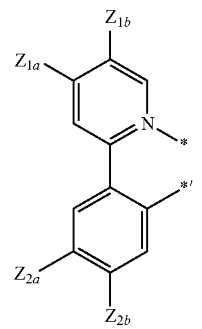
Formula 3-1(51)
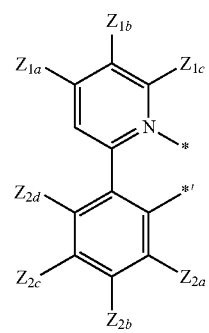
Formula 3-1(52)
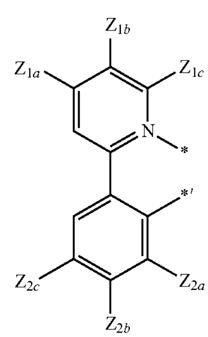
Formula 3-1(53)
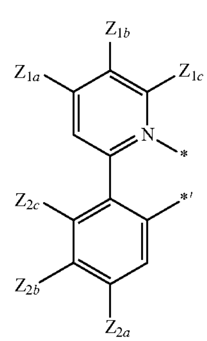

-continued
Formula 3-1(54)
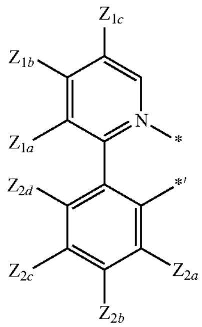
Formula 3-1(55)
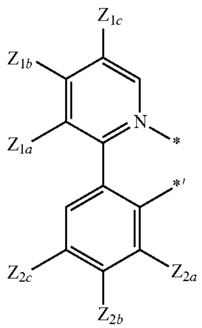
Formula 3-1(56)
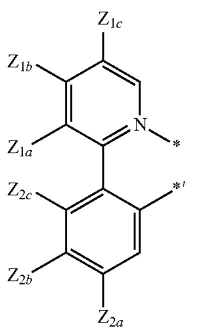
Formula 3-1(57)
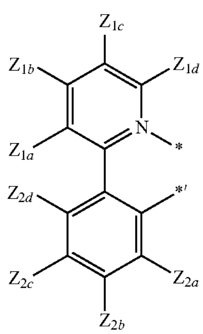
Formula 3-1(58)
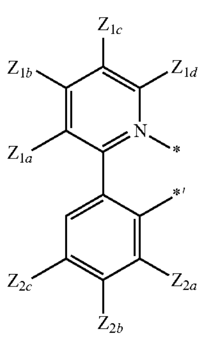
-continued
Formula 3-1(59)
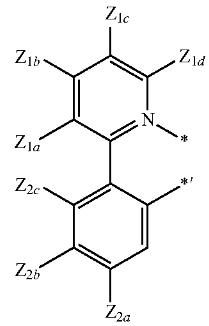
Formula 3-1(60)
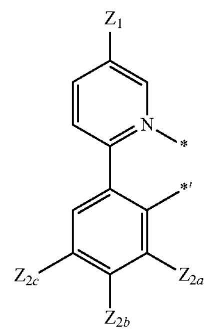
Formula 3-1(61)
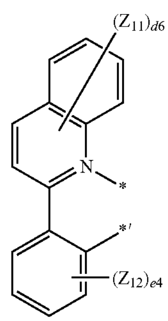
Formula 3-1(62)
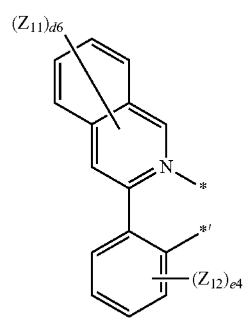
Formula 3-1(63)
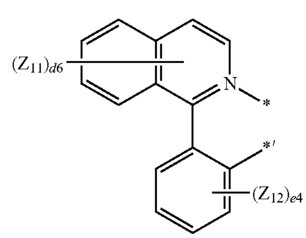

-continued
Formula 3-1(64)
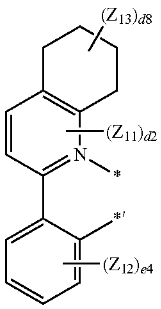
Formula 3-1(65)
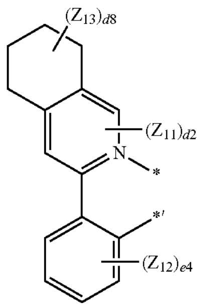
Formula 3-1(66)
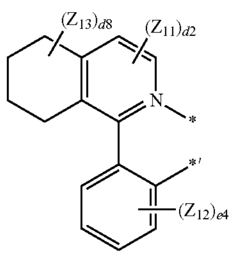
Formula 3-1(67)
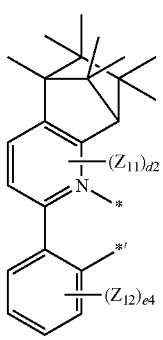
Formula 3-1(68)
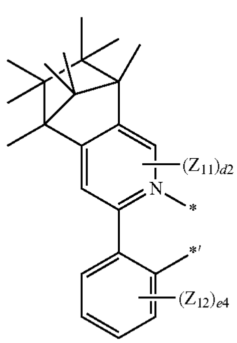
-continued
Formula 3-1(69)
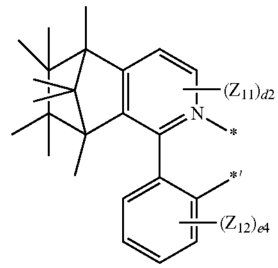
Formula 3-1(71)
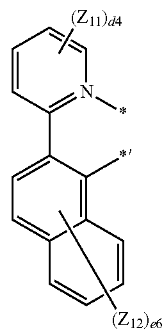
Formula 3-1(72)
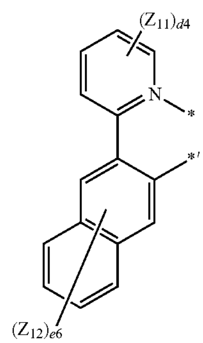
Formula 3-1(73)
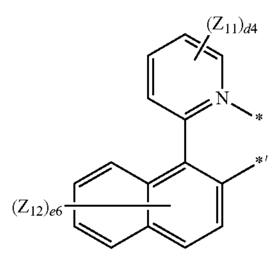
Formula 3-1(74)
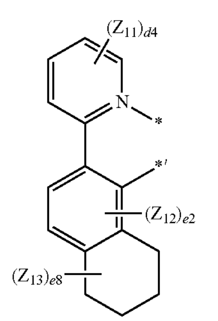

-continued
Formula 3-1(75)
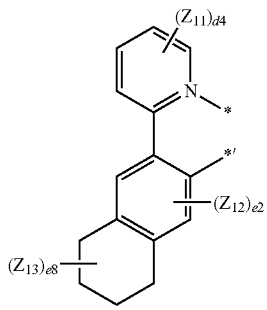
Formula 3-1(76)
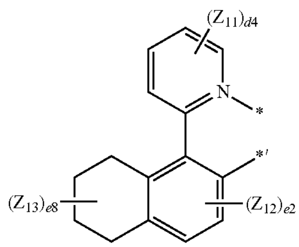
Formula 3-1(77)
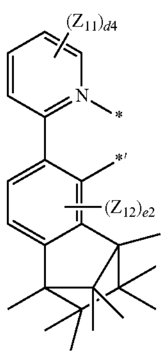
Formula 3-1(78)
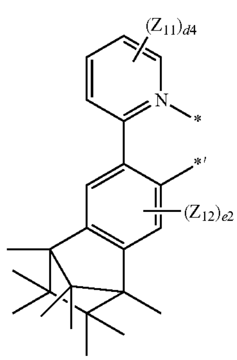
Formula 3-1(79)
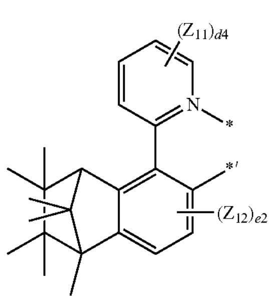
-continued
Formula 3-1(81)
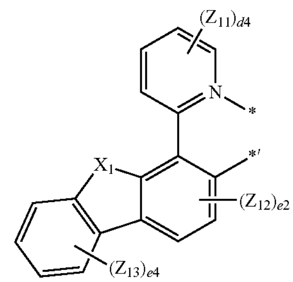
Formula 3-1(82)
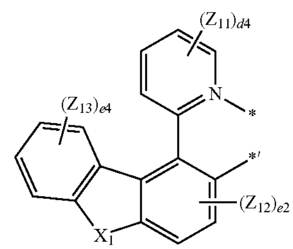
Formula 3-1(83)
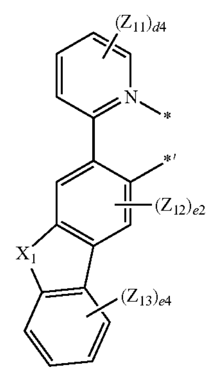
Formula 3-1(84)
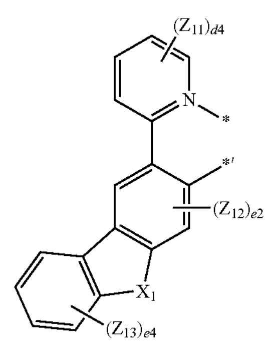
Formula 3-1(85)
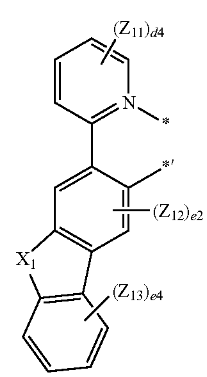

Formula 3-1(86)
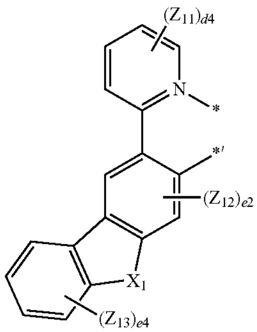
Formula 3-(87)
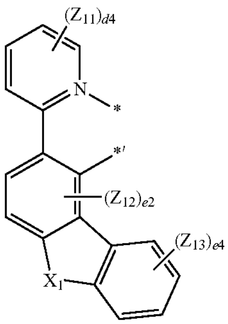
Formula 3-1(88)
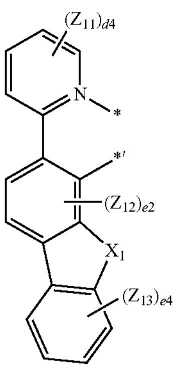
Formula 3-1(91)
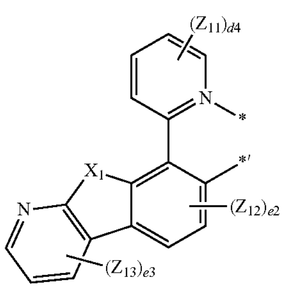
Formula 3-1(92)
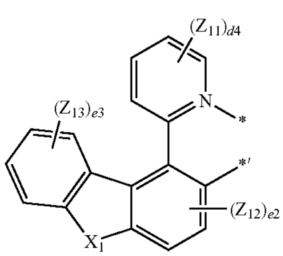
Formula 3-1(93)
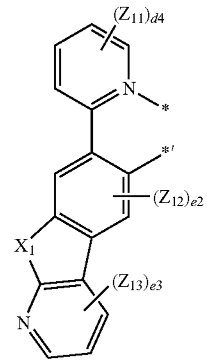
Formula 3-1(94)
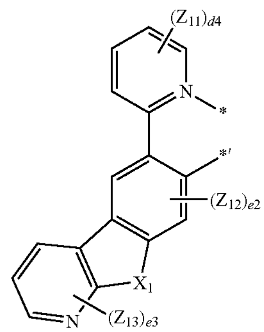
Formula 3-1(95)
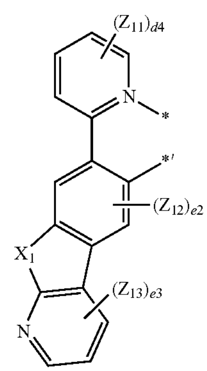
Formula 3-1(96)
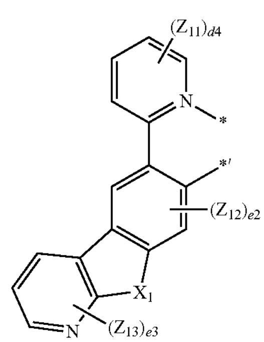

-continued

Formula 3-1(97)

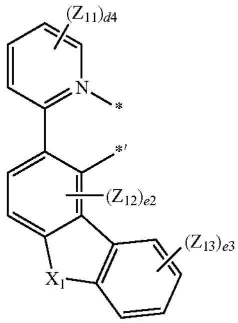

Formula 3-1(98)

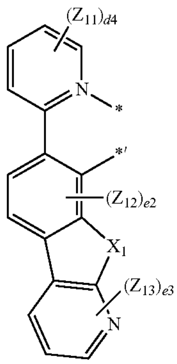

Formula 3-111

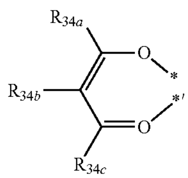

Formula 3-112

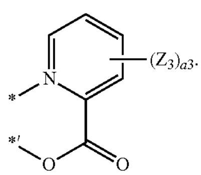

In Formulae 3-1(1) to 3-1(60), 3-1(61) to 3-1(69), 3-1(71) to 3-1(79), 3-1(81) to 3-1(88), 3-1(91) to 3-1(98), 3-111, and 3-112, $Z_1$, $Z_2$, $Z_{1a}$, $Z_{1b}$, $Z_{1c}$, $Z_{1d}$, $Z_{2a}$, $Z_{2b}$, $Z_{2c}$, $Z_{2d}$, $R_{34a}$, $R_{34b}$, and $R_{34c}$ may be each independently selected from deuterium, —F, a cyano group, a nitro group, $—SF_5$, $—CH_3$, $—CD_3$, $—CD_2H$, $—CDH_2$, $—CF_3$, $—CF_2H$, $—CFH_2$, $—Si(Q_1)(Q_2)(Q_3)$, $—N(Q_4)(Q_5)$, $—B(Q_6)(Q_7)$, $—P(=O)(Q_8)(Q_9)$, groups represented by Formulae 9-1 to 9-19, and groups represented by Formulae 10-1 to 10-38, $X_1$ may be O, S, $C(Z_{21})(Z_{22})$, or $N(Z_{23})$, $Z_3$, $Z_{11}$ to $Z_{13}$, and $Z_{21}$ to $Z_{23}$ may be each independently selected from hydrogen, deuterium, —F, a cyano group, a nitro group, $—SF_5$, $—CH_3$, $—CD_3$, $—CD_2H$, $—CDH_2$, $—CF_3$, $—CF_2H$, $—CFH_2$, $—Si(Q_1)(Q_2)(Q_3)$, $—N(Q_4)(Q_5)$, $—B(Q_6)(Q_7)$, $—P(=O)(Q_8)(Q_9)$, groups represented by Formulae 9-1 to 9-19, and groups represented by Formulae 10-1 to 10-38, $Q_1$ to $Q_9$ may be each independently selected from $—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, and $—CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from a deuterium and a $C_1$-$C_{10}$ alkyl group, d2 and e2 may be each independently 0 or 2, e3 may be an integer selected from 0 to 3, d4 and e4 may be each independently an integer selected from 0 to 4, d6 and e6 may be each independently an integer selected from 0 to 6, d8 and e8 may be each independently an integer selected from 0 to 8, and each of * and *' indicates a binding site to M in Formula 1.

In an embodiment, $L_1$ in Formula 1 may be selected from ligands represented by Formula 2(1) (for example, a ligand represented by Formula 2BA), and $L_2$ in Formula 1 may be selected from ligands represented by Formulae 3-1(1) to 3-1(60), 3-1(61) to 3-1(69), 3-1(71) to 3-1(79), 3-1(81) to 3-1(88), 3-1(91) to 3-1(98), 3-111, and 3-112.

In some embodiments, $L_1$ in Formula 1 may be selected from ligands represented by Formulae 2-1 to 2-47, and $L_2$ in Formula 1 may be selected from ligands represented by Formulae 3-1(1) to 3-1(60), 3-1(61) to 3-1(69), 3-1(71) to 3-1(79), 3-1(81) to 3-1(88), 3-1(91) to 3-1(98), 3-111, and 3-112, but they are not limited thereto.

In some embodiments, $L_1$ in Formula 1 may be selected from ligands represented by Formulae 2BA-1 to 2BA-5, and $L_2$ in Formula 1 may be selected from ligands represented by Formulae 3-1(1) to 3-1(60), 3-1(61) to 3-1(69), 3-1(71) to 3-1(79), 3-1(81) to 3-1(88), 3-1(91) to 3-1(98), 3-111, and 3-112, but they are not limited thereto.

The organometallic compound represented by Formula 1 may be selected from Compounds 1 to 288, but is not limited thereto:

1

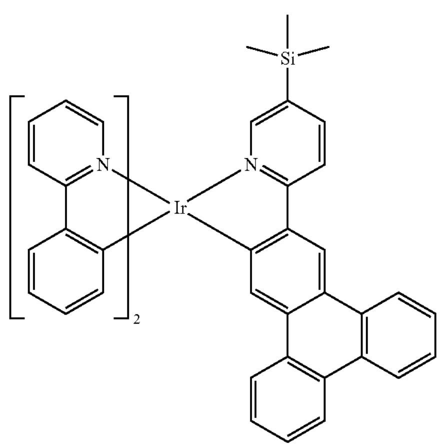

2
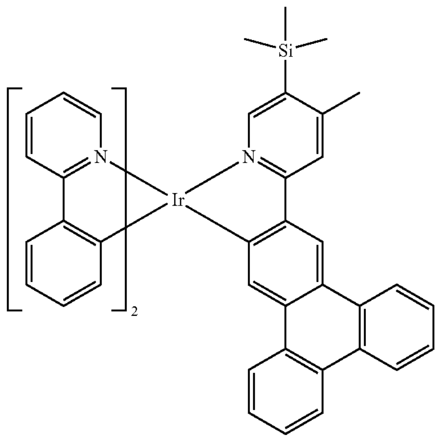
3
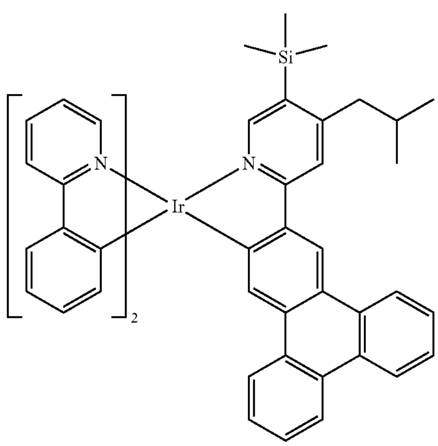
4
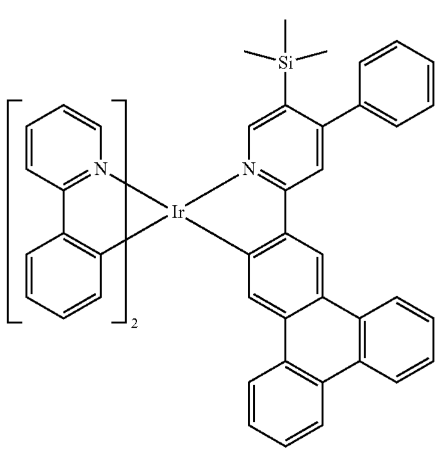
5
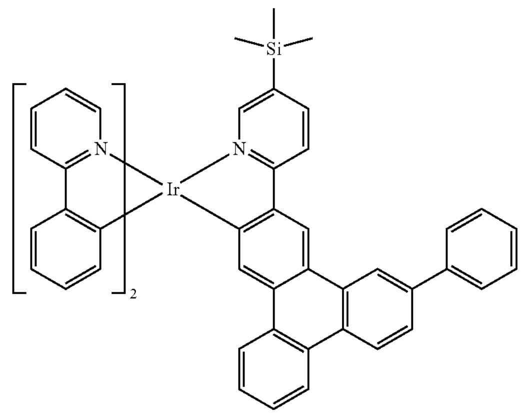
6
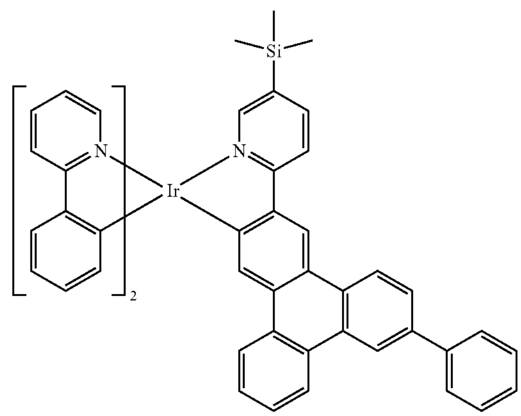
7
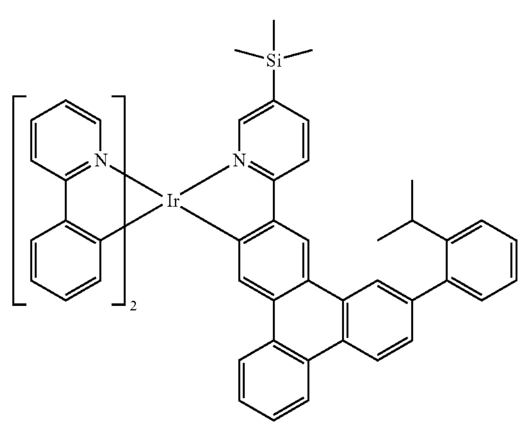

8
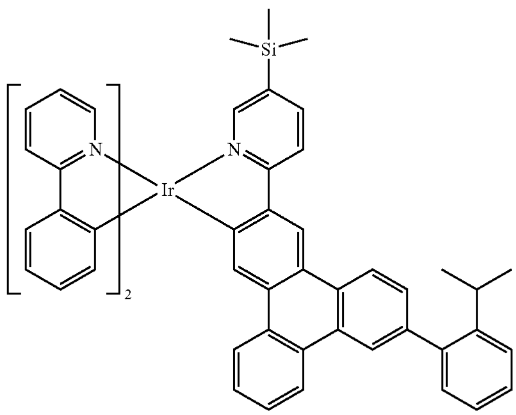
9
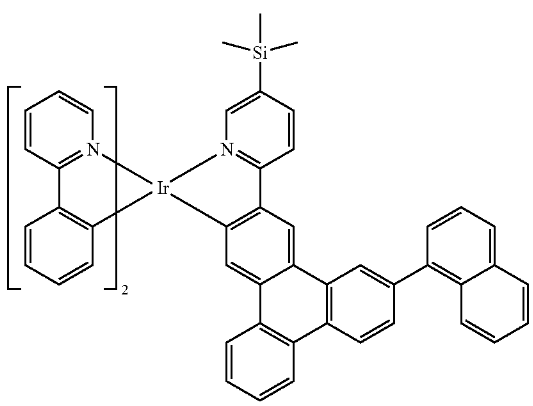
10
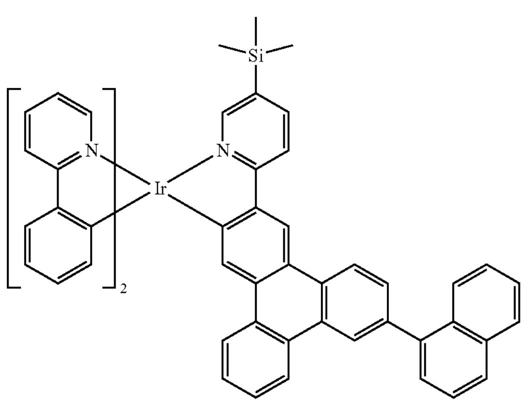
11
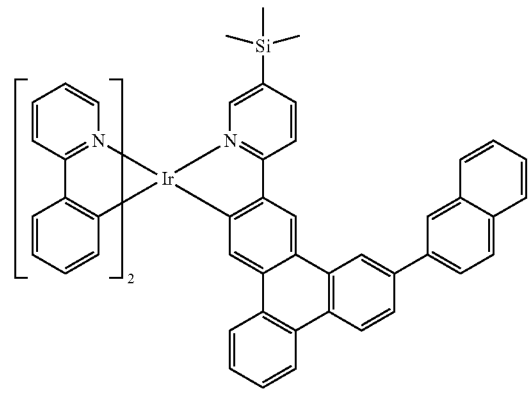
12
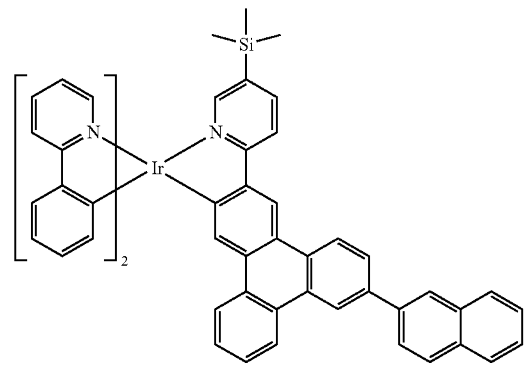
13
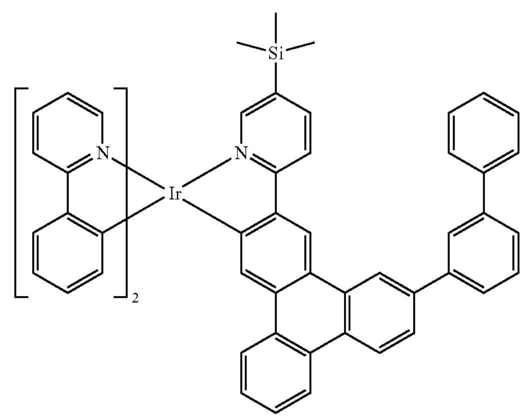
14
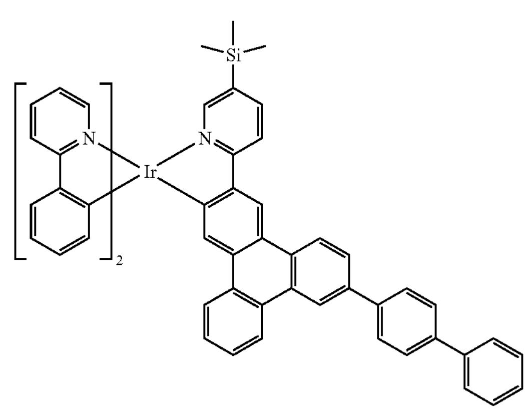

-continued
15
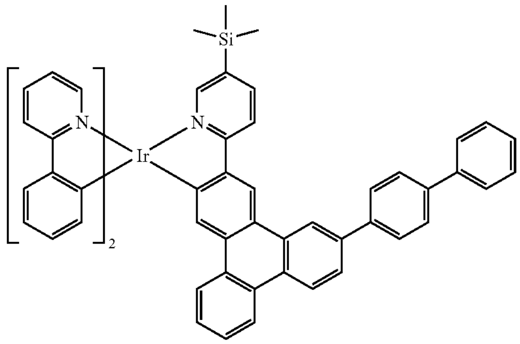
16
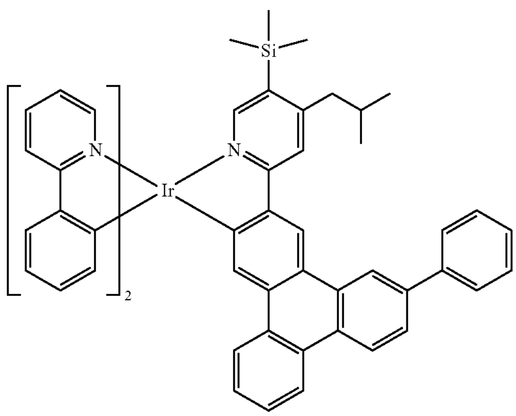
17
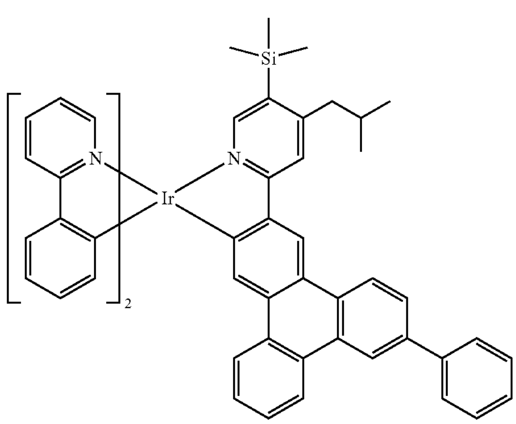
-continued
18
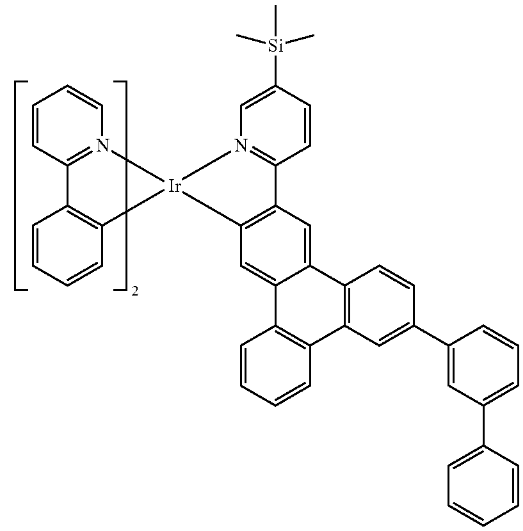
19
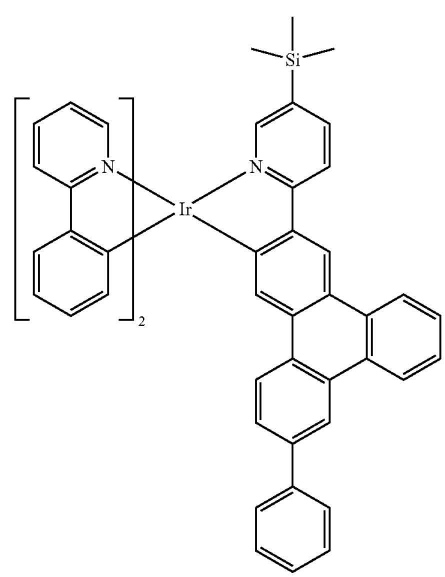

20
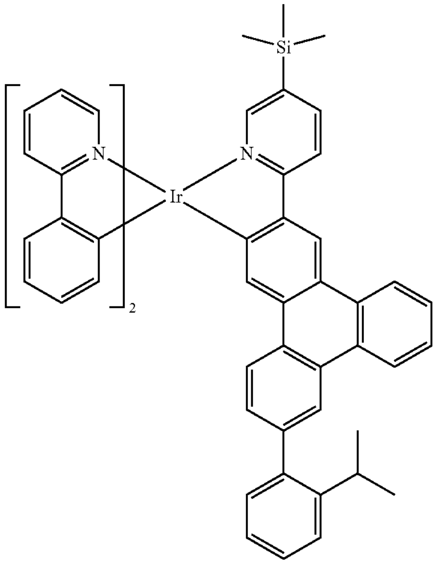
21
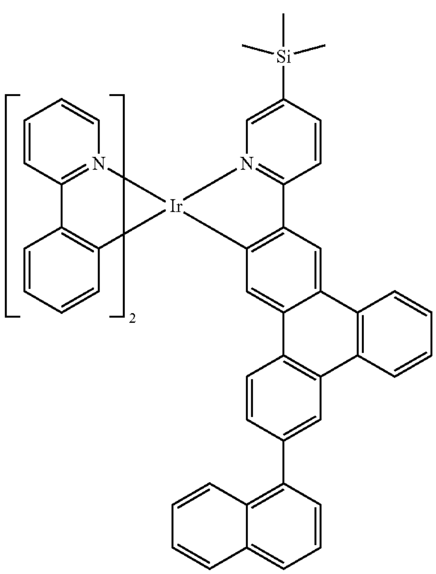
22
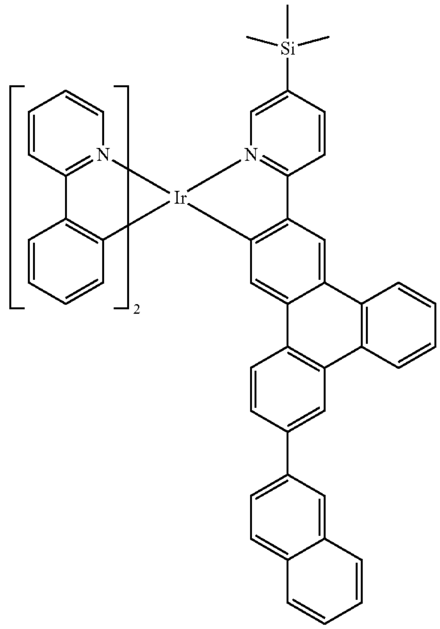
23
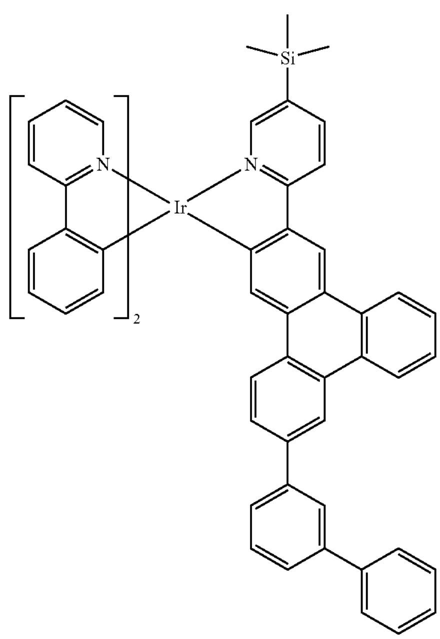

24
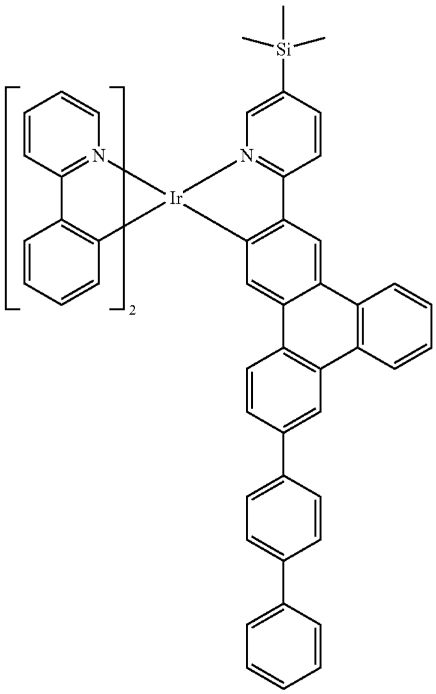
25
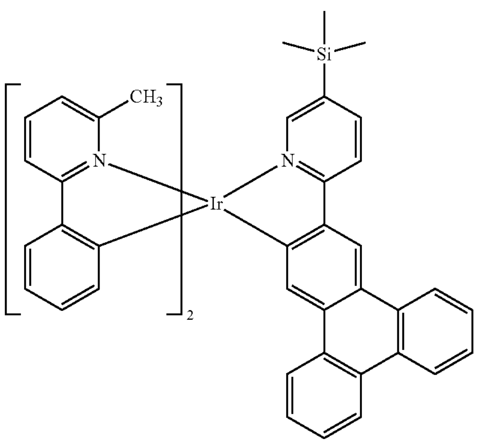
26
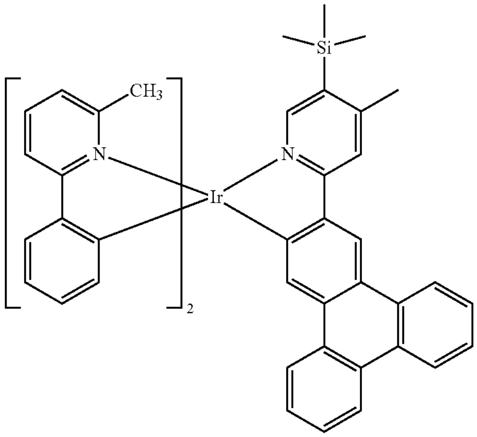
27
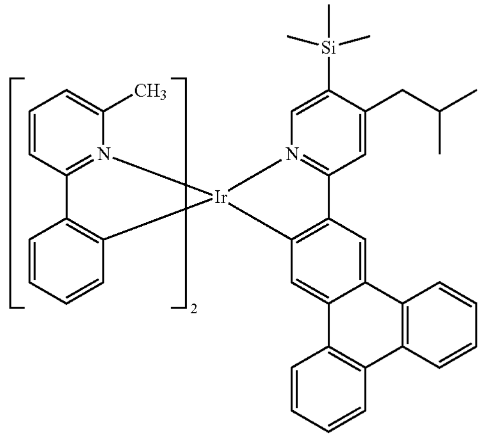
28
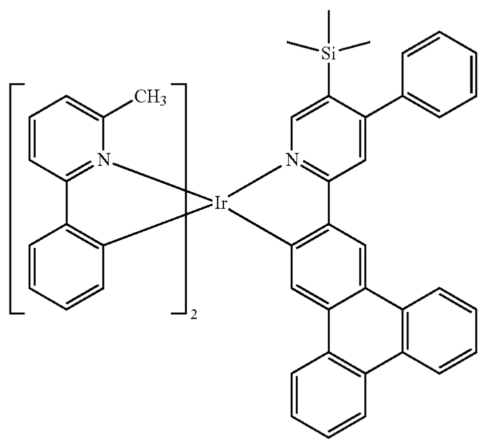
29
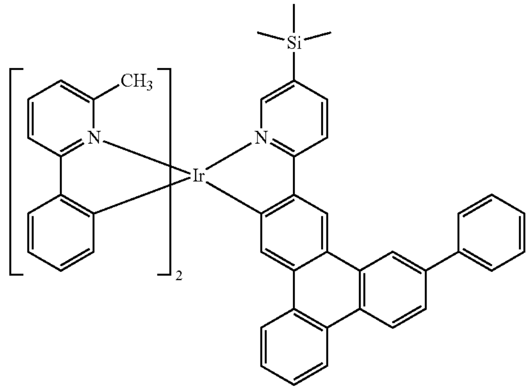

30
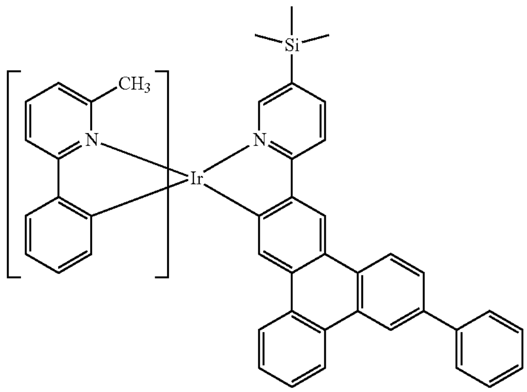
31
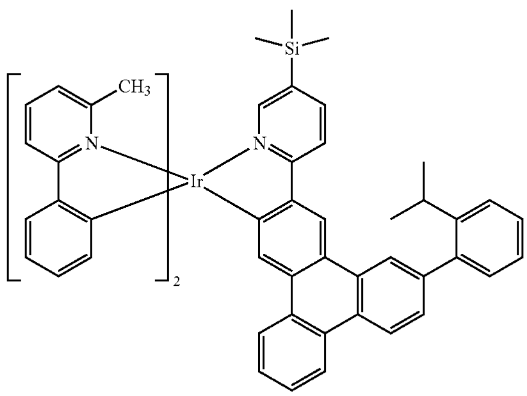
32
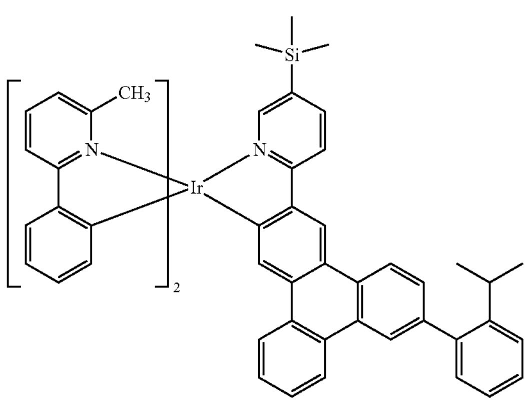
33
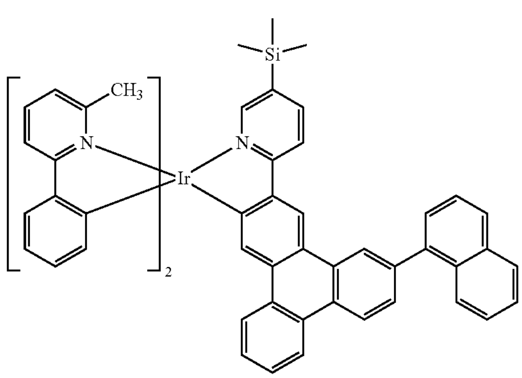
34
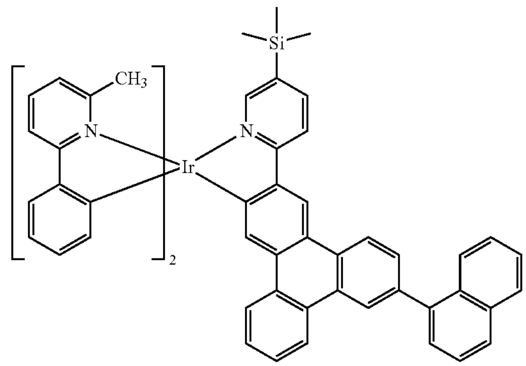
35
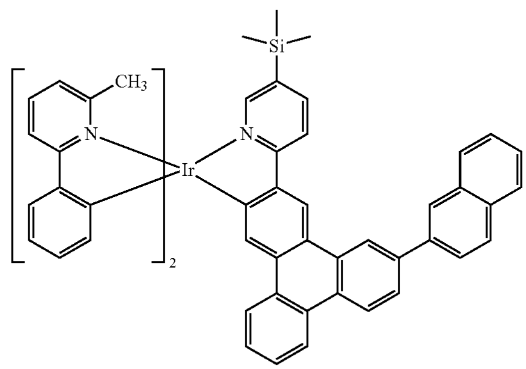
36
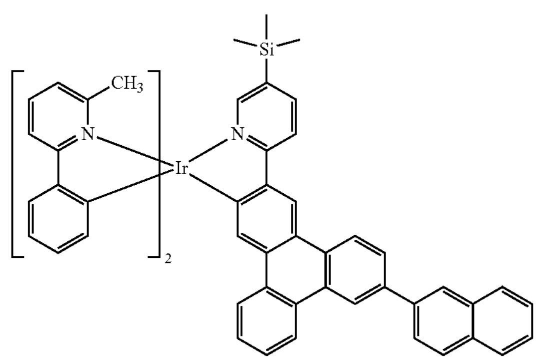
37
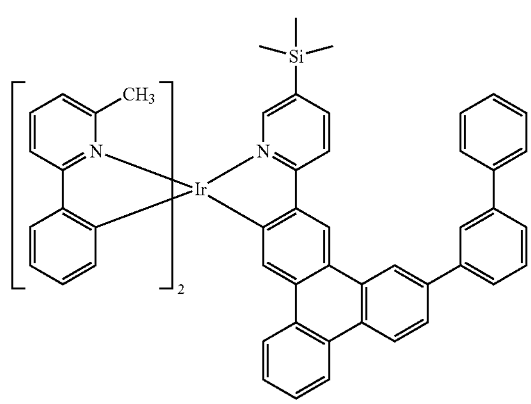

-continued
38
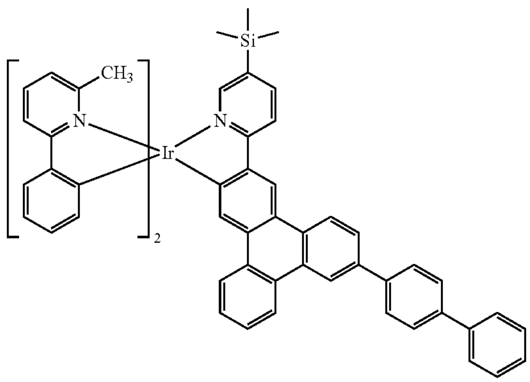
39
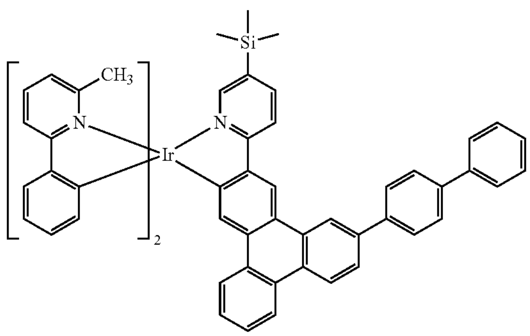
40
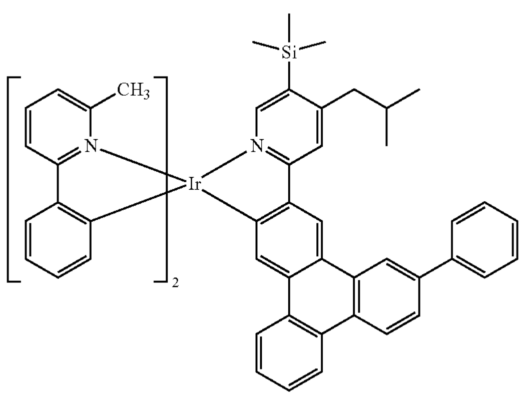
41
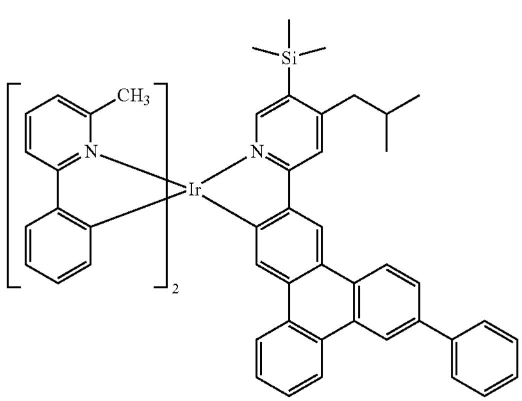
-continued
42
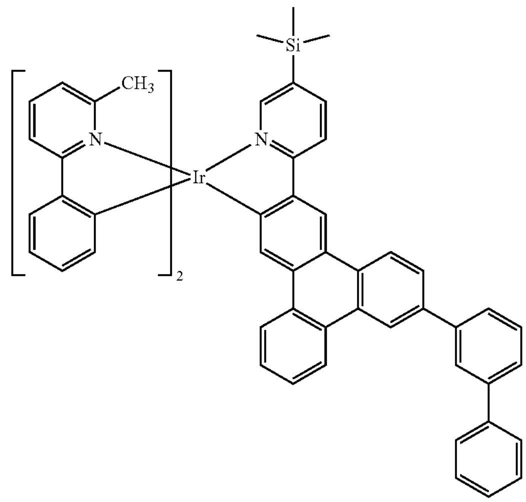
43
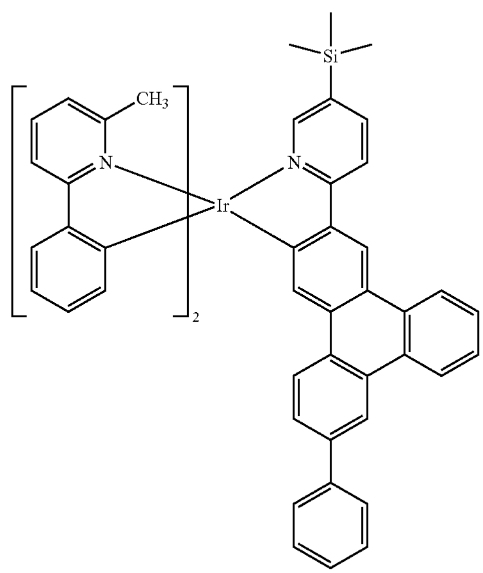
44
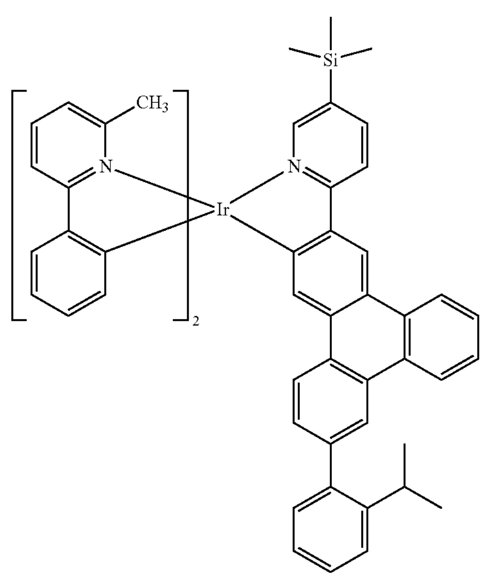

-continued
45
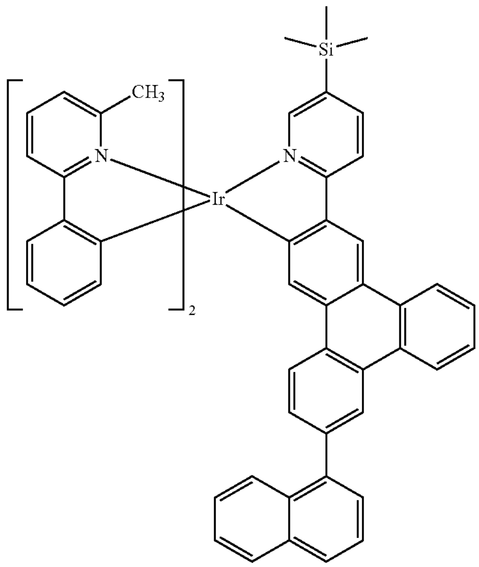
46
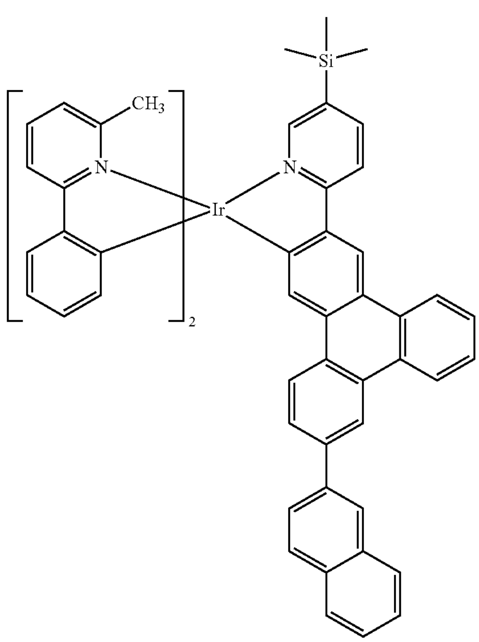
-continued
47
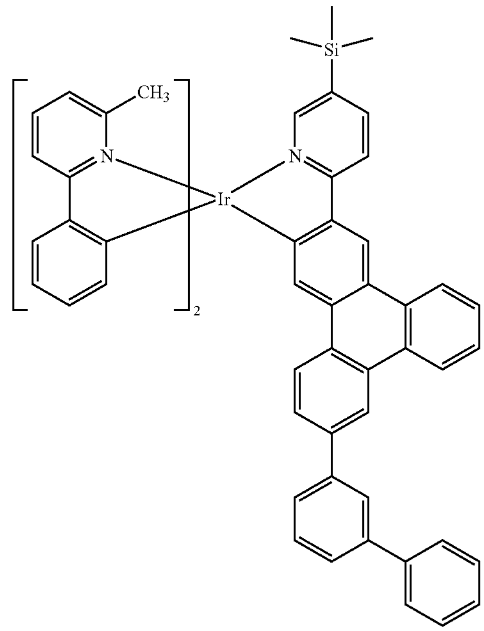
48
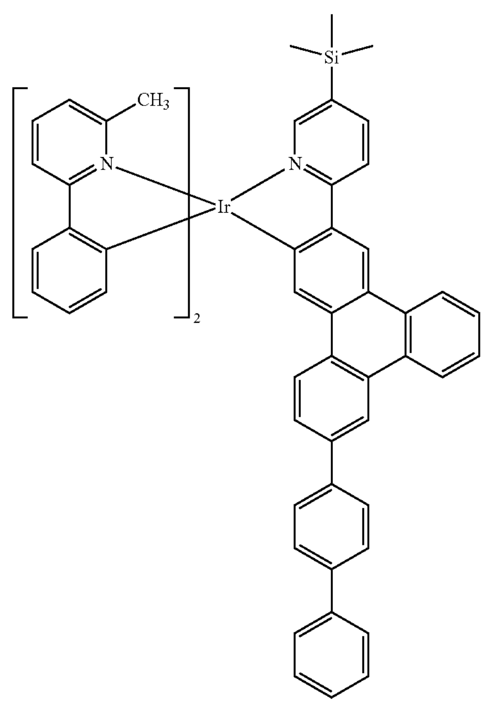

-continued
49
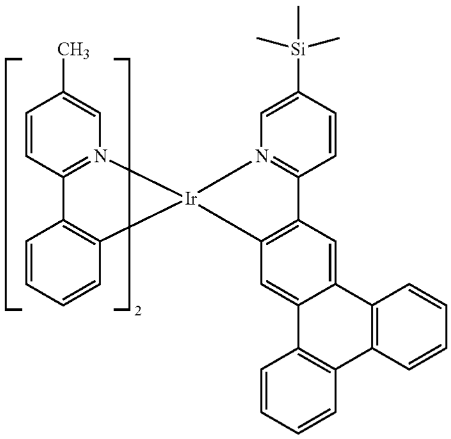
50
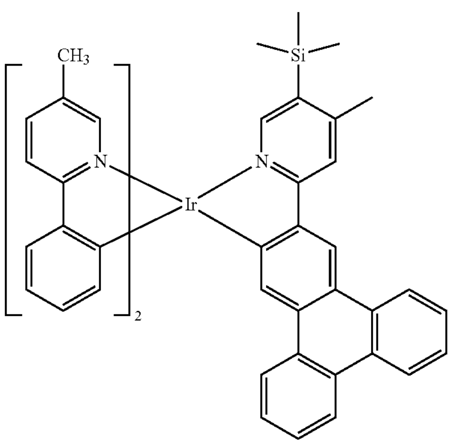
51
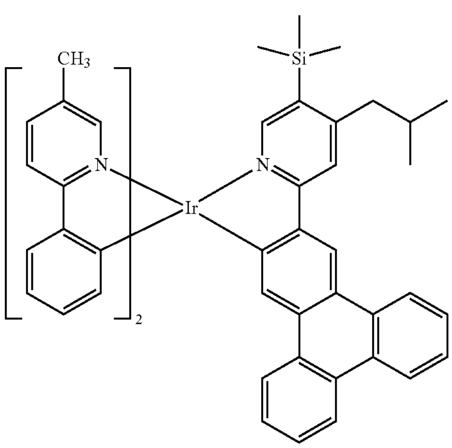
-continued
52
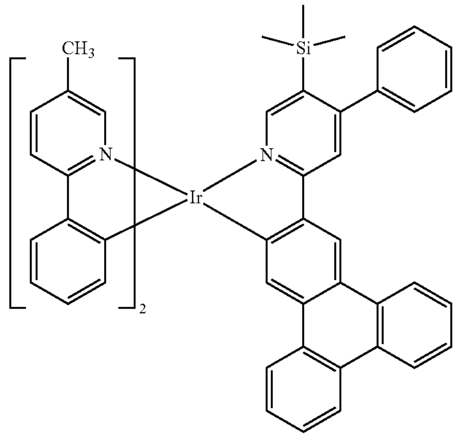
53
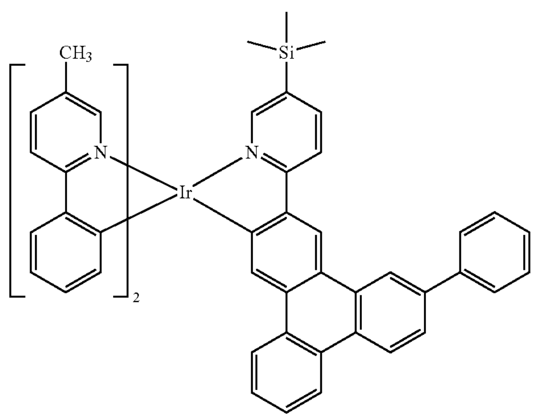
54
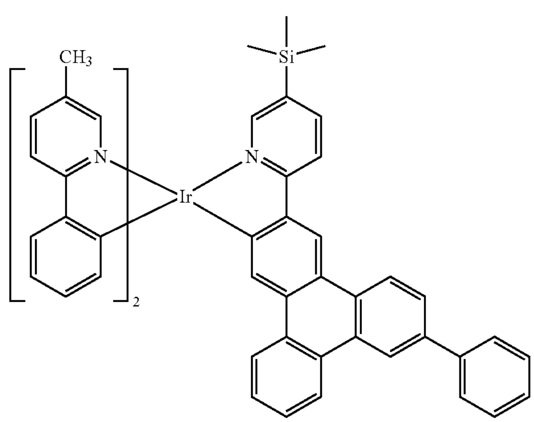

55
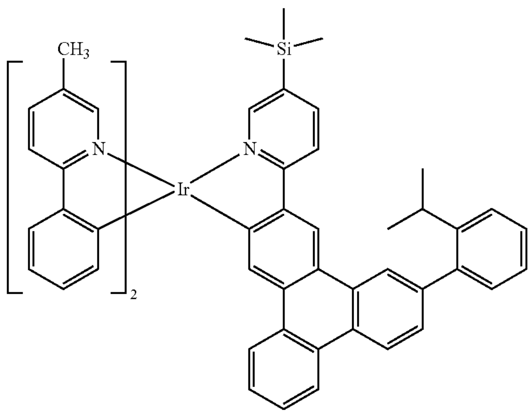
56
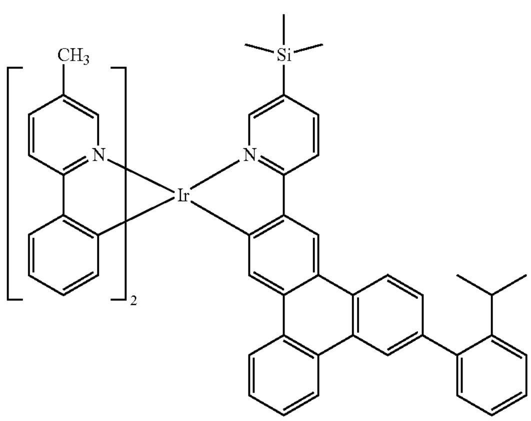
57
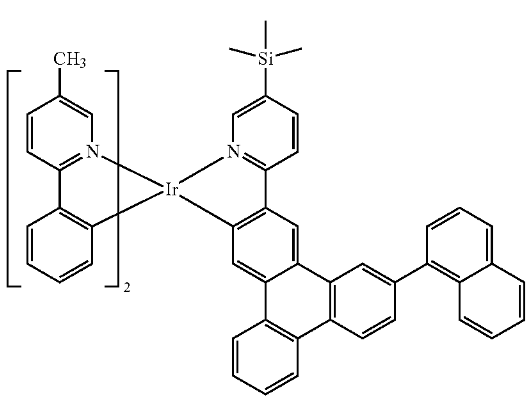
58
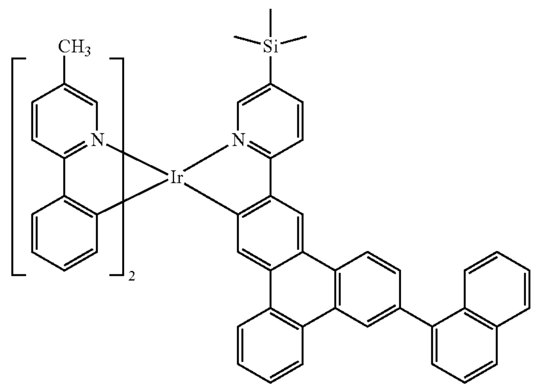
59
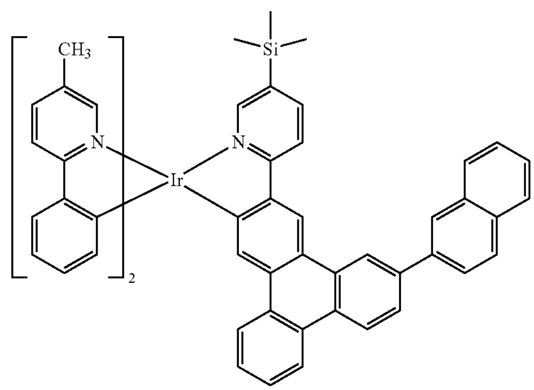
60
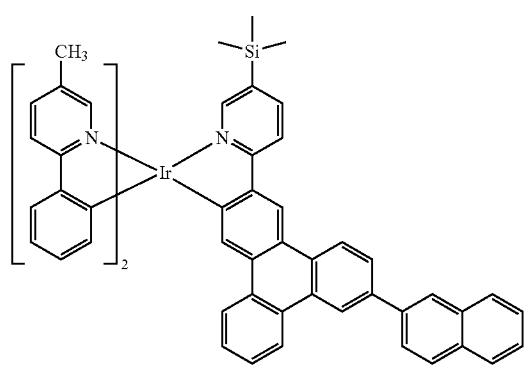
61
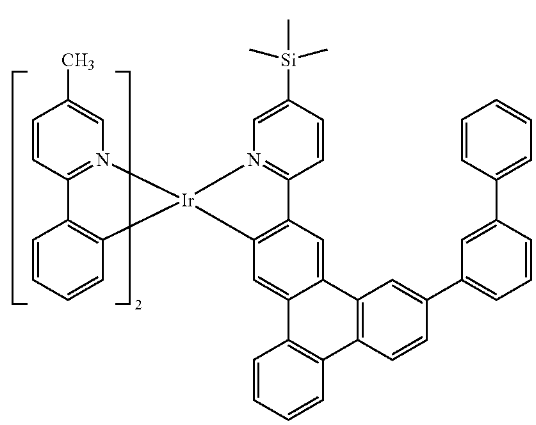

-continued
62
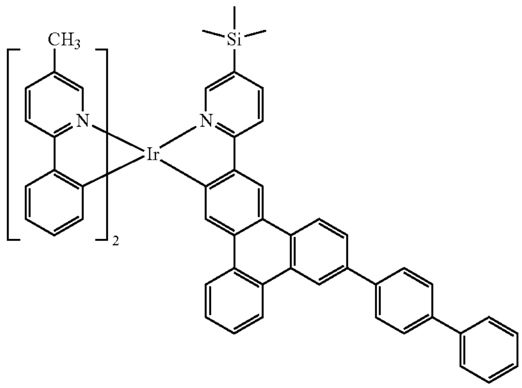
63
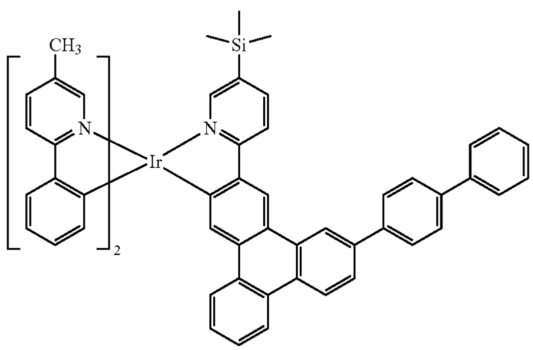
64
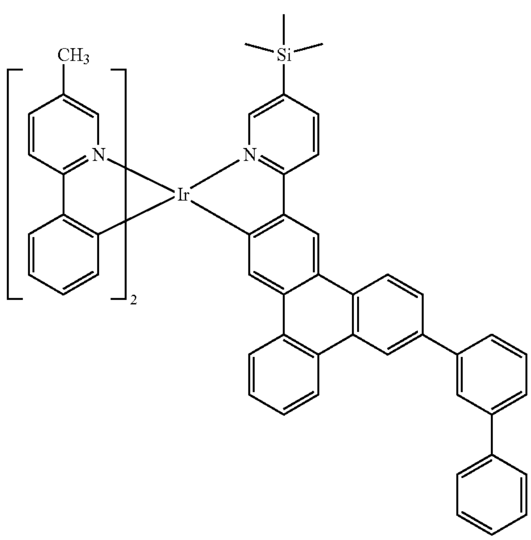
-continued
65
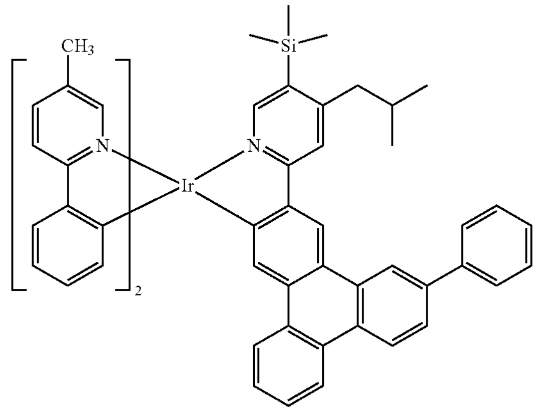
66
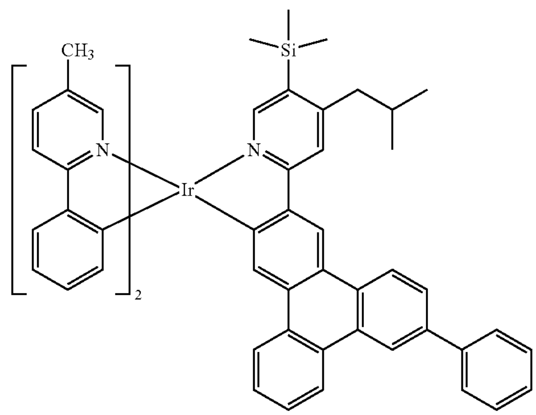
67
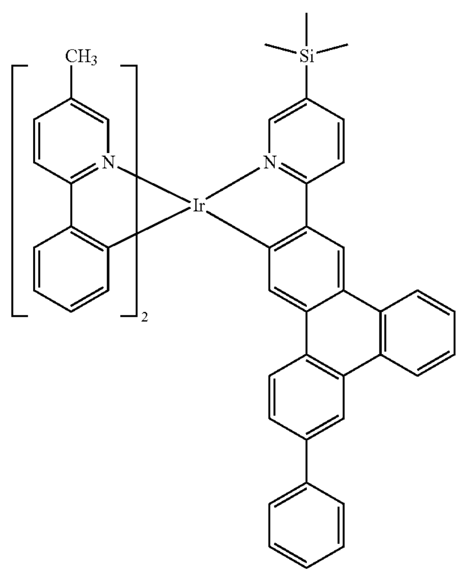

68
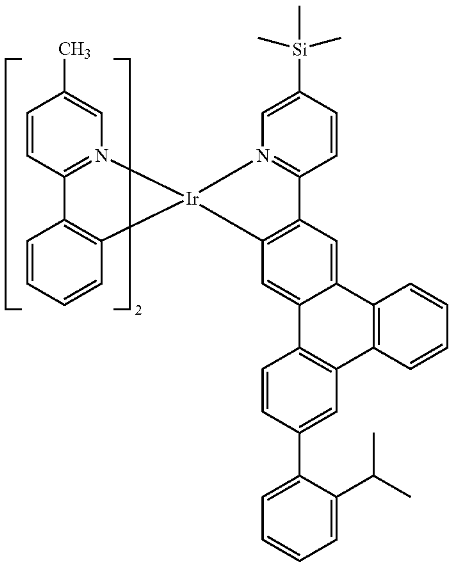
70
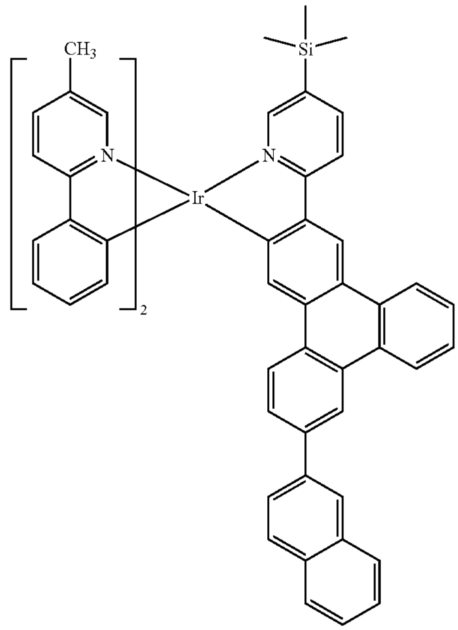
69
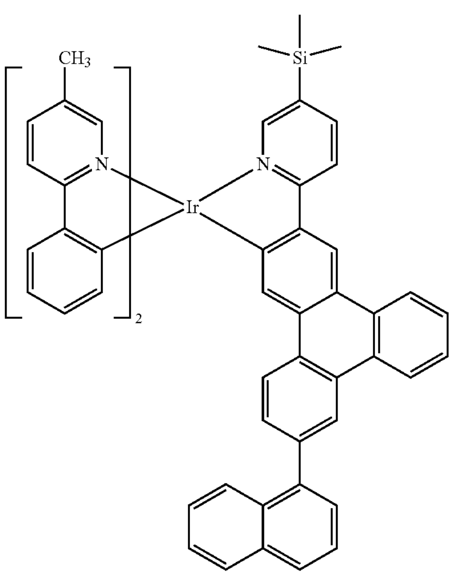
71
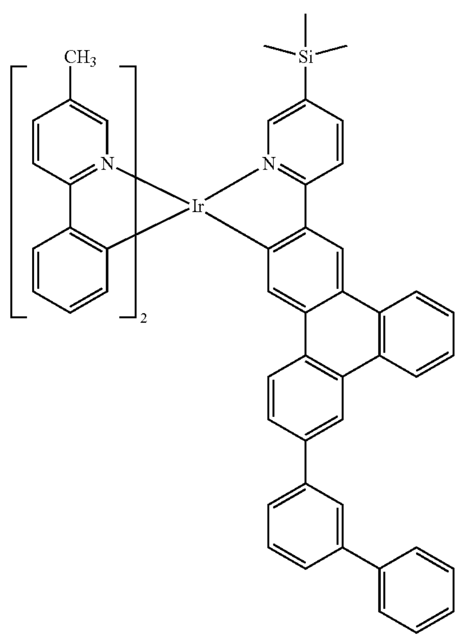

72
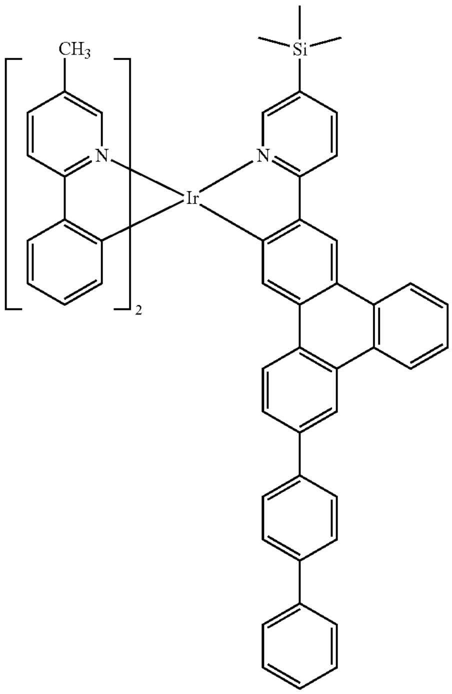
73
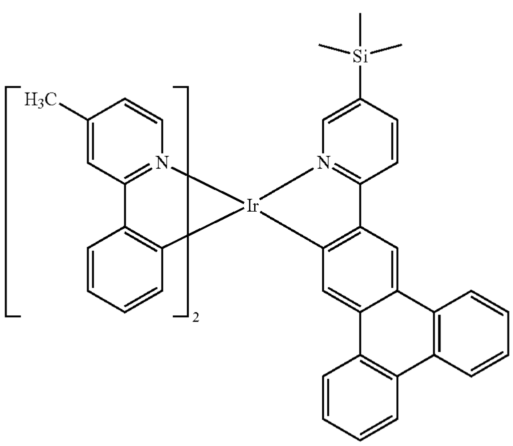
74
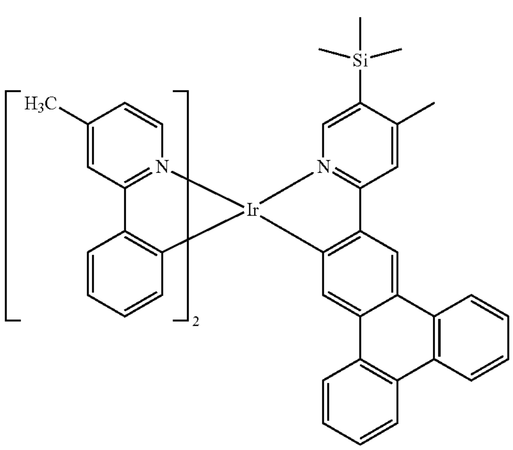
75
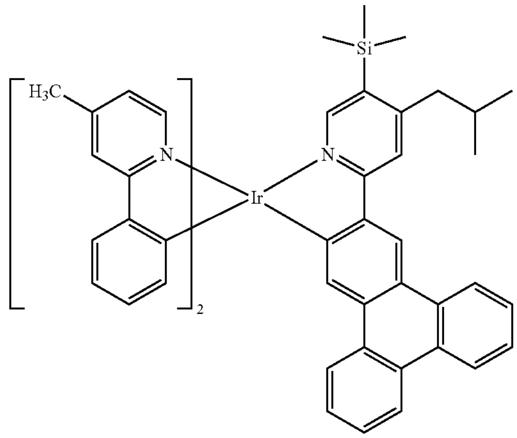
76
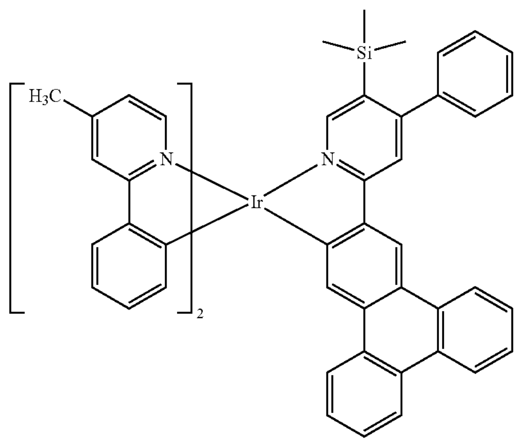
77
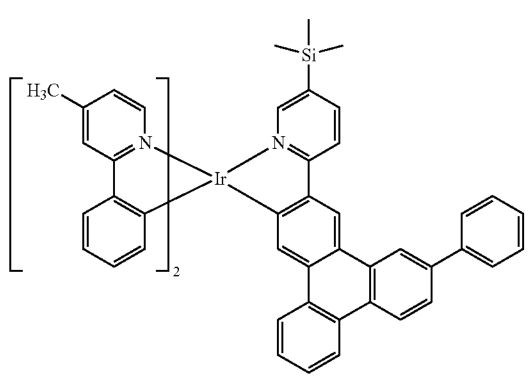

-continued
78
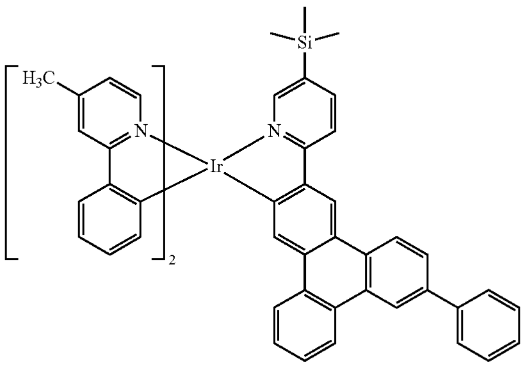
79
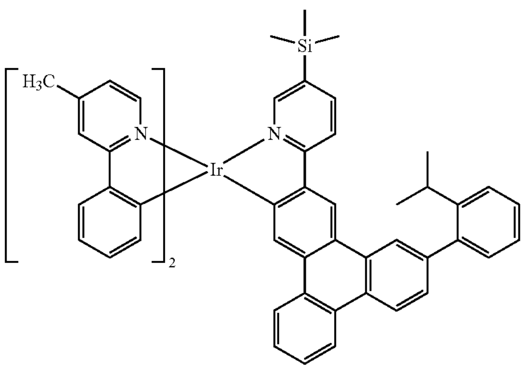
80
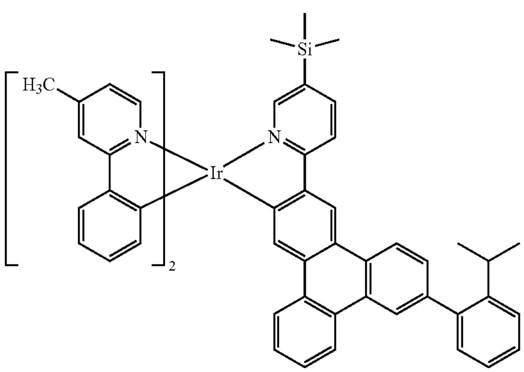
81
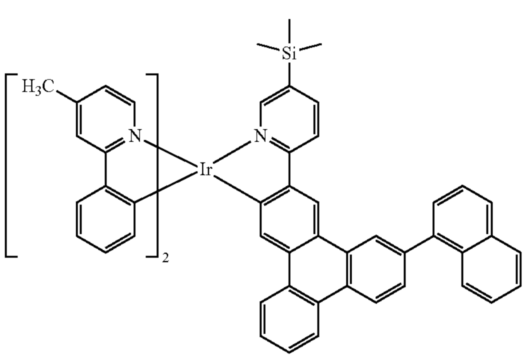
-continued
82
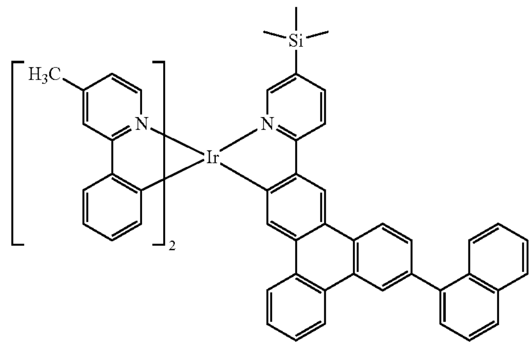
83
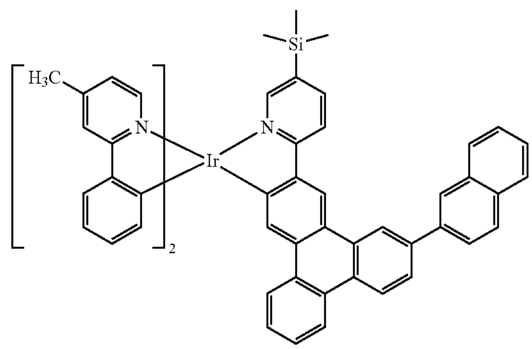
84
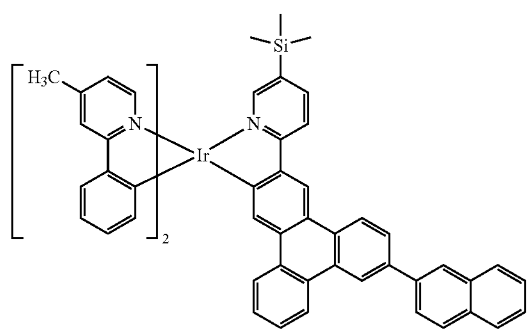
85
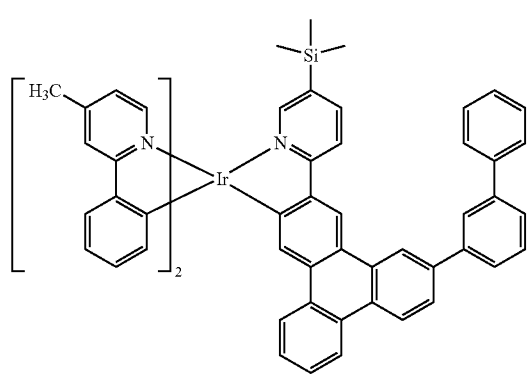

86
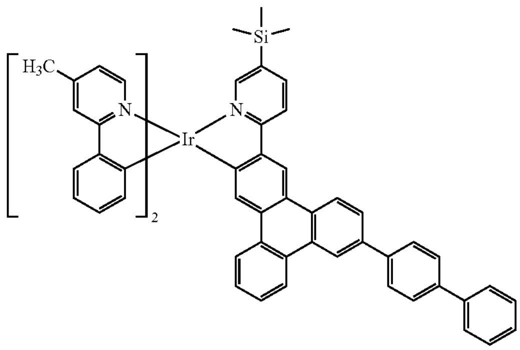
87
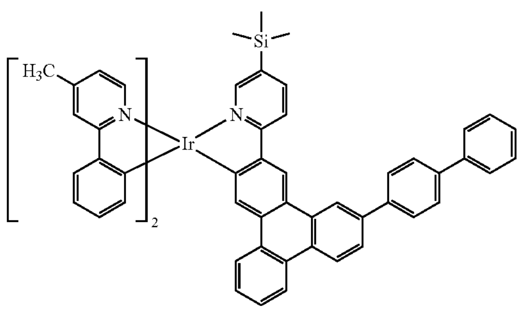
88
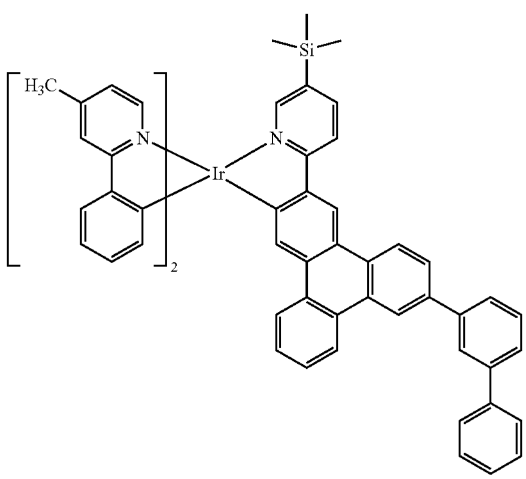
89
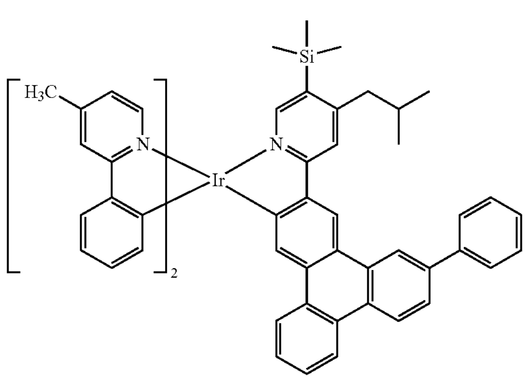
90
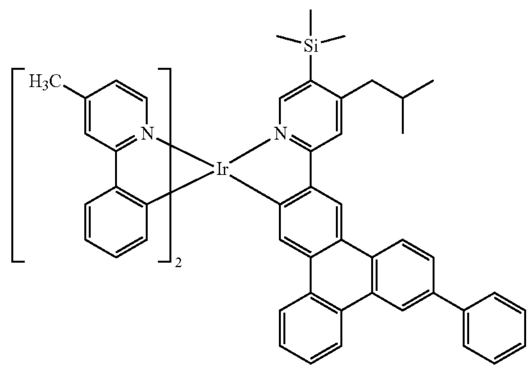
91
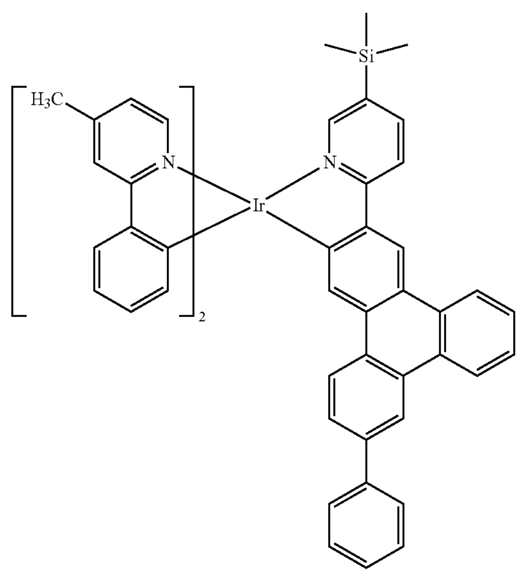
92
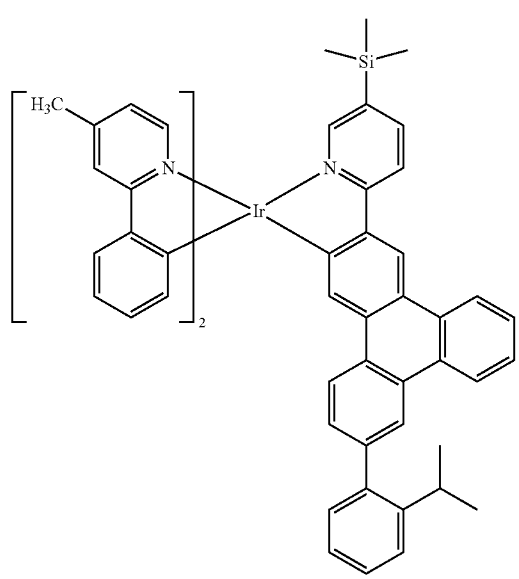

-continued
93
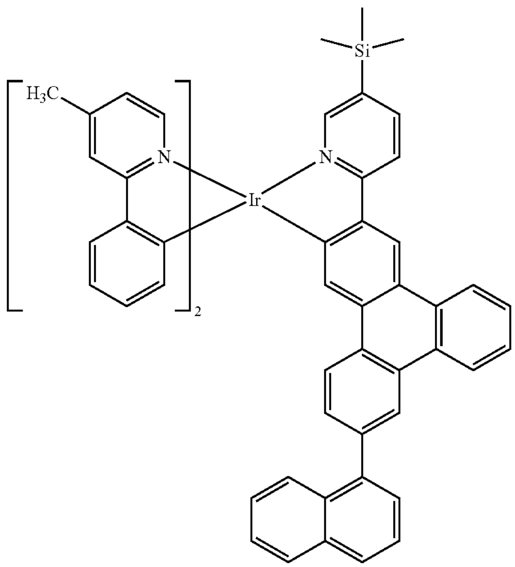
94
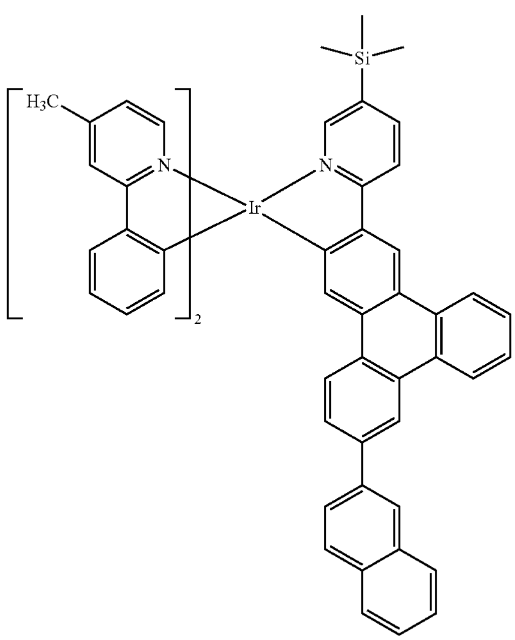
-continued
95
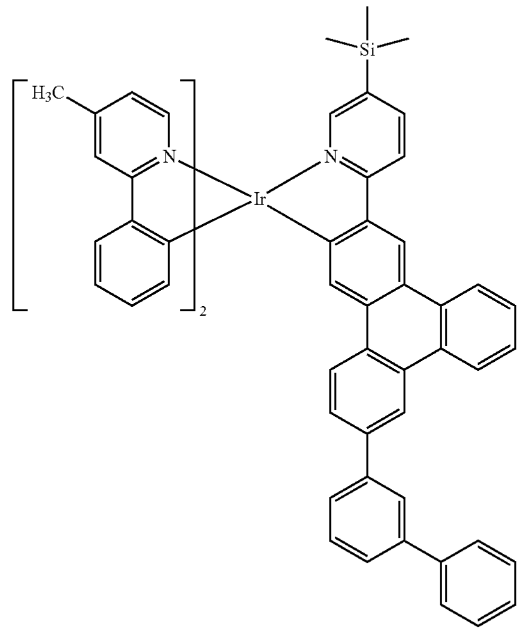
96
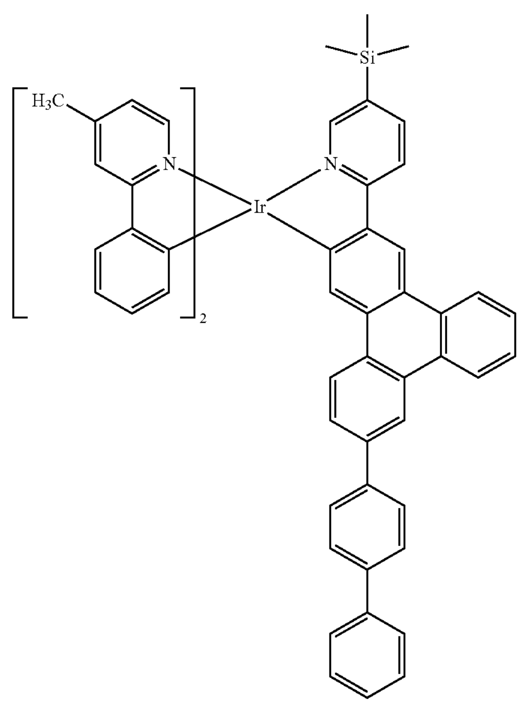

-continued
97
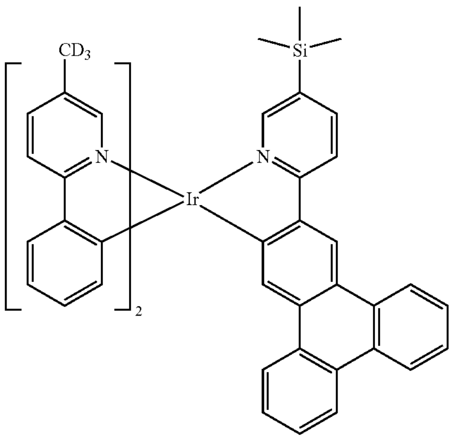
98
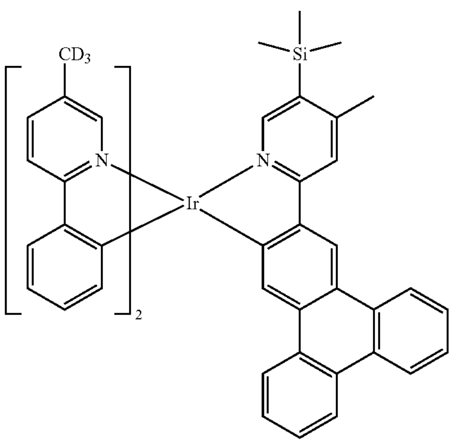
99
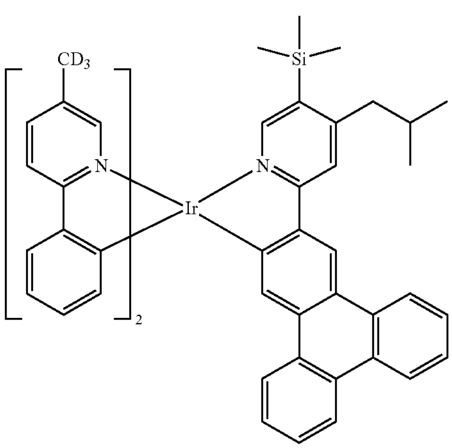
-continued
100
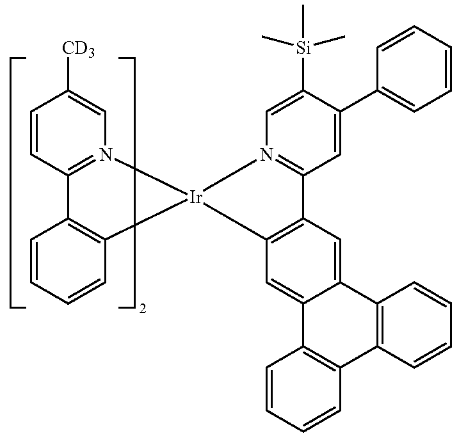
101
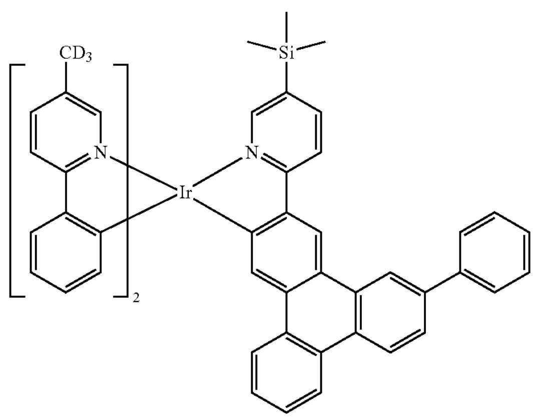
102
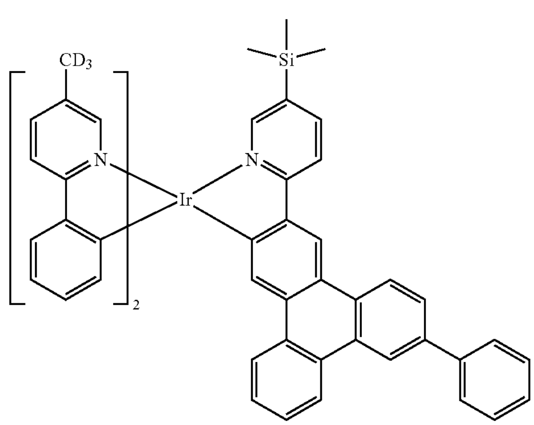

-continued
103
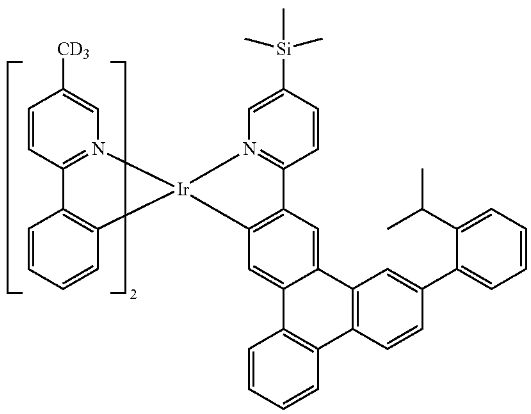
104
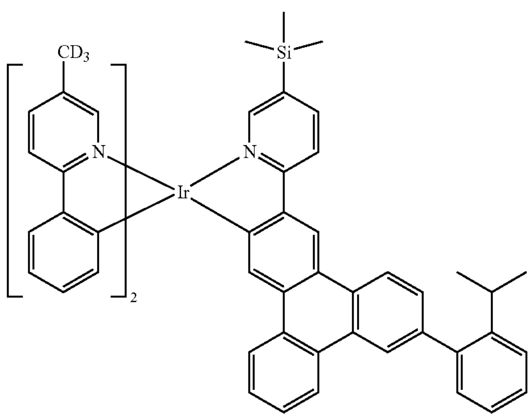
105
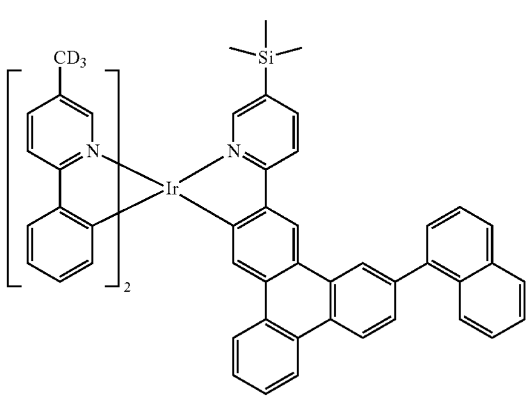
-continued
106
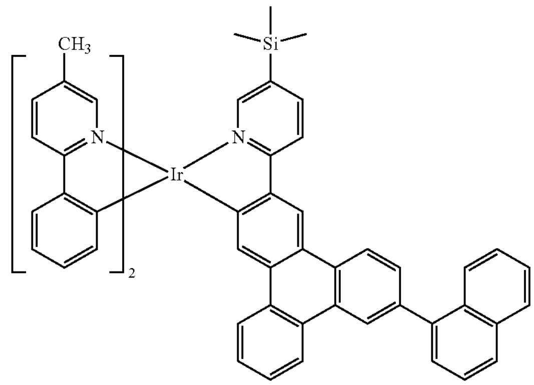
107
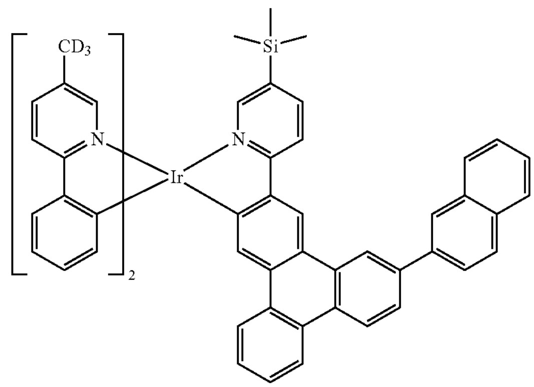
108
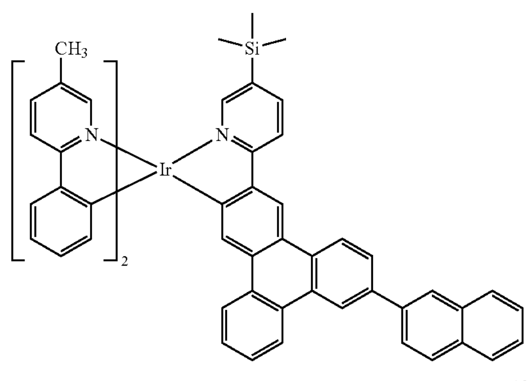
109
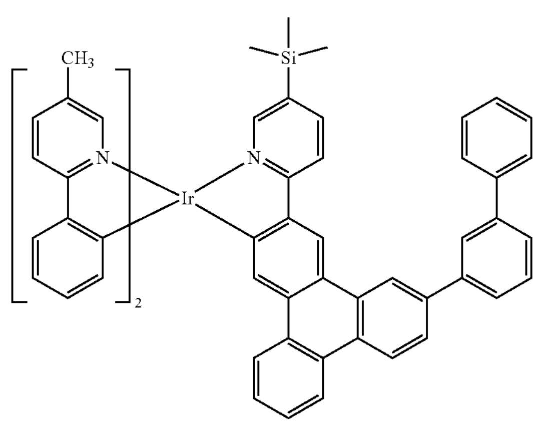

-continued
110
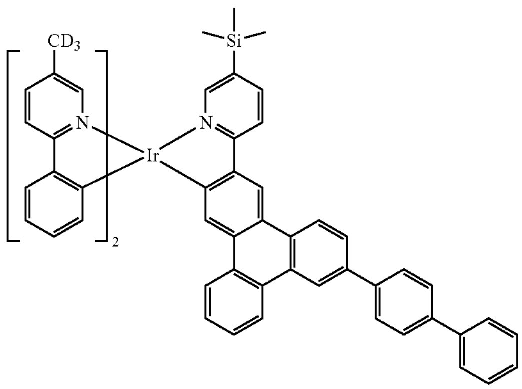
111
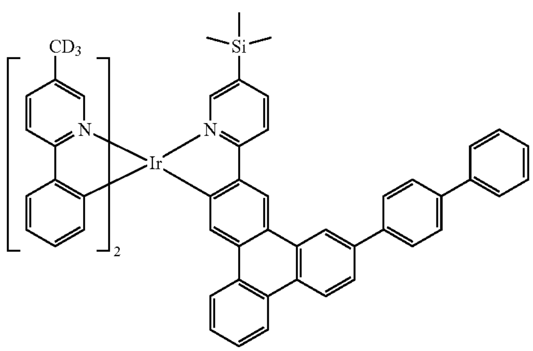
112
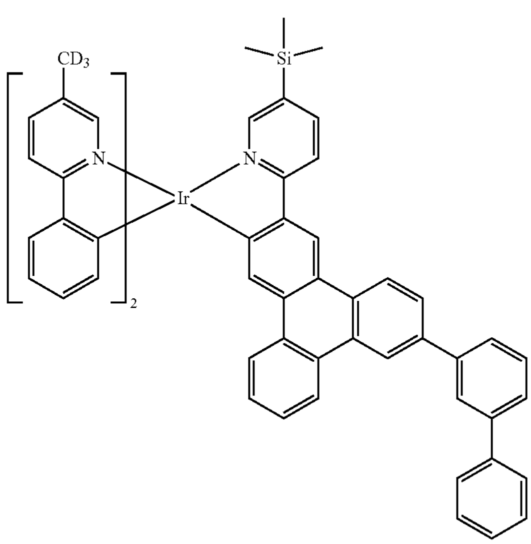
-continued
113
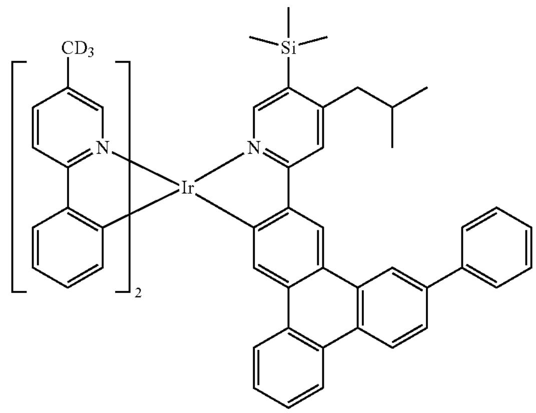
114
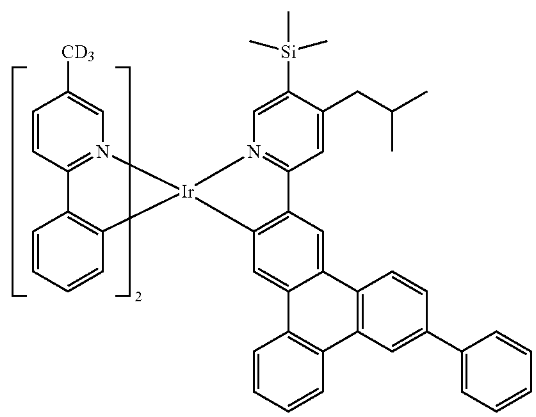
115
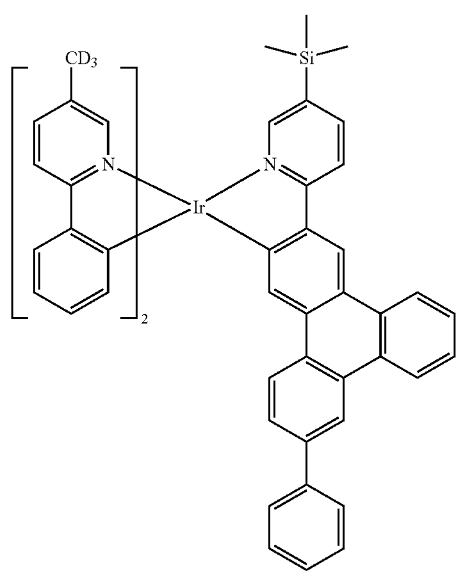

-continued
116
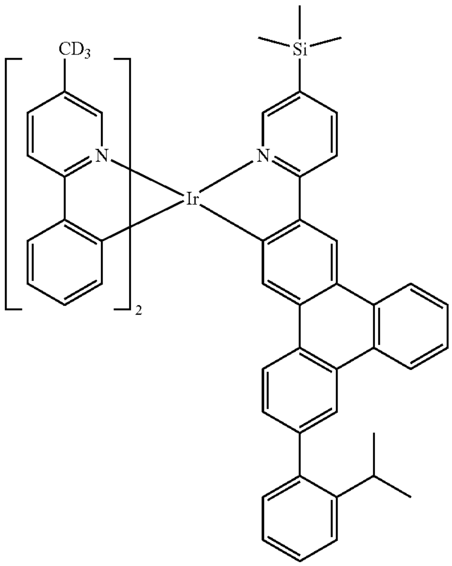
117
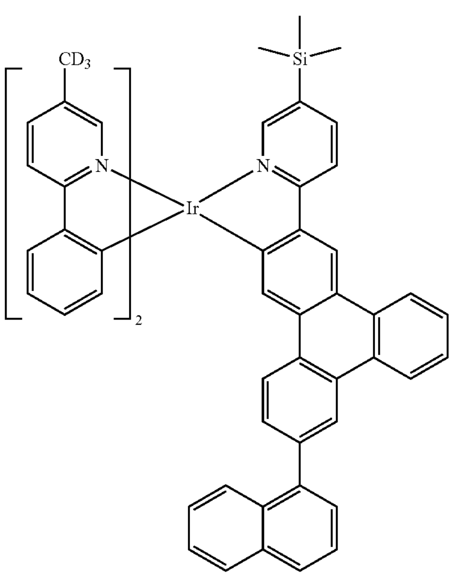
-continued
118
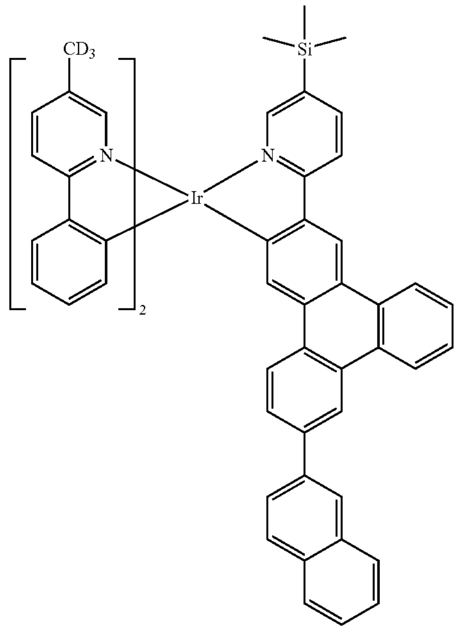
119
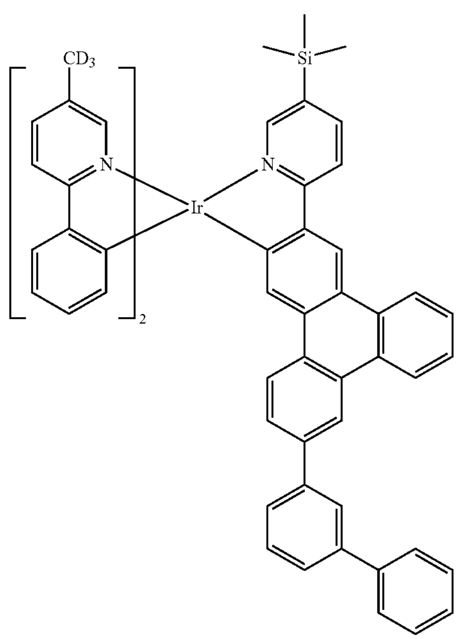

-continued
120
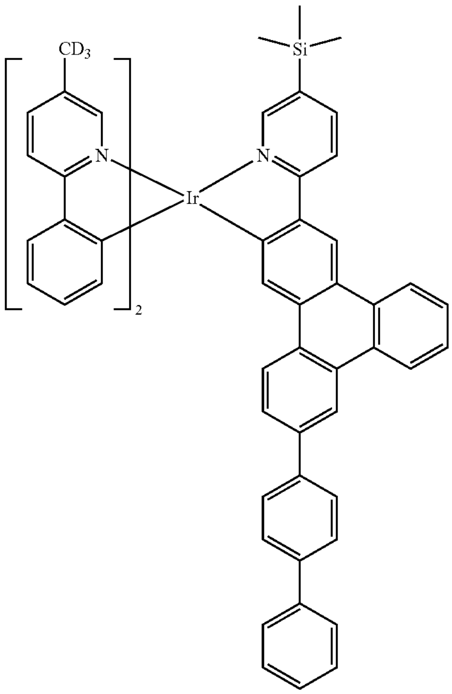
121
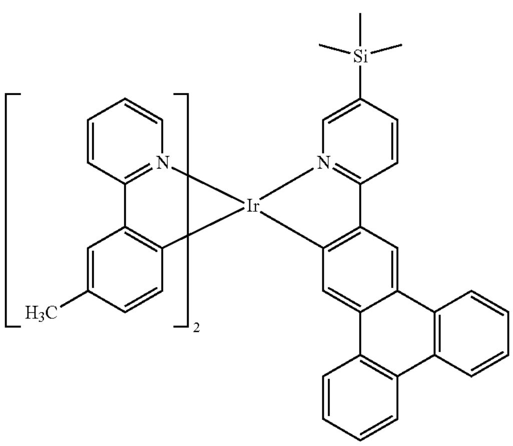
122
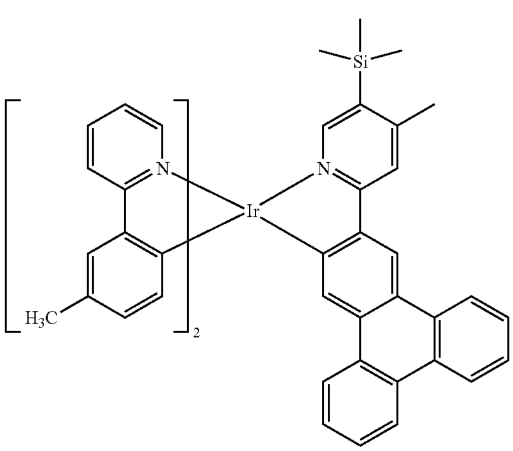
-continued
123
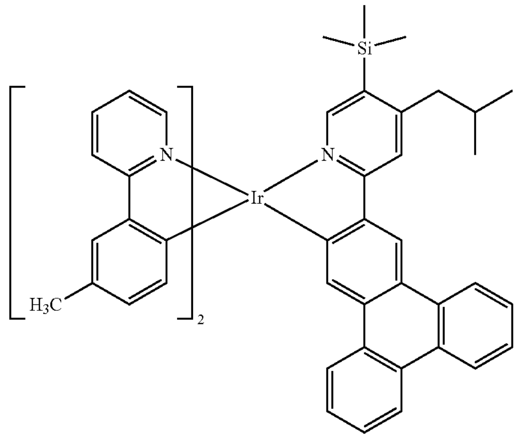
124
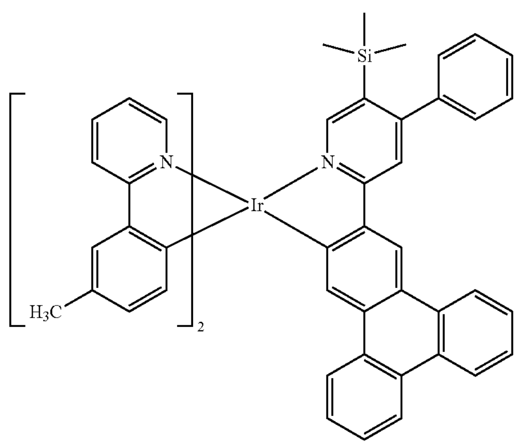
125
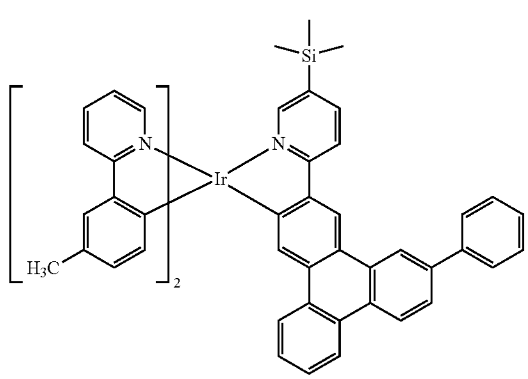

-continued
126
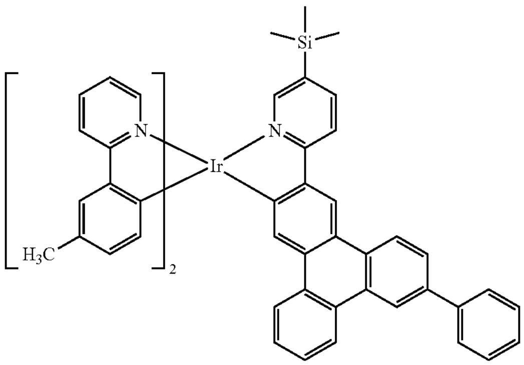
127
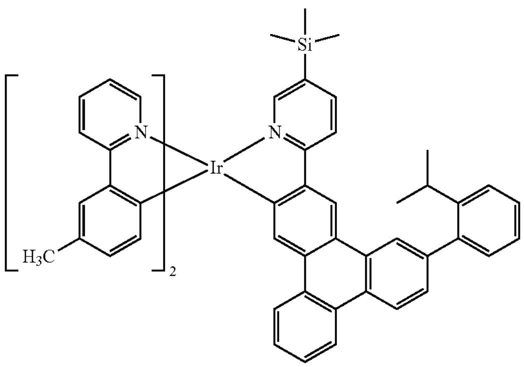
128
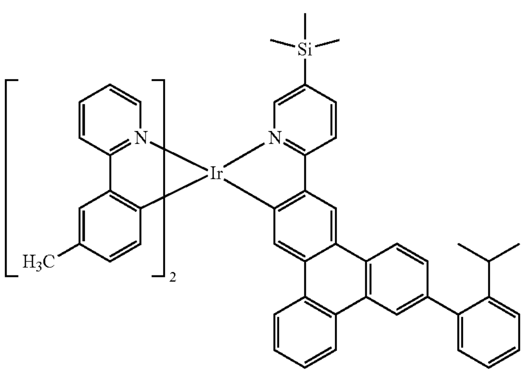
129
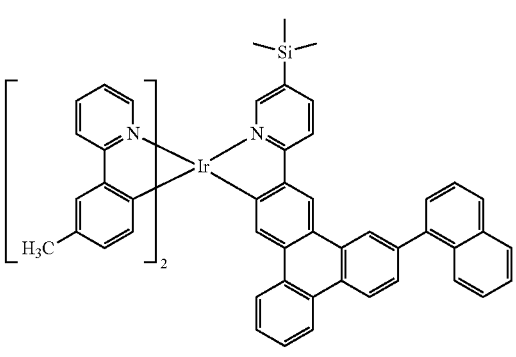
-continued
130
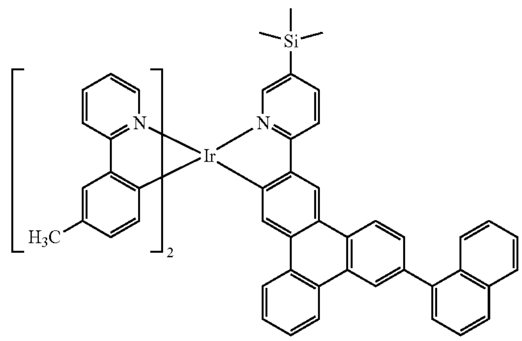
131
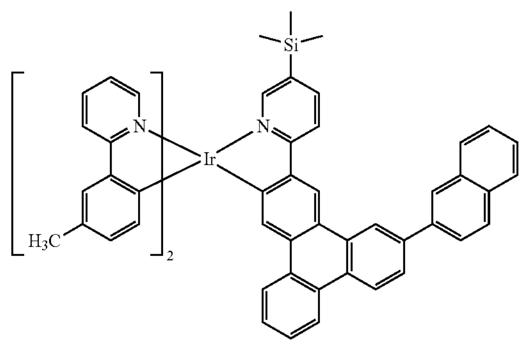
132
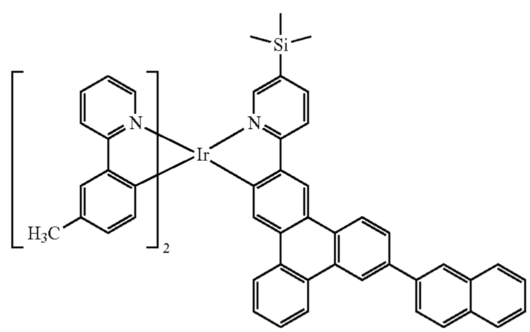
133
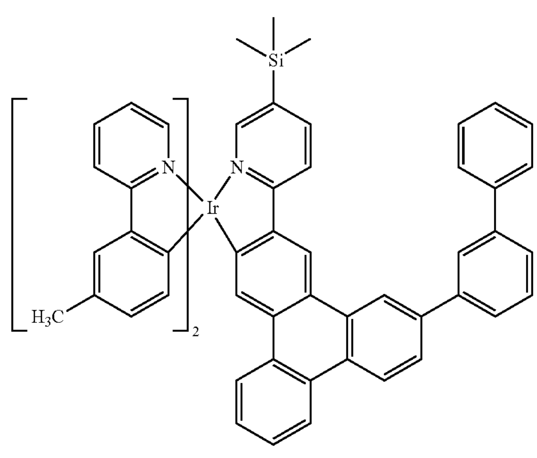

-continued
134
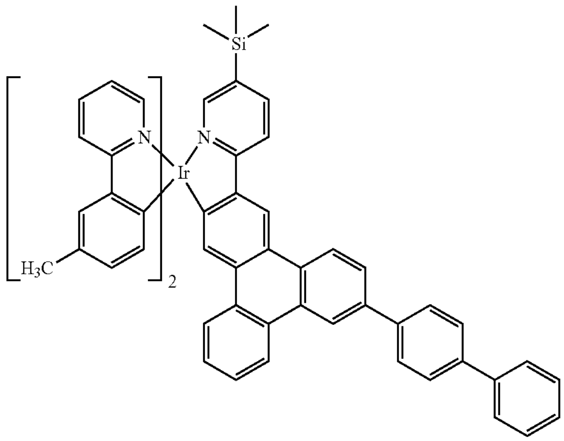
135
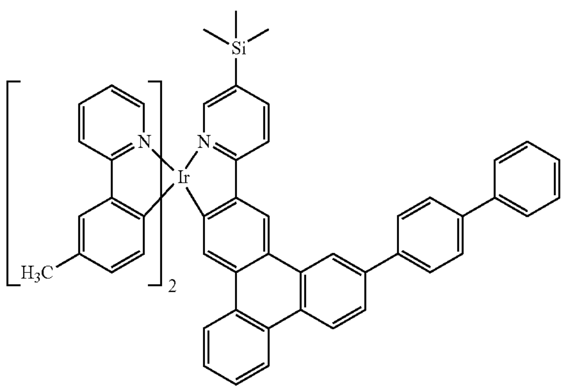
136
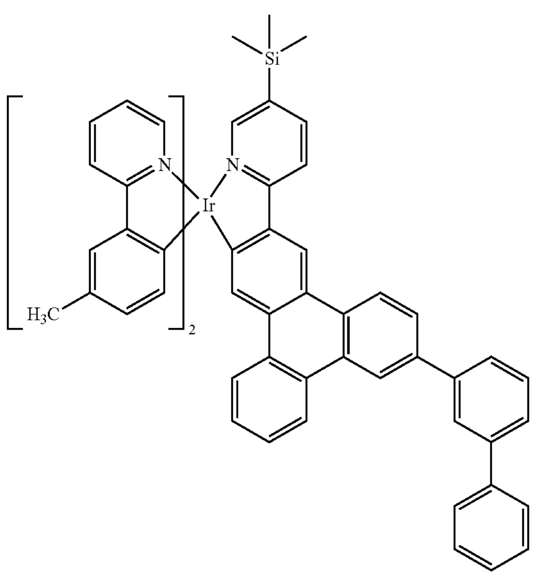
-continued
137
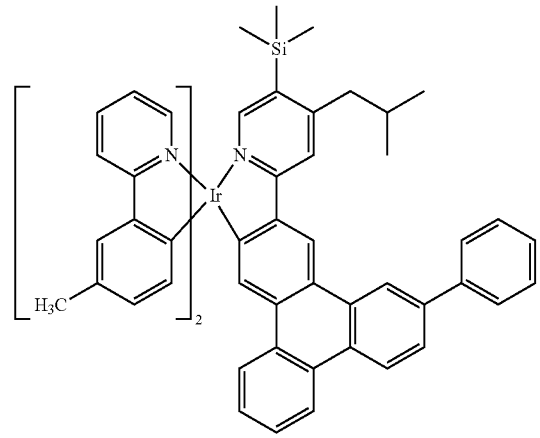
138
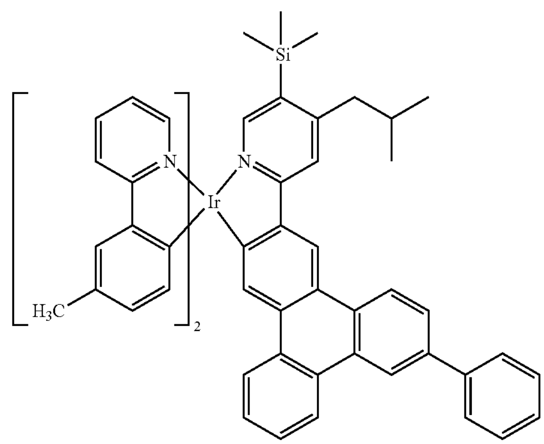
139
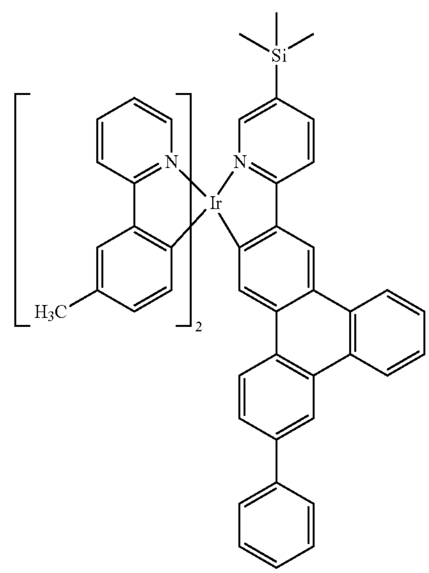

140
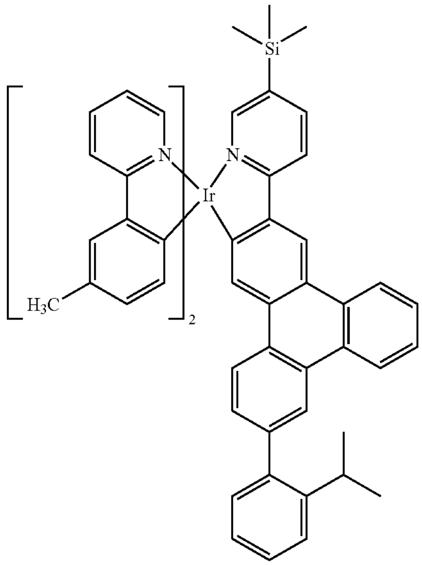
141
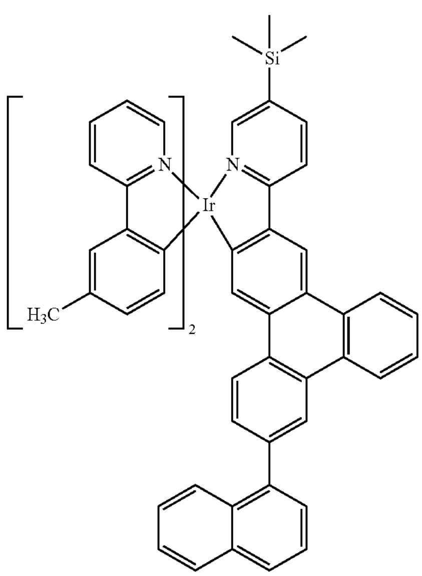
142
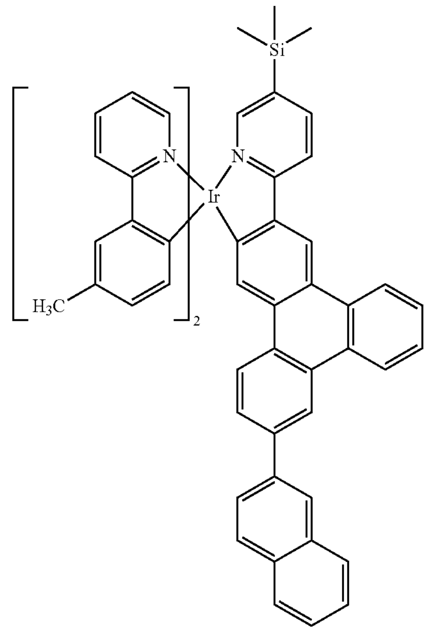
143
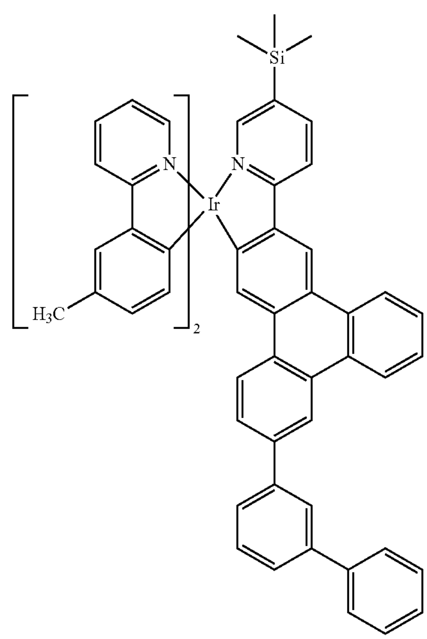

-continued
144
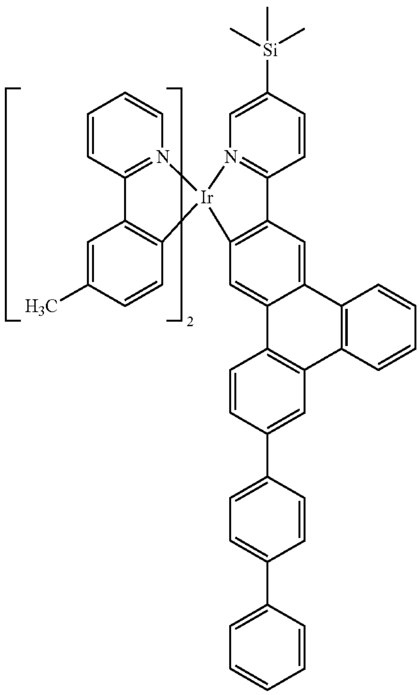
145
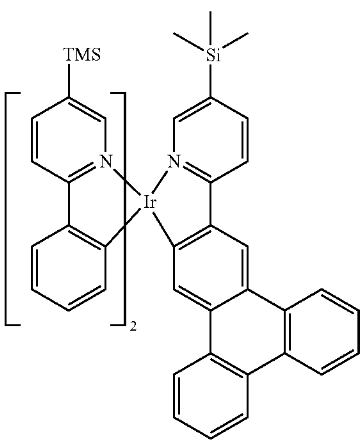
146
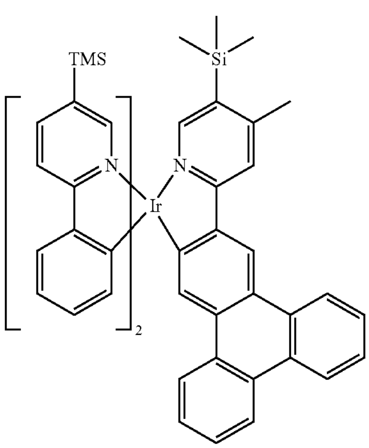
-continued
147
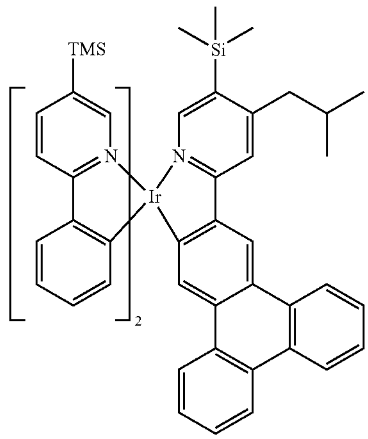
148
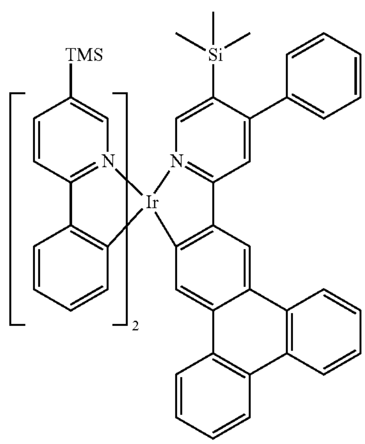
149
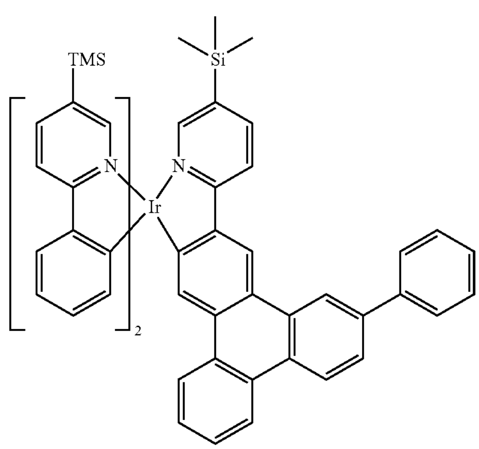

-continued
150
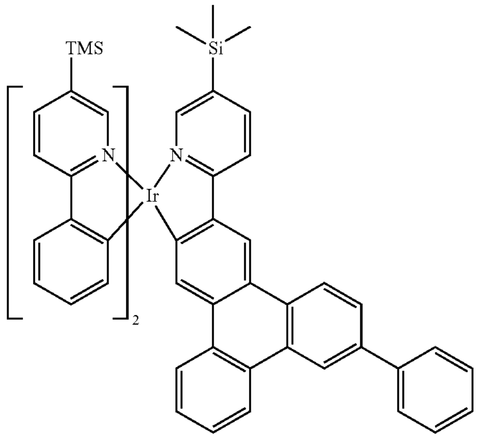
151
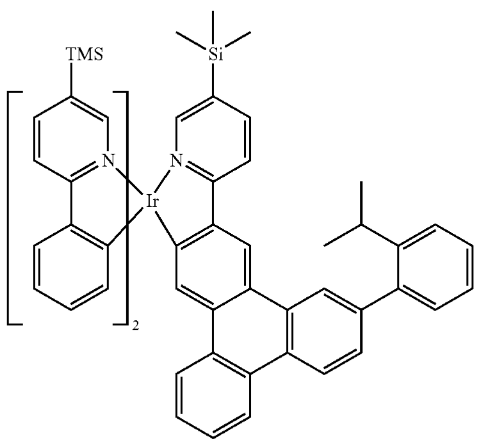
152
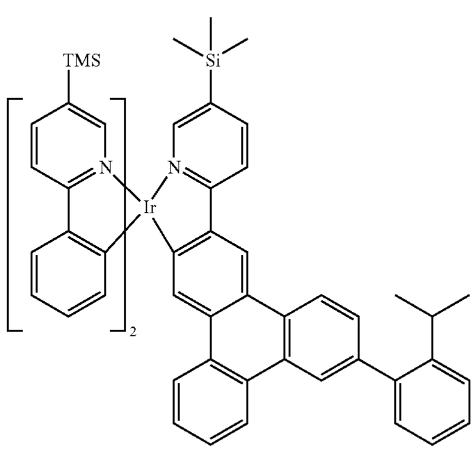
-continued
153
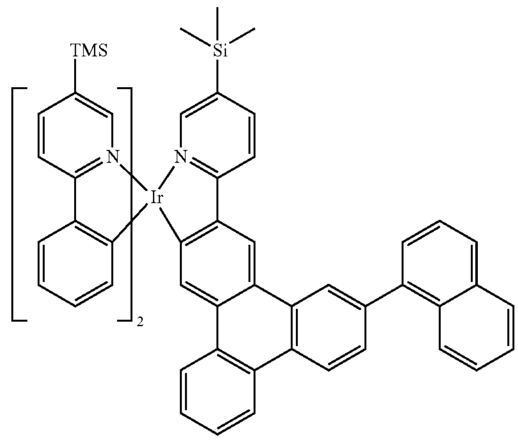
154
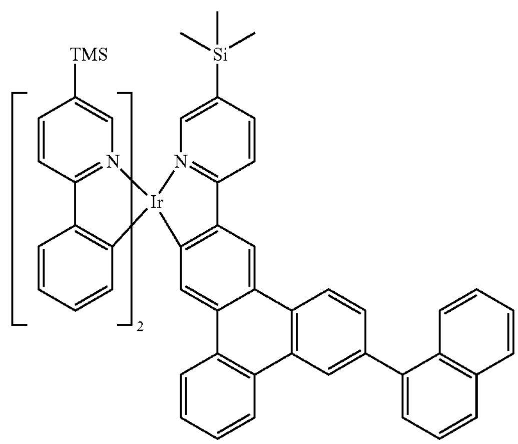
155
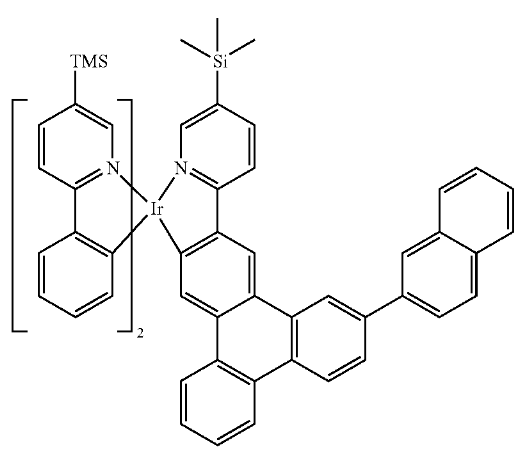

-continued
156
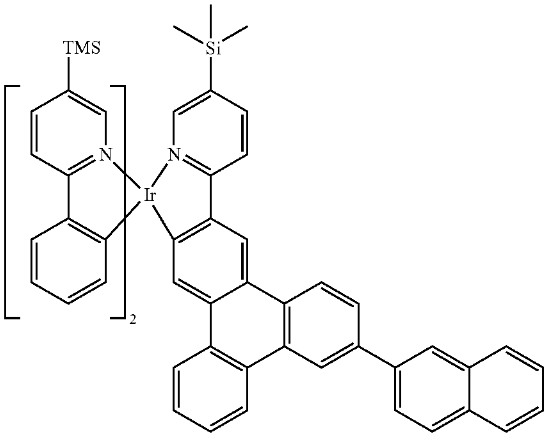
157
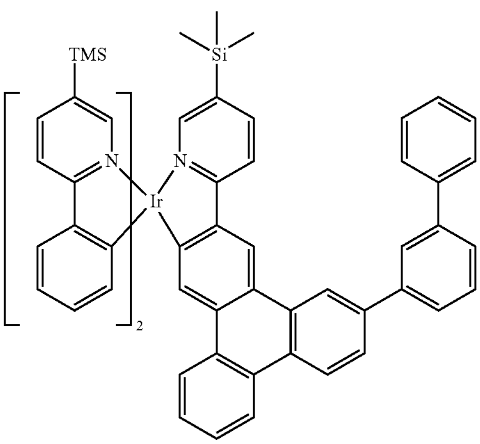
158
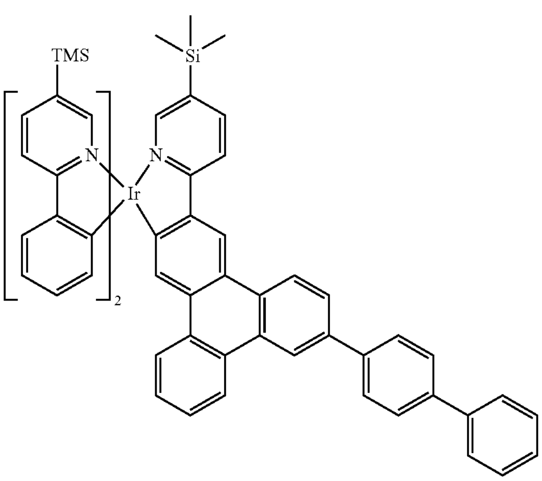
-continued
159
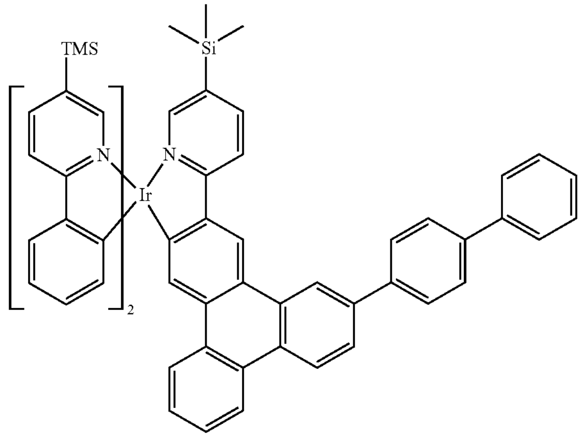
160
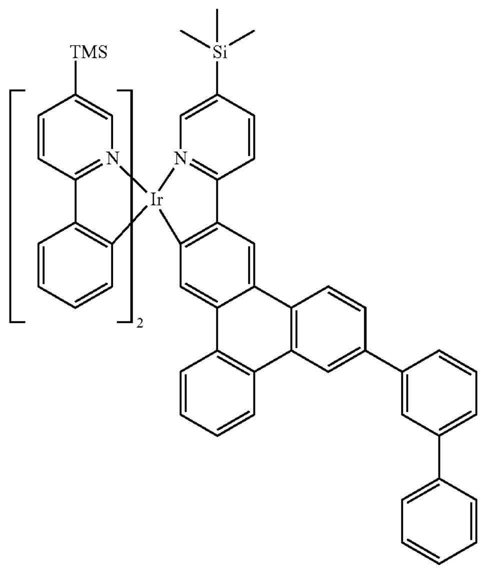
161
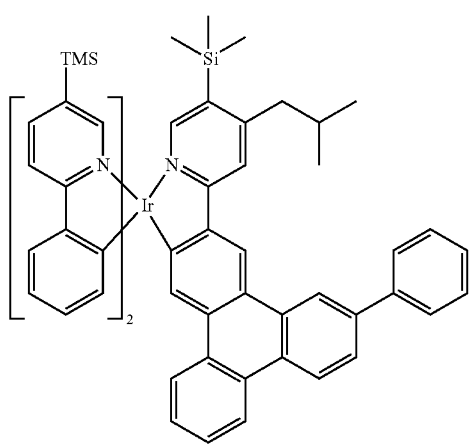

-continued
162
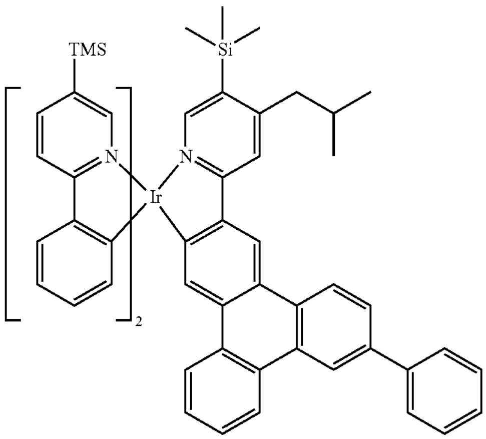
163
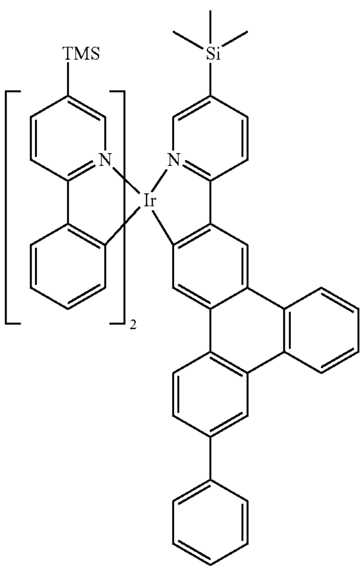
164
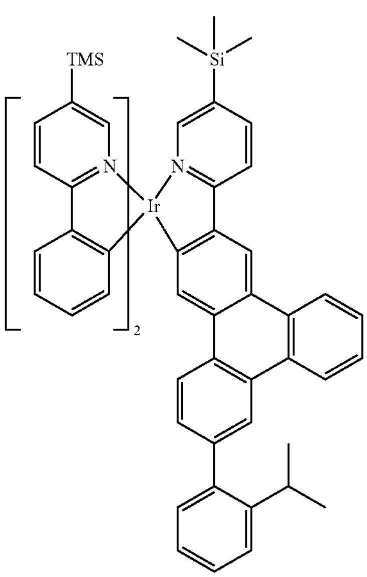
-continued
165
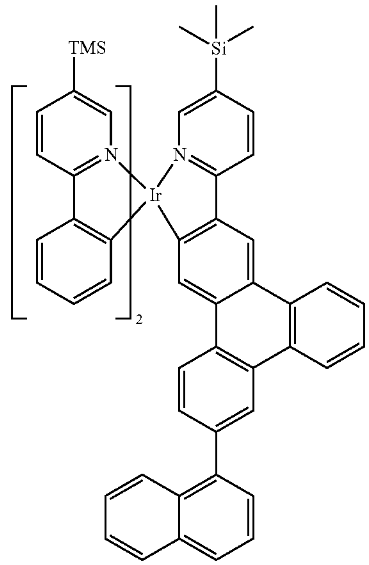
166
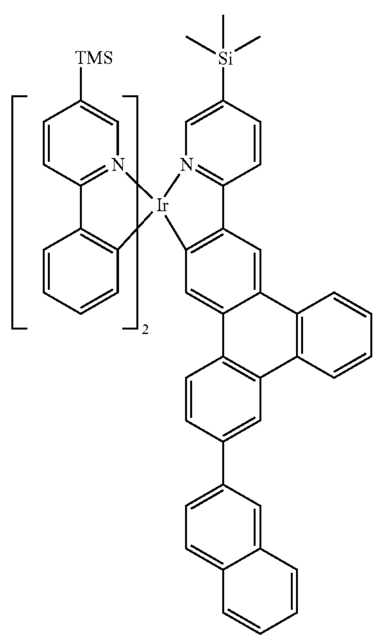

-continued
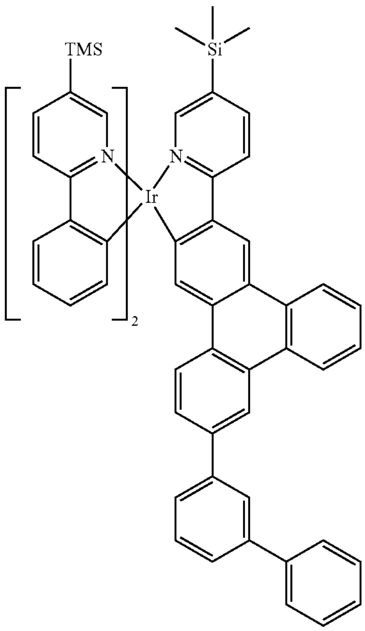
167
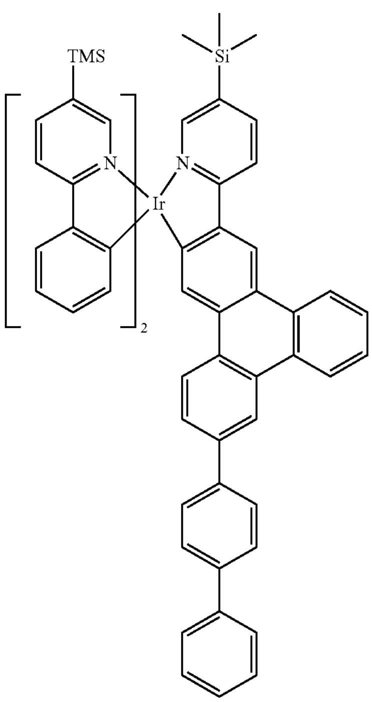
168
-continued
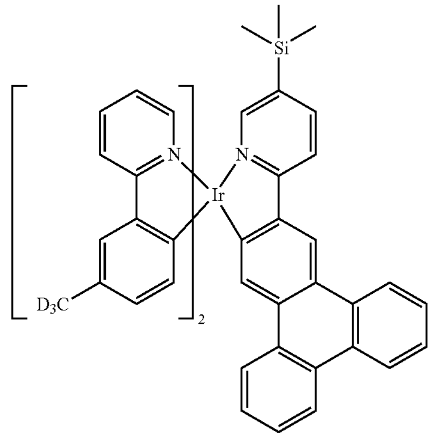
169
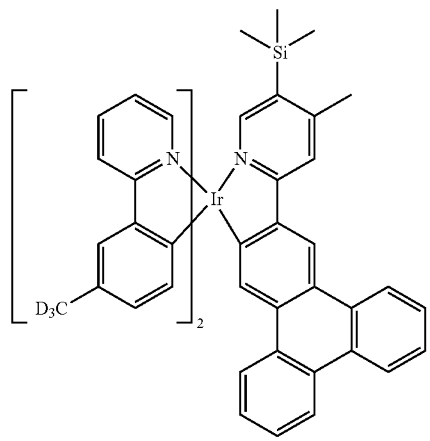
170
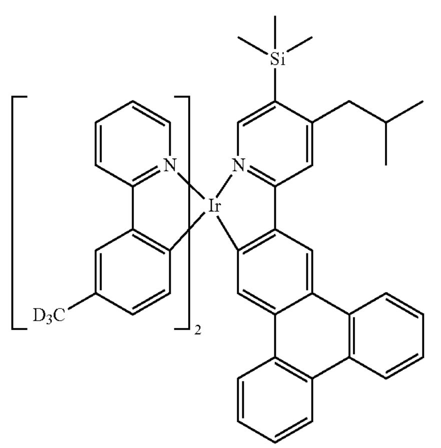
171

-continued
172
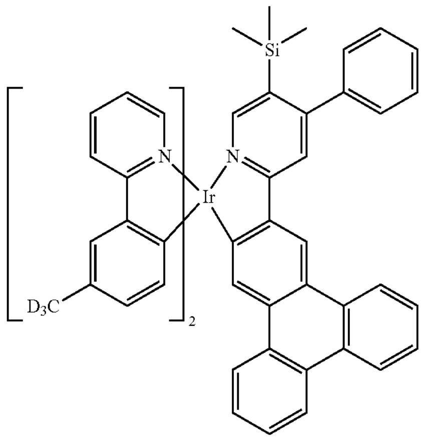
173
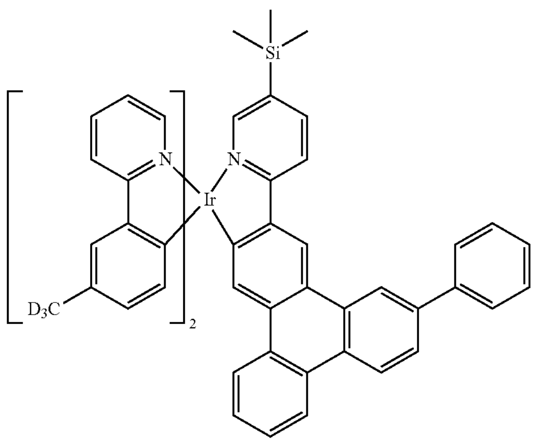
174
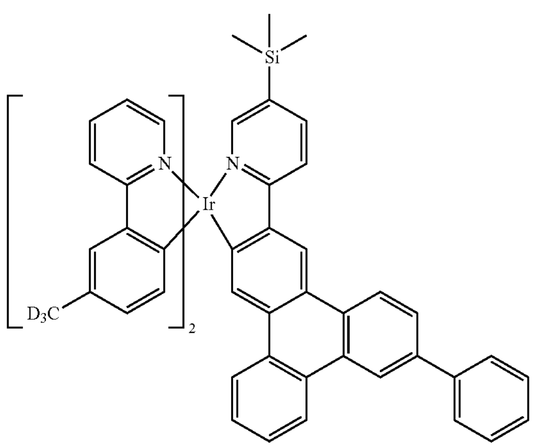
-continued
175
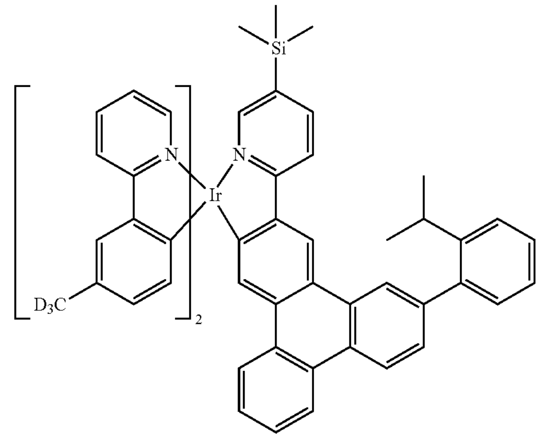
176
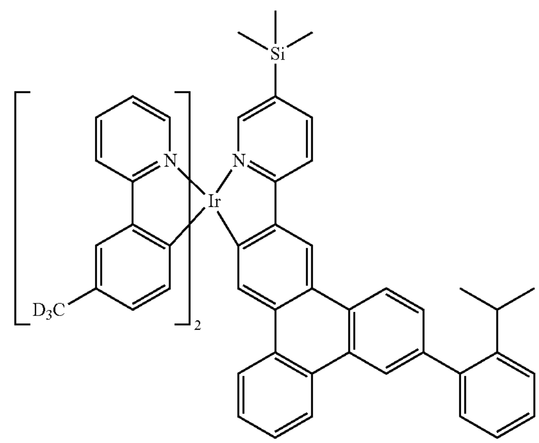
177
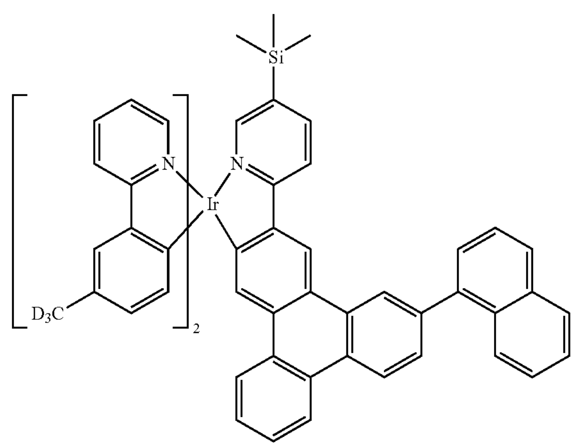

-continued
178
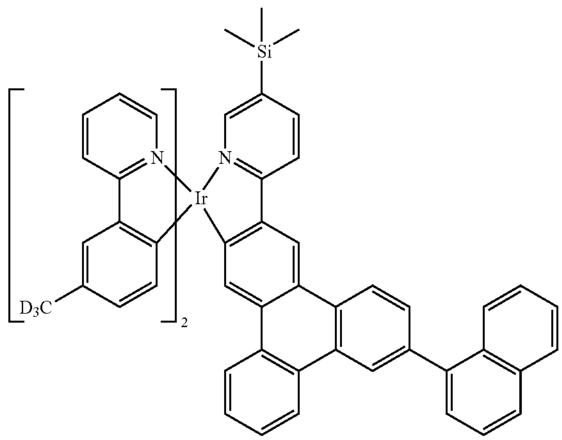
179
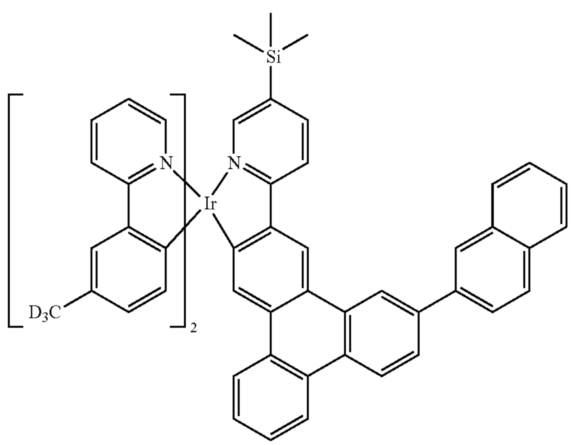
180
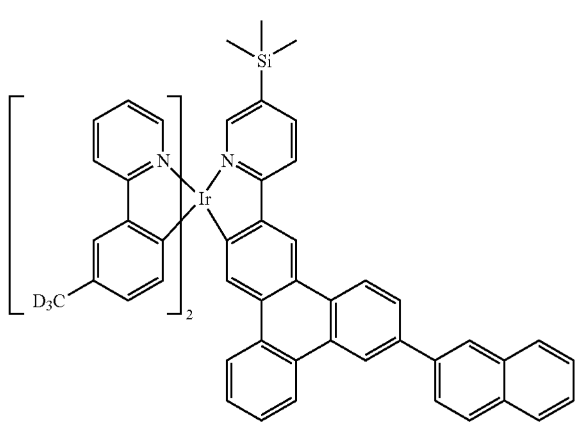
-continued
181
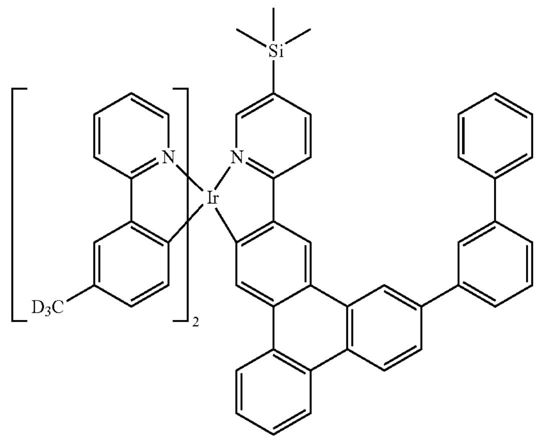
182
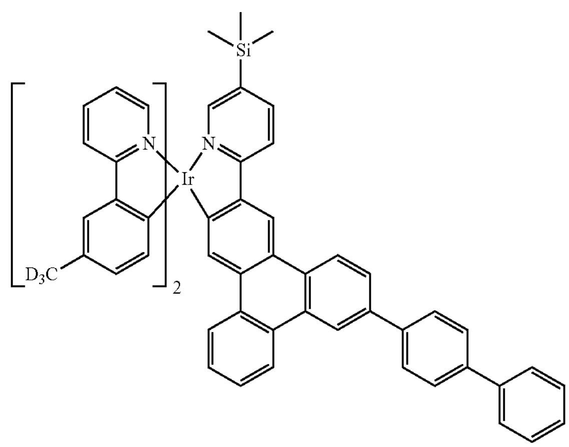
183
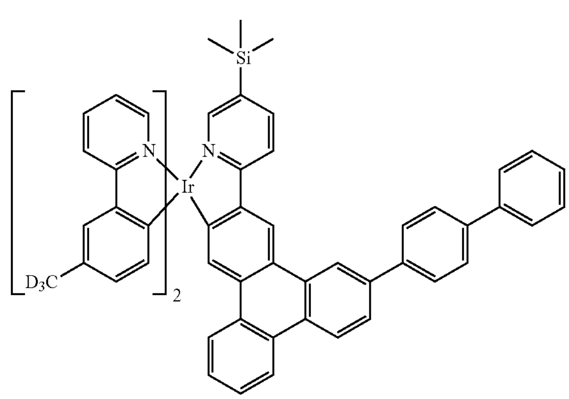

184
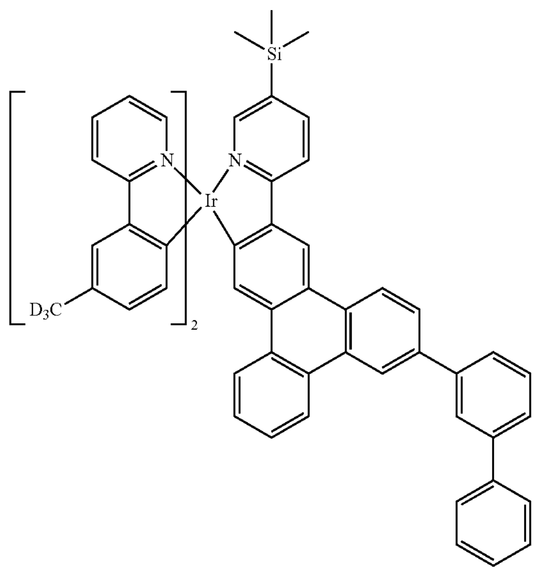
185
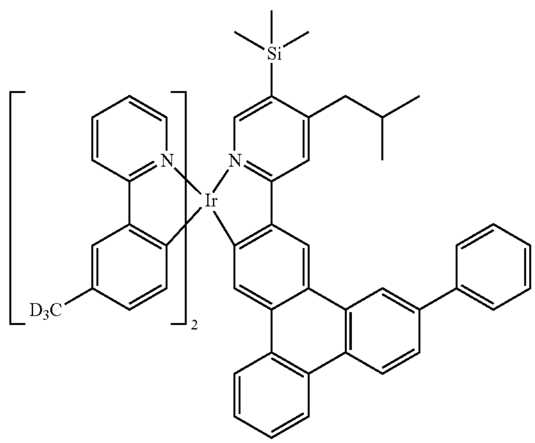
186
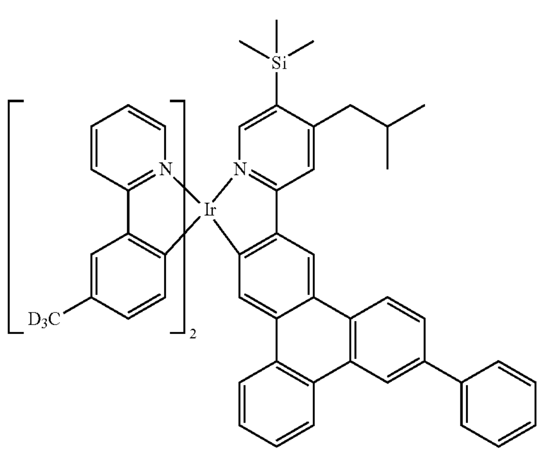
187
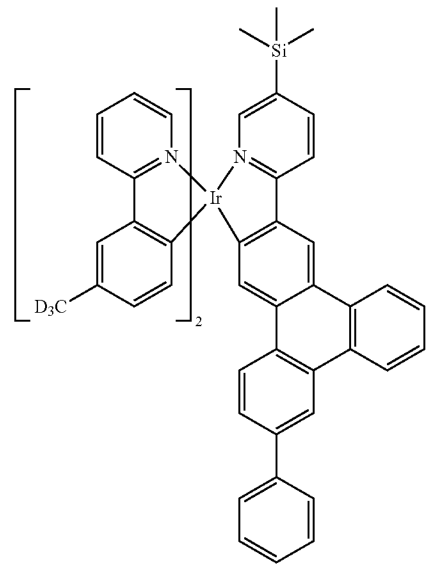
188
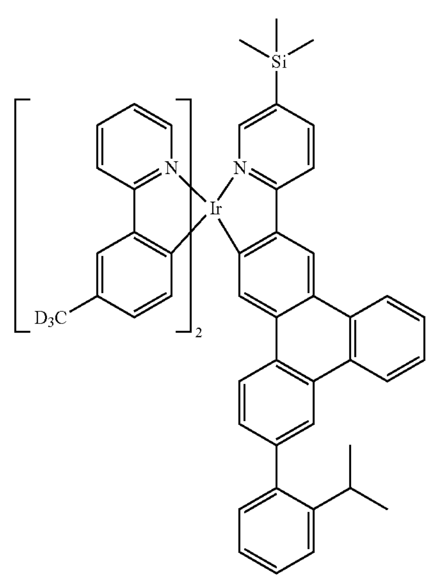

189
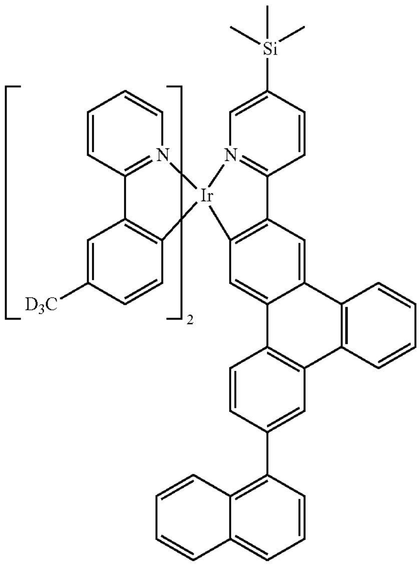
190
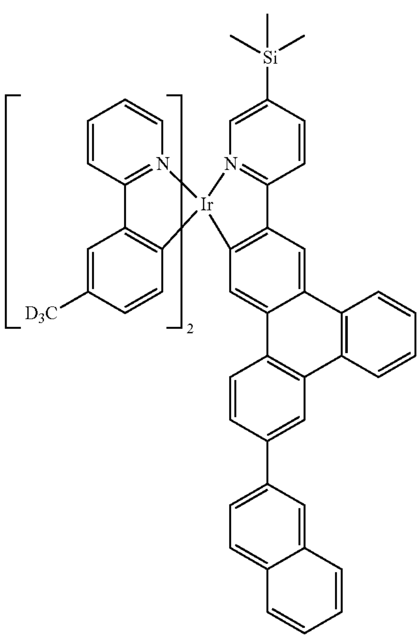
191
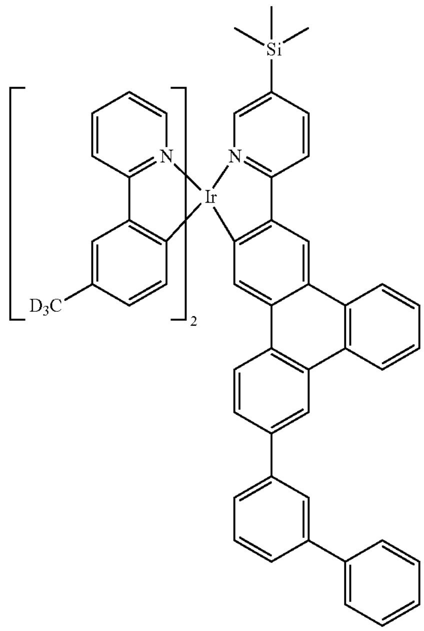
192
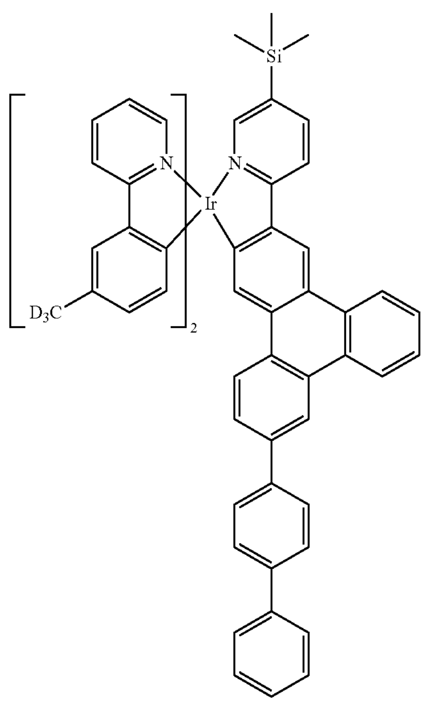

-continued
193
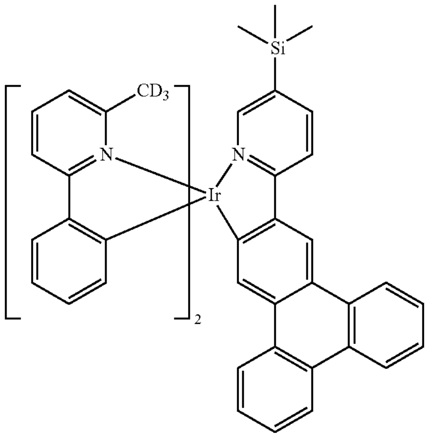
194
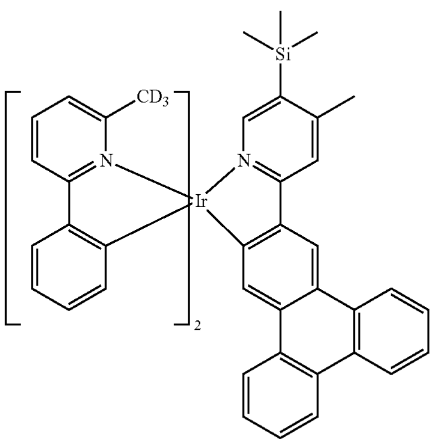
195
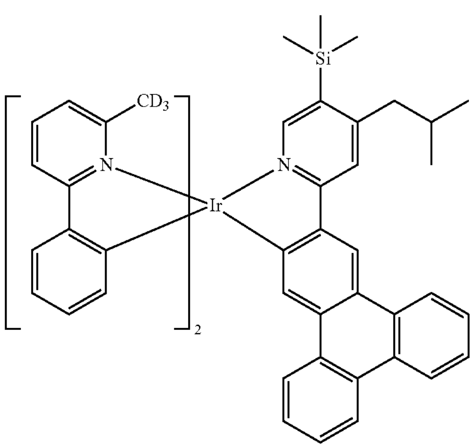
-continued
196
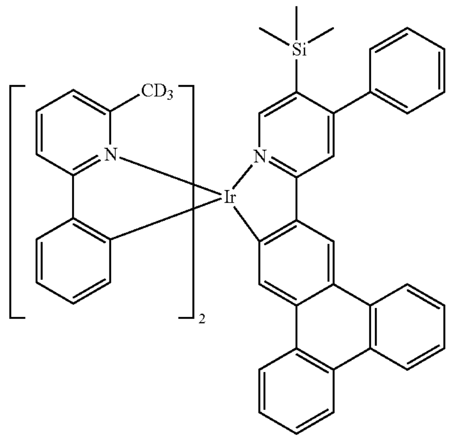
197
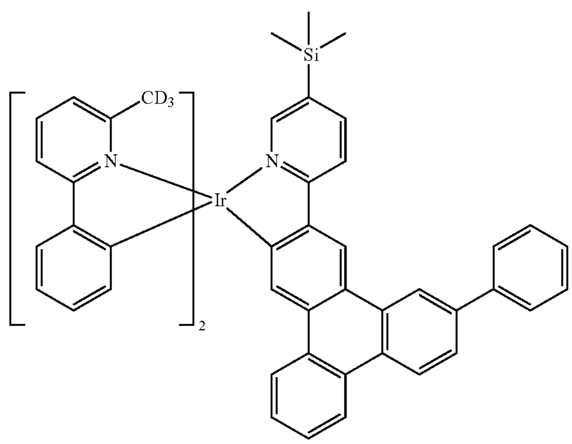
198
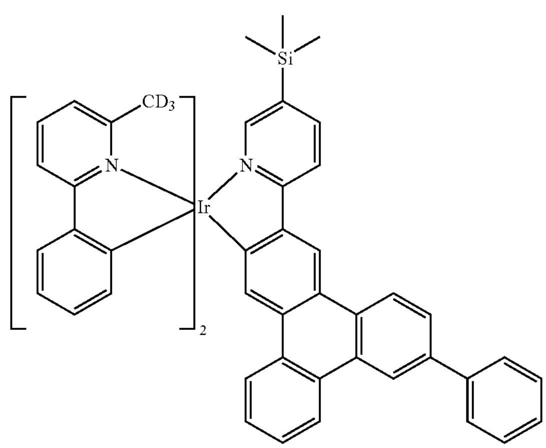

-continued
199
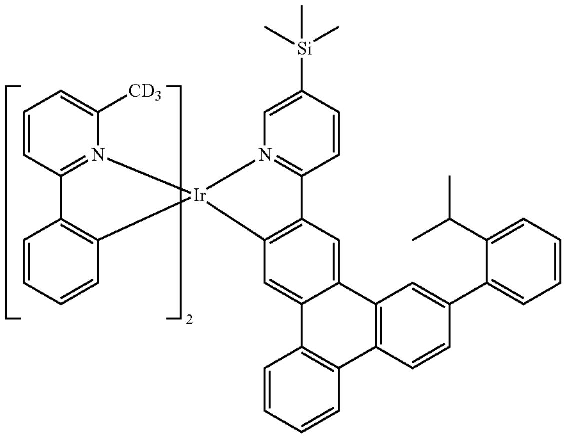
200
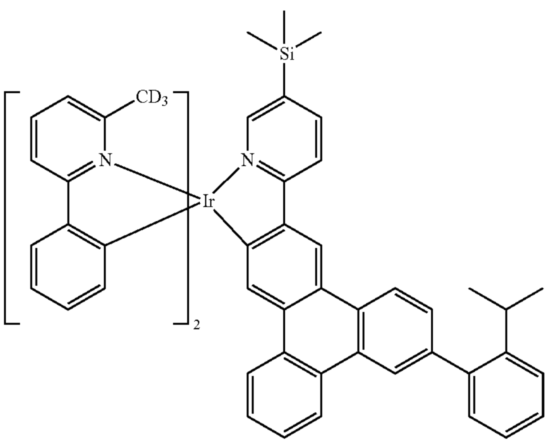
201
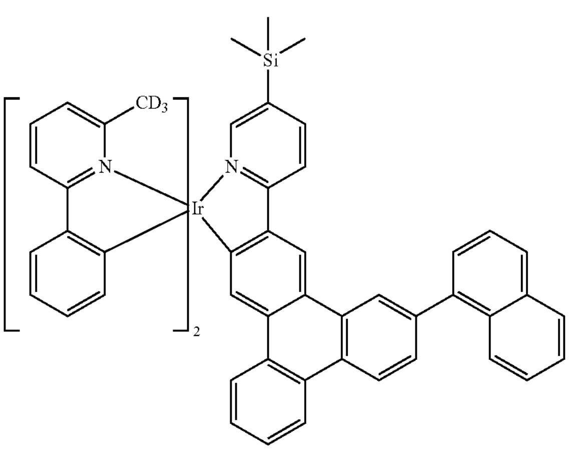
-continued
202
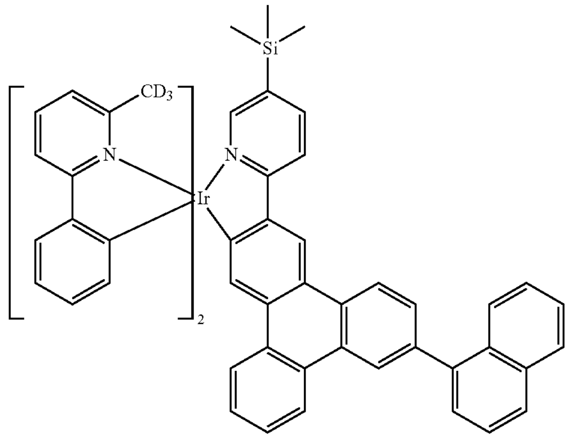
203
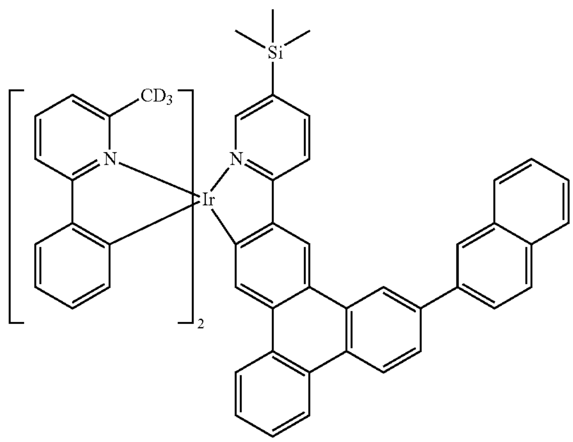
204
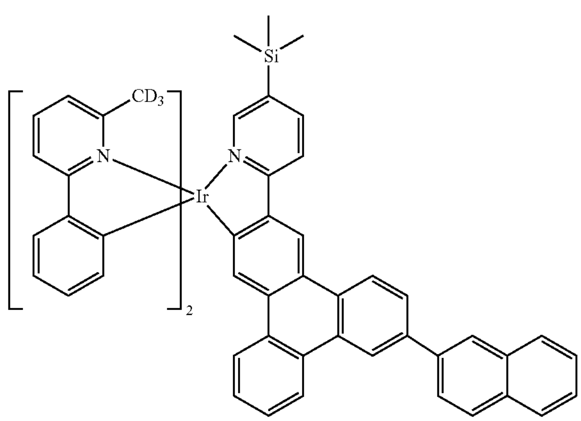

-continued
205
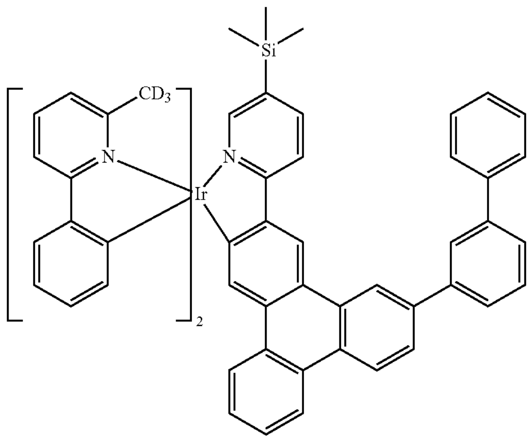
206
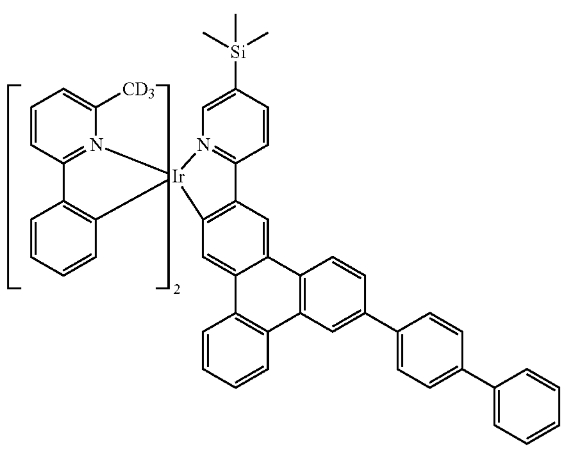
207
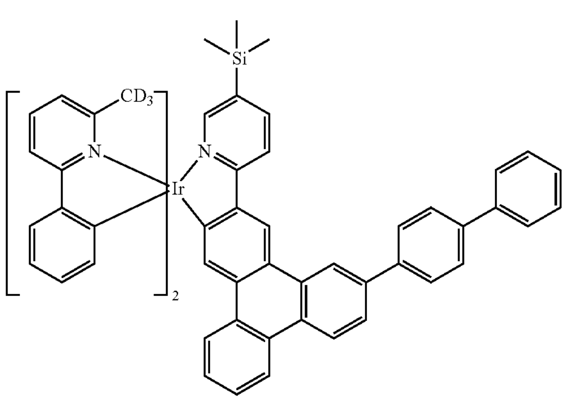
208
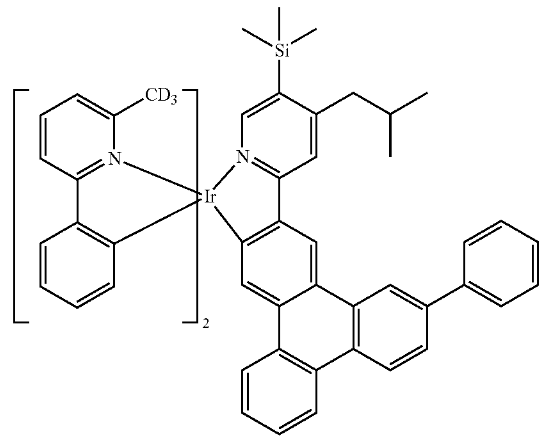
209
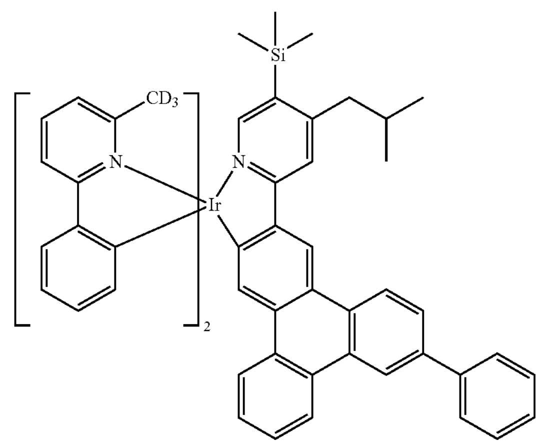
210
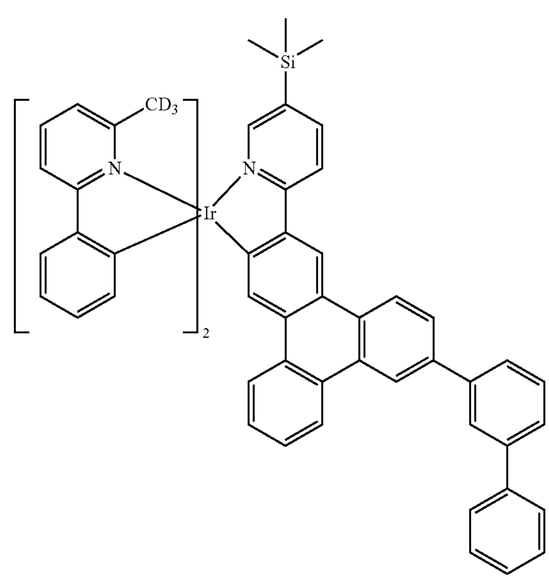

-continued
211
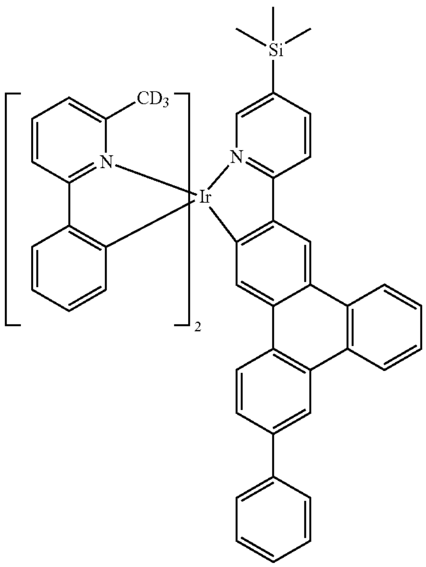
212
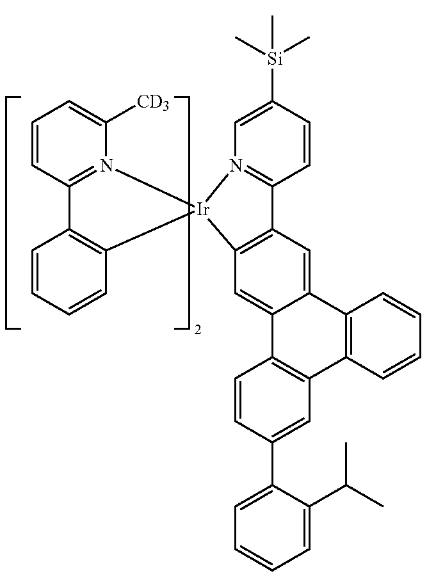
-continued
213
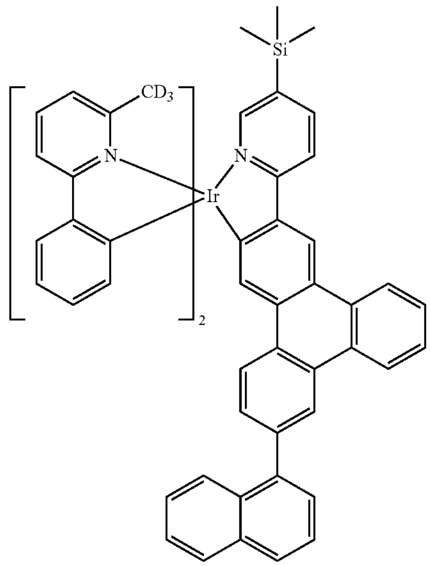
214
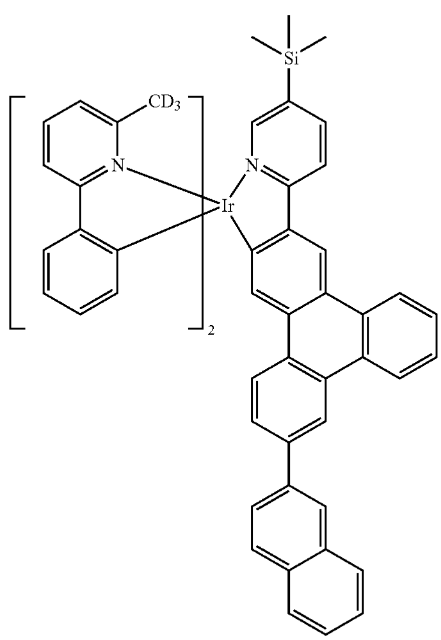

-continued
215
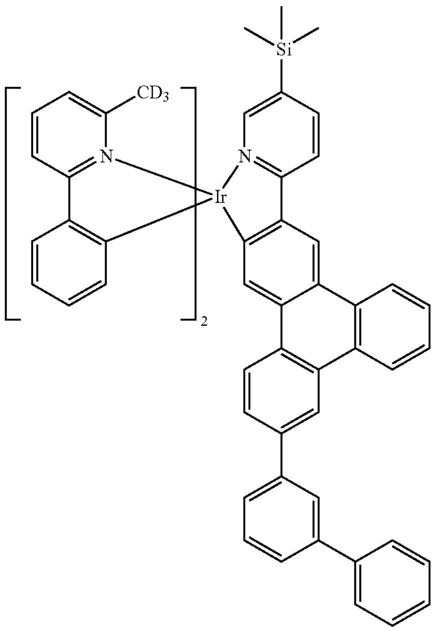
216
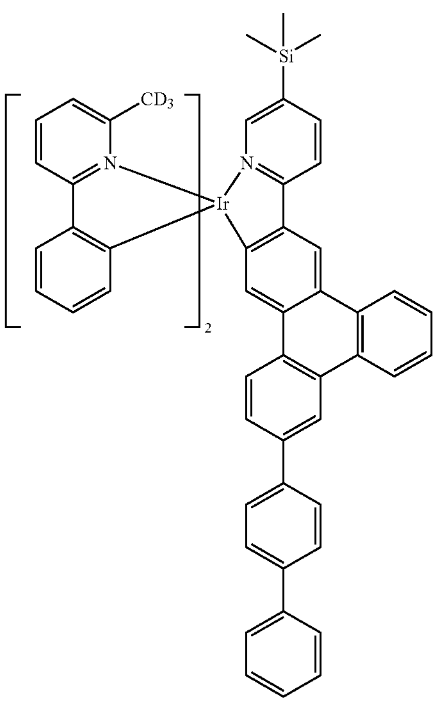
-continued
217
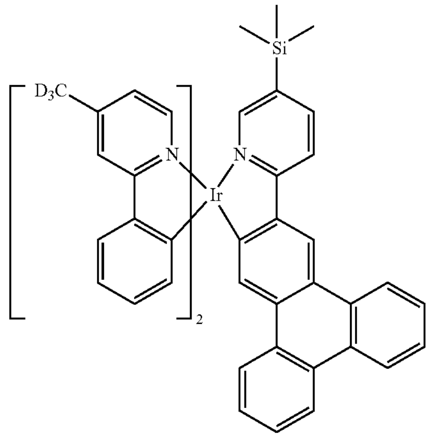
218
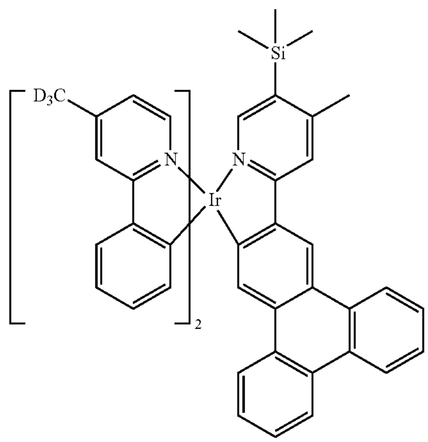
219
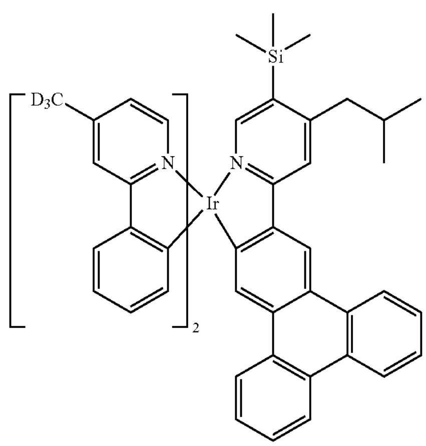

-continued
220
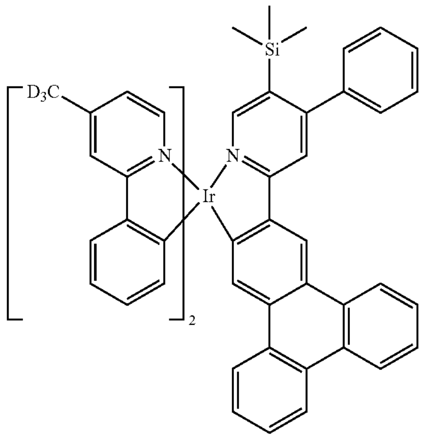
221
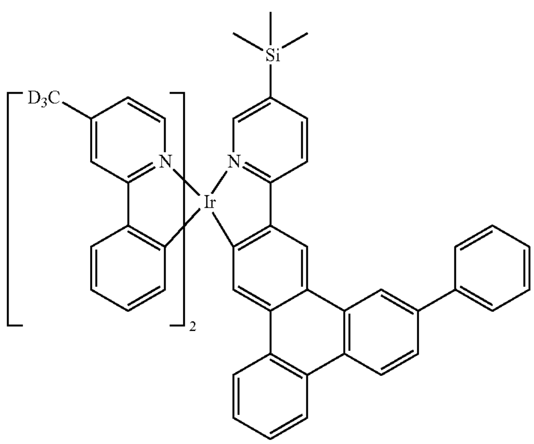
222
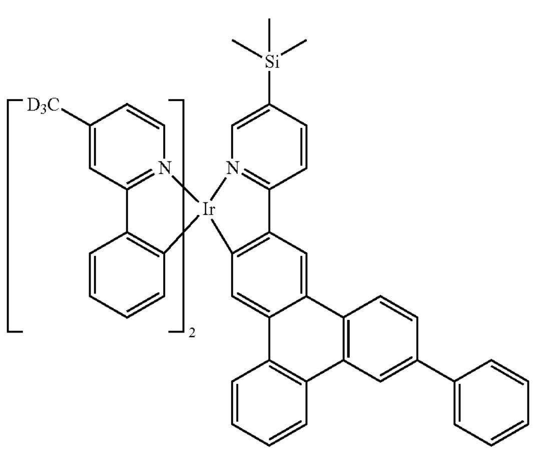
-continued
223
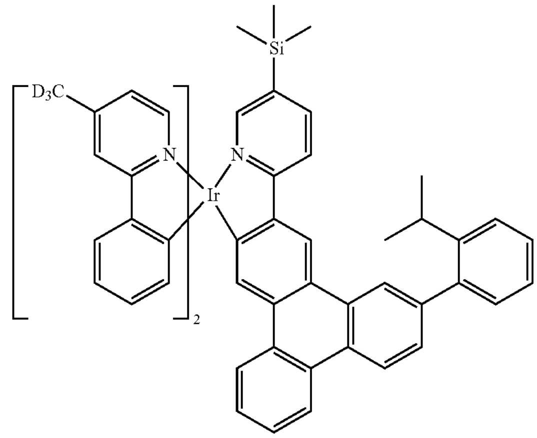
224
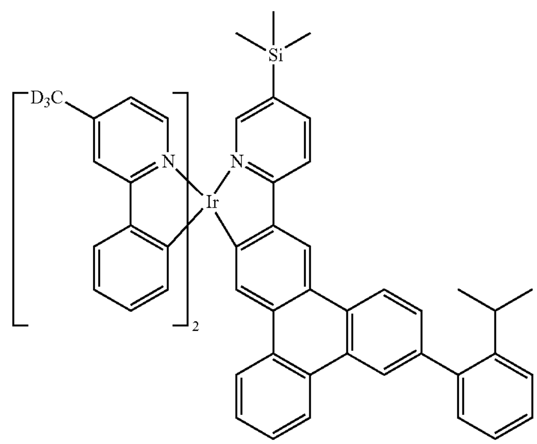
225
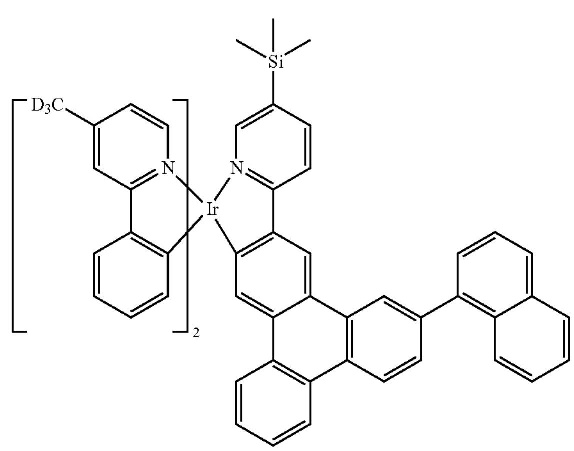

226
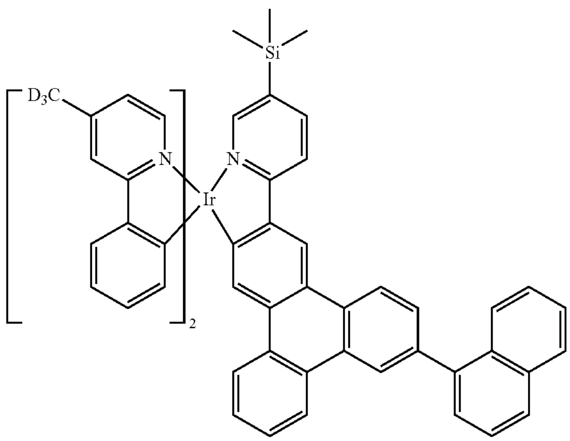
227
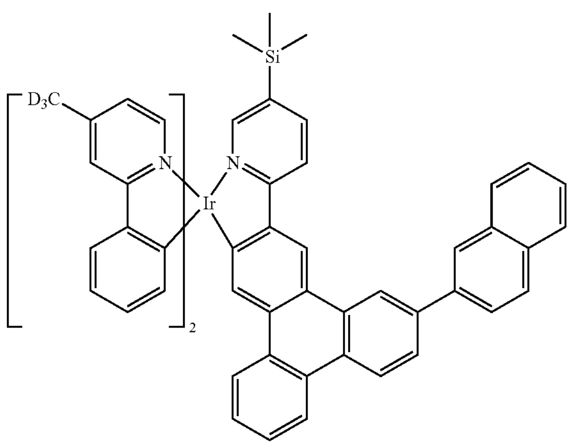
228
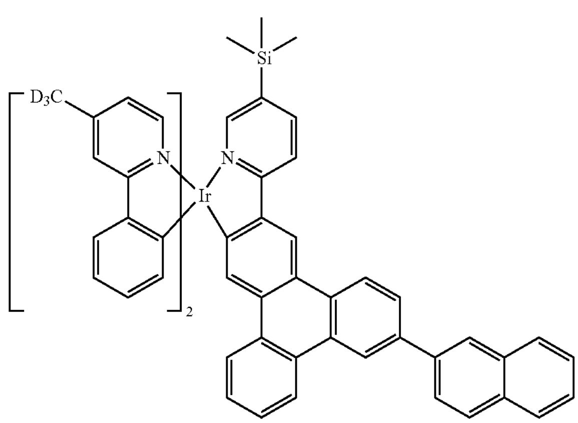
229
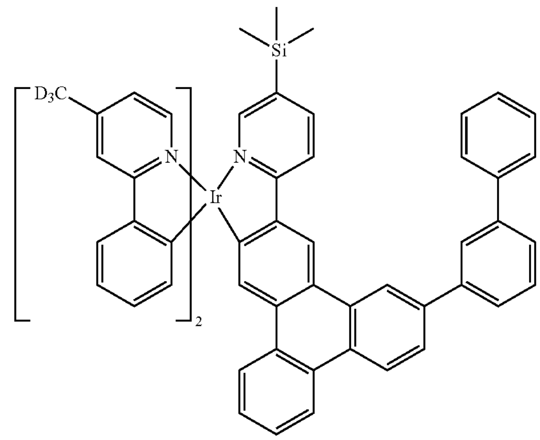
230
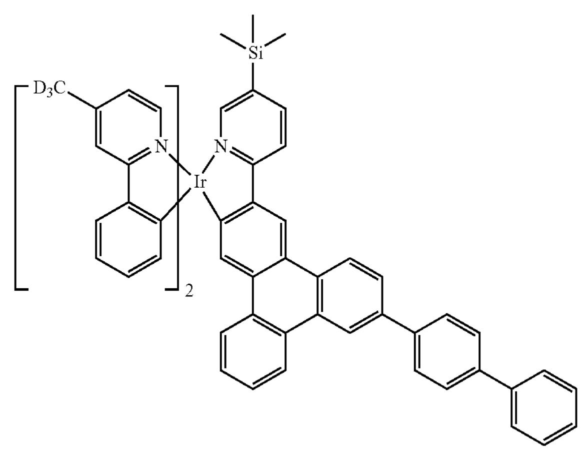
231
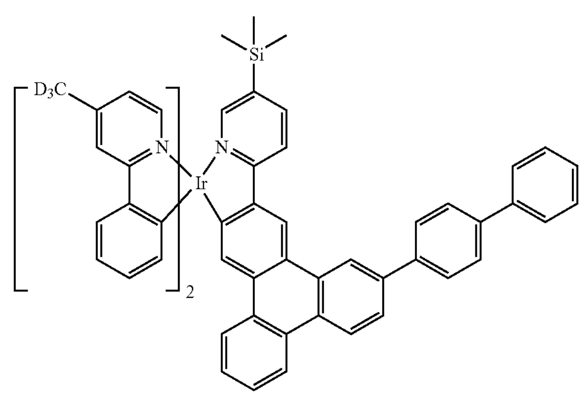

-continued
232
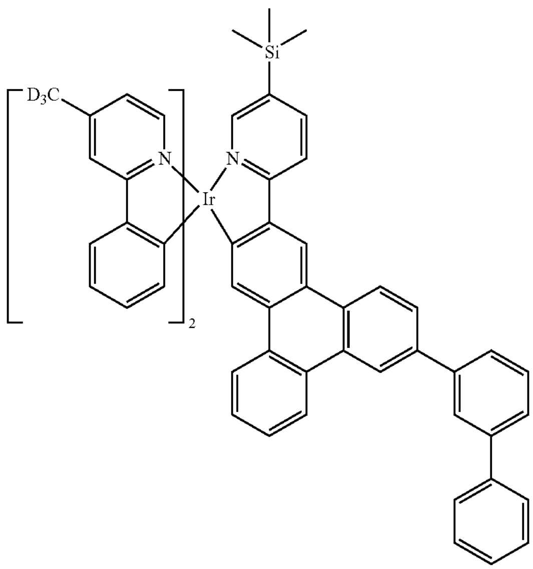
233
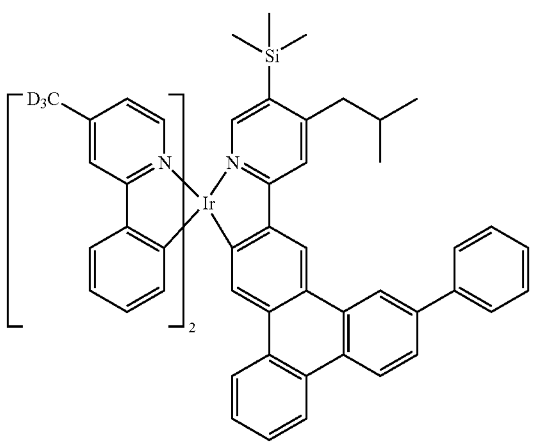
234
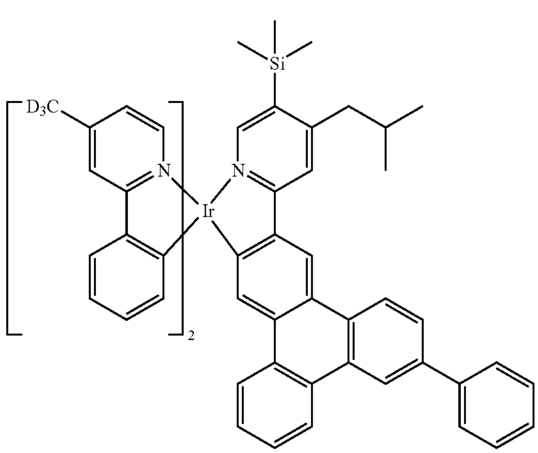
-continued
235
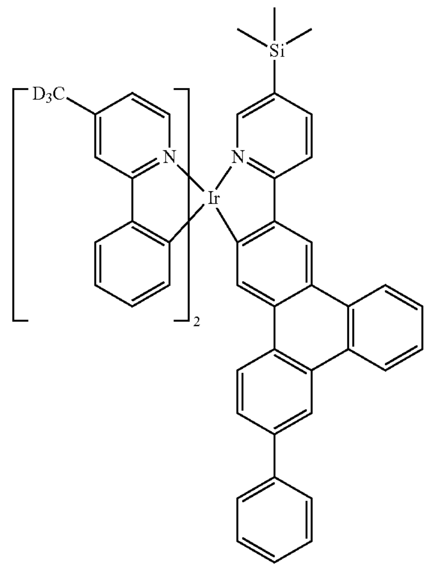
236
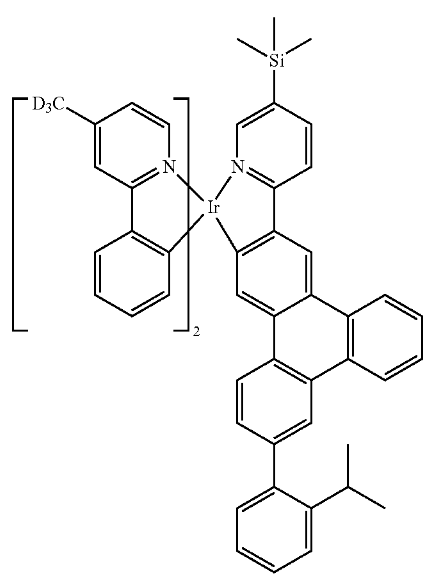

237
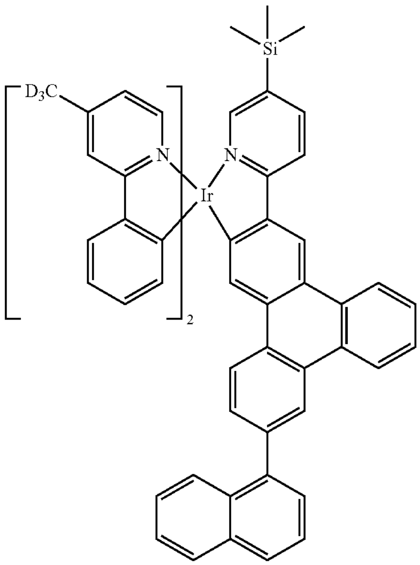
238
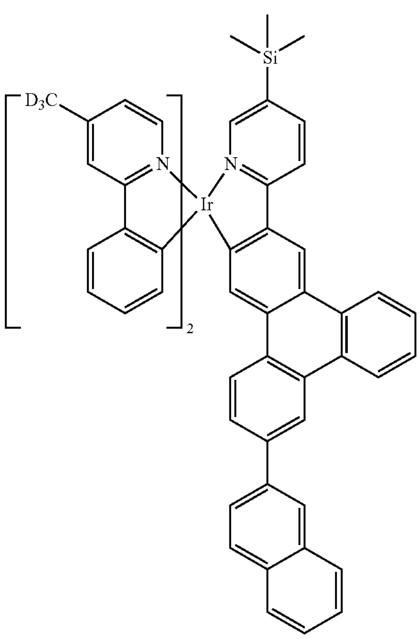
239
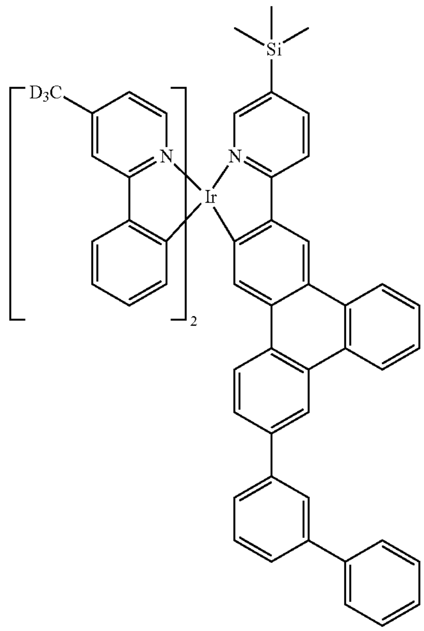
240
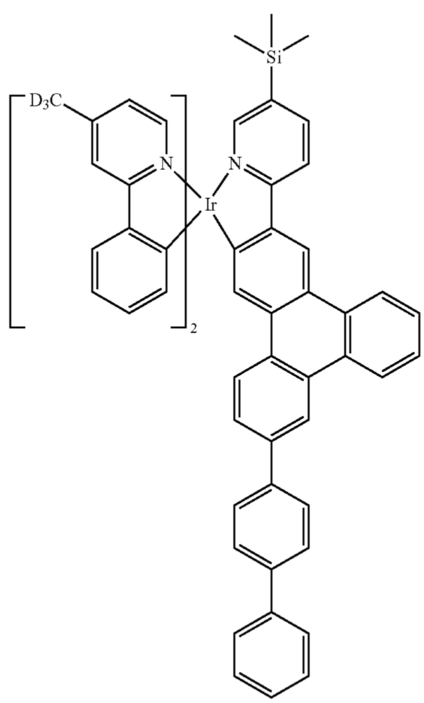

241
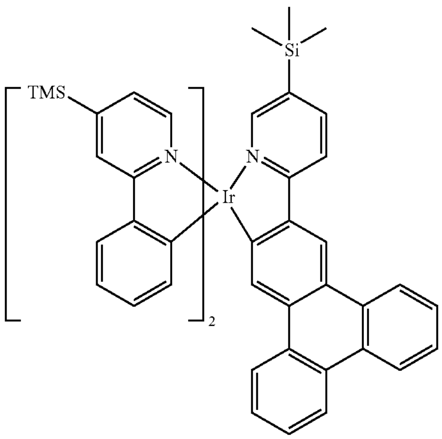
240
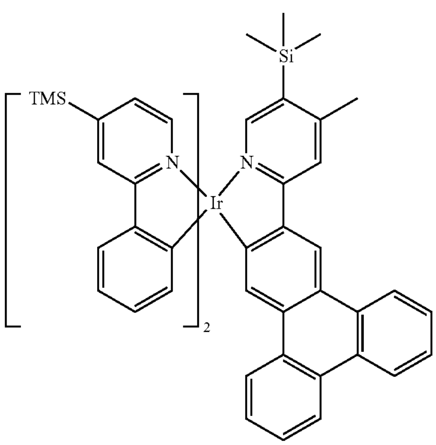
243
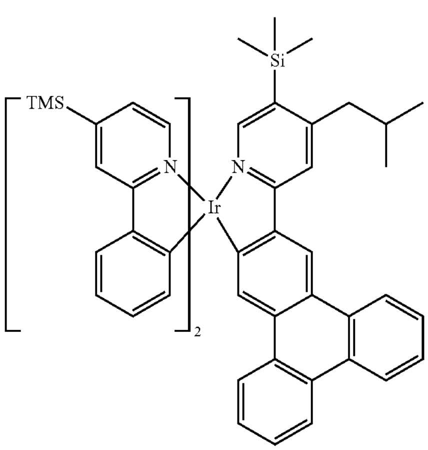
244
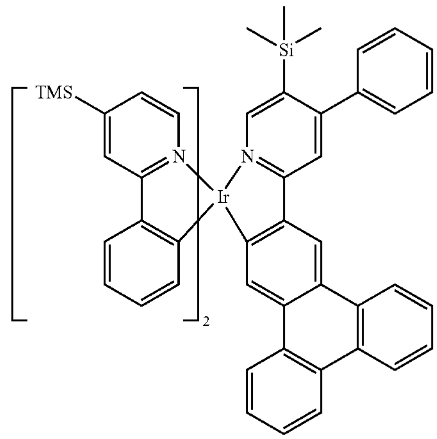
245
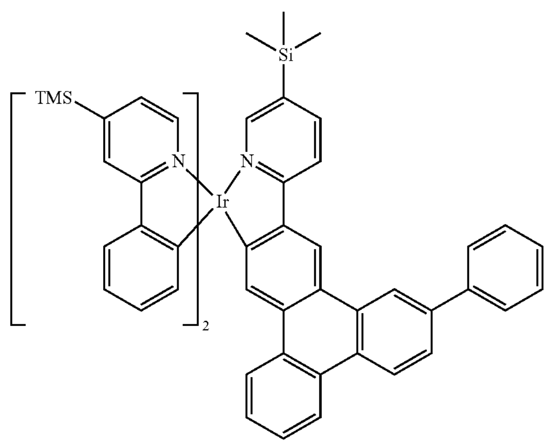
246
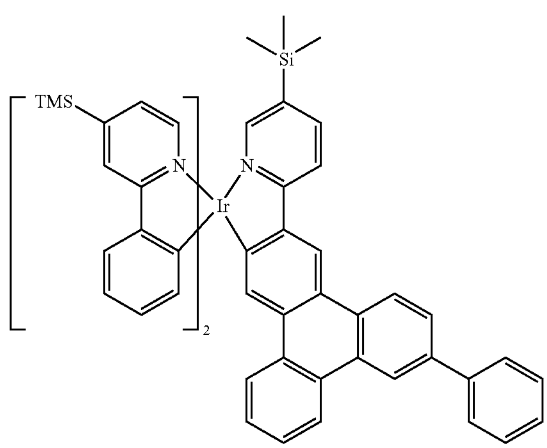

-continued
247
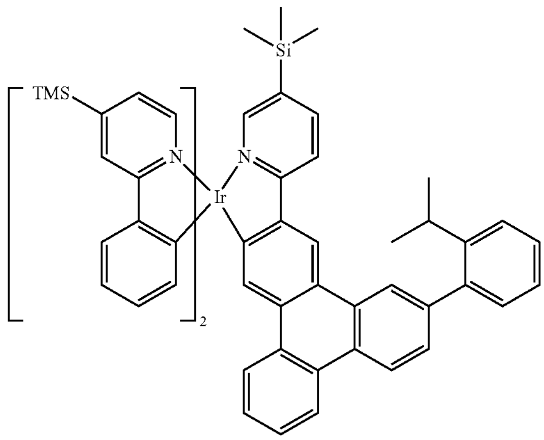
248
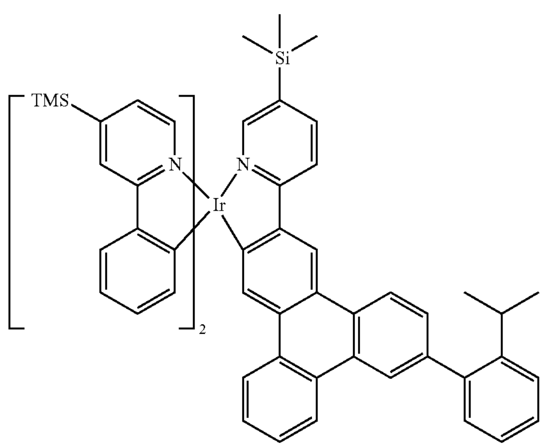
249
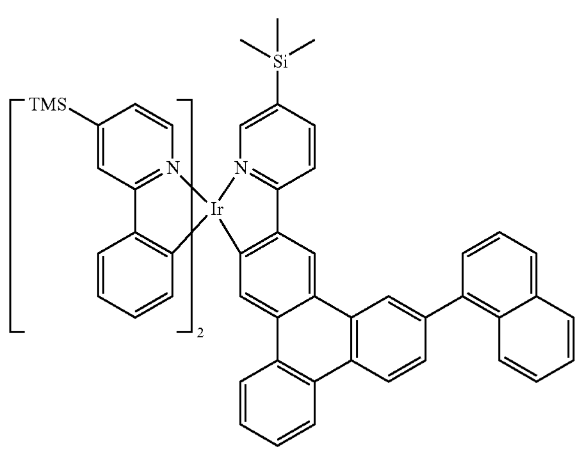
-continued
250
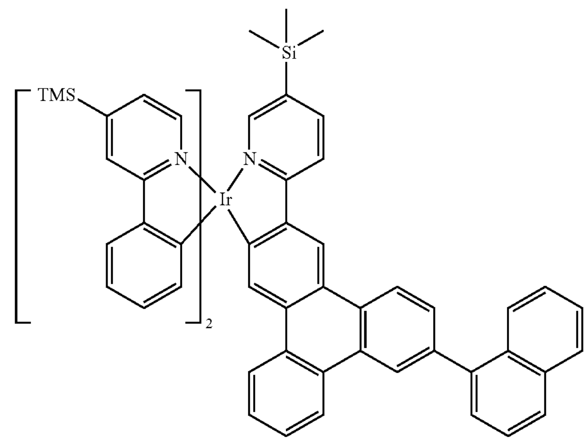
251
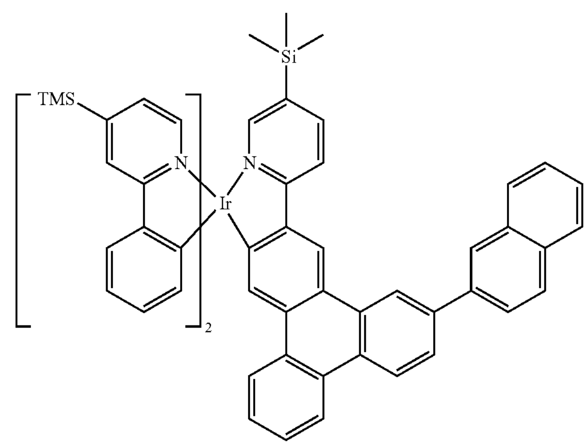
252
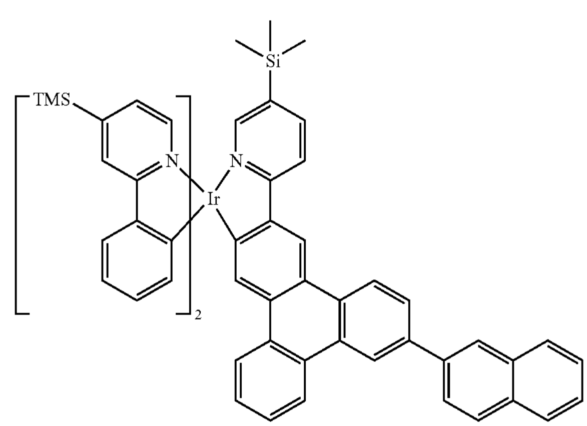

-continued
253
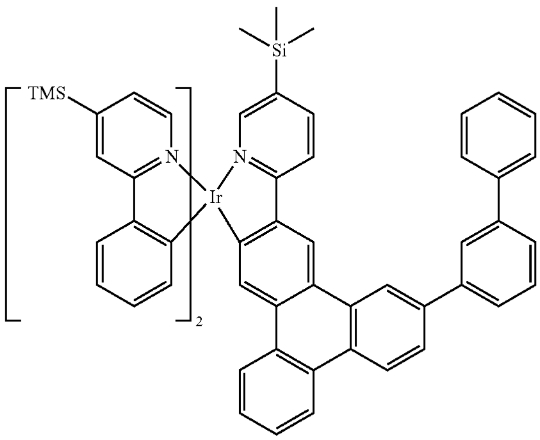
254
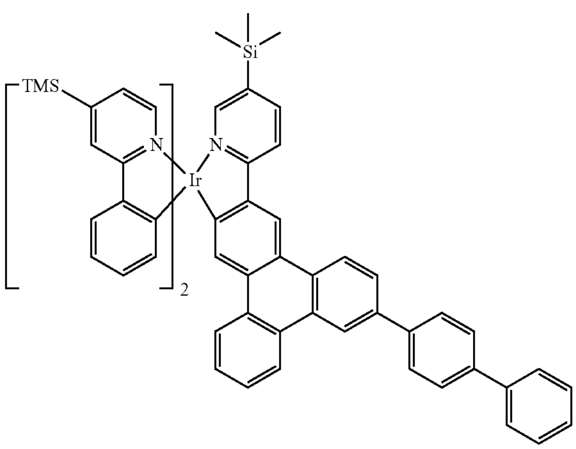
255
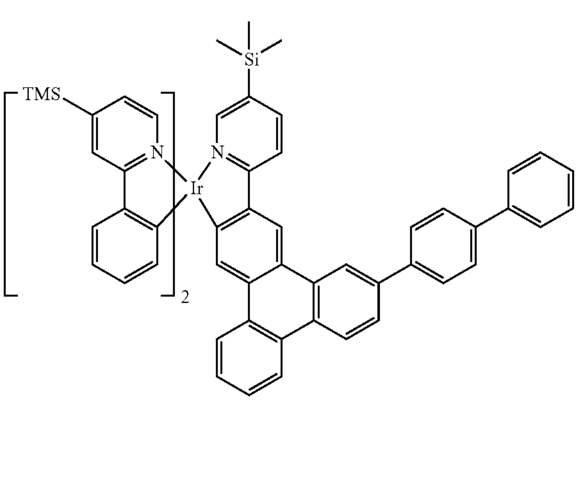
-continued
256
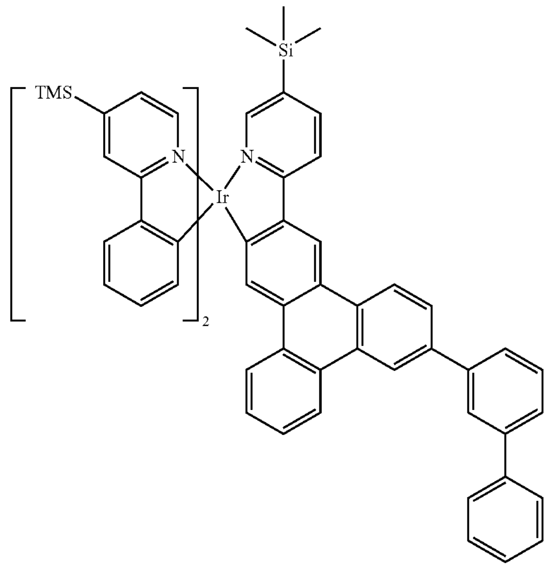
257
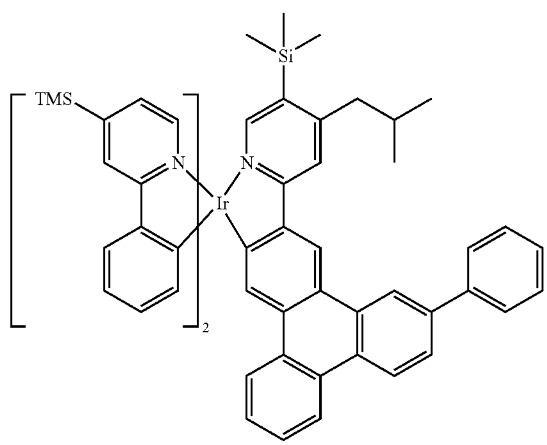
258
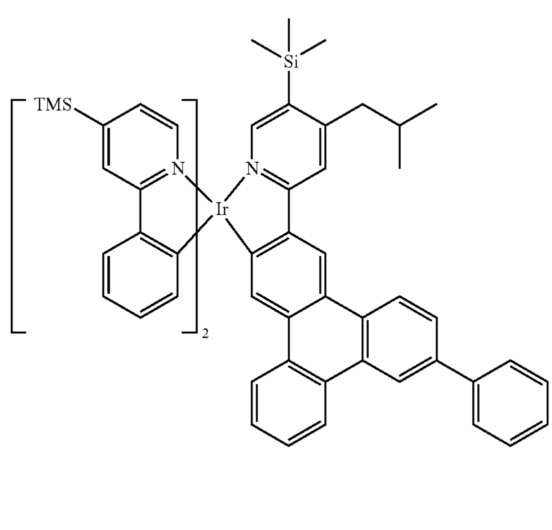

259
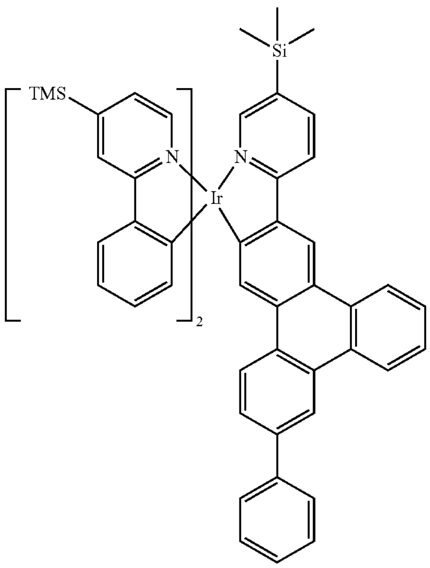
260
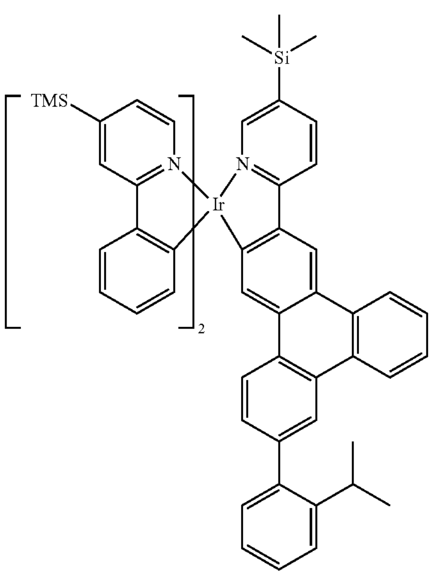
261
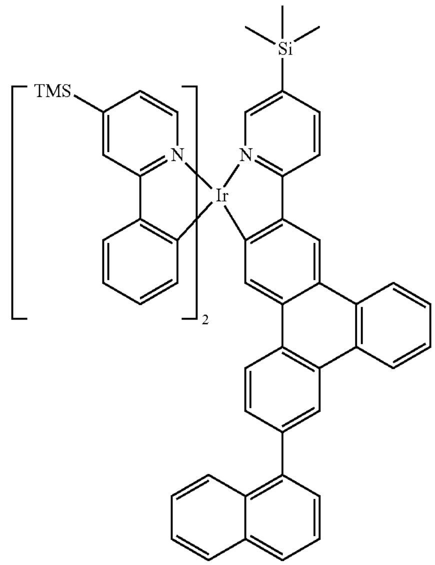
262
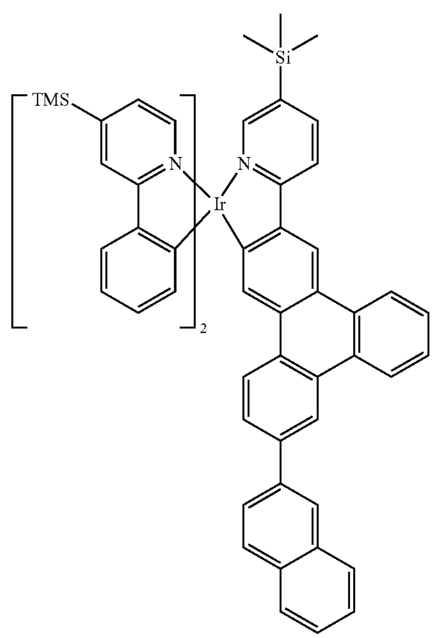

-continued
263
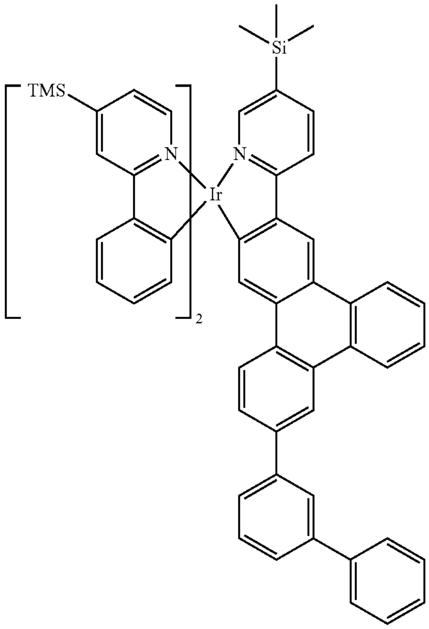
264
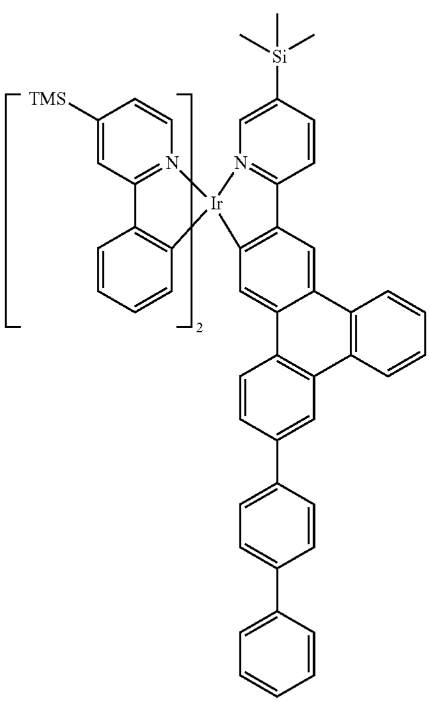
-continued
265
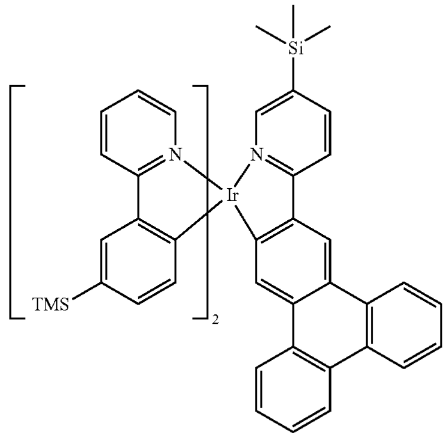
266
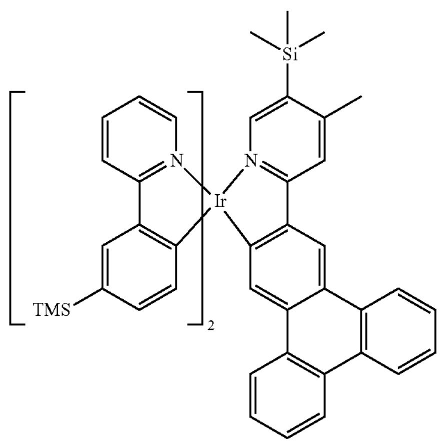
267
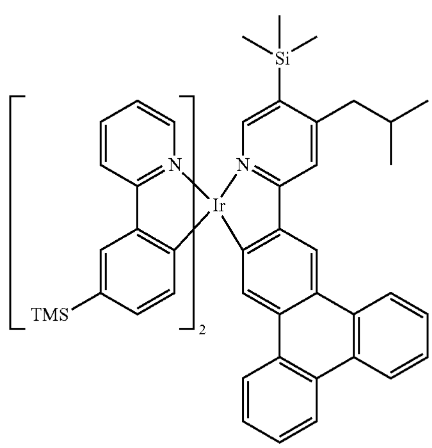

268
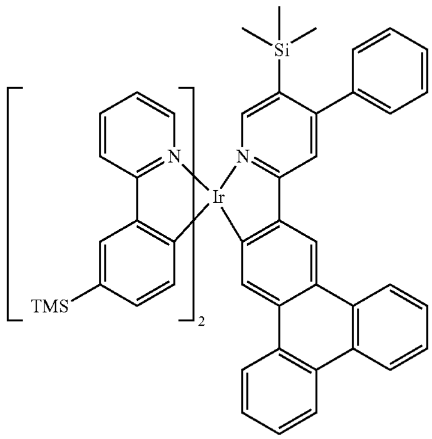
269
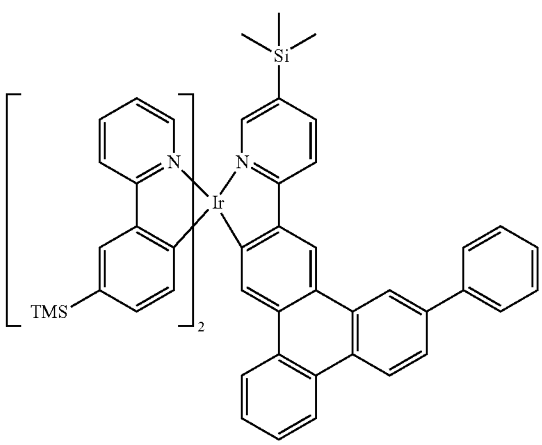
270
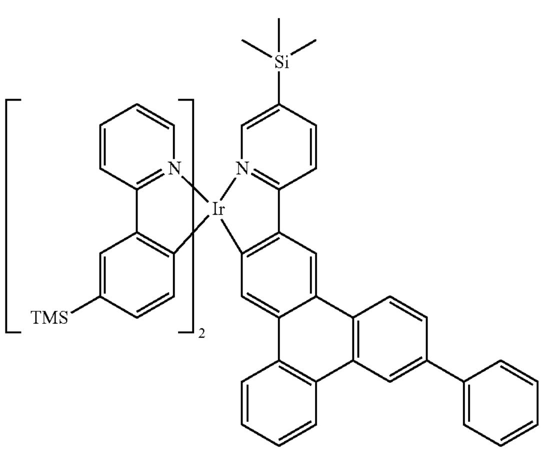
271
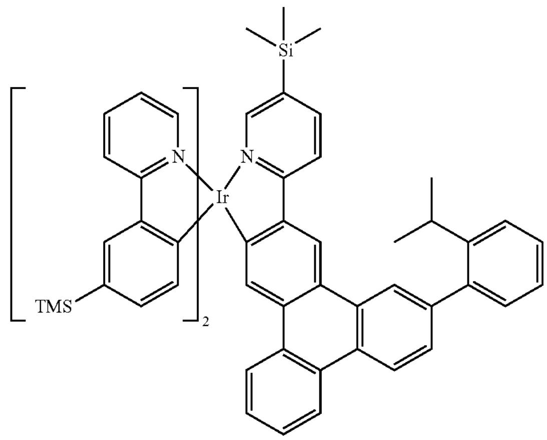
272
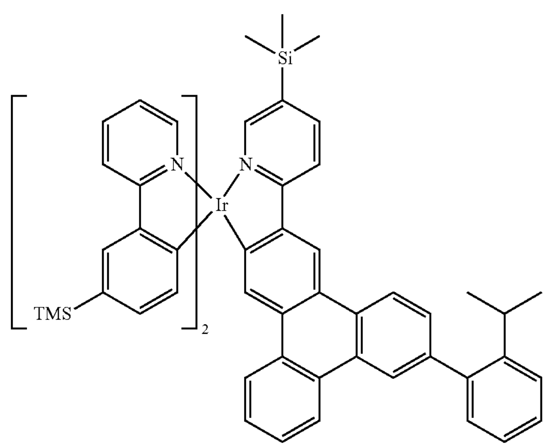
273
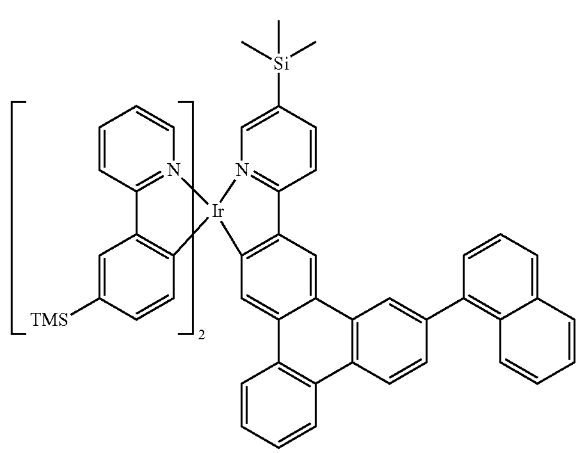

-continued
274
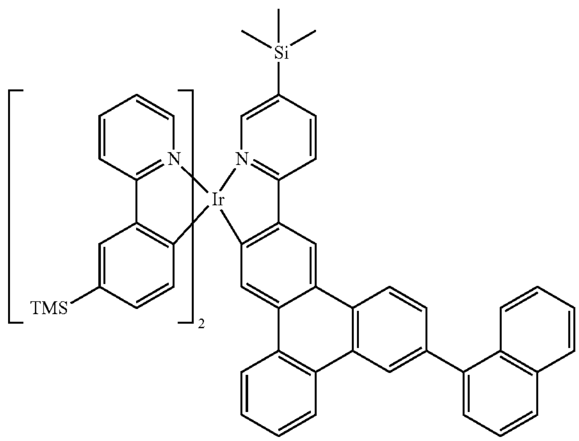
275
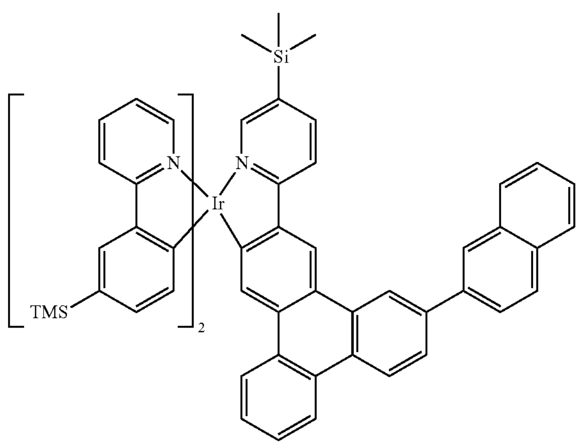
276
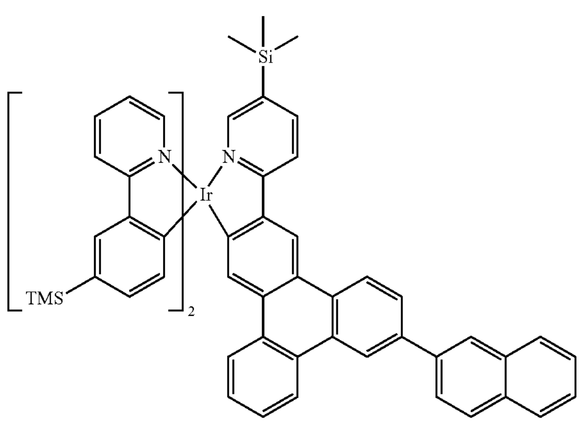
-continued
277
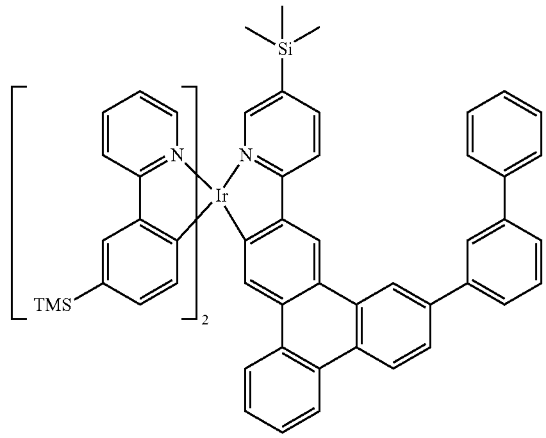
278
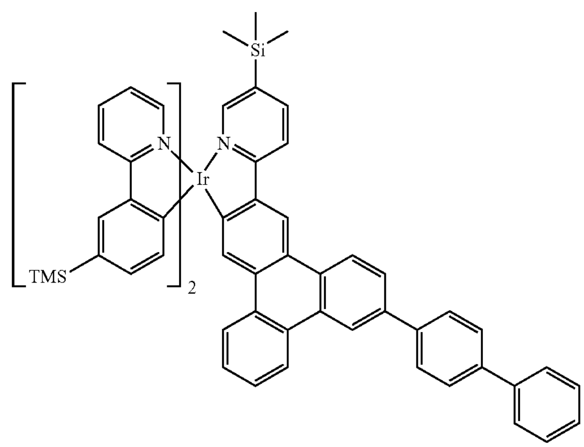
279
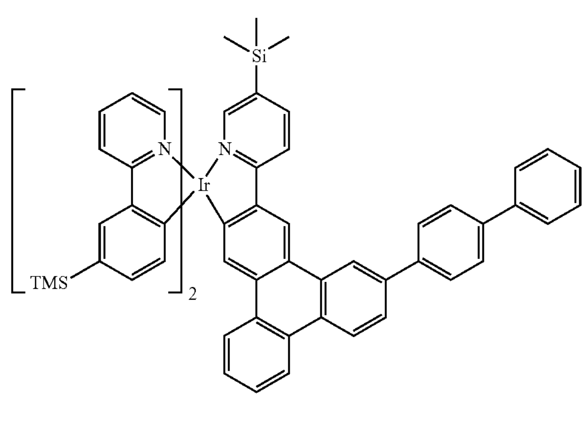

280
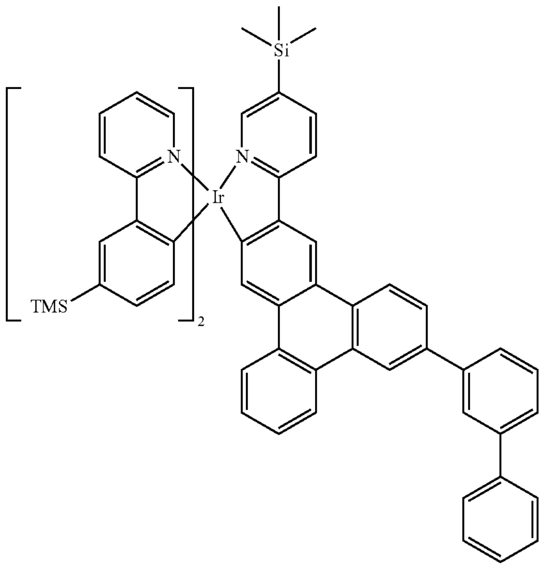
281
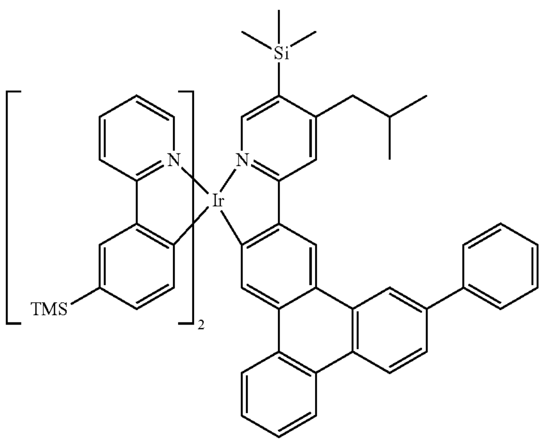
282
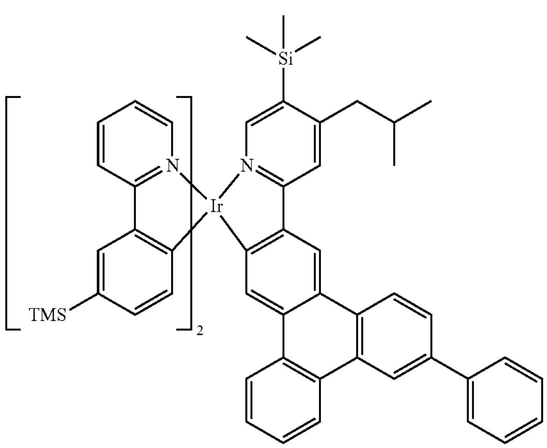
283
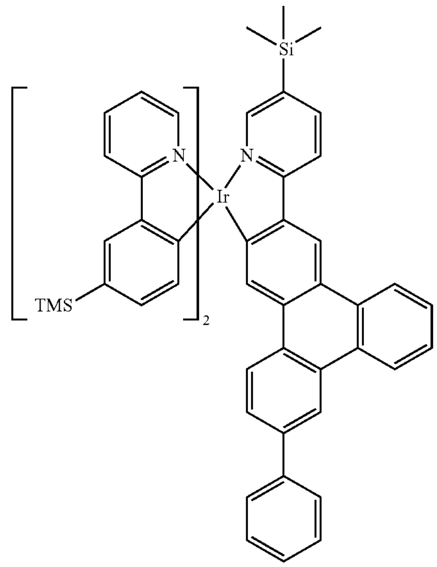
284
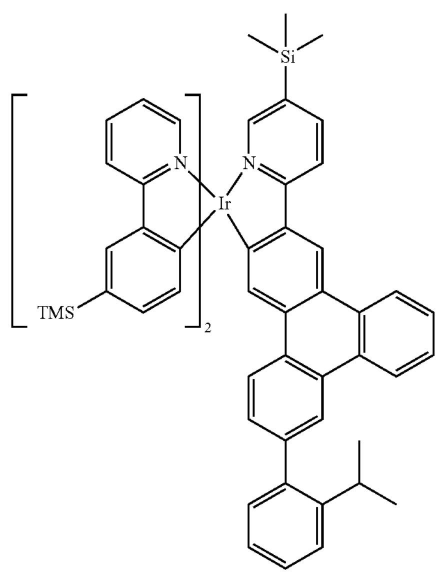

-continued

285

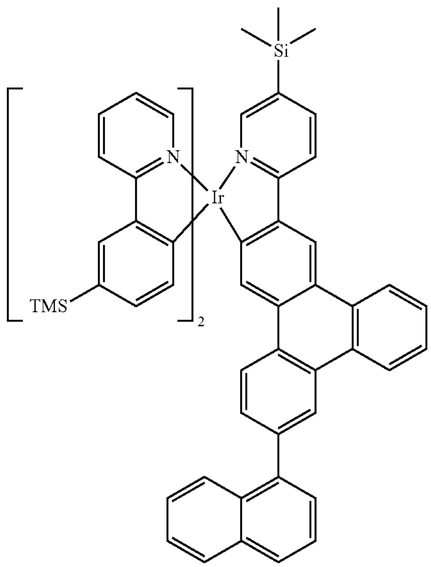

286

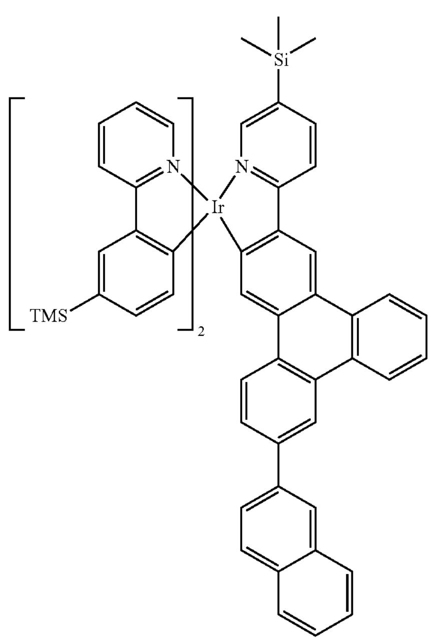

-continued

287

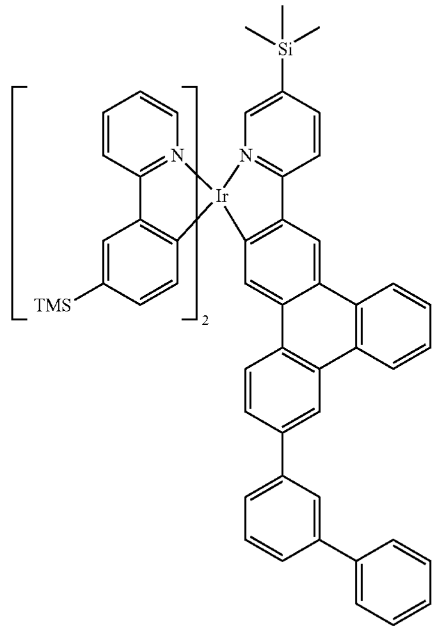

288

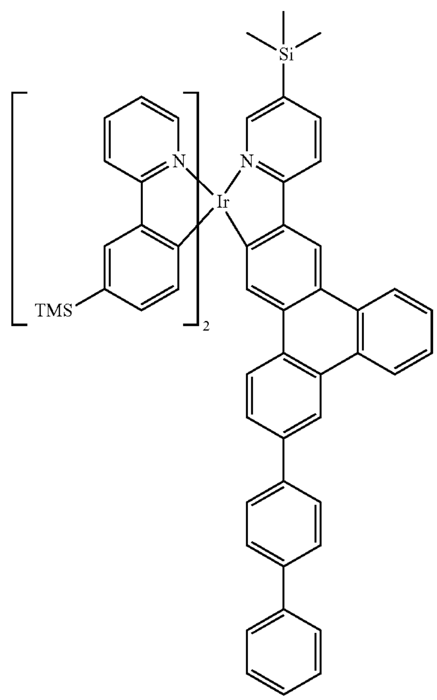

Regarding the organometallic compound represented by Formula 1, $L_1$ is represented by Formula 2, and $CY_1$ in Formula 2 is a $C_1$-$C_{18}$ condensed cyclic ring i) in which two to four unsaturated 6-membered rings are condensed to each other and ii) which optionally has nitrogen (N) as a ring forming atom. Due to this structure, the charge mobility of the organometallic compound represented by Formula 1 may be improved, and accordingly, an electric device, such as an organic light-emitting device, including the organometallic compound, may have long lifespan characteristics.

In addition, since the sum of b5 and b6 in Formula 2 is 1 or greater, a ligand represented by Formula 2 has at least one silyl group. In some embodiments, b5 may be 1, 2, or 3.

Accordingly, a pyridine ring in the ligand represented by Formula 2 may have at least one silyl group. Due to this structure, a device, such as an organic light-emitting device, including the organometallic compound, may have high efficiency and a long lifespan.

For example, the highest occupied molecular orbital (HOMO), lowest unoccupied molecular orbital (LUMO), and triplet ($T_1$) energy levels of some of these organometallic compounds are evaluated by using a DFT (Density Function Theory) method of a Gaussian program (structurally optimized at a level of B3LYP, 6-31G (d,p)). Evaluation results are shown in Table 1.

TABLE 1

| Compound No. | HOMO (eV) | LUMO (eV) | $T_1$ energy level (eV) |
|---|---|---|---|
| 1 | −4.834 | −1.438 | 2.450 |
| 2 | −4.809 | −1.431 | 2.446 |
| 3 | −4.805 | −1.391 | 2.475 |
| 4 | −4.818 | −1.490 | 2.421 |
| 28 | −4.827 | −1.494 | 2.437 |
| 52 | −4.764 | −1.459 | 2.407 |
| 76 | −4.747 | −1.442 | 2.406 |
| 97 | −4.782 | −1.398 | 2.445 |
| 124 | −4.777 | −1.473 | 2.410 |
| 145 | −4.792 | −1.413 | 2.445 |
| 147 | −4.766 | −1.373 | 2.467 |
| 149 | −4.791 | −1.432 | 2.439 |
| 150 | −4.762 | −1.434 | 2.422 |
| 151 | −4.789 | −1.426 | 2.441 |
| 152 | −4.771 | −1.429 | 2.429 |
| 153 | −4.794 | −1.432 | 2.445 |
| 154 | −4.771 | −1.438 | 2.428 |
| 155 | −4.800 | −1.445 | 2.438 |
| 160 | −4.764 | −1.435 | 2.423 |
| 163 | −4.786 | −1.462 | 2.402 |
| 164 | −4.787 | −1.444 | 2.420 |
| 165 | −4.796 | −1.468 | 2.409 |
| 166 | −4.792 | −1.490 | 2.381 |

Referring to Table 1, the organometallic compound represented by Formula 1 has such electric characteristics that are suitable for use as a material for an electric device, for example, as a material for an organic light-emitting device (for example, a dopant).

Methods of synthesizing the organometallic compound represented by Formula 1 may be easily recognizable by one of ordinary skill in the art by referring to the following Synthesis Examples.

Since the organometallic compound represented by Formula 1 is suitable for an organic layer of an organic light-emitting device, for example, a dopant of an emission layer of the organic layer, another aspect provides an organic light-emitting device including:

a first electrode;

a second electrode; and an organic layer that is disposed between the first electrode and the second electrode, wherein the organic layer includes an emission layer and at least one organometallic compound represented by Formula 1.

Due to the inclusion of the organic layer including the organometallic compound represented by Formula 1, the organic light-emitting device may have a low driving voltage, high efficiency, and a long lifespan.

The organometallic compound represented by Formula 1 may be used between a pair of electrodes of an organic light-emitting device. For example, the organometallic compound represented by Formula 1 may be included in the emission layer. In this regard, the organometallic compound may act as a dopant and the emission layer may further include a host (that is, the amount of the organometallic compound represented by Formula 1 is smaller than that of the host).

The expression that "(an organic layer) includes at least one of the organometallic compounds" as used herein may include an embodiment in which "(an organic layer) includes identical organometallic compounds represented by Formula 1 and an embodiment in which (an organic layer) includes two or more different organometallic compounds represented by Formula 1.

For example, the organic layer may include, as the organometallic compound, only Compound 1. In this regard, Compound 1 may be included in an emission layer of the organic light-emitting device. In some embodiments, the organic layer may include, as the organometallic compound, Compound 1 and Compound 2. In this regard, Compound 1 and Compound 2 may be included in the same layer (for example, Compound 1 and Compound 2 both may be included in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

For example, the first electrode may be an anode, the second electrode may be a cathode, and the organic layer may include a hole transport region disposed between the first electrode and the emission layer and an electron transport region disposed between the emission layer and the second electrode, wherein the hole transport region includes at least one selected from a hole injection layer, a hole transport layer, and an electron blocking layer, and wherein the electron transport region includes at least one selected from a hole blocking layer, an electron transport layer, and an electron injection layer.

The term "organic layer" as used herein refers to a single layer and/or a plurality of layers between the first electrode and the second electrode of the organic light-emitting device. The "organic layer" may include, in addition to an organic compound, an organometallic complex including metal.

FIG. 1 is a schematic view of an organic light-emitting device 10 according to an embodiment. Hereinafter, the structure of an organic light-emitting device according to an embodiment and a method of manufacturing an organic light-emitting device, according to an embodiment, will be described in connection with FIG. 1. The organic light-emitting device 10 includes a first electrode 11, an organic layer 15, and a second electrode 19, which are sequentially stacked on each other in this order.

A substrate may be additionally disposed under the first electrode 11 or above the second electrode 19. As the substrate, any substrate that is used in general organic light-emitting devices may be used, and the substrate may be a glass substrate or transparent plastic substrate, each with excellent mechanical strength, thermal stability, transparency, surface smoothness, ease of handling, and water-resistance.

The first electrode 11 may be formed by depositing or sputtering a material for forming the first electrode 11 on the substrate. The first electrode 11 may be an anode. The material for the first electrode 11 may be selected from materials with a high work function to allow holes be easily provided. The first electrode 11 may be a reflective electrode or a transmissive electrode. The material for the first electrode 11 may be, for example, indium tin oxide (ITO), indium zinc oxide (IZO), tin oxide ($SnO_2$), and zinc oxide (ZnO). In some embodiments, magnesium (Mg), aluminum (Al), aluminum-lithium (Al—Li), calcium (Ca), magnesium-indium (Mg—In), or magnesium-silver (Mg—Ag) may be used as the material for the first electrode 11.

The first electrode 11 may have a single-layer structure or a multi-layer structure including two or more layers. For example, the first electrode 11 may have a three-layered structure of ITO/Ag/ITO, but the structure of the first electrode 110 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include at least one selected from a hole injection layer, a hole transport layer, an electron blocking layer, and a buffer layer.

The hole transport region may include only either a hole injection layer or a hole transport layer. In some embodiments, the hole transport region may have a structure of hole injection layer/hole transport layer or hole injection layer/hole transport layer/electron blocking layer, which are sequentially stacked in this stated order from the first electrode 11.

A hole injection layer may be formed on the first electrode 11 by using one or more methods, such as vacuum deposition, spin coating, casting, or Langmuir-Blodgett (LB).

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100 to about 500° C., a vacuum pressure of about $10^{-8}$ to about $10^{-3}$ torr, and a deposition rate of about 0.01 to about 100 Angstroms per second (A/sec). However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 revolutions per minute (rpm) to about 5,000 rpm, and a temperature at which a heat treatment is performed to remove a solvent after coating may be from about 80° C. to about 200° C. However, the coating conditions are not limited thereto.

Conditions for a hole transport layer and an electron blocking layer may be understood by referring to conditions for forming the hole injection layer.

The hole transport region may include at least one selected from m-MTDATA, TDATA, 2-TNATA, NPB, β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonic acid (PANI/CSA), (polyaniline)/poly(4-styrenesulfonate) (Pani/PSS), a compound represented by Formula 201 below, and a compound represented by Formula 202 below:

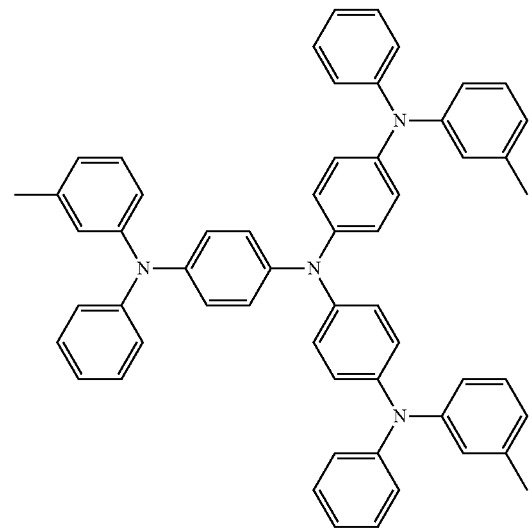

m-MTDATA

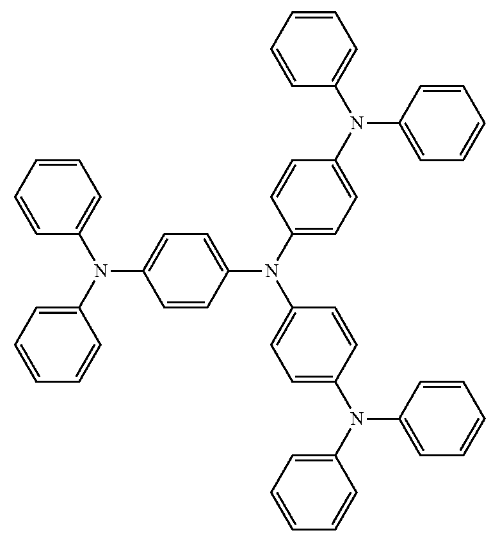

TDATA

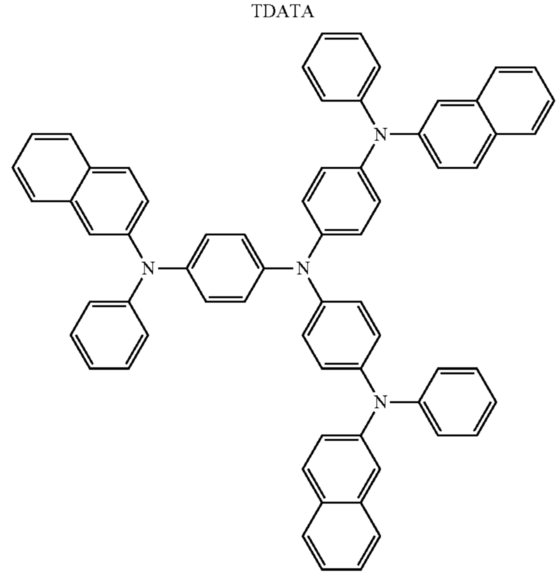

2-TNATA

-continued

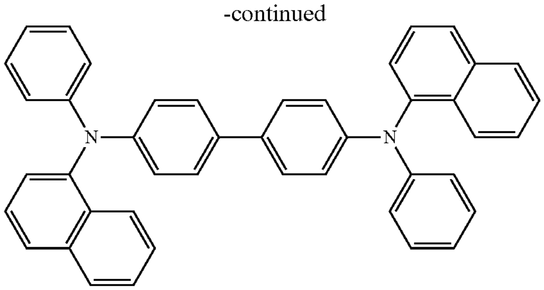

NPB

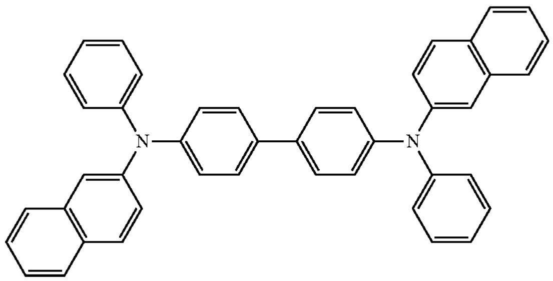

β-NPB

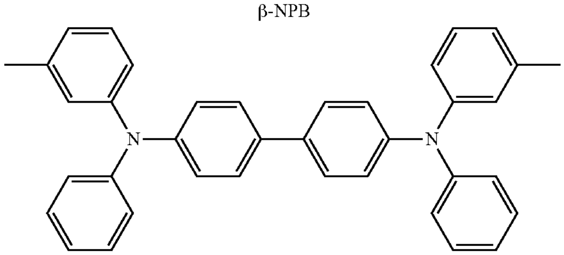

TPD

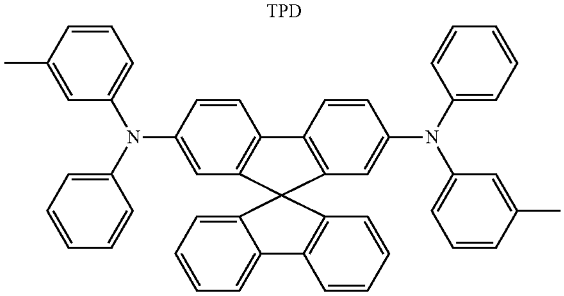

Spiro-TPD

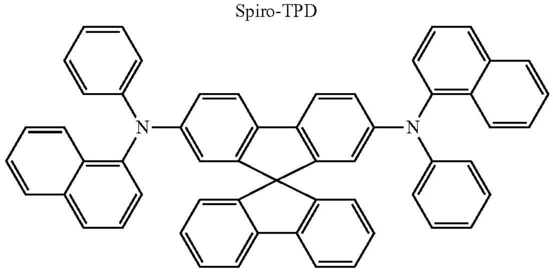

Spiro-NPB

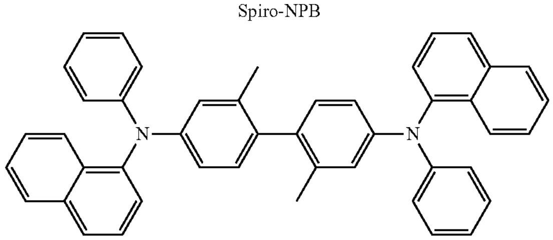

methylated NPB

-continued

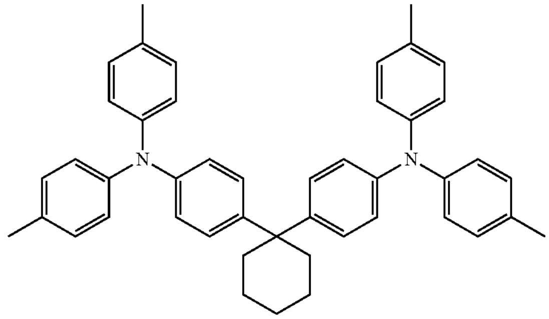

TAPC

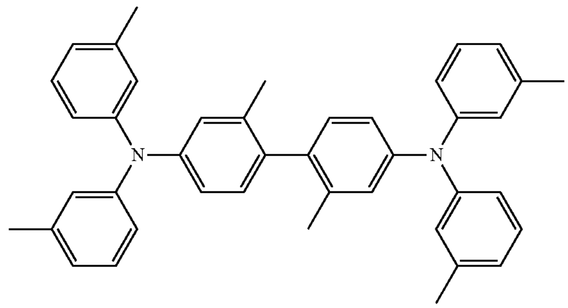

HMTPD

Formula 201

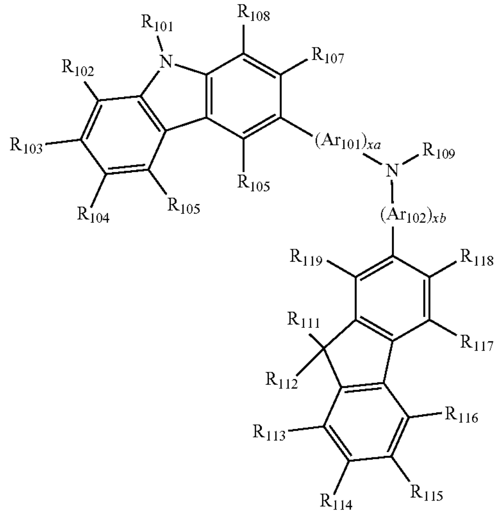

Formula 202

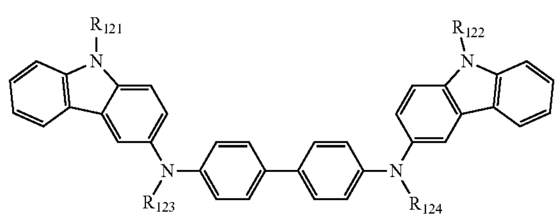

$Ar_{101}$ and $Ar_{102}$ in Formula 201 may be each independently selected from a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group; and a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, and a pentacenylene group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group.

In Formula 201, xa and xb may be each independently an integer of 0 to 5, or 0, 1, or 2. For example, xa is 1 and xb is 0, but xa and xb are not limited thereto.

$R_{101}$ to $R_{108}$, $R_{111}$ to $R_{119}$, and $R_{121}$ to $R_{124}$ in Formulae 201 and 202 may be each independently selected from hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, a pentyl group, a hexyl group, and so on), and a $C_1$-$C_{10}$ alkoxy group (for example, a methoxy group, an ethoxy group, a propoxy group, a butoxy group, a pentoxy group, and so on);

a $C_1$-$C_{10}$ alkyl group or a $C_1$-$C_{10}$ alkoxy group, each substituted with at least one selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, and a phosphoric acid group or a salt thereof;

a phenyl group, a naphthyl group, an anthracenyl group, a fluorenyl group, and a pyrenyl group; and a phenyl group, a naphthyl group, a fluorenyl group, and a pyrenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, or a $C_1$-$C_{10}$ alkoxy group.

However, they are not limited thereto.

$R_{109}$ in Formula 201 may be selected from a phenyl group, a naphthyl group, an anthracenyl group, and a pyridinyl group; and a phenyl group, a naphthyl group, an anthracenyl group, and a pyridinyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, and a pyridinyl group.

According to an embodiment, the compound represented by Formula 201 may be represented by Formula 201A, but is not limited thereto:

Formula 201A

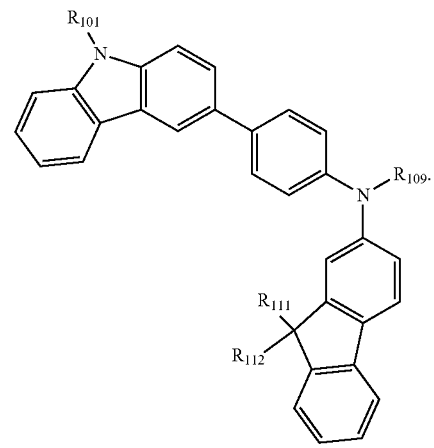

$R_{101}$, $R_{111}$, $R_{112}$, and $R_{109}$ in Formula 201A may be understood by referring to the description provided herein.

For example, the compound represented by Formula 201 and the compound represented by Formula 202 may include compounds HT1 to HT20 illustrated below, but are not limited thereto.

HT1

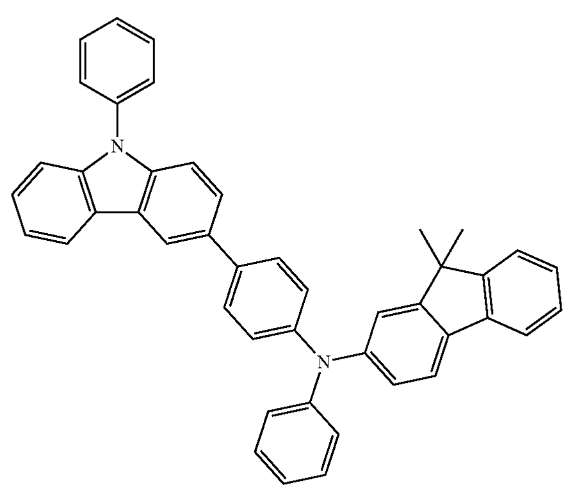

-continued
HT2
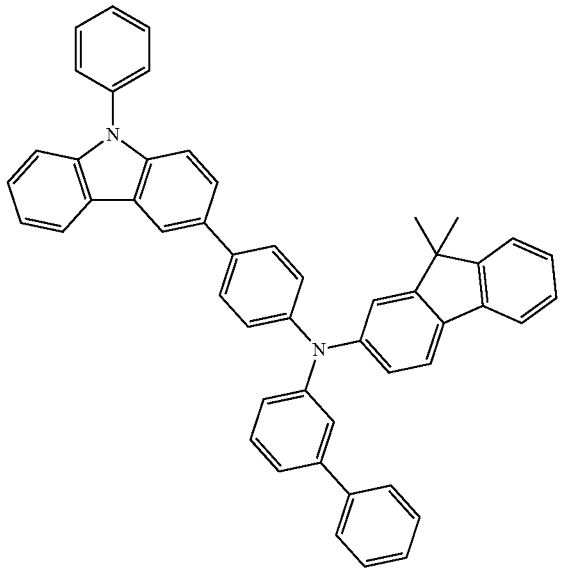
HT3
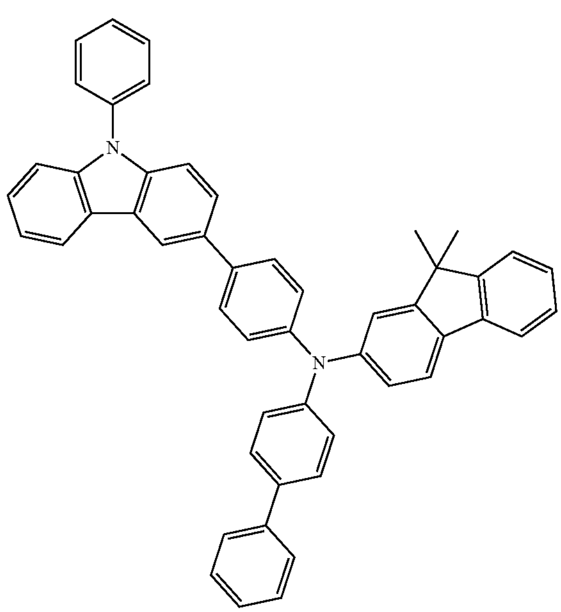
-continued
HT4
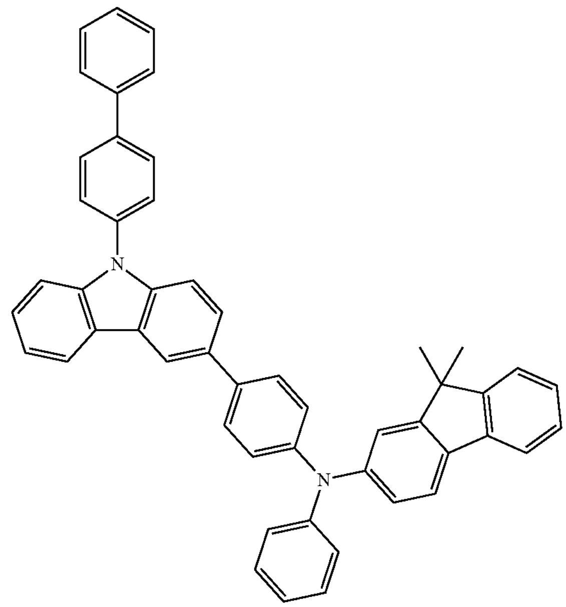
HT5
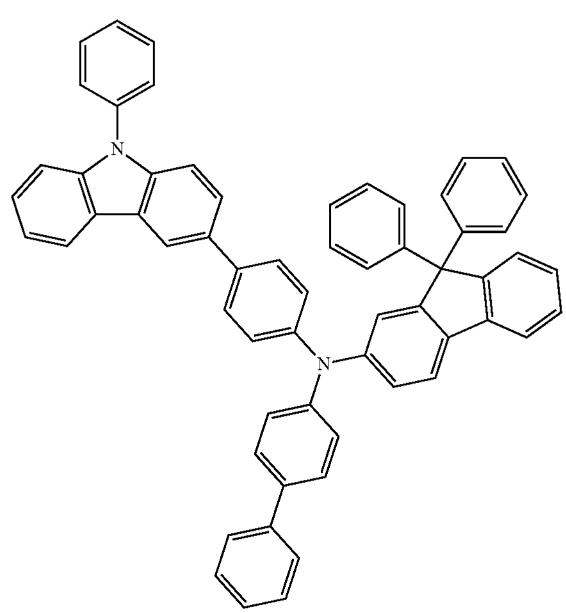

-continued
HT6
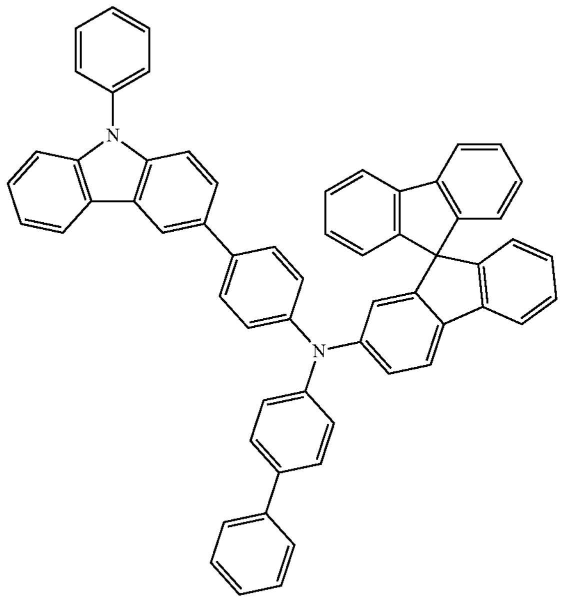
HT7
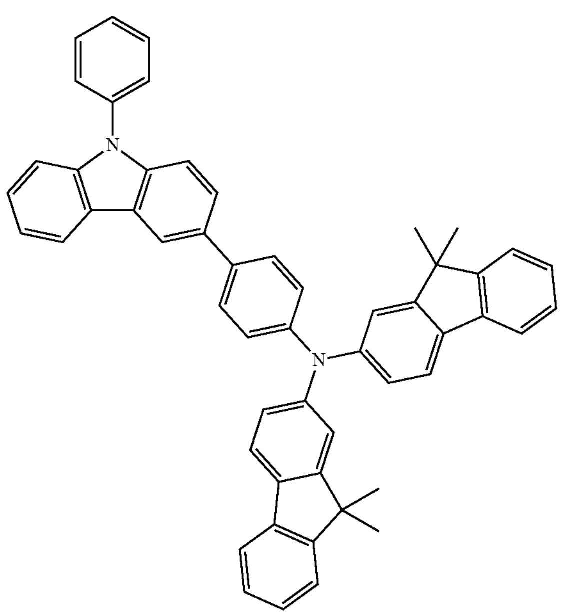
-continued
HT8
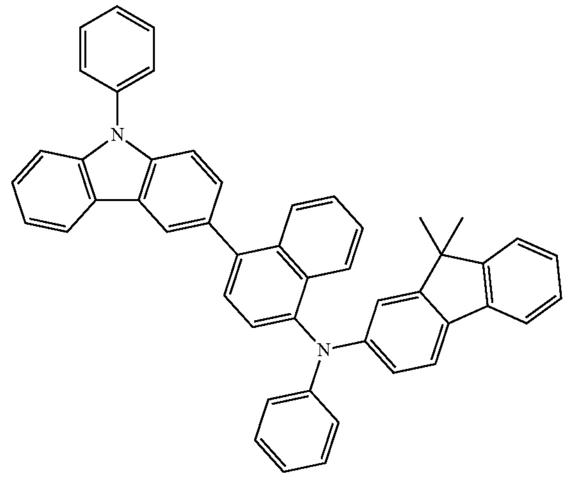
HT9
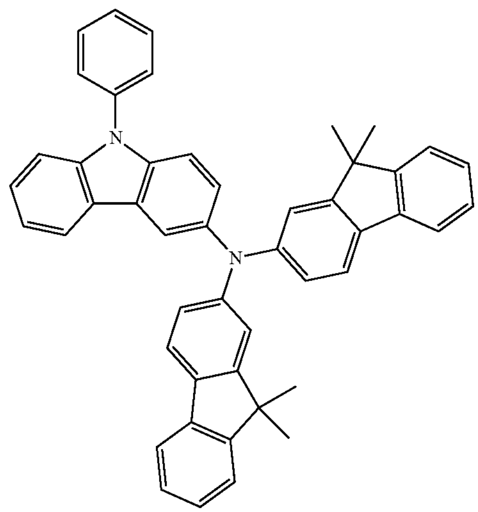
HT10
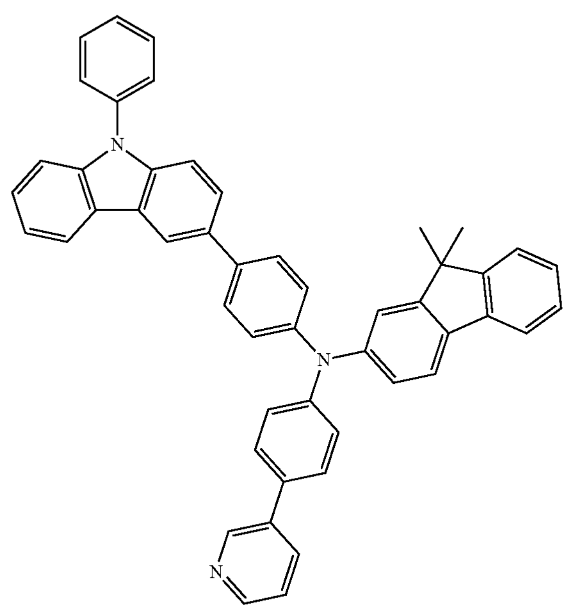

-continued
HT11
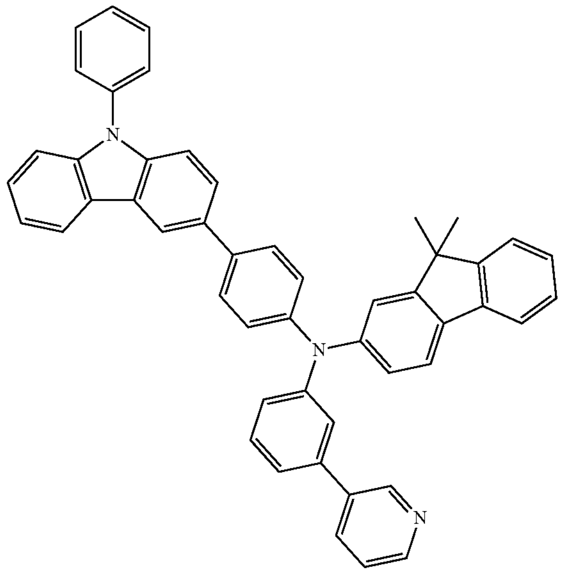
HT12
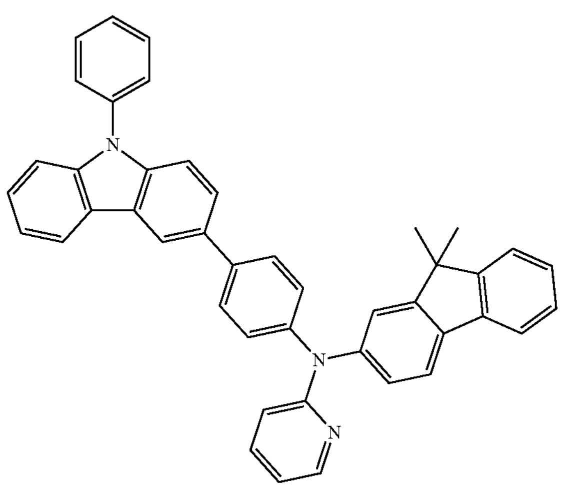
HT13
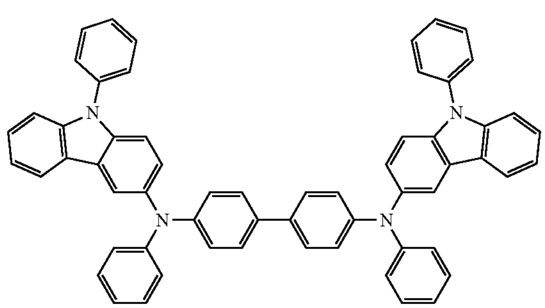
-continued
HT14
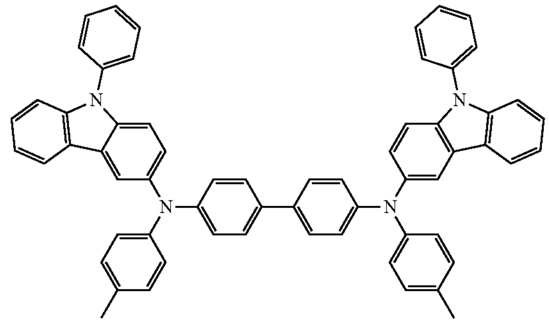
HT15
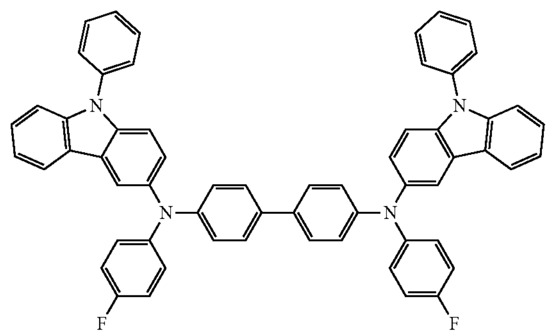
HT16
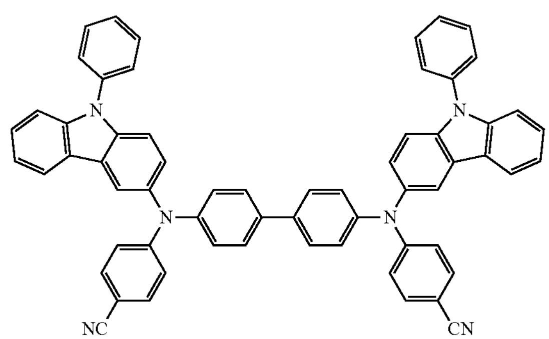
HT17
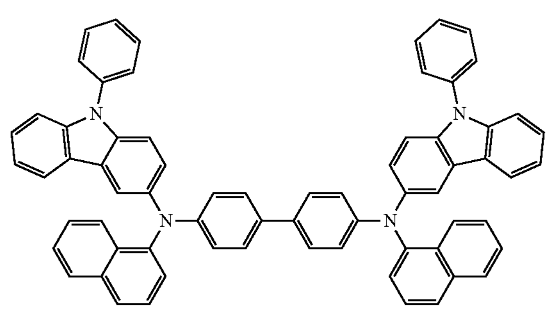

-continued

HT18

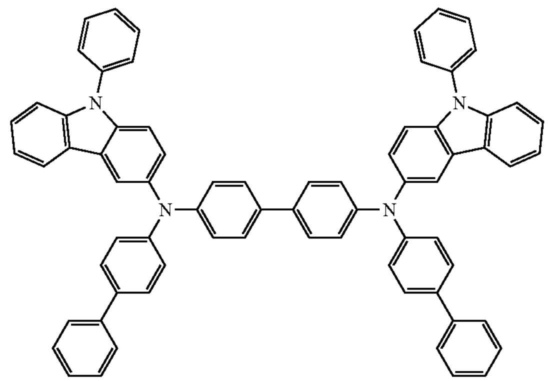

HT19

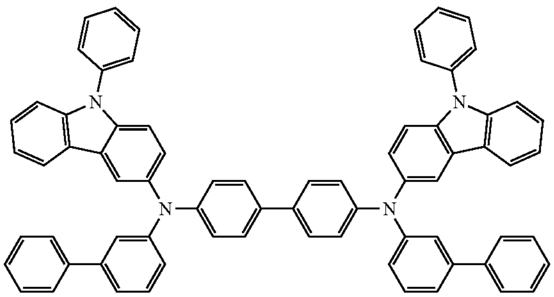

HT20

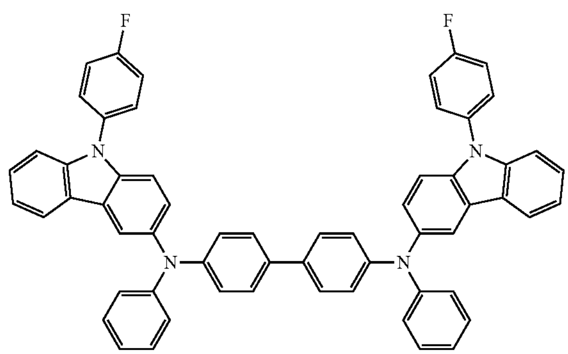

A thickness of the hole transport region may be in a range of about 100 Angstroms (Å) to about 10,000 Å, for example, about 100 Å to about 1,000 Å. While not wishing to be bound by a theory, it is understood that when the hole transport region includes a hole injection layer and a hole transport layer, the thickness of the hole injection layer may be in a range of about 100 Å to about 10,000 Å, and for example, about 100 Å to about 1,000 Å, and the thickness of the hole transport layer may be in a range of about 50 Å to about 2,000 Å, and for example, about 100 Å to about 1,500 Å. While not wishing to be bound by a theory, it is understood that when the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected from a quinone derivative, a metal oxide, and a cyano group-containing compound, but embodiments are not limited thereto. Non-limiting examples of the p-dopant are a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenium oxide; and a cyano group-containing compound, such as Compound HT-D1 below, but are not limited thereto.

Compound HT-D1

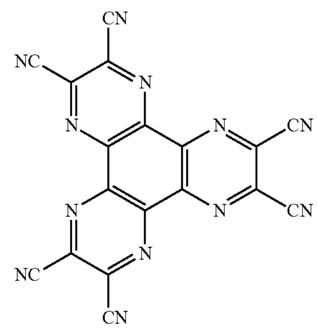

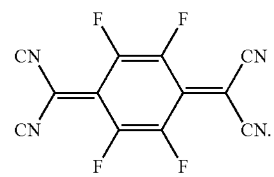

F4-TCNQ

The hole transport region may include a buffer layer.

Also, the buffer layer may compensate for an optical resonance distance according to a wavelength of light emitted from the emission layer, and thus, the efficiency of a formed organic light-emitting device may be improved.

Then, an emission layer may be formed on the hole transport region by vacuum deposition, spin coating, casting, LB deposition, or the like. When the emission layer is formed by vacuum deposition or spin coating, the deposition or coating conditions may be similar to those applied to form the hole injection layer although the deposition or coating conditions may vary according to the material that is used to form the emission layer.

Meanwhile, when the hole transport region includes an electron blocking layer, a material for the electron blocking layer may be selected from materials for the hole transport region described above and materials for a host to be explained later. However, the material for the electron blocking layer is not limited thereto. For example, when the hole transport region includes an electron blocking layer, a material for the electron blocking layer may be mCP, which will be explained below.

The emission layer may include a host and a dopant, and the dopant may include the organometallic compound represented by Formula 1.

The host may include at least one selected from TPBi, TBADN, ADN (also referred to as "DNA"), CBP, CDBP, TCP, mCP, Compound H50, and Compound H51:

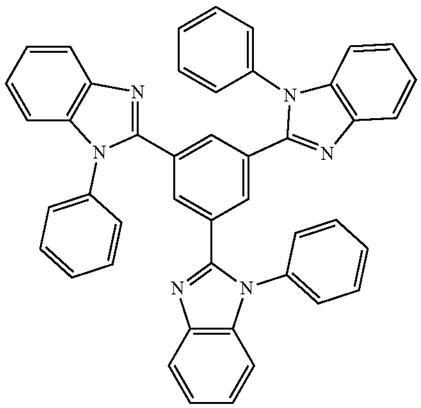

TPBi

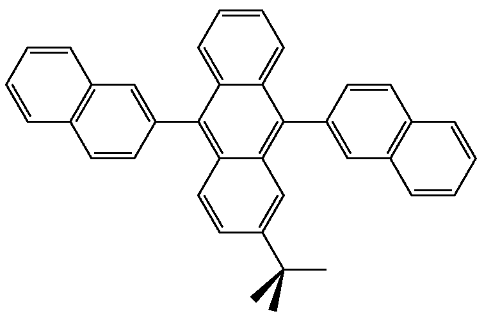

TBADN

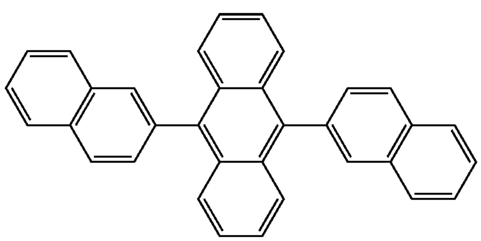

ADN

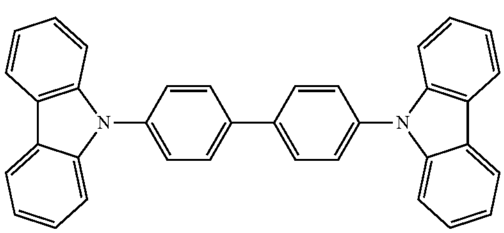

CBP

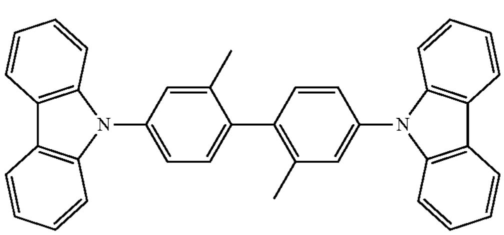

CDBP

-continued

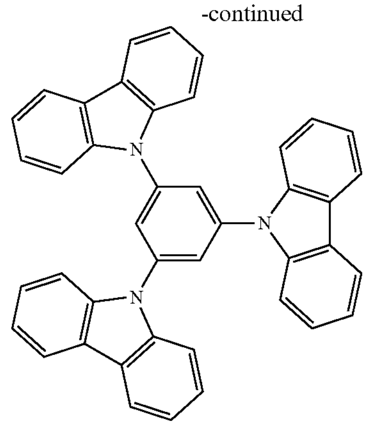

TCP

<Compound H50>

<mCP>

<Compound H51>

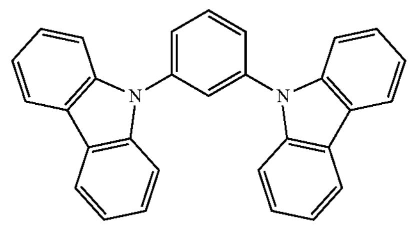

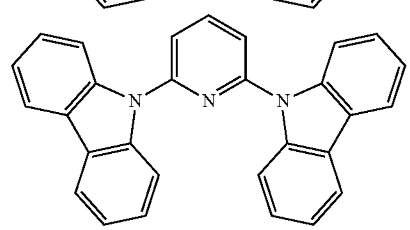

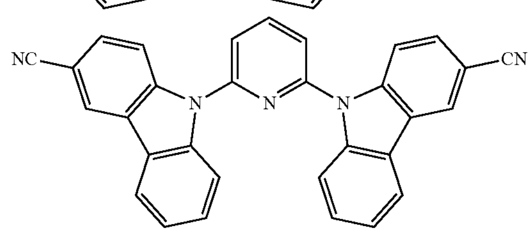

In some embodiments, the host may further include a compound represented by Formula 301 below.

Formula 301

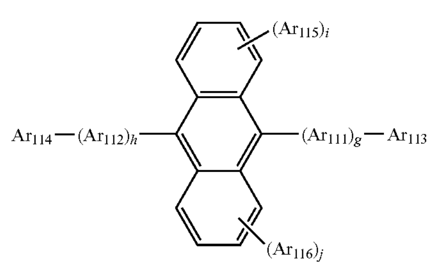

$Ar_{111}$ and $Ar_{112}$ in Formula 301 may be each independently selected from a phenylene group, a naphthylene group, a phenanthrenylene group, and a pyrenylene group; and a phenylene group, a naphthylene group, a phenanthrenylene group, and a pyrenylene group, each substituted with at least one selected from a phenyl group, a naphthyl group, and an anthracenyl group.

$Ar_{113}$ to $Ar_{116}$ in Formula 301 may be each independently selected from a $C_1$-$C_{10}$ alkyl group, a phenyl group, a naphthyl group, a phenanthrenyl group, and a pyrenyl group; and a phenyl group, a naphthyl group, a phenanthrenyl group, and a pyrenyl group, each substituted with at least one selected from a phenyl group, a naphthyl group, and an anthracenyl group.

g, h, l, and j in Formula 301 may be each independently an integer of 0 to 4, for example, an integer of 0, 1, or 2.

$Ar_{113}$ to $Ar_{116}$ in Formula 301 may be each independently selected from a $C_1$-$C_{10}$ alkyl group, substituted with at least one selected from a phenyl group, a naphthyl group, and an anthracenyl group;

a phenyl group, a naphthyl group, an anthracenyl group, a pyrenyl, a phenanthrenyl group, and a fluorenyl group;

a phenyl group, a naphthyl group, an anthracenyl group, a pyrenyl group, a phenanthrenyl group, and a fluorenyl group, each substituted with at least one selected from deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, and a fluorenyl group; and

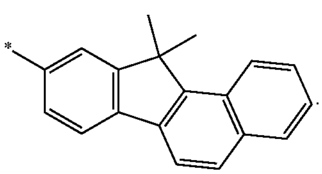 [SMILES: *c1ccc2c(c1)C(C)(C)c1c-2ccc2ccccc12]

However, they are not limited thereto.

In some embodiments, the host may include a compound represented by Formula 302 below:

Formula 302

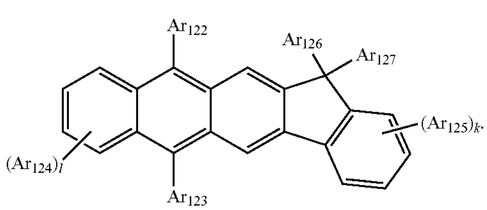

$Ar_{122}$ to $Ar_{125}$ in Formula 302 are the same as described in detail in connection with $Ar_{113}$ in Formula 301.

$Ar_{126}$ and $Ar_{127}$ in Formula 302 may be each independently a $C_1$-$C_{10}$ alkyl group (for example, a methyl group, an ethyl group, or a propyl group).

k and l in Formula 302 may be each independently an integer of 0 to 4. For example, k and l may be 0, 1, or 2.

The compound represented by Formula 301 and the compound represented by Formula 302 may include Compounds H1 to H42 illustrated below, but are not limited thereto.

H1

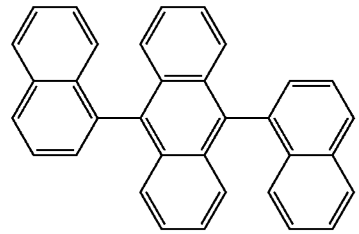

H2

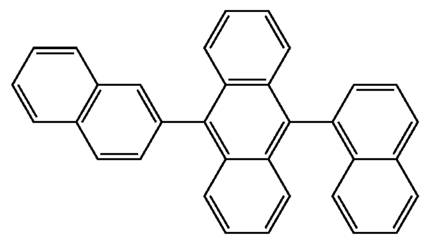

HJ3

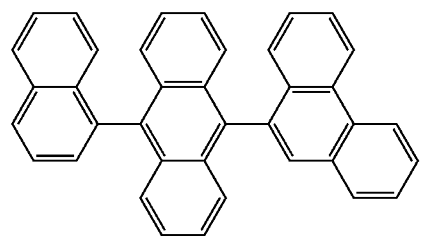

H4

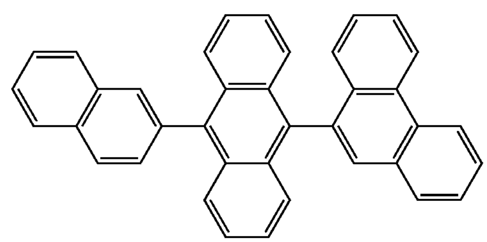

H5

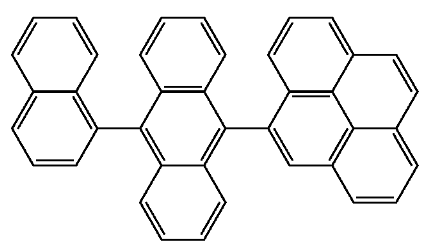

H6

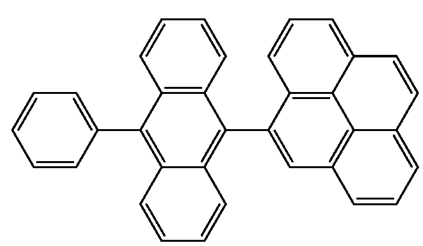

-continued
H7
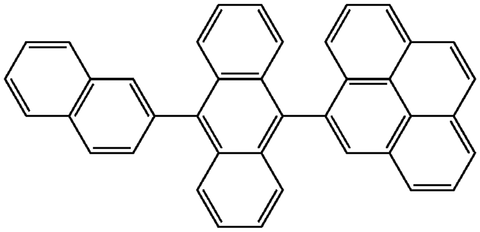
H8
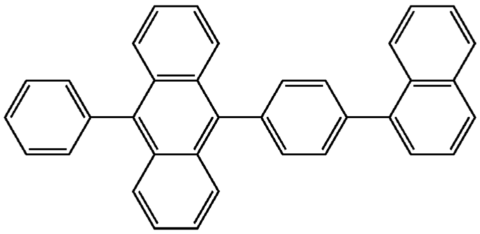
H9
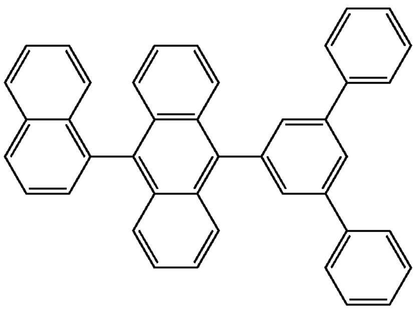
H10
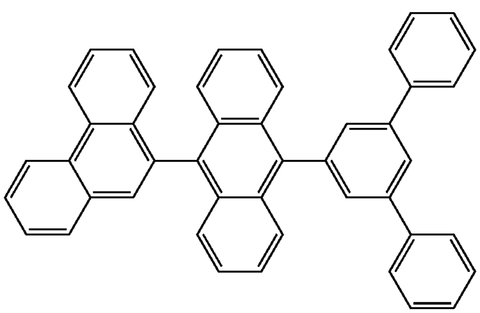
H11
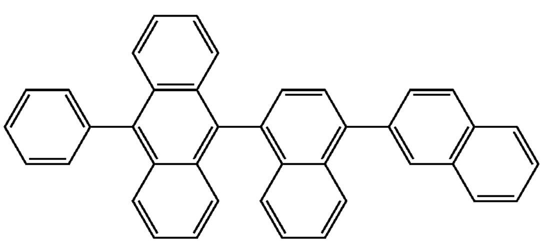
H12
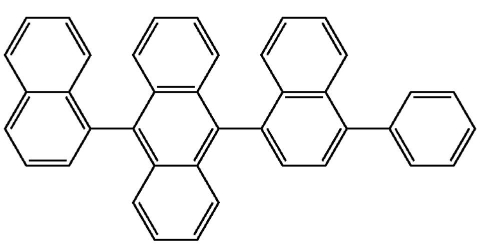
-continued
H13
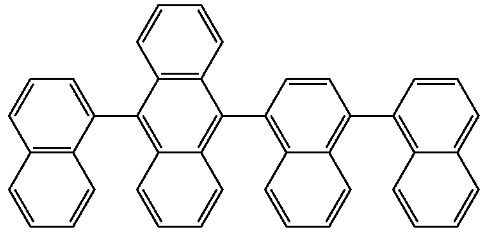
H14
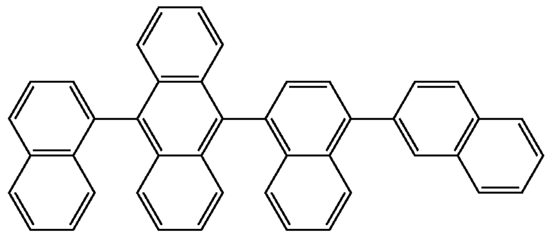
H15
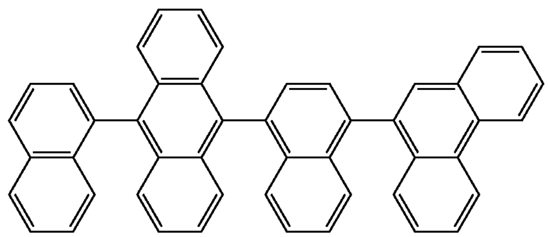
H16
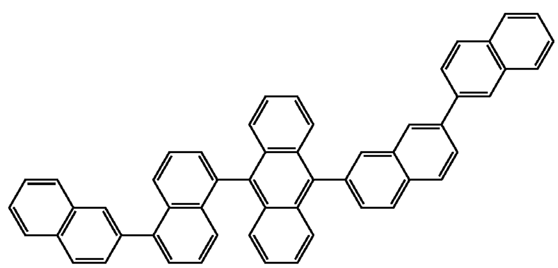
H17
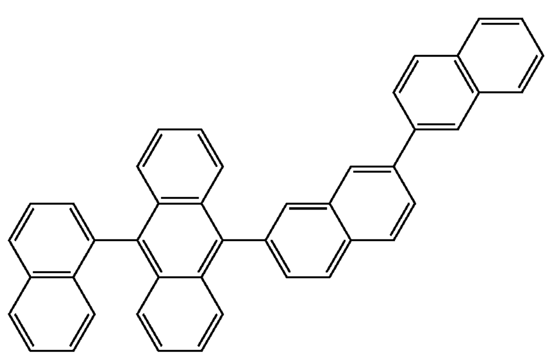

-continued
H18
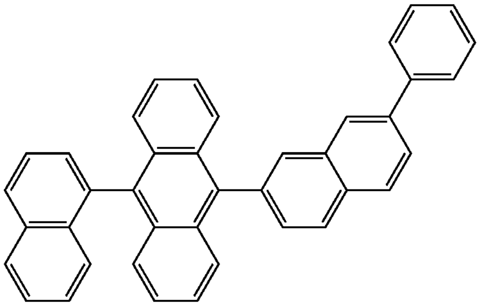
H19
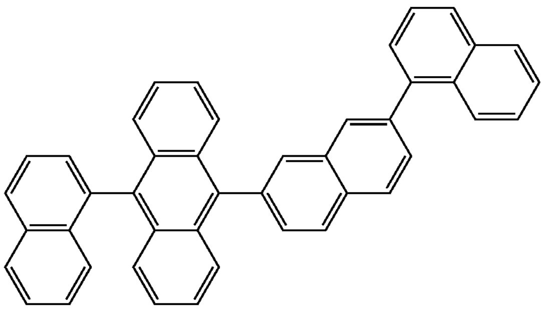
H20
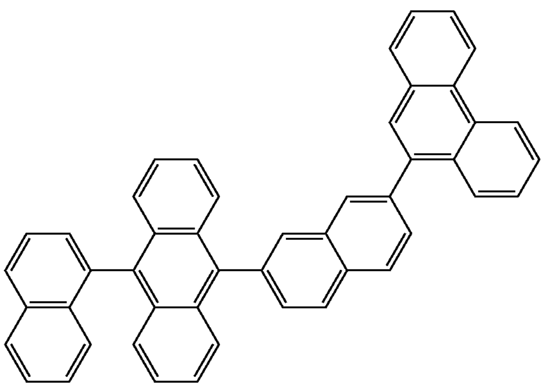
H21
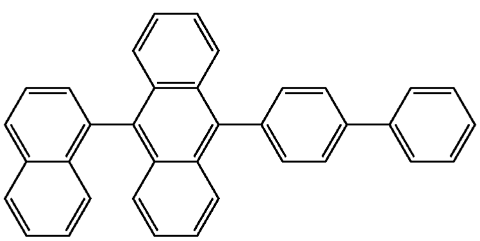
H22
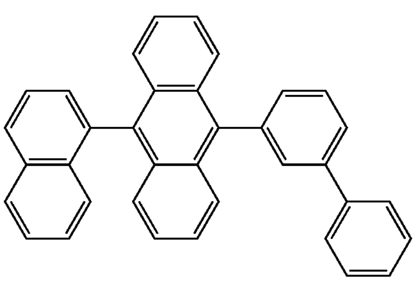
-continued
H23
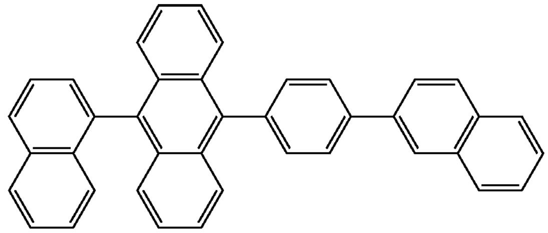
H24
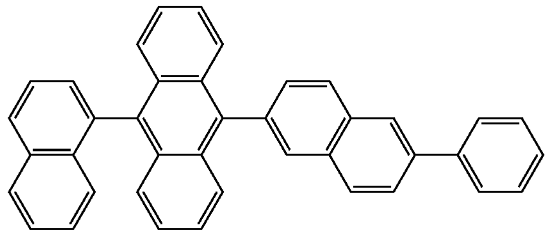
H25
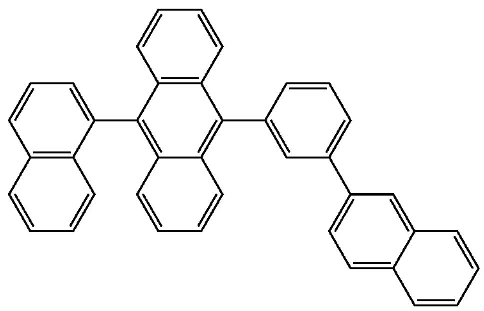
H26
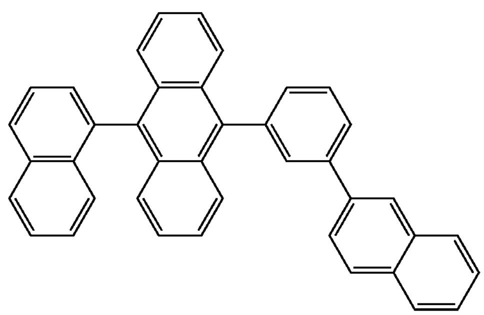
H27
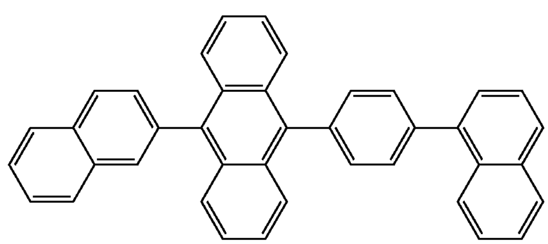

-continued
H28
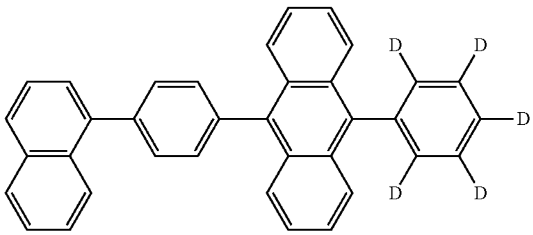
H29
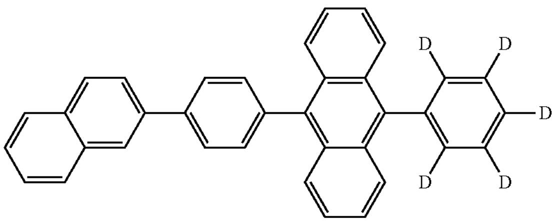
H30
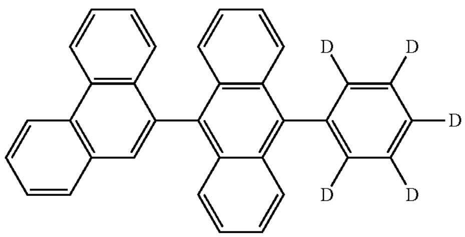
H31
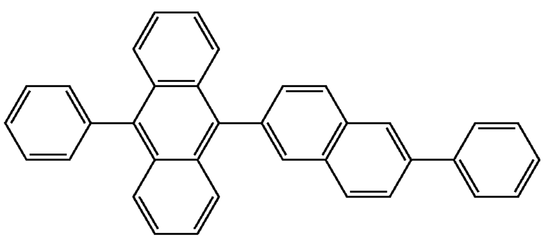
H32
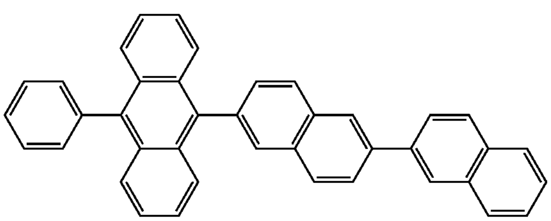
H33
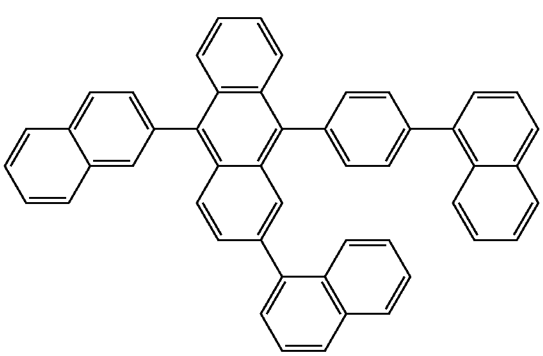
-continued
H34
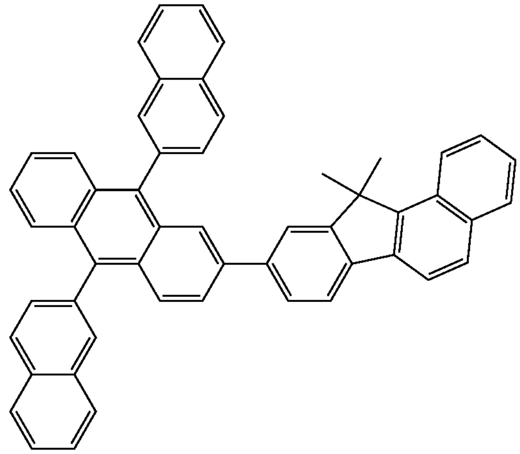
H35
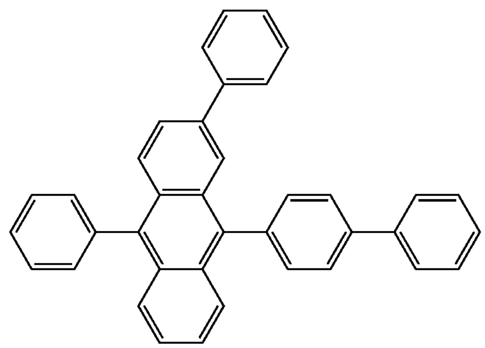
H36
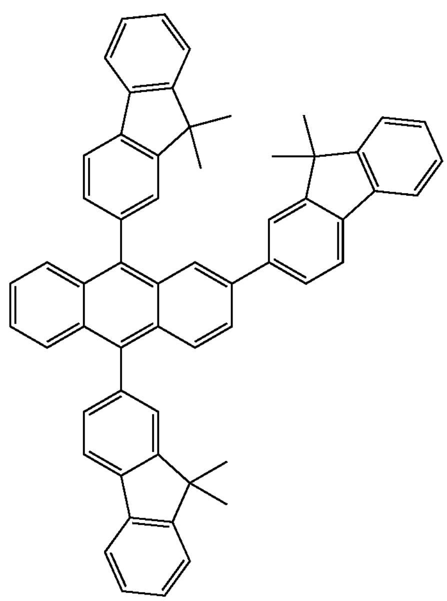

-continued

H37

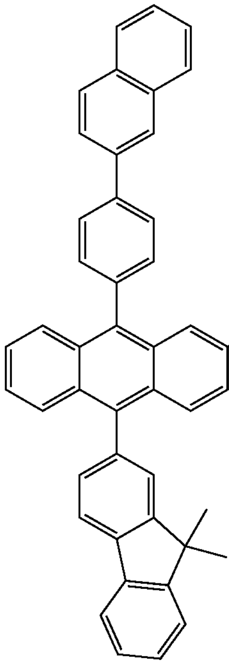

H38

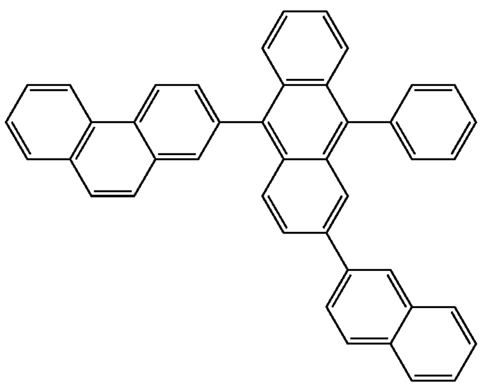

H39

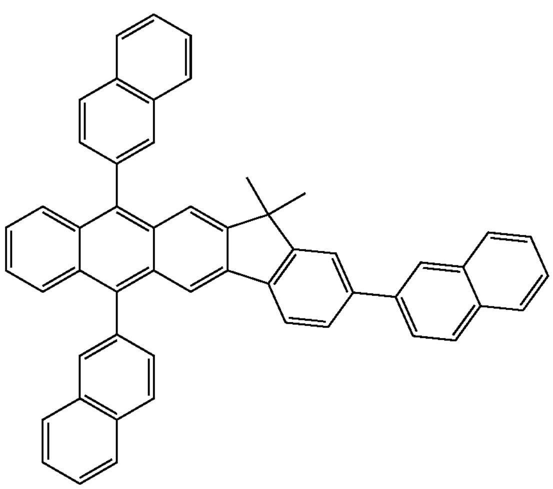

-continued

H40

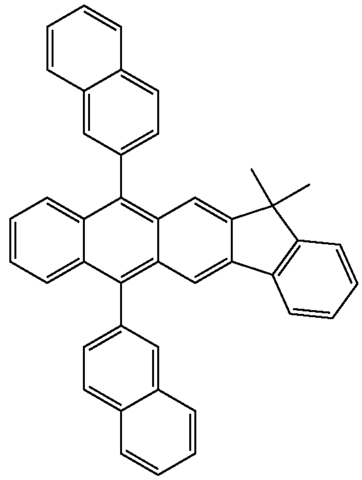

H41

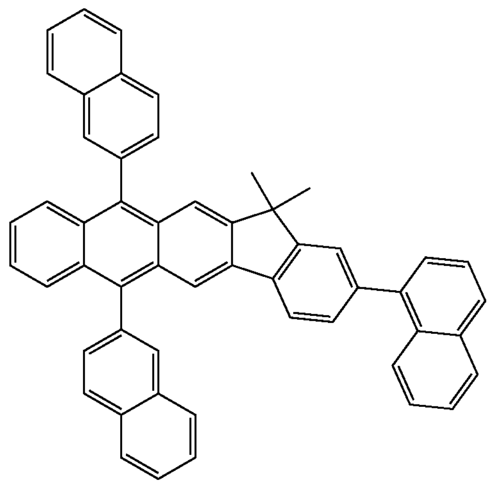

H42

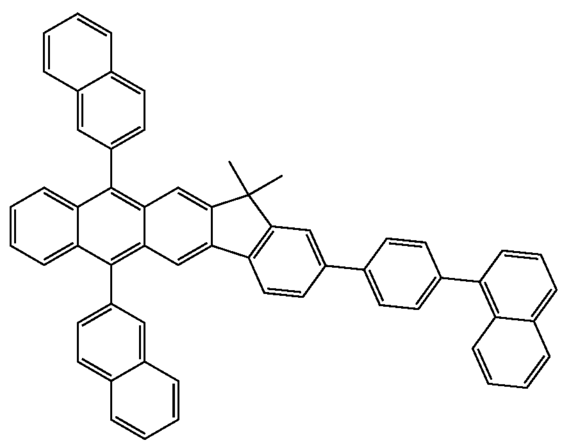

When the organic light-emitting device is a full color organic light-emitting device, the emission layer may be patterned into a red emission layer, a green emission layer, and a blue emission layer. In some embodiments, due to a stack structure including a red emission layer, a green emission layer, and/or a blue emission layer, the emission layer may emit white light.

When the emission layer includes a host and a dopant, the amount of the dopant may be in a range of about 0.01 to about 15 parts by weight based on 100 parts by weight of the host, but is not limited thereto.

A thickness of the emission layer may be in a range of about 100 Å to about 1,000 Å, for example, about 200 Å to about 600 Å. While not wishing to be bound by a theory, it is understood that when the thickness of the emission layer is within this range, excellent light-emission characteristics may be obtained without a substantial increase in driving voltage.

Then, an electron transport region may be disposed on the emission layer.

The electron transport region may include at least one selected from a hole blocking layer, an electron transport layer, and an electron injection layer.

For example, the electron transport region may have a structure of hole blocking layer/electron transport layer/electron injection layer or a structure of electron transport layer/electron injection layer, but the structure of the electron transport region is not limited thereto. The electron transport layer may have a single-layered structure or a multi-layer structure including two or more different materials.

Conditions for forming the hole blocking layer, the electron transport layer, and the electron injection layer which constitute the electron transport region may be understood by referring to the conditions for forming the hole injection layer.

When the electron transport layer includes a hole blocking layer, the hole blocking layer may include, for example, at least one of BCP, Bphen, and Balq. However, materials included in the hole blocking layer are limited thereto.

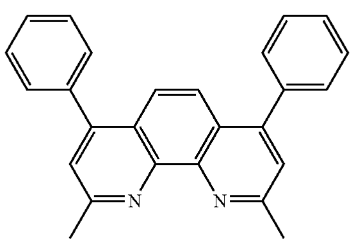

BCP

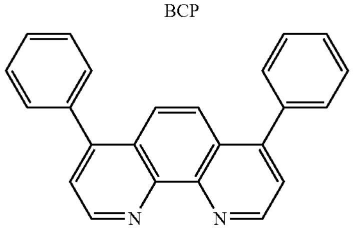

Bphen

A thickness of the hole blocking layer may be in a range of about 20 Å to about 1,000 Å, for example, about 30 Å to about 300 Å. While not wishing to be bound by a theory, it is understood that when the thickness of the hole blocking layer is within these ranges, the hole blocking layer may have improved hole blocking ability without a substantial increase in driving voltage.

The electron transport layer may further include at least one selected from BCP, Bphen, $Alq_3$, Balq, TAZ, and NTAZ.

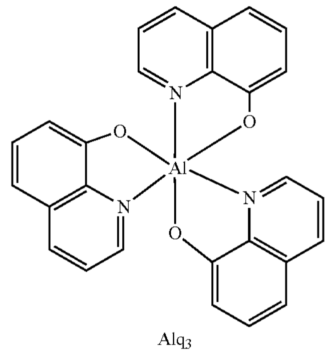

$Alq_3$

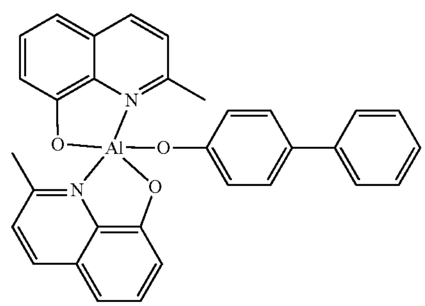

BAlq

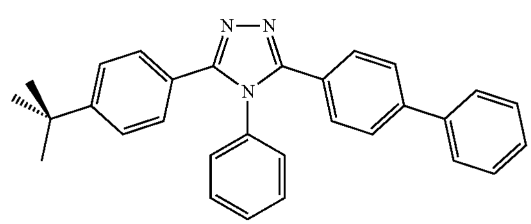

TAZ

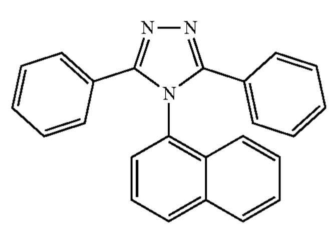

NTAZ

In some embodiments, the electron transport layer may include at least one of ET1 and ET2, but are not limited thereto:

ET1

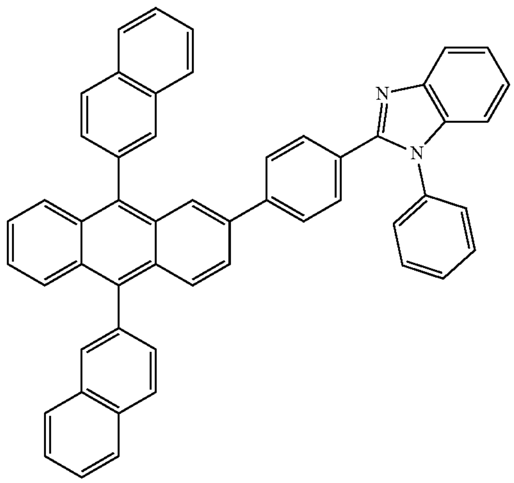

ET2

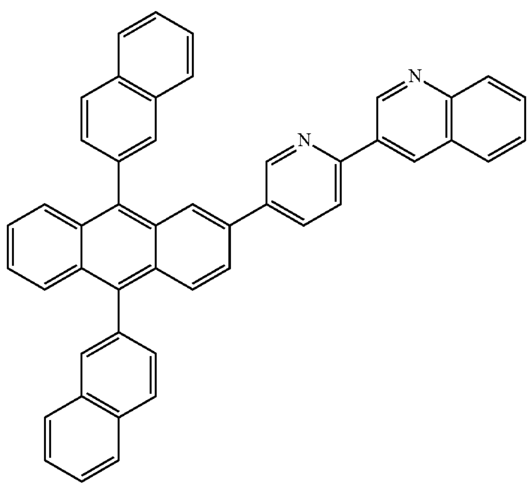

A thickness of the electron transport layer may be in a range of about 100 Å to about 1,000 Å, for example, about 150 Å to about 500 Å. While not wishing to be bound by a theory, it is understood that when the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (lithium quinolate, LiQ) or ET-D2.

ET-D1

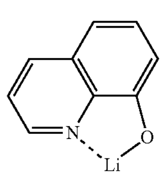

-continued

ET-D2

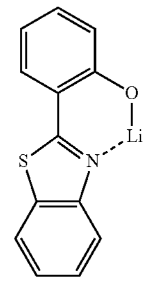

The electron transport layer may include an electron injection layer (EIL) that promotes flow of electrons from the second electrode 19 thereinto.

The electron injection layer may include at least one selected from, LiF, NaCl, CsF, $Li_2O$, BaO, and LiQ.

A thickness of the electron injection layer may be in a range of about 1 Å to about 100 Å, for example, about 3 Å to about 90 Å. While not wishing to be bound by a theory, it is understood that when the thickness of the electron injection layer is within the range described above, the electron injection layer may have satisfactory electron injection characteristics without a substantial increase in driving voltage.

The second electrode 19 is disposed on the organic layer 15. The second electrode 19 may be a cathode. A material for forming the second electrode 19 may be selected from metal, an alloy, an electrically conductive compound, and a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be formed as a material for forming the second electrode 19. In some embodiments, to manufacture a top emission type light-emitting device, a transmissive electrode formed using ITO or IZO may be used as the second electrode 19.

Hereinbefore, the organic light-emitting device has been described with reference to FIG. 1, but is not limited thereto.

A $C_1$-$C_{60}$ alkyl group as used herein refers to a linear or branched aliphatic hydrocarbon monovalent group having 1 to 60 carbon atoms. Detailed examples thereof are a methyl group, an ethyl group, a propyl group, an isobutyl group, a sec-butyl group, a tert-butyl group, a pentyl group, an iso-amyl group, and a hexyl group. A $C_1$-$C_{60}$ alkylene group as used herein refers to a divalent group having the same structure as the $C_1$-$C_{60}$ alkyl group.

A $C_1$-$C_{60}$ alkoxy group as used herein refers to a monovalent group represented by $—OA_{101}$ (wherein $A_{101}$ is the $C_1$-$C_{60}$ alkyl group). Detailed examples thereof are a methoxy group, an ethoxy group, and an isopropyloxy group.

A $C_2$-$C_{60}$ alkenyl group as used herein refers to a hydrocarbon group formed by placing at least one carbon double bond in the middle or at the terminal of the $C_2$-$C_{60}$ alkyl group. Detailed examples thereof are an ethenyl group, a propenyl group, and a butenyl group. A $C_2$-$C_{60}$ alkenylene group as used herein refers to a divalent group having the same structure as the $C_2$-$C_{60}$ alkenyl group.

A $C_2$-$C_{60}$ alkynyl group as used herein refers to a hydrocarbon group formed by placing at least one carbon triple bond in the middle or at the terminal of the $C_2$-$C_{60}$ alkyl group. Detailed examples thereof are an ethynyl group, and a propynyl group. A $C_2$-$C_{60}$ alkynylene group as used herein refers to a divalent group having the same structure as the $C_2$-$C_{60}$ alkynyl group.

A $C_3$-$C_{10}$ cycloalkyl group as used herein refers to a monovalent hydrocarbon monocyclic group having 3 to 10 carbon atoms. Detailed examples thereof are a cyclopropyl group, a cyclobutyl group, a cyclopentyl group, a cyclohexyl group, and a cycloheptyl group. A $C_3$-$C_{10}$ cycloalkylene group as used herein refers to a divalent group having the same structure as the $C_3$-$C_{10}$ cycloalkyl group.

A $C_1$-$C_{10}$ heterocycloalkyl group as used herein refers to a monovalent monocyclic group having at least one hetero atom selected from N, O, P, Si, and S as a ring-forming atom and 1 to 10 carbon atoms. Detailed examples thereof are a tetrahydrofuranyl group, and a tetrahydrothiophenyl group. A $C_1$-$C_{10}$ heterocycloalkylene group as used herein refers to a divalent group having the same structure as the $C_1$-$C_{10}$ heterocycloalkyl group.

A $C_3$-$C_{10}$ cycloalkenyl group as used herein refers to a monovalent monocyclic group that has 3 to 10 carbon atoms and at least one double bond in the ring thereof, and which is not aromatic. Detailed examples thereof are a cyclopentenyl group, a cyclohexenyl group, and a cycloheptenyl group. A $C_3$-$C_{10}$ cycloalkenylene group as used herein refers to a divalent group having the same structure as the $C_3$-$C_{10}$ cycloalkenyl group.

A $C_1$-$C_{10}$ heterocycloalkenyl group as used herein refers to a monovalent monocyclic group that has at least one hetero atom selected from N, O, P, Si, and S as a ring-forming atom, 1 to 10 carbon atoms, and at least one double bond in its ring. Examples of the $C_1$-$C_{10}$ heterocycloalkenyl group are a 2,3-dihydrofuranyl group and a 2,3-dihydrothiophenyl group. A $C_1$-$C_{10}$ heterocycloalkenylene group as used herein refers to a divalent group having the same structure as the $C_1$-$C_{10}$ heterocycloalkenyl group.

A $C_6$-$C_{60}$ aryl group as used herein refers to a monovalent group having a carbocyclic aromatic system having 6 to 60 carbon atoms, and a $C_6$-$C_{60}$ arylene group as used herein refers to a divalent group having a carbocyclic aromatic system having 6 to 60 carbon atoms. Detailed examples of the $C_6$-$C_{60}$ aryl group are a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

A $C_1$-$C_{60}$ heteroaryl group as used herein refers to a monovalent group having a carbocyclic aromatic system that has at least one hetero atom selected from N, O, P, Si, and S as a ring-forming atom, and 1 to 60 carbon atoms. A $C_1$-$C_{60}$ heteroarylene group as used herein refers to a divalent group having a carbocyclic aromatic system that has at least one hetero atom selected from N, O, P, Si, and S as a ring-forming atom, and 1 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

A $C_6$-$C_{60}$ aryloxy group as used herein indicates —$OA_{102}$ (wherein $A_{102}$ is the $C_6$-$C_{60}$ aryl group), and a $C_6$-$C_{60}$ arylthio group as used herein indicates —$SA_{103}$ (wherein $A_{103}$ is the $C_6$-$C_{60}$ aryl group).

A monovalent non-aromatic condensed polycyclic group as used herein refers to a monovalent group (for example, having 8 to 60 carbon atoms) that has two or more rings condensed to each other, only carbon atoms as a ring forming atom, and which is non-aromatic in the entire molecular structure. A detailed example of the monovalent non-aromatic condensed polycyclic group is a fluorenyl group. A divalent non-aromatic condensed polycyclic group as used herein refers to a divalent group having the same structure as the monovalent non-aromatic condensed polycyclic group.

A monovalent non-aromatic condensed heteropolycyclic group as used herein refers to a monovalent group (for example, having 2 to 60 carbon atoms) that has two or more rings condensed to each other, has a heteroatom selected from N, O P, and S, other than carbon atoms, as a ring forming atom, and which is non-aromatic in the entire molecular structure. An example of the monovalent non-aromatic condensed heteropolycyclic group is a carbazolyl group. A divalent non-aromatic condensed heteropolycyclic group as used herein refers to a divalent group having the same structure as the monovalent non-aromatic condensed heteropolycyclic group.

In the present specification, at least one of substituents of the substituted $C_1$-$C_{60}$ alkyl group, substituted $C_2$-$C_{60}$ alkenyl group, substituted $C_2$-$C_{60}$ alkynyl group, substituted $C_1$-$C_{60}$ alkoxy group, substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group may be selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from a deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, and —$P(=O)(Q_{18})(Q_{19})$;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, and —$P(=O)(Q_{28})(Q_{29})$; and —$N(Q_{31})(Q_{32})$, —$Si(Q_{33})(Q_{34})(Q_{35})$, —$B(Q_{36})(Q_{37})$, and —$P(=O)(Q_{38})(Q_{39})$, wherein $Q_1$ to $Q_9$, $Q_{11}$ to $Q_{19}$, $Q_{21}$ to $Q_{29}$, and $Q_{31}$ to $Q_{39}$ are each independently selected from hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{50}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

When a group containing a specified number of carbon atoms is substituted with any of the substituents listed above, the number of carbon atoms in the resulting "substituted" group may be the number of atoms contained in the original (base) group plus the number of carbon atoms (if any) contained in the substituent. For example, the "substituted $C_1$-$C_{30}$ alkyl" may refer to a $C_1$-$C_{30}$ alkyl group substituted with C-so aryl group, in which the total number of carbon atoms may be $C_7$-$C_{90}$.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1: Synthesis of Compound 1

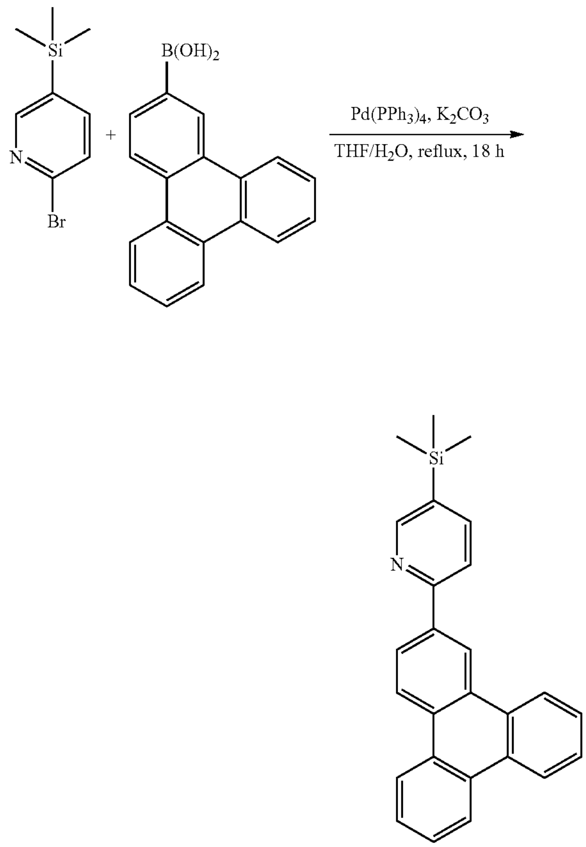

L1

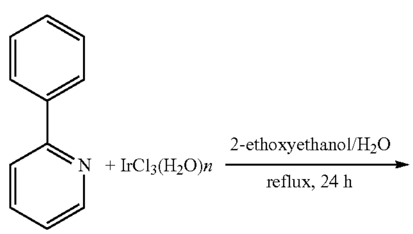

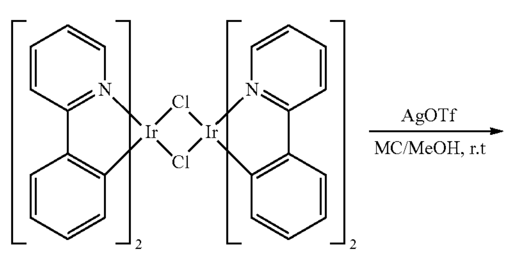

A

-continued

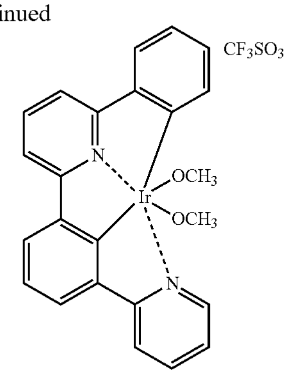

B

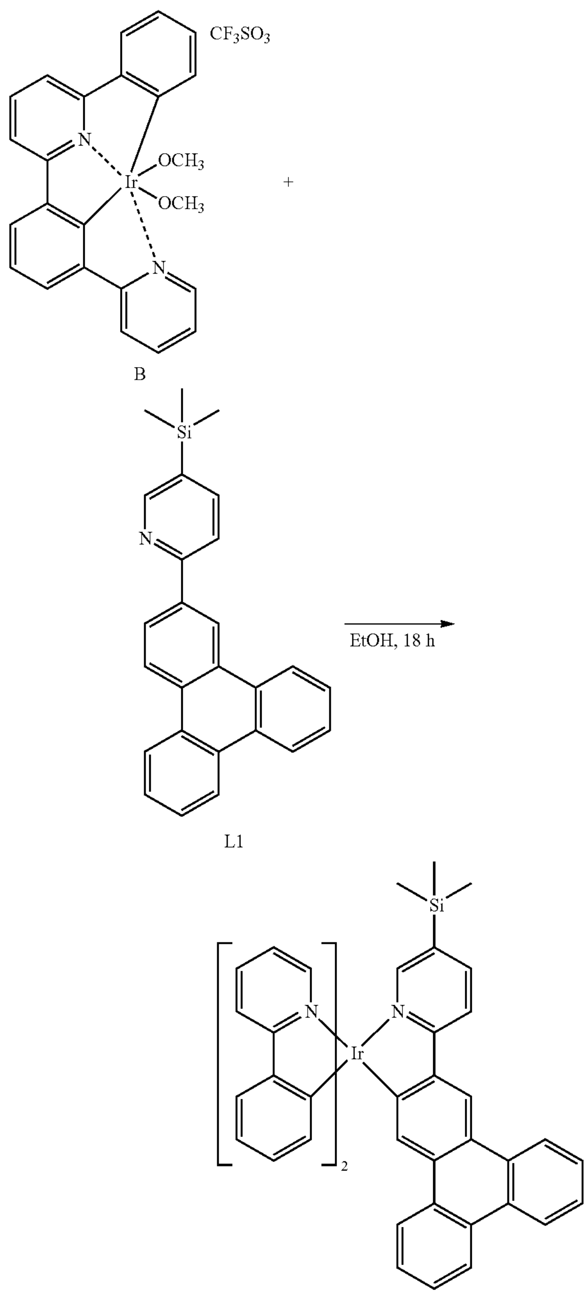

B

L1

1

Synthesis of Compound L1

2-bromo-5-(trimethylsilyl)pyridine (9.15 grams (g), 39.73 millimoles (mmol)), triphenylen-2-ylboronic acid (12.43 g, 45.69 mmol), $Pd(PPh_3)_4$(3.06 g, 2.65 mmol), and $K_2CO_3$ (21.94 g, 158.74 mmol) were mixed with 210 milliliters (mL) of tetrahydrofuran (THF) and 70 mL of distilled water, and the mixture was stirred for 18 hours under reflux. The temperature was decreased to room temperature, and the organic layer was extracted by using methylene chloride (MC). Anhydrous magnesium sulfate ($MgSO_4$) was added thereto to remove moisture therefrom. The result was filtered to obtain a filtrate, and the solvent was removed under reduced pressure. The residual was purified by column chromatography using MC and hexane at a ratio of 1:1 to obtain 10.40 g (69%) of Compound L1.

MALDI-TOFMS (m/z): $C_{26}H_{23}NSi$ ($M^+$) 378.

Synthesis of Compound A 2-phenylpyridine (14.66 g, 94.44 mmol) and iridium chloride (14.80 g, 41.97 mmol) were mixed with 210 mL of ethoxyethanol and 70 mL of distilled water. The mixture was stirred for 24 hours under reflux to perform a reaction. The temperature was then decreased to room temperature. A solid obtained therefrom was separated therefrom by filtration, and was thoroughly washed with water, methanol, and hexane sequentially in this stated order. The resultant solid was dried in a vacuum oven to obtain 19.5 g (87%) of Compound A.

Synthesis of Compound B

Compound A (4.51 g, 4.20 mmol) was mixed with 45 mL of MC, and AgOTf (2.16 g, 8.41 mmol) dissolved in 15 mL of methanol was added thereto. While light was blocked by using an aluminum foil, the mixture was stirred at room temperature for 18 hours to perform a reaction. The reaction mixture was filtered through celite to remove generated solid therefrom. A filtrate was placed under reduced pressure to obtain a solid (Compound B), which was used in the subsequent reaction without additional purification.

Synthesis of Compound 1

Compound B (6.0 g, 8.41 mmol) and Compound L1 (3.81 g, 10.10 mmol) were mixed with 100 mL of ethanol, and the mixture was stirred for 18 hours under reflux to perform a reaction. After the temperature was decreased, the resultant mixture was filtered to obtain a solid, which was thoroughly washed with ethanol and hexane. The crude product was purified by column chromatography using MC and hexane at a ratio of 40:60 to obtain 1.4 g (19%) of Compound 1. The obtained compound was identified by Mass and HPLC.

HRMS (MALDI-TOF) calcd for $C_{48}H38IrN_3Si$: m/z 877.2464, Found: 877.2461.

Synthesis Example 2: Synthesis of Compound 2

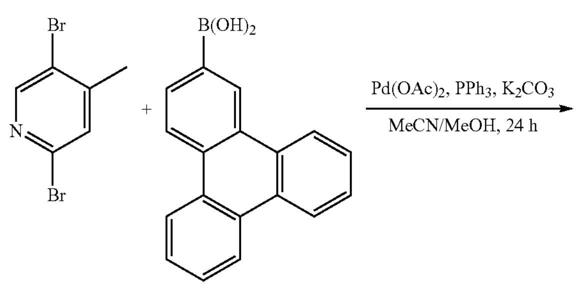

-continued

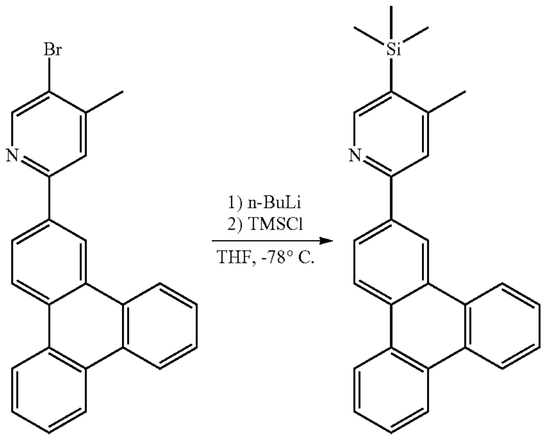

C L2

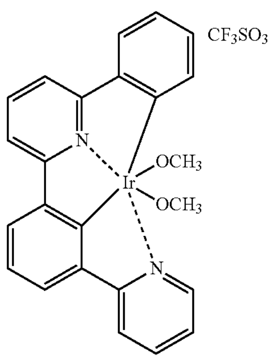

B

+

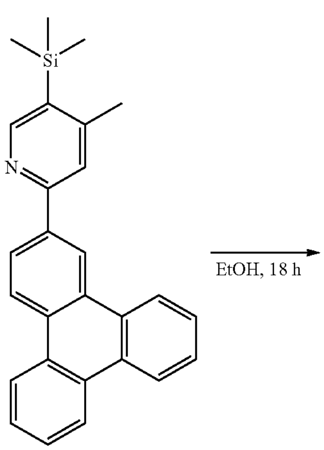

L2

-continued

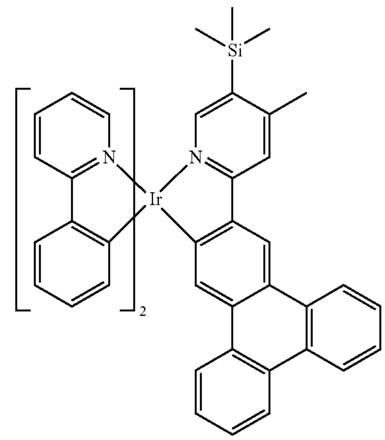

2

Synthesis of Compound C 9.5 g (60%) of Compound C was prepared in the same manner as Compound L1 in Synthesis Example 1, except that 2,5-dibromo-4-methylpyridine (10 g, 39.86 mmol) was used instead of 2-bromo-5-(trimethylsilyl)pyridine.

MALDI-TOFMS (m/z): $C_{27}$H25NSi ($M^+$) 397.

Synthesis of Compound L2

100 mL of tetrahydrofuran (THF) was added to Compound C (6.09 g, 15.31 mmol), and the mixture was cooled to a temperature of −78° C. n-BuLi (14.4 mL, 22.96 mmol) was slowly added thereto, and the result was stirred at a temperature of −78° C. for 1 hour. Trimethylsilyl chloride (TMSCl) (2.91 mL, 22.96 mmol) was added thereto, and a reaction was performed at a temperature of −78° C. for 1 hour. The reaction product was heated to room temperature to perform a reaction for 12 hours. An organic layer was extracted therefrom by using MC, and anhydrous magnesium sulfate was added thereto to remove moisture therefrom. The filtrate obtained by filtration was placed under reduced pressure to evaporate the solvent. The residue was purified by column chromatography using EA and hexane at a ratio of 5:95 to obtain 4.8 g (80%) of Compound L2.

MALDI-TOFMS (m/z): $C_{27}$H25NSi ($M^+$) 391.

Synthesis of Compound 2

1.9 g (32%) of Compound 2 was prepared in the same manner as Compound 1 in Synthesis Example 1, except that Compound L2 (3.17 g, 8.08 mmol) was used instead of Compound L1. The obtained compound was confirmed by Mass and HPLC.

HRMS (MALDI-TOF) calcd for $C_{49}H_{40}IrN_3Si$: m/z 891.2621, Found: 891.2621.

Synthesis Example 3: Synthesis of Compound 3

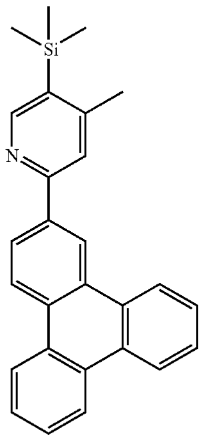

L2

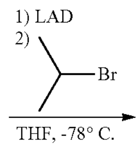

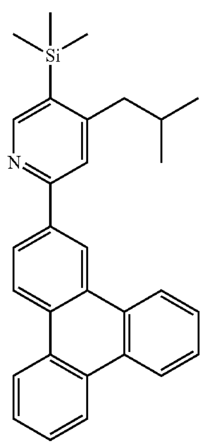

L3

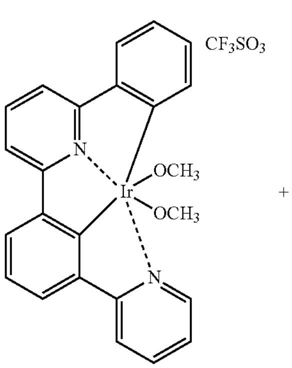

B

-continued

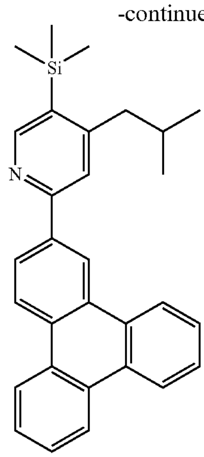

L3

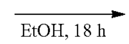

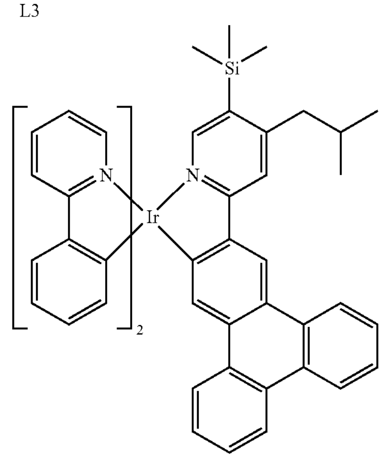

3

Synthesis of Compound L3

Compound L2 (4.52 g, 11.52 mmol) was mixed with 70 mL of THF, and the mixture was cooled to a temperature of −78° C. Lithium diisopropylamide (LDA, 14.4 mL, 28.8 mmol) was slowly added thereto. The resulting mixture was stirred at a temperature of −78° C. for 1 hour to perform a reaction, and then at room temperature for an additional 1.5 hours. Subsequently, the temperature was decreased to −78° C., and 2-bromopropane (2.70 mL, 28.8 mmol) was slowly added thereto. The temperature was increased to room temperature and a reaction was performed for 12 hours. The organic layer obtained therefrom was extracted using MC, and anhydrous magnesium sulfate was added thereto to remove moisture therefrom. A filtrate obtained by filtration was placed under reduced pressure to remove solvent. The residual was subjected to column chromatography using EA and hexane at a ratio of 10:90 to obtain 4.3 g (86%) of Compound L3.

MALDI-TOFMS (m/z): $C_{30}H_{31}NSi$ ($M^+$) 434.

Synthesis of Compound 3

1.8 g (32%) of Compound 3 was prepared in the same manner as Compound 1 in Synthesis Example 1, except that Compound L3 (3.35 g, 7.71 mmol) was used instead of Compound L1. The obtained compound was confirmed by Mass and HPLC.

HRMS (MALDI-TOF) calcd for $C_{52}H_{46}IrN_3Si$: m/z 933.3090, Found: 933.3092.

Synthesis Example 4: Synthesis of Compound 4

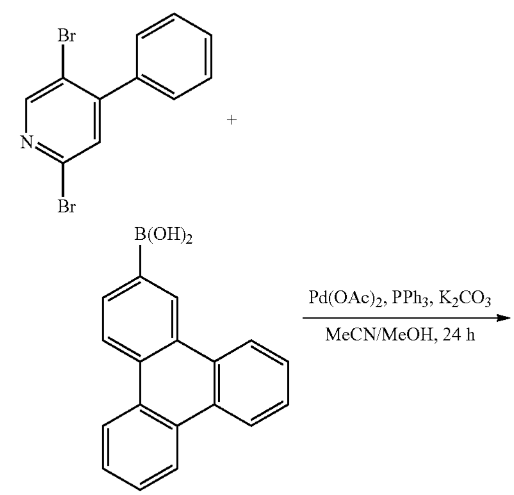

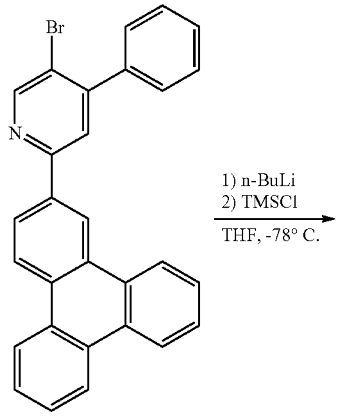

D

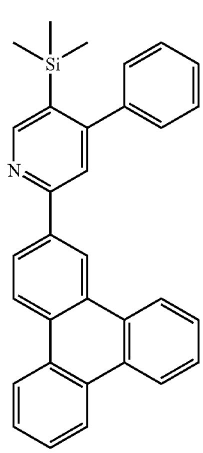

L4

-continued

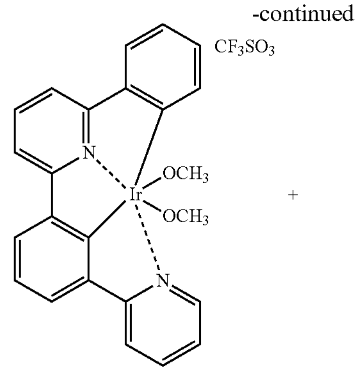

B

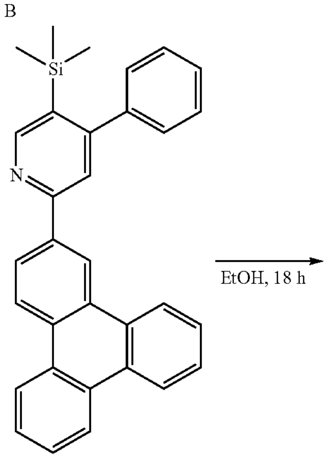

L4

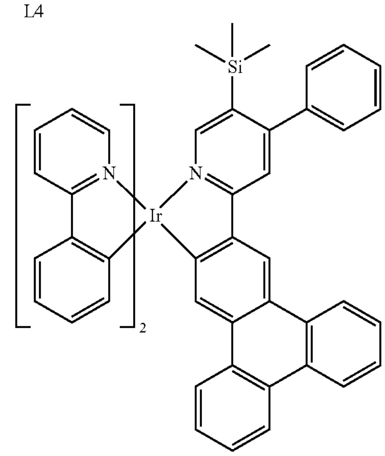

4

Synthesis of Compound D 10.4 g (74%) of Compound D was prepared in the same manner as Compound L1 in Synthesis Example 1, except that 2,5-dibromo-4-phenylpyridine (9.518 g, 30.41 mmol) was used instead of 2-bromo-5-(trimethylsilyl)pyridine.

MALDI-TOFMS (m/z): $C_{29}H_{18}BrN$ ($M^+$) 459.

Synthesis of Compound L4

6.7 g (84%) of Compound L4 was prepared in the same manner as Compound L2 in Synthesis Example 2, except that Compound D (8.106 g, 17.66 mmol) was used instead of Compound C.

MALDI-TOFMS (m/z): $C_{32}H_{27}NSi$ ($M^+$) 453.

Synthesis of Compound 4

1.1 g (22%) of Compound 4 was prepared in the same manner as Compound 1 in Synthesis Example 1, except that Compound L4 (2.912 g, 6.43 mmol) was used instead of Compound L1. The obtained compound was confirmed by Mass and HPLC.

HRMS (MALDI-TOF) calcd for $C_{54}H_{42}IrN_3Si$: m/z 953.2777, Found: 953.2775.

Synthesis Example 5: Synthesis of Compound 97

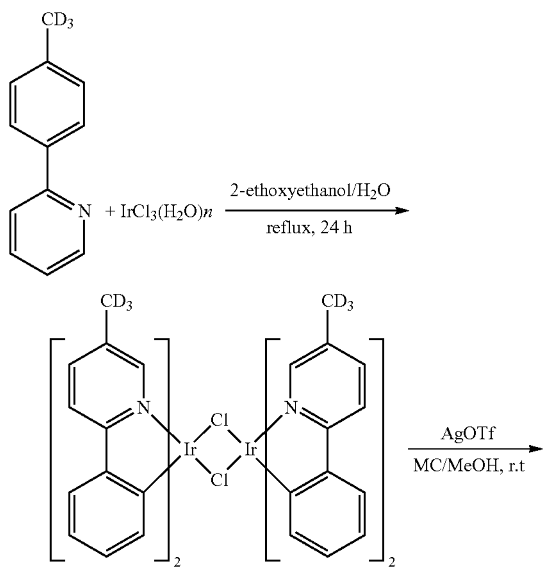

E

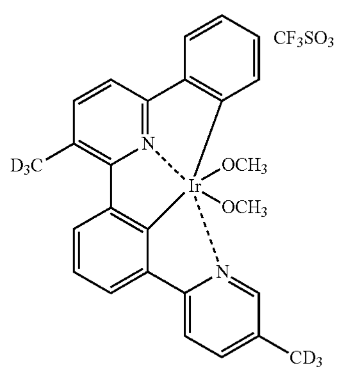

F

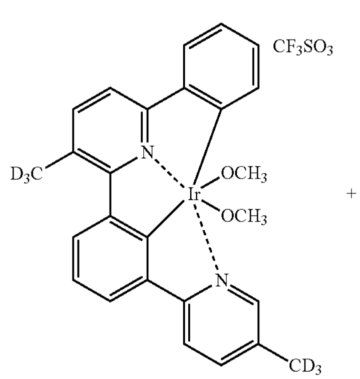

F

-continued

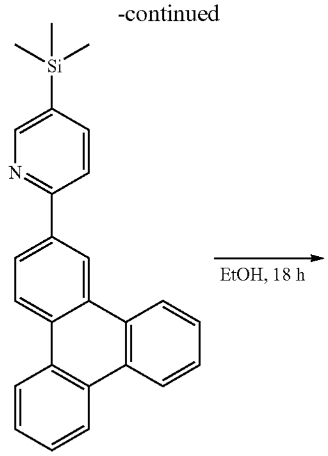

L1

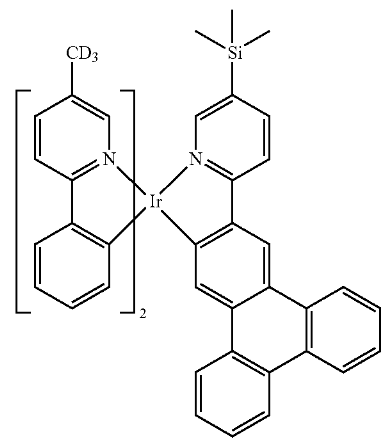

97

Synthesis of Compound E 2-(5-(methylD$_3$))phenylpyridine (8.74 g, 33.07 mmol) and iridium chloride (7.95 g, 22.5 mmol) were mixed with 120 mL of ethoxyethanol and 40 mL of distilled water. The mixture was stirred for 24 hours under reflux to perform a reaction. The temperature was then decreased to room temperature. A solid generated therefrom was separated by filtration, and thoroughly washed with water, methanol, and hexane sequentially in this stated order. The resultant solid was dried in a vacuum oven to obtain Compound E (11 g, 86%).

Synthesis of Compound F

Compound E (4.59 g, 4.02 mmol) was mixed with 210 mL of MC, and AgOTf (2.07 g, 8.04 mmol) dissolved in 70 mL of methanol was added thereto. Thereafter, while light was blocked by using an aluminum foil, a reaction was performed at room temperature for 18 hours. The generated solid was removed therefrom by celite filtration. A filtrate was placed under reduced pressure to obtain a solid (Compound F), which was used in the subsequent reaction without additional purification.

Synthesis of Compound 97

1.7 g (34%) of Compound 97 was prepared in the same manner as Compound 1 in Synthesis Example 1, except that Compound F was used instead of Compound B. The obtained compound was confirmed by Mass and HPLC.

HRMS (MALDI-TOF) calcd for $C_{50}H_{36}D_6IrN_3Si$: m/z 911.3154, Found: 911.3154.

Synthesis Example 6: Synthesis of Compound 99

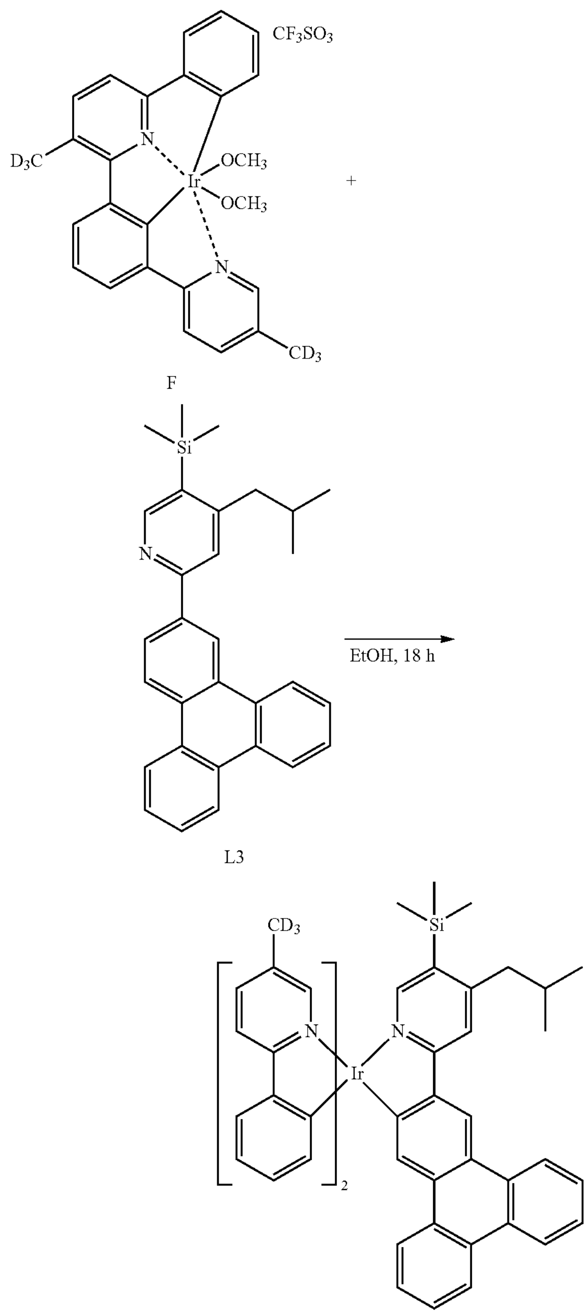

99

1.4 g (28%) of Compound 99 was prepared in the same manner as Compound 1 in Synthesis Example 1, except that Compound F was used instead of Compound B and Compound L3 (2.767 g, 6.39 mmol) was used instead of Compound L1. The obtained compound was confirmed by Mass and HPLC.

HRMS (MALDI-TOF) calcd for $C_{54}H_{44}D_6IrN_3Si$: m/z 967.3780, Found: 967.3781.

Synthesis Example 7: Synthesis of Compound 100

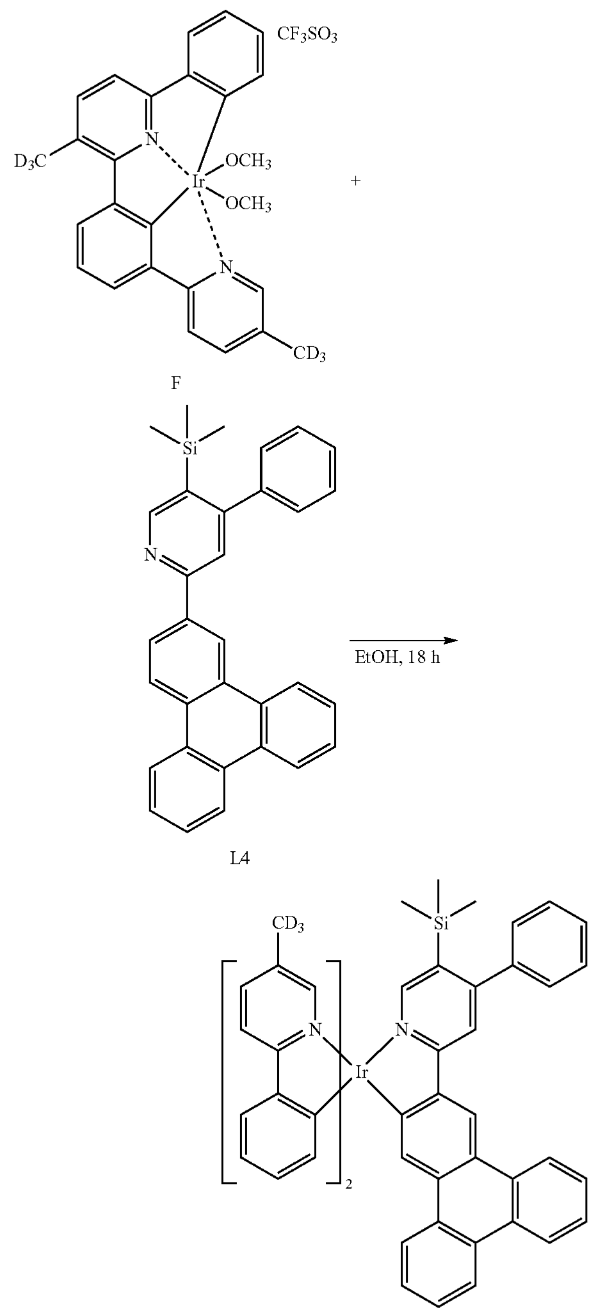

100

1.07 g (21%) of Compound 100 was prepared in the same manner as Compound 1 in Synthesis Example 1, except that Compound F was used instead of Compound B and Compound L4 (2.755 g, 6.08 mmol) was used instead of Compound L1. The obtained compound was confirmed by Mass and HPLC.

HRMS (MALDI-TOF) calcd for $C_{56}H_{40}D_6IrN_3Si$: m/z 987.3467, Found: 987.3469.

Synthesis Example 8: Synthesis of Compound 145

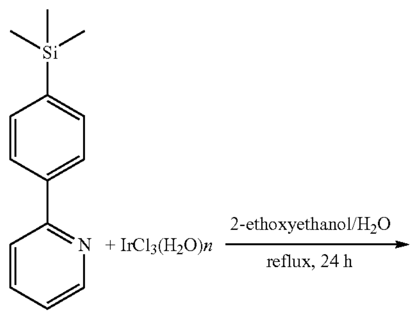

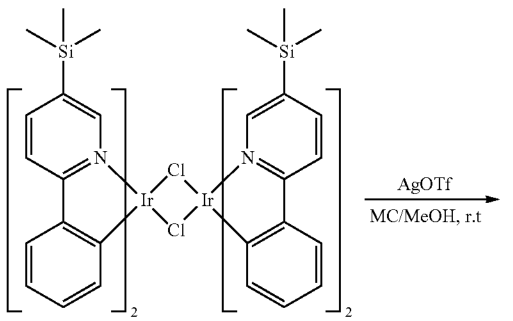

G

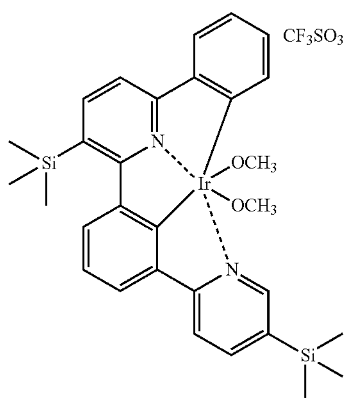

H

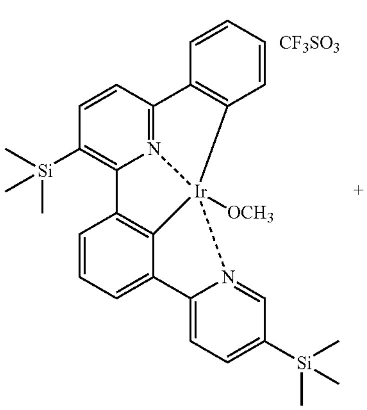

H

-continued

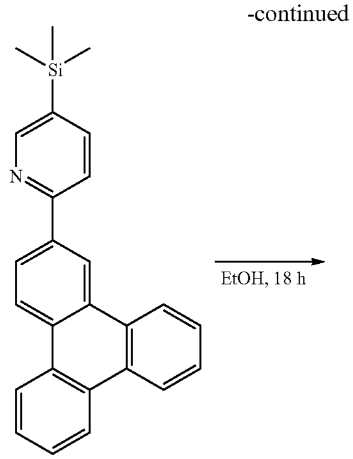

L1

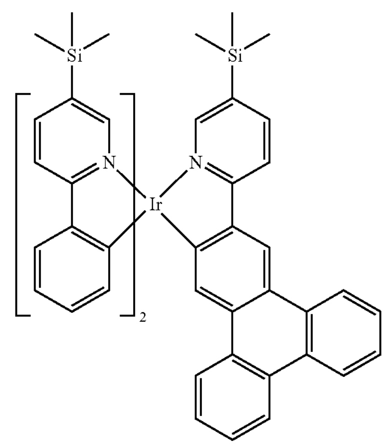

145

Synthesis of Compound G 2-(4-(trimethylsilyl))phenylpyridine (7.05 g, 33.07 mmol) and iridium chloride (5.18 g, 14.7 mmol) were mixed with 75 mL of ethoxyethanol and 25 mL of distilled water. The mixture was stirred for 24 hours under reflux to perform a reaction. The temperature was then decreased to room temperature. A solid generated therefrom was separated by filtration, and thoroughly washed with water, methanol, and hexane sequentially in this stated order to obtain a solid, which was then dried in a vacuum oven to obtain Compound G (9.01 g, 90%).

Synthesis of Compound H

Compound D (2.78 g, 2.04 mmol) was mixed with 60 mL of MC, and AgOTf (1.05 g, 4.08 mmol) dissolved in 20 mL of methanol was added thereto. While light was blocked by using aluminum foil, a reaction was performed at room temperature for 18 hours. The generated solid was removed by filtration through celite and a filtrate was placed under reduced pressure to obtain a solid (Compound H), which was used in the subsequent reaction without additional purification.

Synthesis of Compound 145

1.4 g (27%) of Compound 145 was prepared in the same manner as Compound 1 in Synthesis Example 1, except that Compound H was used instead of Compound B. The obtained compound was confirmed by Mass and HPLC.

HRMS (MALDI-TOF) calcd for $C_{54}H_{44}D_6IrN_3Si$: m/z 1021.3255, Found: 1021.3253.

Synthesis Example 9: Synthesis of Compound 146

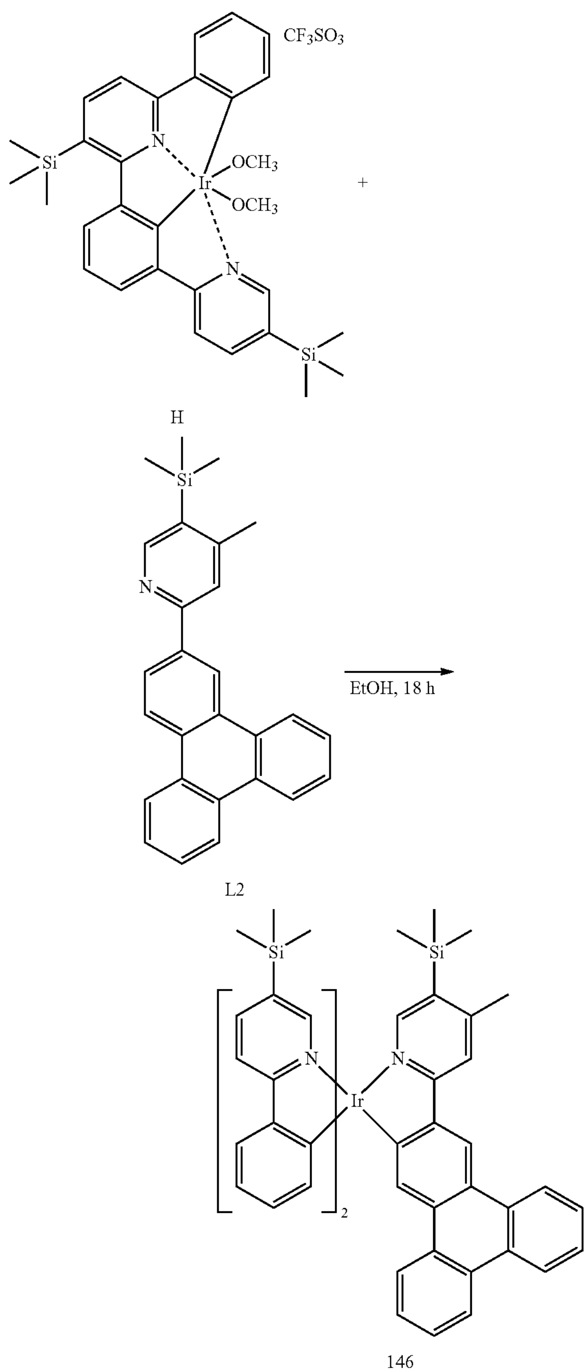

1.9 g (32%) of Compound 146 was prepared in the same manner as Compound 1 in Synthesis Example 1, except that Compound H was used instead of Compound B and Compound L2 (2.727 g, 6.96 mmol) was used instead of Compound L1. The obtained compound was confirmed by Mass and HPLC.

HRMS (MALDI-TOF) calcd for $C_{55}H_{56}D_6IrN_3Si$: m/z 1035.3411, Found: 1035.3410.

Synthesis Example 10: Synthesis of Compound 147

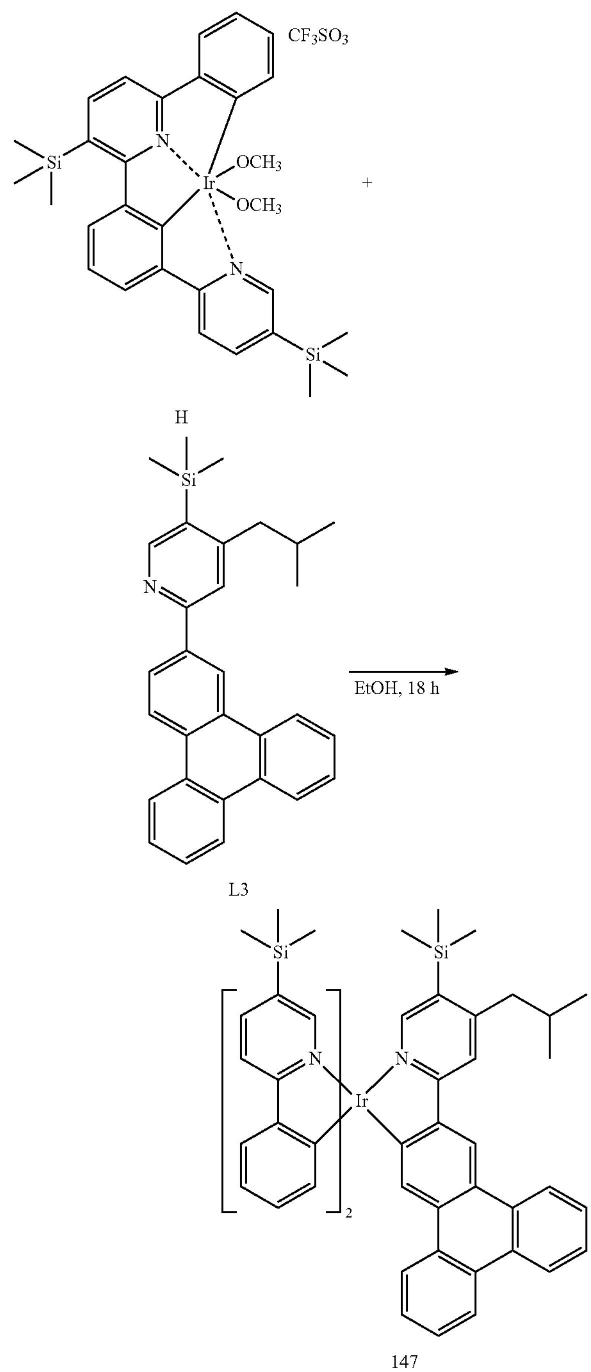

1.8 g (30%) of Compound 147 was prepared in the same manner as Compound 1 in Synthesis Example 1, except that Compound H was used instead of Compound B and Compound L3 (2.901 g, 6.69 mmol) was used instead of Compound L1. The obtained compound was confirmed by Mass and HPLC.

HRMS (MALDI-TOF) calcd for $C_{58}H_{62}D_6IrN_3Si$: m/z 1077.3881, Found: 1077.3881.

Synthesis Example 11: Synthesis of Compound 148

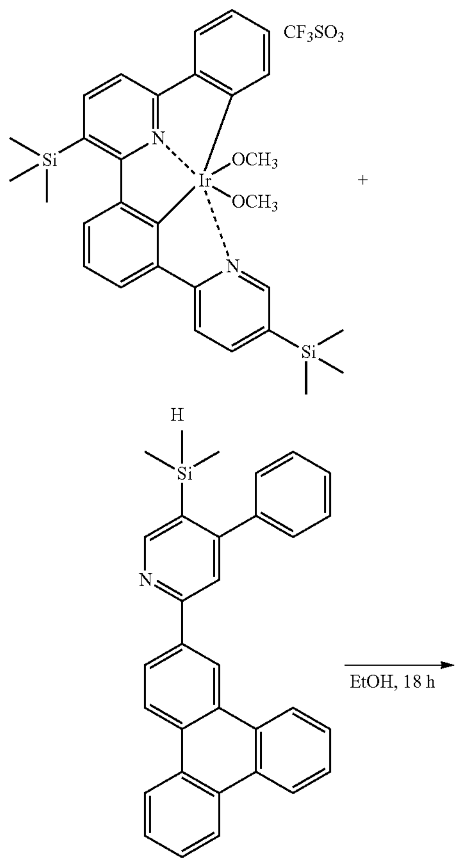

L4

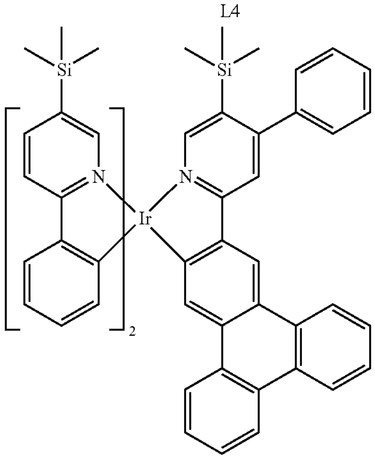

148

1.7 g (28%) of Compound 148 was prepared in the same manner as Compound 1 in Synthesis Example 1, except that Compound H was used instead of Compound B and Compound L4 (2.973 g, 6.56 mmol) was used instead of Compound L1. The obtained compound was confirmed by Mass and HPLC.

HRMS (MALDI-TOF) calcd for $C_{60}H_{58}D_6IrN_3Si$: m/z 1097.3568, Found: 1097.3569.

Synthesis Example 12: Synthesis of Compound 217

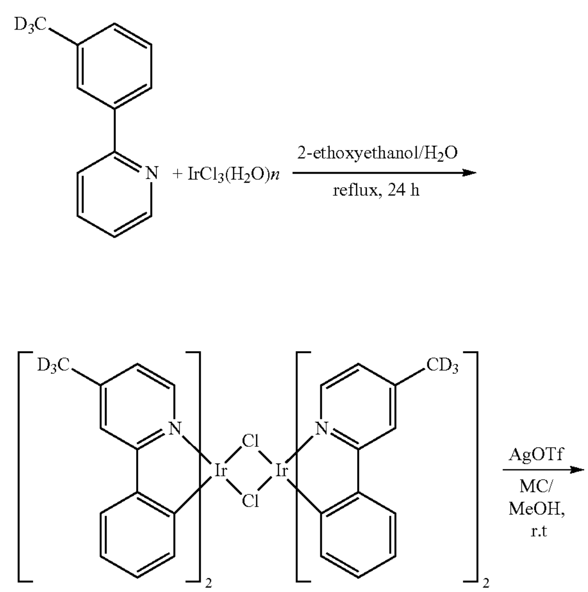

I

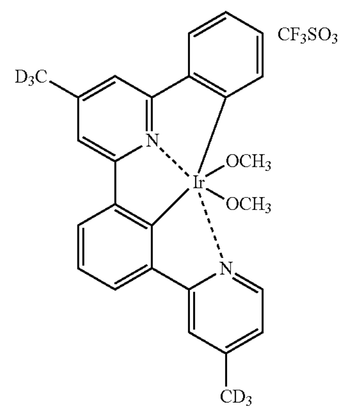

J

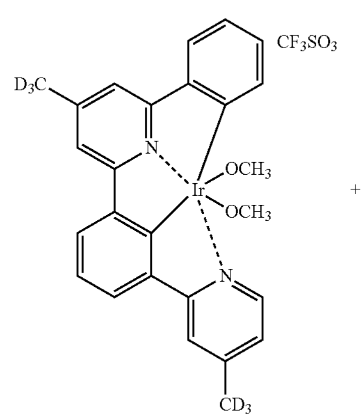

J

-continued

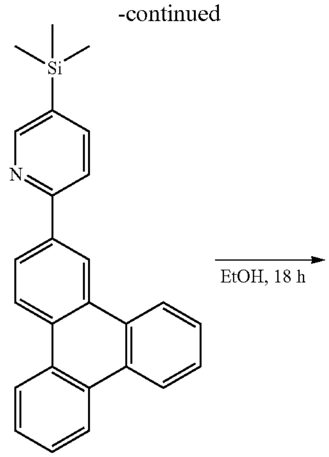

L1

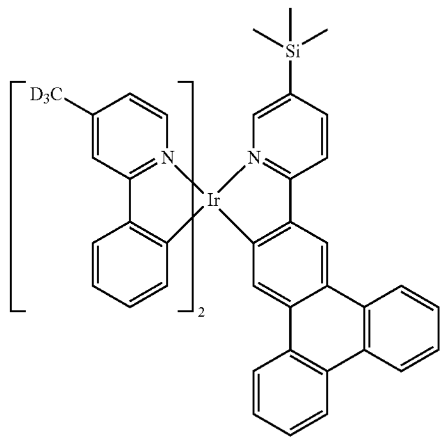

217

Synthesis of Compound I

Compound I (10.6 g, 83%) was prepared in the same manner as Compound E in Synthesis Example 5, except that 2-(4-(methyl$D_3$))phenylpyridine (8.74 g, 33.07 mmol) was used instead of 2-(5-(methyl$D_3$))phenylpyridine.

Synthesis of Compound J

Compound J was prepared in the same manner as Compound F in Synthesis Example 5, except that Compound I (8.74 g, 33.07 mmol) was used instead of Compound E.

Synthesis of Compound 217

1.3 g (22%) of Compound 217 was prepared in the same manner as used to synthesize Compound 97 in Synthesis Example 5, except that Compound J was used instead of Compound F. The obtained compound was confirmed by Mass and HPLC.

HRMS (MALDI-TOF) calcd for $C_{50}H_{36}D_6IrN_3Si$: m/z 911.3154, Found: 911.3152.

Evaluation Example 1: Evaluation on HOMO, LUMO, and Triplet (Ti) Energy Levels HOMO, LUMO and $T_1$ energy levels of Compounds 1, 2, 3, 4, 97, 99, 100, 145, 146, 147, 148, and 217 were evaluated according to the method indicated in Table 2, and results thereof are shown in Table 3.

TABLE 2

| | |
|---|---|
| HOMO energy level evaluation method | A potential (V)-current (A) graph of each compound was obtained by using cyclic voltammetry (CV) (electrolyte: 0.1 molar (M) $Bu_4NPF_6$/solvent: $CH_2Cl_2$/electrode: 3-electrode system (working electrode: Pt disc (in a diameter of 1 millimeter (mm)), reference electrode: Pt wire, and auxiliary electrode: Pt wire)). From oxidation onset of the graph, a HOMO energy level of the compound was calculated. |
| LUMO energy level evaluation method | Each compound was diluted at a concentration of $1 \times 10^{-5}$M in $CHCl_3$, and an UV absorption spectrum thereof was measured at room temperature by using a Shimadzu UV-350 spectrometer. A LUMO energy level thereof was calculated by using an optical band gap (Eg) from an edge of the absorption spectrum and HOMO energy levels. |
| T1 energy level evaluation method | A mixture (each compound was dissolved in an amount of 1 milligram (mg) in 3 cubic centimeters (cc) of toluene) of toluene and each compound was loaded into a quartz cell. The resultant quartz cell was loaded into liquid nitrogen (77 Kelvins (K)) and a photoluminescence spectrum thereof was measured by using a device for measuring photoluminescence. The obtained spectrum was compared with a photoluminescence spectrum measured at room temperature, and peaks observed only at low temperature were analyzed to calculate $T_1$ energy levels. |

TABLE 3

| Compound No. | HOMO (eV) (found) | LUMO (eV) (found) | $T_1$ energy level (eV) |
|---|---|---|---|
| 1 | −5.054 | −2.594 | 2.358 |
| 2 | −5.029 | −2.573 | 2.354 |
| 3 | −5.025 | −2.540 | 2.383 |
| 4 | −5.038 | −2.607 | 2.329 |
| 97 | −5.002 | −2.547 | 2.353 |
| 99 | −4.975 | −2.500 | 2.373 |
| 100 | −4.984 | −2.553 | 2.329 |
| 145 | −5.012 | −2.557 | 2.353 |
| 146 | −4.992 | −2.541 | 2.349 |
| 147 | −4.986 | −2.509 | 2.375 |
| 148 | −5.003 | −2.581 | 2.320 |
| 217 | −4.984 | −2.547 | 2.335 |

From Table 3, it was confirmed that Compounds 1, 2, 3, 4, 97, 99, 100, 145, 146, 147, 148, and 217 have electric characteristics suitable for use as a material for an organic light-emitting device.

Example 1

An ITO glass substrate was cut to a size of 50 mm×50 mm×0.5 mm sonicated in acetone isopropyl alcohol and pure water, each for 15 minutes, and then, washed by exposure to UV ozone for 30 minutes.

Subsequently, on the ITO electrode (anode) on the glass substrate, m-MTDATA was deposited at a deposition speed of 1 Angstroms per second (A/sec) to form a hole injection layer having a thickness of 600 Å, and α-NPD was deposited on the hole injection layer at a deposition speed of 1 Å/sec to form a hole transport layer having a thickness of 250 Å.

Compound 1 (dopant) and CBP (host) were co-deposited on the hole transport layer at a deposition speed of 0.1 Å/sec and a deposition speed of 1 Å/sec, respectively, to form an emission layer having a thickness of 400 Å.

BAlq was deposited on the emission layer at a deposition speed of 1 Å/sec to form a hole blocking layer having a thickness of 50 Å. $Alq_3$ was deposited on the hole blocking layer to form an electron transport layer having a thickness of 300 Å. LiF was deposited on the electron transport layer to form an electron injection layer having a thickness of 10 Å. Al was vacuum deposited on the electron injection layer to form a second electrode (cathode) having a thickness of 1,200 Å, thereby completing the manufacture of an organic light-emitting device having a structure of ITO/m-MTDATA (600 Å)/α-NPD (250 Å)/CBP+10% (Compound 1) (400 Å)/Balq(50 Å)/$Alq_3$(300 Å)/LiF(10 Å)/Al(1200 Å).

Examples 2 to 4 and Comparative Examples 1 and 2

Organic light-emitting devices were manufactured in the same manner as in Example 1, except that in forming an emission layer, for use as a dopant, corresponding compounds shown in Table 4 were used instead of Compound 1.

Evaluation Example 2: Evaluation on Characteristics of Organic Light-Emitting Devices The driving voltage, current efficiency and lifespan of the organic light-emitting devices manufactured according to Examples 2 to 4 and Comparative Examples 1 and 2 were evaluated by using Keithley 2400 and luminance meter Minolta Cs-1000A. The driving voltage and current efficiency of the organic light-emitting devices of Examples 2 to 4 and Comparative Examples 1 and 2 were expressed in a relative value with respect to the driving voltage and current efficiency of the organic light-emitting device of Example 1 which were each expressed as "100". Their relative values are shown in Table 4. Regarding Table 4, a lifespan ($T_{95}$) indicates a time that lapses when luminance is decreased to 95% of the initial luminance under 6,000 nit, which is 100%, after driving. In Table 4, the lifespans ($T_{95}$) of Examples 2 to 4 and Comparative Examples 1 and 2 are expressed as relative values when the lifespan ($T_{95}$) of the organic light-emitting device of Example 1 is "100."

TABLE 4

| | Dopant | Driving voltage (v) (relative value) | Efficiency (cd/A) (relative value) | Lifespan (hr) $T_{95}$, at 6,000 nit) (relative value) |
|---|---|---|---|---|
| Example 1 | 1 | 100 | 100 | 100 |
| Example 2 | 145 | 88 | 121 | 114 |
| Example 3 | 147 | 87 | 129 | 113 |
| Example 4 | 217 | 92 | 109 | 105 |
| Comparative Example 1 | $Ir(ppy)_3$ | 121 | 86 | 36 |
| Comparative Example 2 | Compound A | 108 | 91 | 43 |

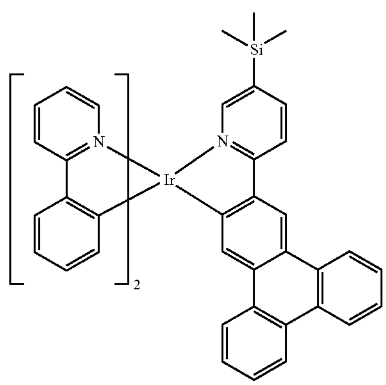

1

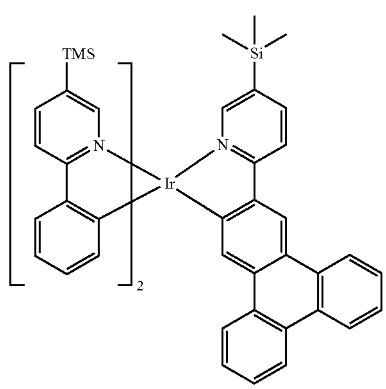

145

TABLE 4-continued

| Dopant | Driving voltage (v) (relative value) | Efficiency (cd/A) (relative value) | Lifespan (hr) $T_{95}$, at 6,000 nit) (relative value) |
|---|---|---|---|
| 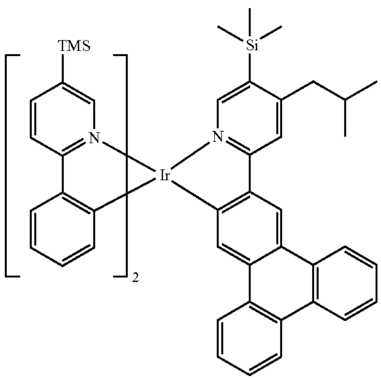 147 | | | |
| 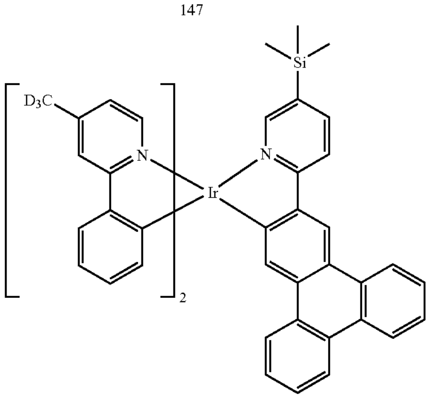 217 | | | |
| Compound A 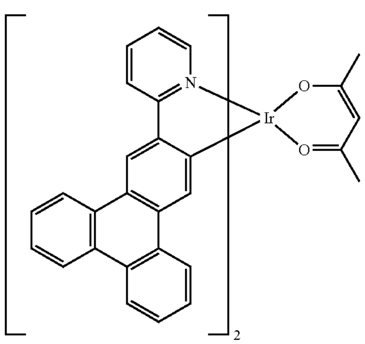 2t-ppy | | | |

From Table 4, it was confirmed that the organic light-emitting devices of Examples 1 to 4 had lower driving voltage, higher efficiency, and longer lifespan than the organic light-emitting devices of Comparative Examples 1 and 2.

Organometallic compounds according to embodiments of the present disclosure have excellent electric characteristics and thermal stability. Accordingly, organic light-emitting device including such organometallic compounds may have excellent driving voltage, current efficiency, power, and lifetime characteristics.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the FIGURES, it will be understood by those of ordinary skill in the art that various changes in form and details may be made therein without departing from the spirit and scope of the present inventive concept as defined by the following claims.

What is claimed is:

1. An organometallic compound represented by Formula 1:

Formula 1

$$M(L_1)_{n1}(L_2)_{n2}$$

Formula 2(1)

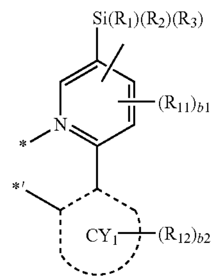

Formula 3A

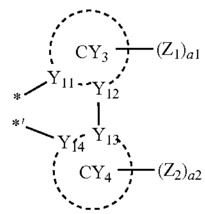

wherein M in Formula 1 is Ir, $L_1$ in Formula 1 is selected from ligands represented by Formula 2(1), n1 is 1, 2, or 3, provided that when n1 is 2 or greater, two or more groups $L_1$ are identical to or different from each other, $L_2$ in Formula 1 is selected from ligands represented by Formula 3A, n2 is 0, 1, or 2, provided that when n2 is 2 or greater, two or more groups $L_2$ are identical to or different from each other, $L_1$ and $L_2$ in Formula 1 are different from each other, the sum of n1 and n2 is 3, $CY_1$ in Formula 2(1) is a triphenylene, $Y_{11}$ in Formula 3A is N, $Y_{12}$ to $Y_{14}$ in Formula 3A is C, $CY_3$ in Formula 3A is selected from a pyridine, a 5,6,7,8-tetrahydroquinoline, a 5,6,7,8-tetrahydroisoquinoline, a quinoline, and an isoquinoline, $CY_4$ in Formula 3A is selected from a benzene, 1,2,3,4-tetrahydronaphthalene, a naphthalene, a carbazole, an azacarbazole, a fluorene, a dibenzofuran, a dibenzothiophene, a benzofuropyridine, and a benzothienopyridine, a1 and a2 in Formula 3A are each independently an integer selected from 1 to 5, $R_1$ to $R_6$ in Formula 2(1) are each independently selected from:

a hydrogen, deuterium, —F, $C_1$-$C_{20}$ alkyl group, and a $C_1$-$C_{20}$ alkoxy group; and a $C_1$-$C_{20}$ alkyl group and a $C_1$-$C_{20}$ alkoxy group, each substituted with at least one selected from deuterium, —F, —$CD_3$, —$CD_2H$, —$CDH_2$, —$CF_3$, —$CF_2H$, and —$CFH_2$;

$Z_1$ and $Z_2$ in Formula 3A are each independently selected from:

hydrogen, deuterium, —F, —Cl, —Br, —I, —$SF_5$, a hydroxyl group, a nitro group, an amino group, an amidino group, a hydrazine group, a hydrazone group, a carboxylic acid or a salt thereof, a sulfonic acid or a salt thereof, and a phosphoric acid or a salt thereof;

a $C_1$-$C_{20}$ alkyl group and a $C_1$-$C_{20}$ alkoxy group, each substituted with at least one selected from deuterium, —F, —$CD_3$, —$CD_2H$, —$CDH_2$, —$CF_3$, —$CF_2H$, and —$CFH_2$; and a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —Si($Q_1$)($Q_2$)($Q_3$), —N($Q_4$)($Q_5$), —B($Q_6$)($Q_7$), and —P(=O)($Q_8$)($Q_9$), $R_{11}$ and $R_{12}$ in Formula 2 are each independently selected from:

deuterium, —F, —Cl, —Br, —I, —$SF_5$, a hydroxyl group, a nitro group, an amino group, an amidino group, a hydrazine group, a hydrazone group, a carboxylic acid or a salt thereof, a sulfonic acid or a salt thereof, and a phosphoric acid or a salt thereof;

a $C_1$-$C_{20}$ alkyl group and a $C_1$-$C_{20}$ alkoxy group, each substituted with at least one selected from deuterium, —F, —$CD_3$, —$CD_2H$, —$CDH_2$, —$CF_3$, —$CF_2H$, and —$CFH_2$; and a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —N($Q_4$)($Q_5$), —B($Q_6$)($Q_7$), and —P(=O)($Q_8$)($Q_9$), b1 in Formula 2(1) is selected from 0 to 3, b2 in Formula 2(1) is selected from 0 to 4, each of * and *' in Formulae 2(1) and 3A indicates a binding site to M in Formula 1, and at least one of substituents of the substituted $C_3$-$C_{10}$ cycloalkyl group, substituted $C_1$-$C_{10}$ heterocycloalkyl group, substituted $C_3$-$C_{10}$ cycloalkenyl group, substituted $C_1$-$C_{10}$ heterocycloalkenyl group, substituted $C_6$-$C_{60}$ aryl group, substituted $C_6$-$C_{60}$ aryloxy group, substituted $C_6$-$C_{60}$ arylthio group, substituted $C_1$-$C_{60}$ heteroaryl group, substituted monovalent non-aromatic condensed polycyclic group, and substituted monovalent non-aromatic condensed heteropolycyclic group is selected from deuterium, —F, —Cl, —Br, —I, —$CD_3$, —$CD_2H$, —$CDH_2$, —$CF_3$, —$CF_2H$, —$CFH_2$, a hydroxyl group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group and a phenyl group, wherein $Q_1$ to $Q_9$ are each independently selected from hydrogen, deuterium, —F, —Cl, —Br, —I, a hydroxyl group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

2. The organometallic compound of claim 1, wherein $R_{11}$ and $R_{12}$ in Formula 2 are each independently selected from deuterium, —F, —Cl, —Br, —I, a hydroxyl group, a nitro group, an amino group, an amidino group, a hydrazine group, a hydrazone group, a carboxylic acid or a salt thereof, a sulfonic acid or a salt thereof, a phosphoric acid or a salt thereof, —$SF_5$, $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from deuterium, —F, —Cl, —Br, —I, —$CD_3$, —$CD_2H$, —$CDH_2$, —$CF_3$, —$CF_2H$, —$CFH_2$, a hydroxyl group, a nitro group, an amino group, an amidino group, a hydrazine group, a hydrazone group, a carboxylic acid or a salt thereof, a sulfonic acid or a salt thereof, and a phosphoric acid or a salt thereof, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, and an imidazopyrimidinyl group, each substituted with at least one selected from deuterium, —F, —Cl, —Br, —I, $—CD_3$, $—CD_2H$, $—CDH_2$, $—CF_3$, $—CF_2H$, $—CFH_2$, a hydroxyl group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, and a phenyl group; and $—B(Q_6)(Q_7)$ and $—P(=O)(Q_8)(Q_9)$, wherein $Q_6$ to $Q_9$ are each independently selected from $—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, and $—CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group.

3. The organometallic compound of claim 1, wherein $R_{11}$ and $R_{12}$ in Formula 2 are each independently selected from deuterium, —F, a nitro group, $—SF_5$, a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group, each substituted with at least one selected from deuterium, —F, $—CD_3$, $—CD_2H$, $—CDH_2$, $—CF_3$, $—CF_2H$, $—CFH_2$, and a nitro group;

a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group, each substituted with at least one selected from deuterium, —F, $—CD_3$, $—CD_2H$, $—CDH_2$, $—CF_3$, $—CF_2H$, $—CFH_2$, a nitro group, a $C_1$-$C_{10}$ alkyl group, a $C_1$-$C_{10}$ alkoxy group, and a phenyl group; and $—B(Q_6)(Q_7)$ and $—P(=O)(Q_8)(Q_9)$, wherein $Q_6$ to $Q_9$ are each independently selected from $—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, and $—CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group.

4. The organometallic compound of claim 1, wherein $R_1$ to $R_6$ in Formula 2 are each independently selected from a $C_1$-$C_{10}$ alkyl group; and a $C_1$-$C_{10}$ alkyl group substituted with at least one selected from a deuterium.

5. The organometallic compound of claim 1, wherein $R_{11}$ and $R_{12}$ in Formula 2 are each independently selected from deuterium, —F, a nitro group, $—SF_5$, $—CH_3$, $—CD_3$, $—CD_2H$, $—CDH_2$, $—CF_3$, $—CF_2H$, $—CFH_2$, groups represented by Formulae 9-1 to 9-19, and groups represented by Formulae 10-1 to 10-9 and 10-13 10-38, and $R_1$ to $R_6$ in Formula 2 are each independently selected from —$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, and —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, and a tert-pentyl group; and an n-propyl group, an isopropyl group, an n-butyl group, an isobutyl group, a sec-butyl group, a tert-butyl group, an n-pentyl group, an isopentyl group, a sec-pentyl group, and a tert-pentyl group, each substituted with at least one selected from deuterium:

Formula 9-1

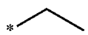

Formula 9-2

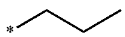

Formula 9-3

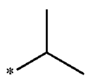

Formula 9-4

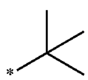

Formula 9-5

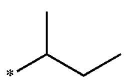

Formula 9-6

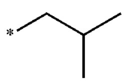

Formula 9-7

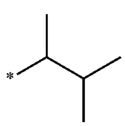

Formula 9-8

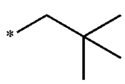

Formula 9-9

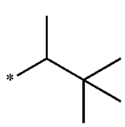

Formula 9-10

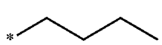

Formula 9-11

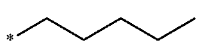

Formula 9-12

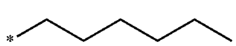

Formula 9-13

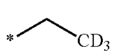

Formula 9-14

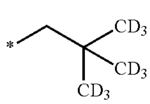

-continued

Formula 9-15

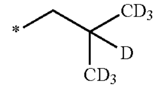

Formula 9-16

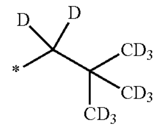

Formula 9-17

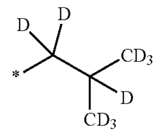

Formula 9-18

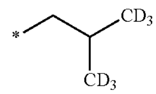

Formula 9-19

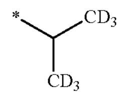

Formula 10-1

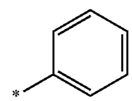

Formula 10-2

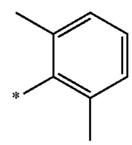

Formula 10-3

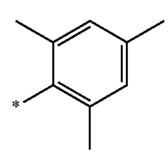

Formula 10-4

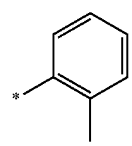

Formula 10-5

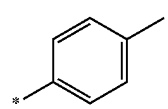

Formula 10-6

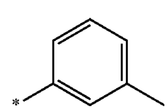

Formula 10-7

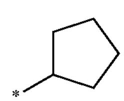

Formula 10-8

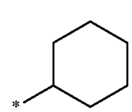

-continued
Formula 10-9
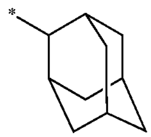
Formula 10-13
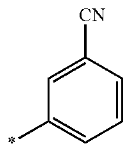
Formula 10-14
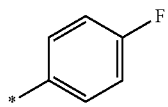
Formula 10-15
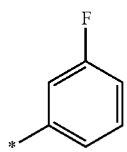
Formula 10-16
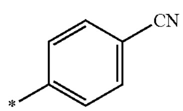
Formula 10-17
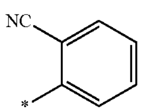
Formula 10-18
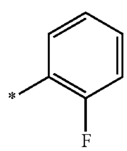
Formula 10-19
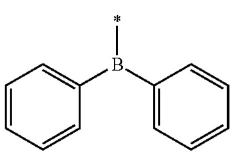
Formula 10-20
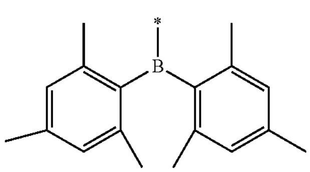
Formula 10-21
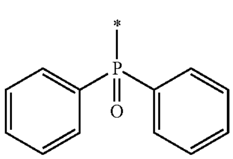
Formula 10-22
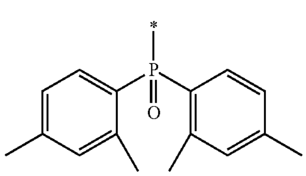
-continued
Formula 10-23
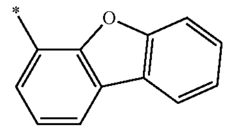
Formula 10-24
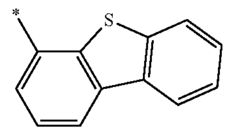
Formula 10-25
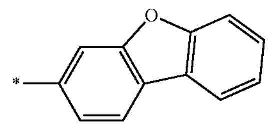
Formula 10-26
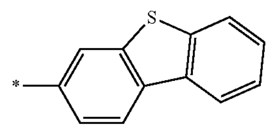
Formula 10-27
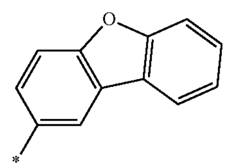
Formula 10-28
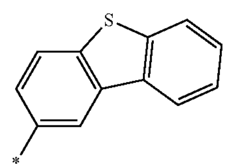
Formula 10-29
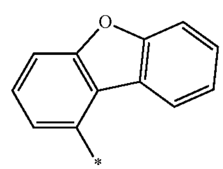
Formula 10-30
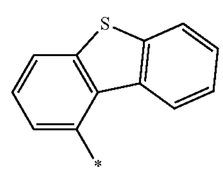
Formula 10-31
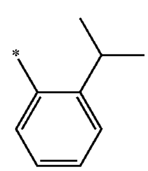
Formula 10-32
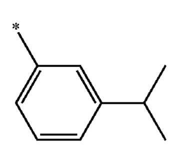

-continued

Formula 10-33

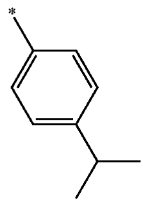

Formula 10-34

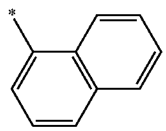

Formula 10-35

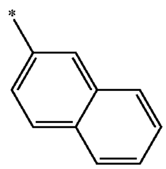

Formula 10-36

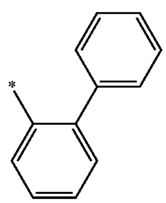

Formula 10-37

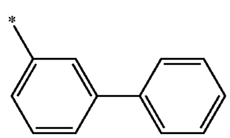

Formula 10-38

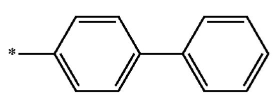

wherein * in Formulae 9-1 to 9-19, 10-1 to 10-9 and 10-13 10-38 indicates a binding site to a neighboring atom.

6. The organometallic compound of claim 1, wherein $L_1$ in Formula 1 is selected from ligands represented by Formulae 2BA-2 to 2BA-5:

Formula 2BA-2

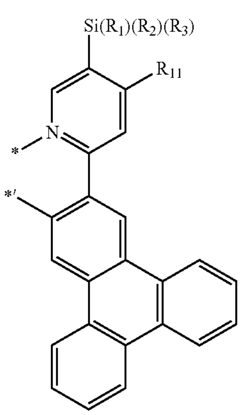

-continued

Formula 2BA-3

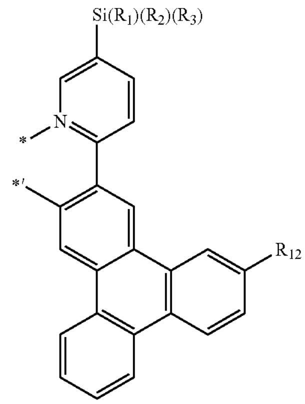

Formula 2BA-4

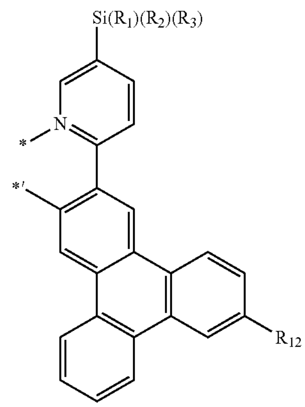

Formula 2BA-5

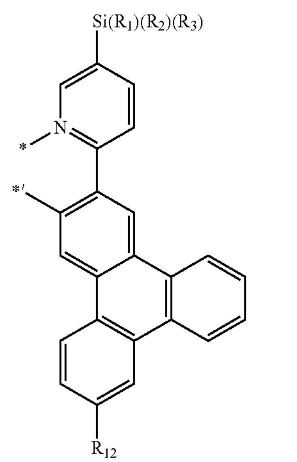

wherein, in Formulae 2BA-2 to 2BA-5, $R_{11}$ and $R_{12}$ are each independently selected from deuterium, —F, a nitro group, —$SF_5$, a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group;

a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group, each substituted with at least one selected from deuterium, —F, $—CD_3$, $—CD_2H$, $—CDH_2$, $—CF_3$, $—CF_2H$, $—CFH_2$, and a cyano group;

a methoxy group, an ethoxy group, a propoxy group, a butoxy group, a pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, and a pyrimidinyl group, each substituted with at least one selected from deuterium, —F, $—CD_3$, $—CD_2H$, $—CDH_2$, $—CF_3$, $—CF_2H$, $—CFH_2$, a $C_1$-$C_{10}$ alkyl group, a $C_1$-$C_{10}$ alkoxy group, and a phenyl group; and $—B(Q_6)(Q_7)$ and $—P(=O)(Q_8)(Q_9)$, wherein $Q_6$ to $Q_9$ are each independently selected from $—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, and $—CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium, a $C_1$-$C_{10}$ alkyl group, and a phenyl group, $R_1$ to $R_3$ are each independently selected from $—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, and $—CD_2CDH_2$;

an n-propyl group, an isopropyl group, an n-butyl group, an isobutyl group, a sec-butyl group, a tert-butyl group, an n-pentyl group, an isopentyl group, a sec-pentyl group, and a tert-pentyl group; and an n-propyl group, an isopropyl group, an n-butyl group, an isobutyl group, a sec-butyl group, a tert-butyl group, an n-pentyl group, an isopentyl group, a sec-pentyl group, and a tert-pentyl group, a phenyl group, and a naphthyl group, each substituted with at least one selected from deuterium, and each of * and *' indicates a binding site to M in Formula 1.

7. The organometallic compound of claim 1, wherein $L_2$ in Formula 1 is selected from ligands represented by Formulae 3-1(1) to 3-1(60), 3-1(61) to 3-1(69), 3-1(71) to 3-1(79), 3-1(81) to 3-1(88), and 3-1(91) to 3-1(98):

Formula 3-3(1)

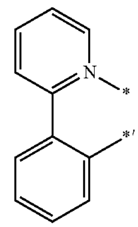

Formula 3-1(2)

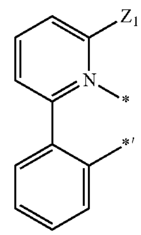

Formula 3-1(3)

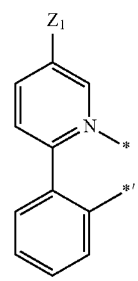

Formula 3-1(4)

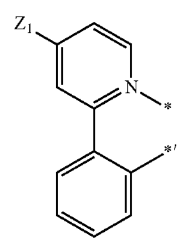

Formula 3-1(5)

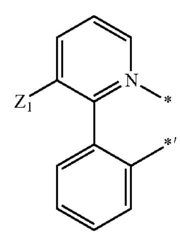

Formula 3-1(6)

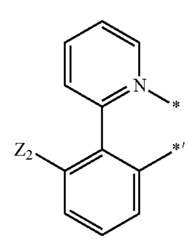

-continued
Formula 3-1(7)
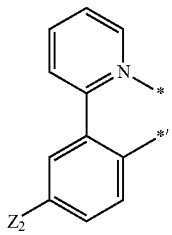
Formula 3-1(8)
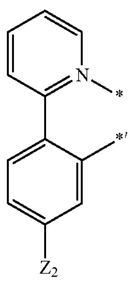
Formula 3-1(9)
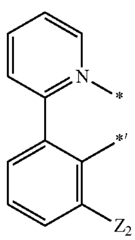
Formula 3-1(10)
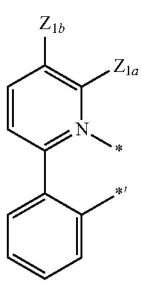
Formula 3-1(11)
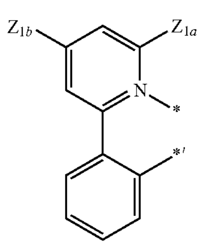
Formula 3-1(12)
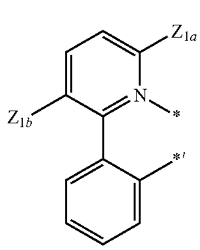
-continued
Formula 3-1(13)
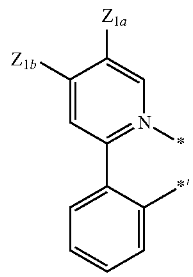
Formula 3-1(14)
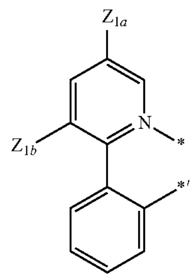
Formula 3-1(15)
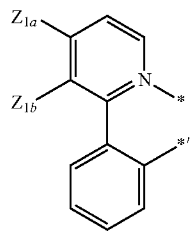
Formula 3-1(16)
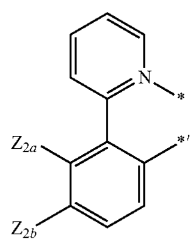
Formula 3-1(17)
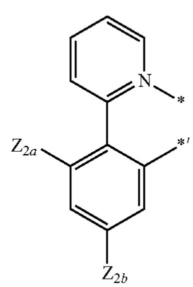
Formula 3-1(18)
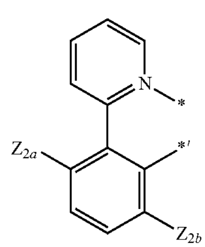

-continued
Formula 3-1(19)
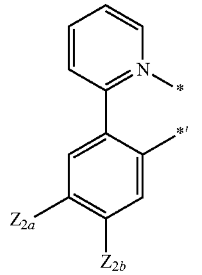
Formula 3-1(20)
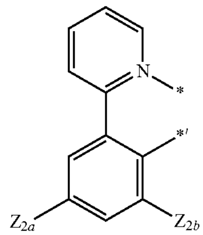
Formula 3-1(21)
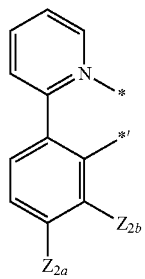
Formula 3-1(22)
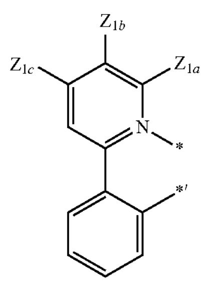
Formula 3-1(23)
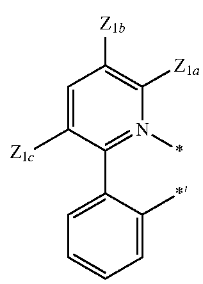
Formula 3-1(24)
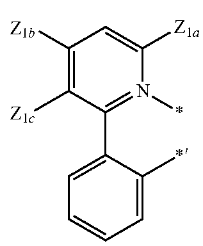
-continued
Formula 3-1(25)
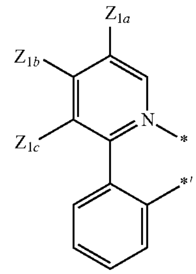
Formula 3-1(26)
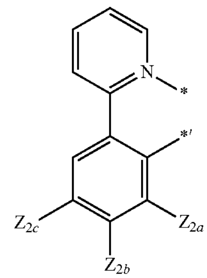
Formula 3-1(27)
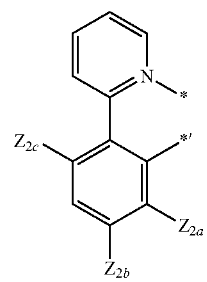
Formula 3-1(28)
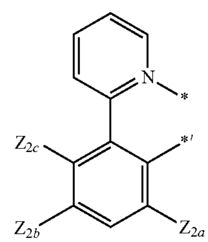
Formula 3-1(29)
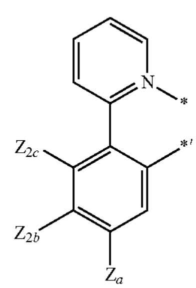

-continued
Formula 3-1(30)
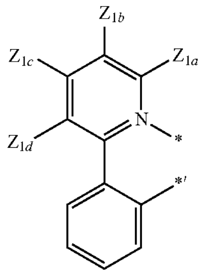
Formula 3-1(31)
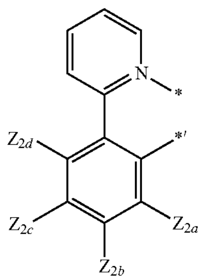
Formula 3-1(32)
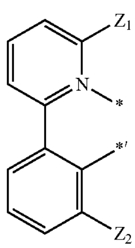
Formula 3-1(33)
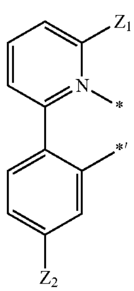
Formula 3-1(34)
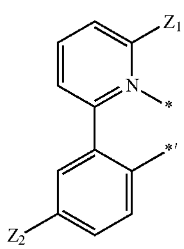
Formula 3-1(35)
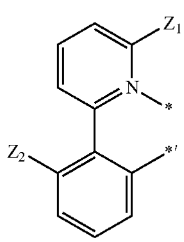
-continued
Formula 3-1(36)
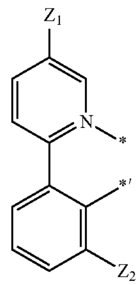
Formula 3-1(37)
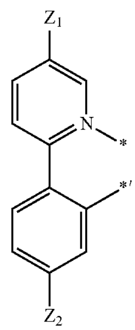
Formula 3-1(38)
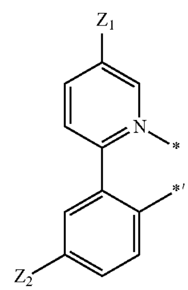
Formula 3-1(39)
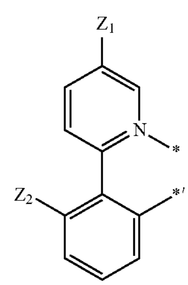
Formula 3-1(40)
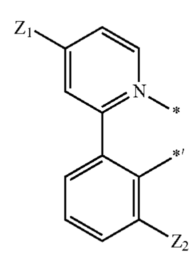

Formula 3-1(41)
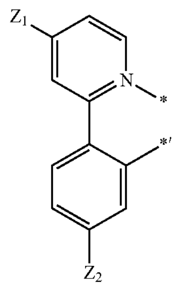
Formula 3-1(42)
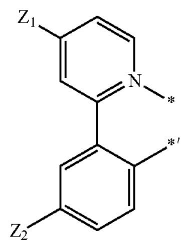
Formula 3-1(43)
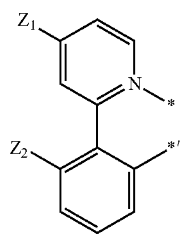
Formula 3-1(44)
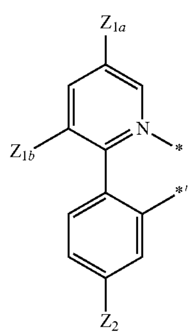
Formula 3-1(45)
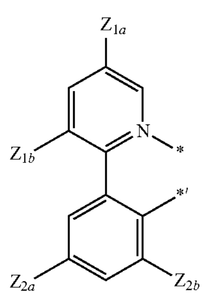
Formula 3-1(46)
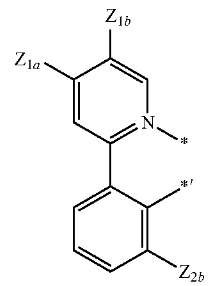
Formula 3-1(47)
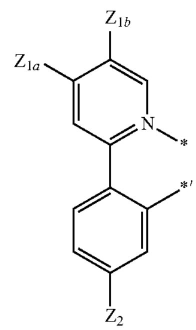
Formula 3-1(48)
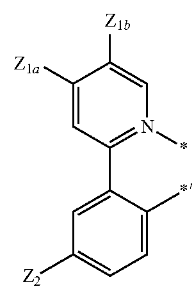
Formula 3-1(49)
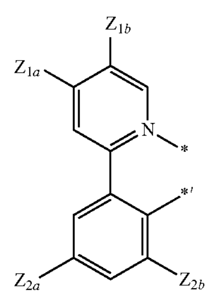
Formula 3-1(50)
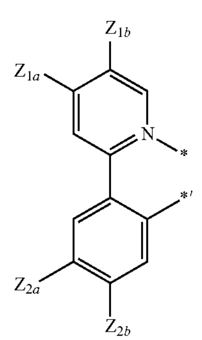

-continued
Formula 3-1(51)
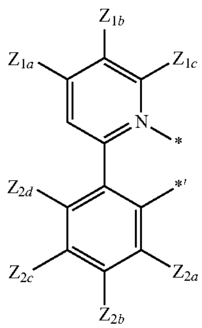
Formula 3-1(52)
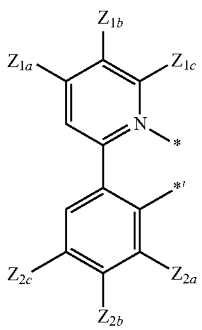
Formula 3-1(53)
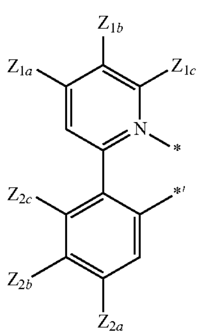
Formula 3-1(54)
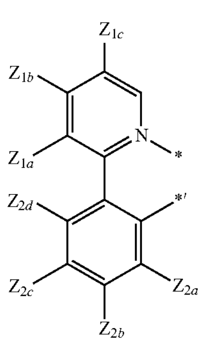
-continued
Formula 3-1(55)
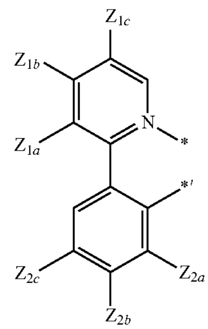
Formula 3-1(56)
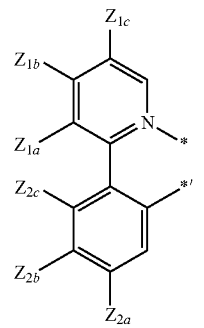
Formula 3-1(57)
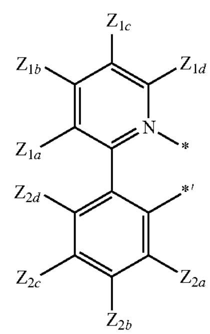
Formula 3-1(58)
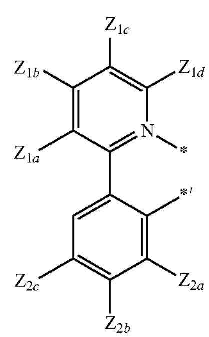
Formula 3-1(59)
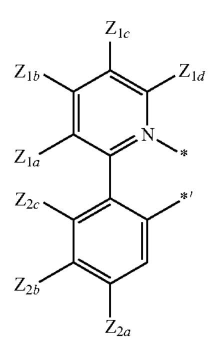

-continued
Formula 3-1(60)
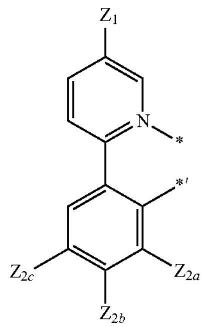
Formula 3-1(61)
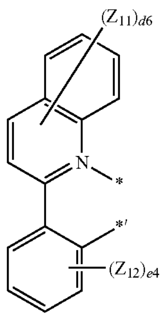
Formula 3-1(62)
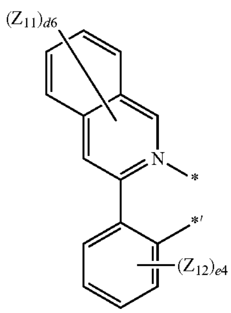
Formula 3-1(63)
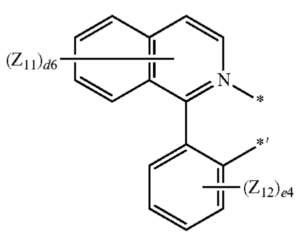
Formula 3-1(64)
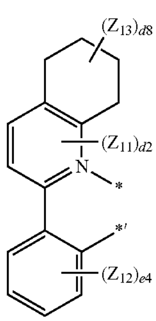
-continued
Formula 3-1(65)
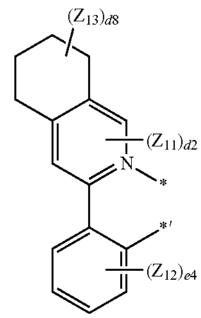
Formula 3-1(66)
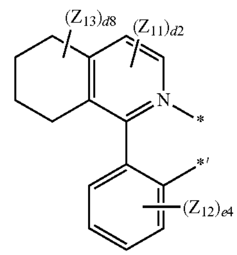
Formula 3-1(67)
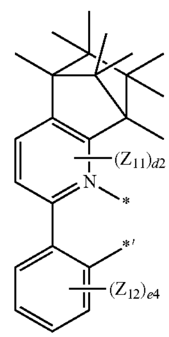
Formula 3-1(68)
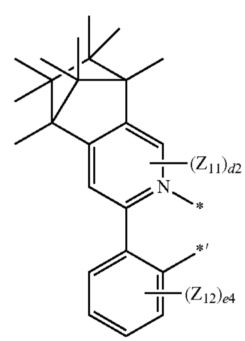
Formula 3-1(69)
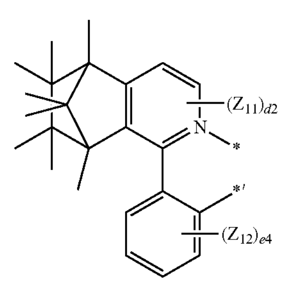

-continued
Formula 3-1(71)
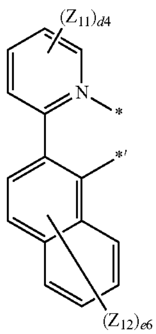
Formula 3-1(72)
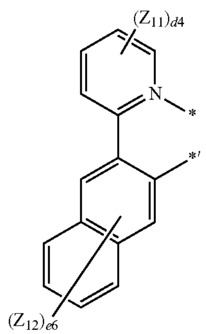
Formula 3-1(73)
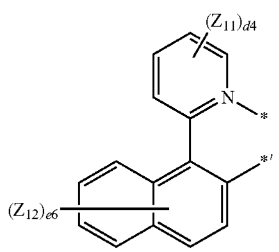
Formula 3-1(74)
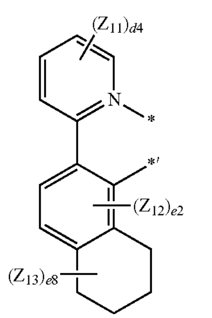
Formula 3-1(75)
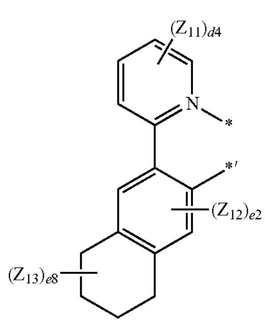
-continued
Formula 3-1(76)
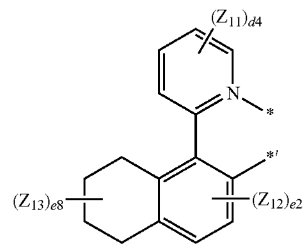
Formula 3-1(77)
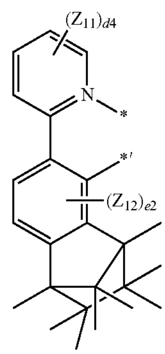
Formula 3-1(78)
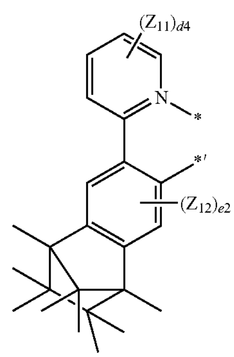
Formula 3-1(79)
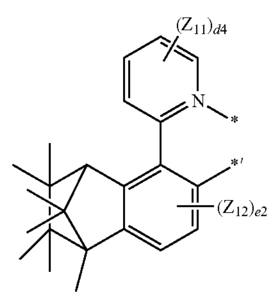
Formula 3-1(81)
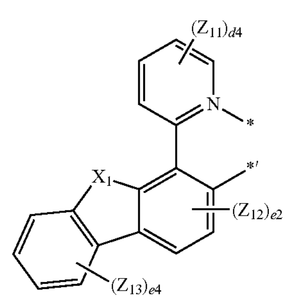

Formula 3-1(82)
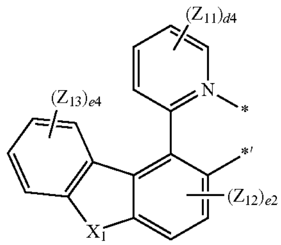
Formula 3-1(83)
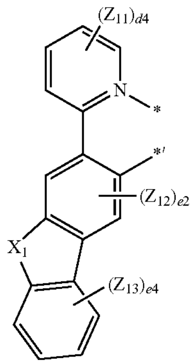
Formula 3-1(84)
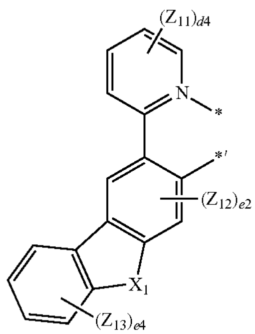
Formula 3-1(85)
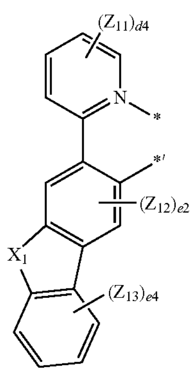
Formula 3-1(86)
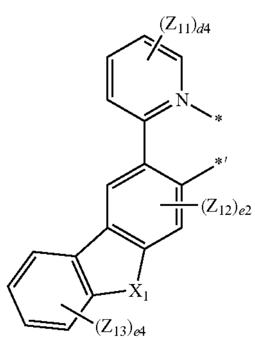
Formula 3-1(87)
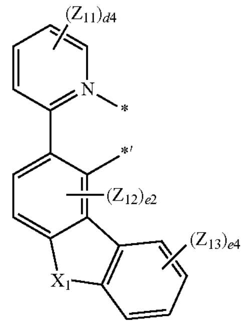
Formula 3-1(88)
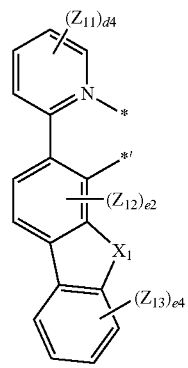
Formula 3-1(91)
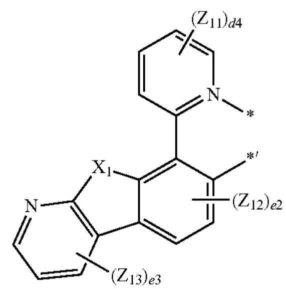
Formula 3-1(92)
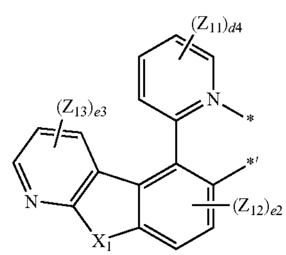
Formula 3-1(93)
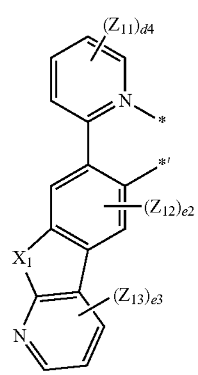

-continued

Formula 3-1(94)

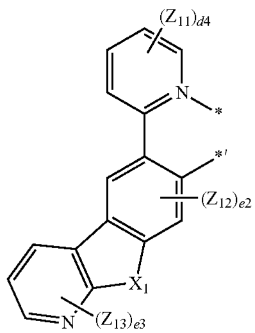

Formula 3-1(95)

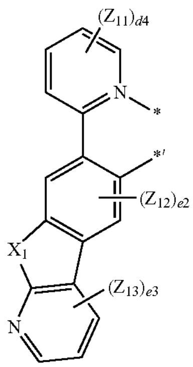

Formula 3-1(96)

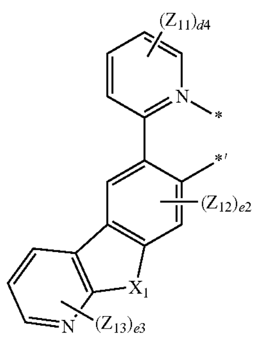

Formula 3-1(97)

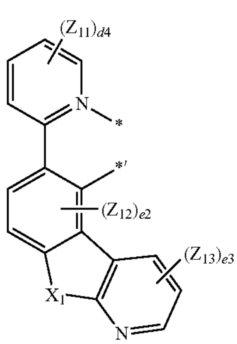

-continued

Formula 3-1(98)

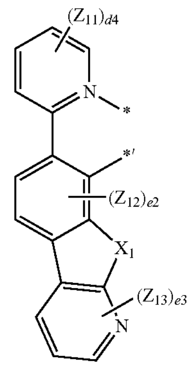

wherein, in Formulae 3-1(1) to 3-1(60), 3-1(61) to 3-1 (69), 3-1(71) to 3-1(79), 3-1(81) to 3- 1(88), and 3-1(91) to 3-1(98), $Z_1$, $Z_2$, $Z_{1a}$, $Z_{1b}$, $Z_{1c}$, $Z_{2a}$, $Z_{2a}$, $Z_{2b}$, $Z_{2c}$, and $Z_{2d}$ are each independently selected from deuterium, —F, a nitro group, $—SF_5$, $—CH_3$, $—CD_3$, $—CD_2H$, $—CDH_2$, $—CF_3$, $—CF_2H$, $—CFH_2$, $—Si(Q_1)(Q_2)(Q_3)$, $—N(Q_4)(Q_5)$, $—B(Q_6)(Q_7)$, $—P({=}O)(Q_8)(Q_9)$, groups represented by Formulae 9-1 to 9-19, and groups represented by Formulae 10-1 to 10-9 and 10-13 to 10-38, $X_1$ is O, S, $C(Z_{21})(Z_{22})$, or $N(Z_{23})$, $Z_3$, $Z_{11}$ to $Z_{13}$, and $Z_{21}$ to $Z_{23}$ are each independently selected from hydrogen, deuterium, —F, a nitro group, $—SF_5$, $—CH_3$, $—CD_3$, $—CD_2H$, $—CDH_2$, $—CF_3$, $—CF_2H$, $—CFH_2$, $—Si(Q_1)(Q_2)(Q_3)$, $—N(Q_4)(Q_5)$, $—B(Q_6)(Q_7)$, $—P({=}O)(Q_8)(Q_9)$, groups represented by Formulae 9-1 to 9-19, and groups represented by Formulae 10-1 to 10-9 and 10-13 to 10-38, wherein $Q_1$ to $Q_9$ are each independently selected from $—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, and $—CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group; and an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, and a naphthyl group, each substituted with at least one selected from deuterium and a $C_1$-$C_{10}$ alkyl group, d2 and e2 are each independently 0 or 2, e3 is an integer selected from 0 to 3, d4 and e4 are each independently an integer selected from 0 to 4, d6 and e6 are each independently an integer selected from 0 to 6, d8 and e8 are each independently an integer selected from 0 to 8, and each of * and *' indicates a binding site to M in Formula 1:

Formula 9-1

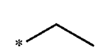

-continued
Formula 9-2
Formula 9-3
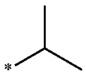
Formula 9-4
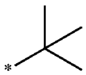
Formula 9-5
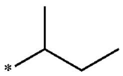
Formula 9-6
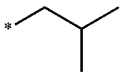
Formula 9-7
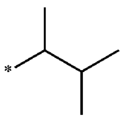
Formula 9-8
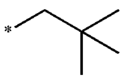
Formula 9-9
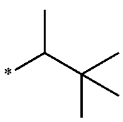
Formula 9-10
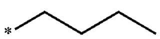
Formula 9-11
Formula 9-12
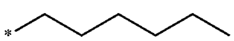
Formula 9-13
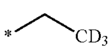
Formula 9-14
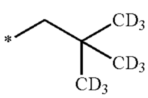
Formula 9-15
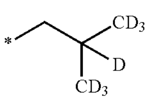
Formula 9-16
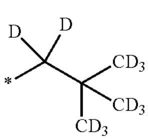
Formula 9-17
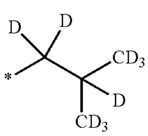
Formula 9-18
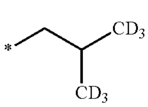
-continued
Formula 9-19
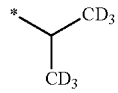
Formula 10-1
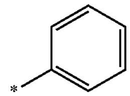
Formula 10-2
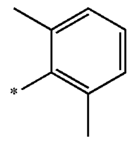
Formula 10-3
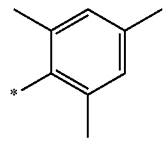
Formula 10-4
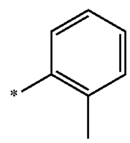
Formula 10-5
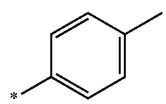
Formula 10-6
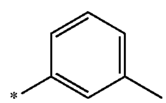
Formula 10-7
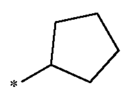
Formula 10-8
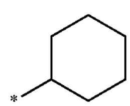
Formula 10-9
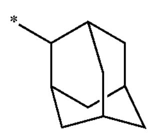
Formula 10-13
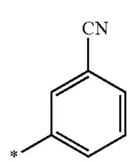
Formula 10-14
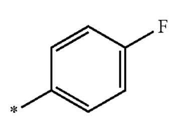

-continued
Formula 10-15
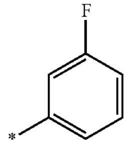
Formula 10-16
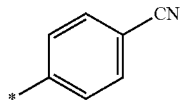
Formula 10-17
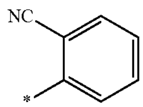
Formula 10-18
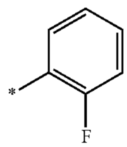
Formula 10-19
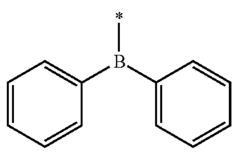
Formula 10-20
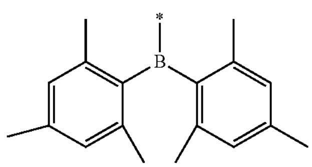
Formula 10-21
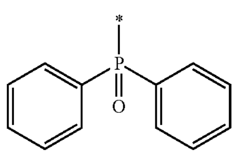
Formula 10-22
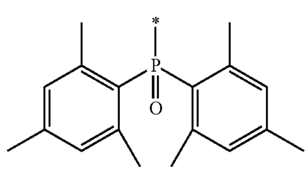
Formula 10-23
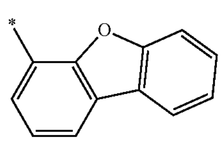
Formula 10-24
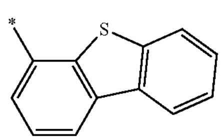
Formula 10-25
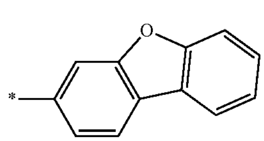
-continued
Formula 10-26
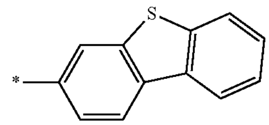
Formula 10-27
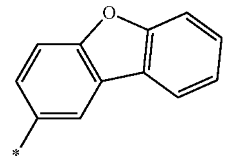
Formula 10-28
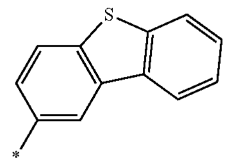
Formula 10-29
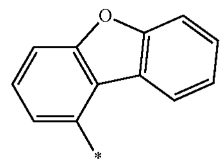
Formula 10-30
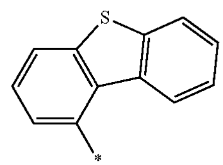
Formula 10-31
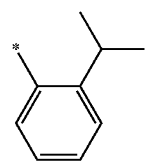
Formula 10-32
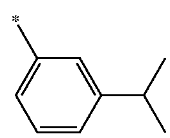
Formula 10-33
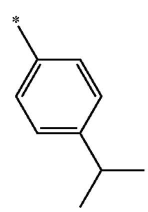
Formula 10-34
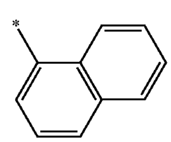

-continued
Formula 10-35
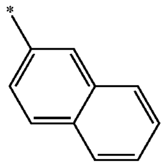
Formula 10-36
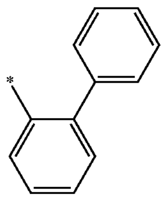
Formula 10-37
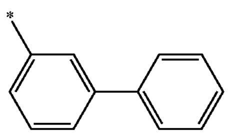
Formula 10-38
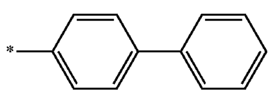
ⓘ indicates text missing or illegible when filed
wherein * in Formula 9-1 to 9-19, 10-1 to 10-9 and 10-13 to 10-38 indicates a binding site to a neighboring atom.
8. An organometallic compound, wherein
the organometallic compound is one of Compounds 1 to 144 and 146 to 288:
1
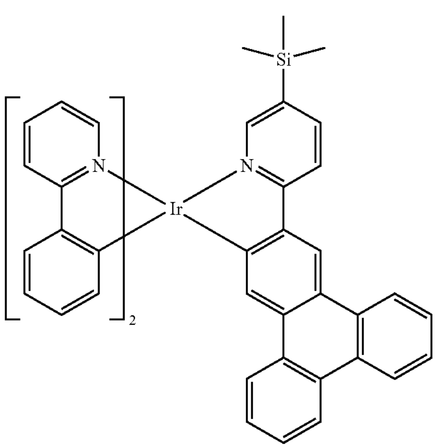
-continued
2
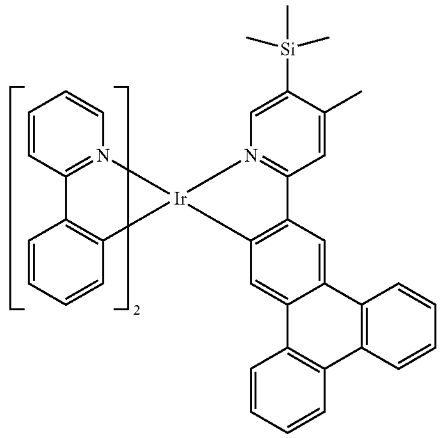
3
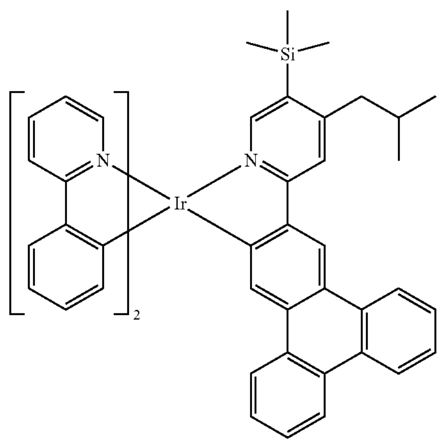
4
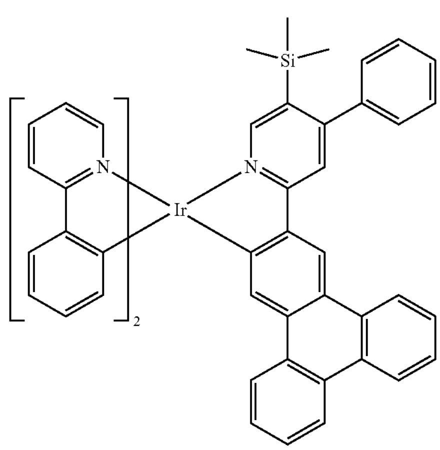

-continued
5
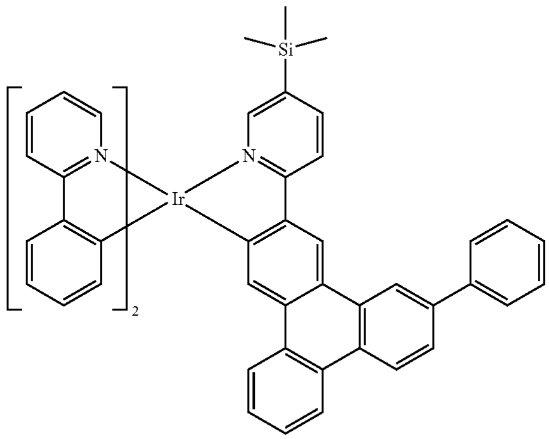
6
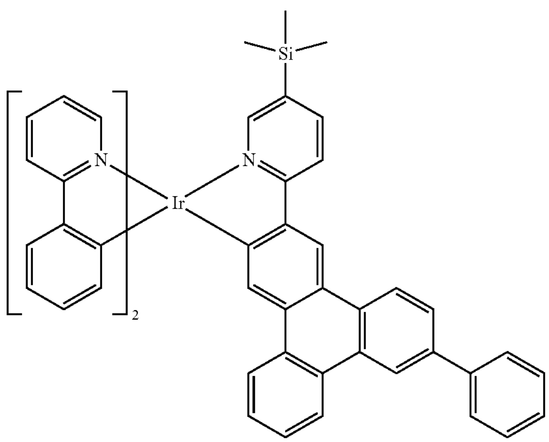
7
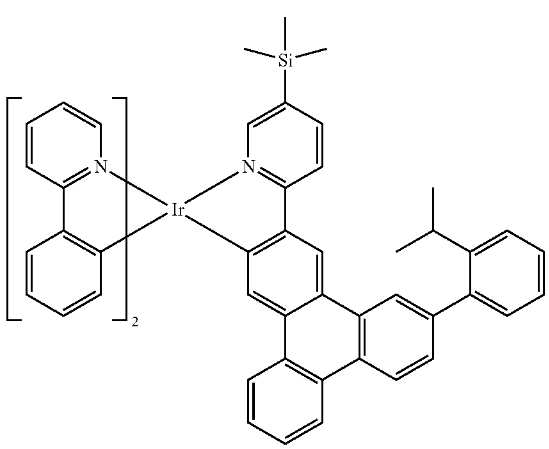
-continued
8
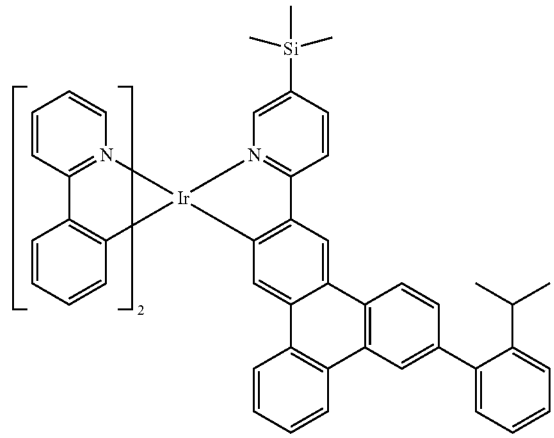
9
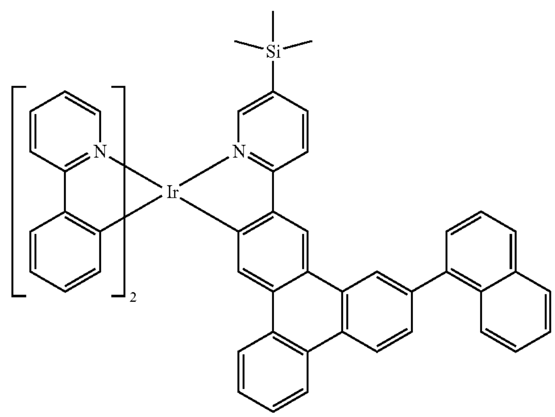
10
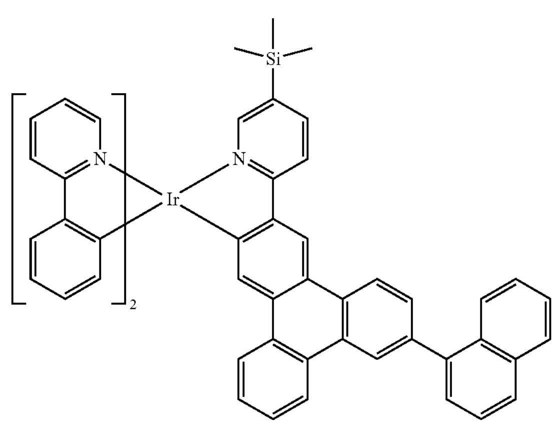

11
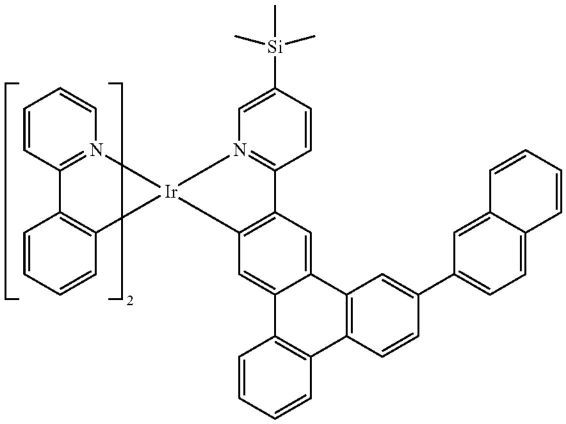
12
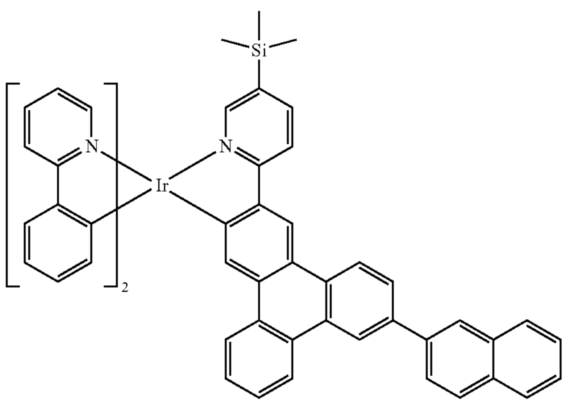
13
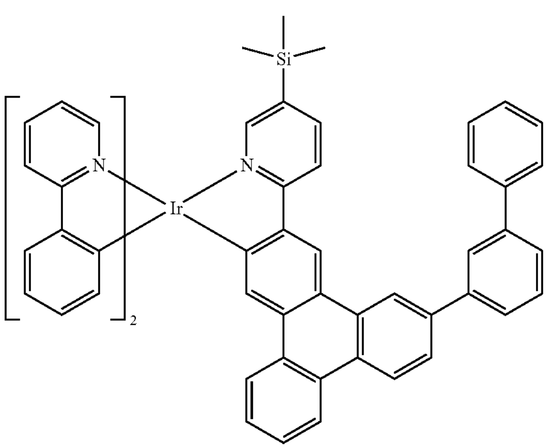
14
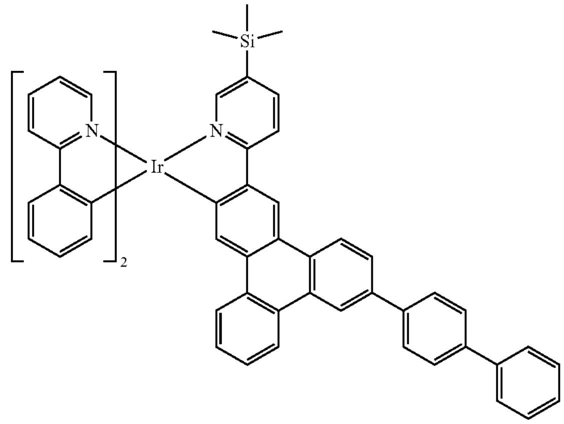
15
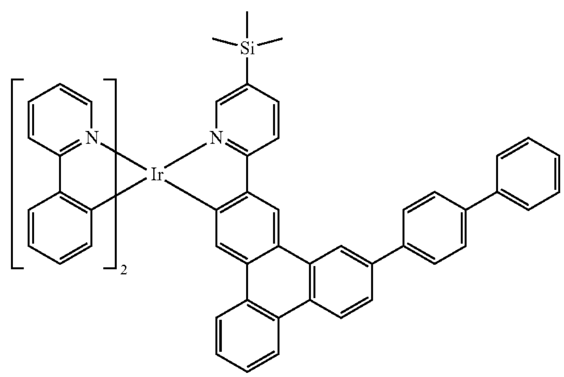
16
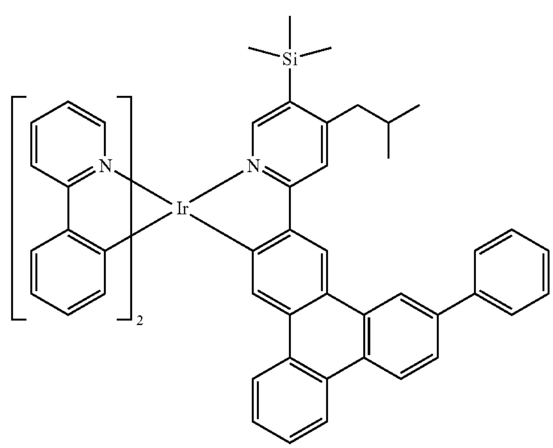

-continued
17
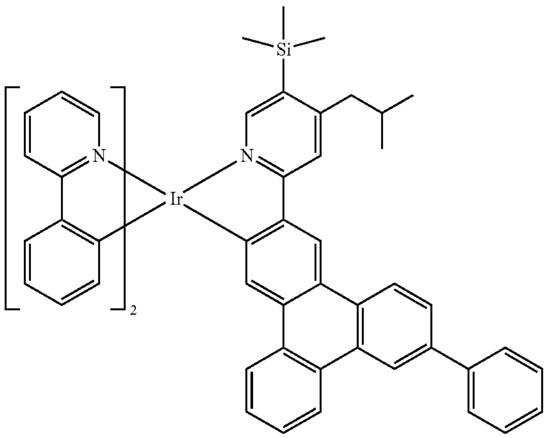
18
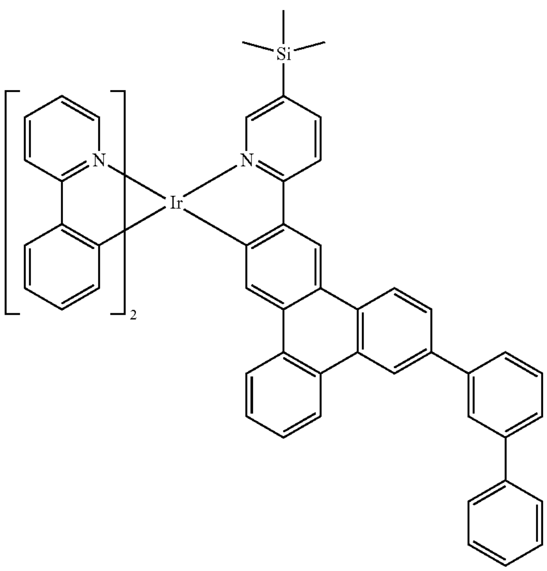
19
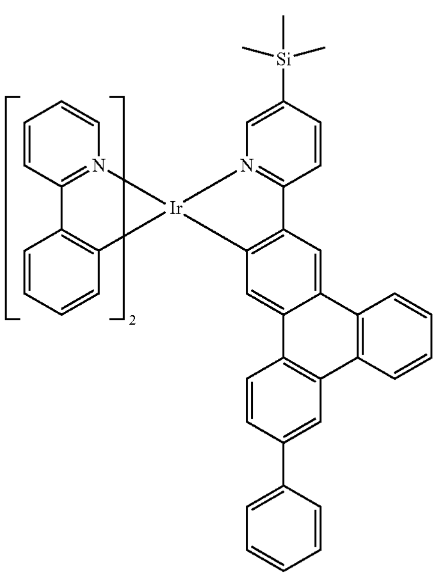
-continued
20
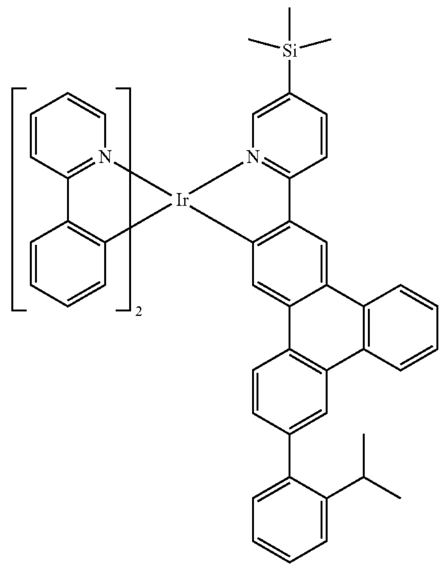
21
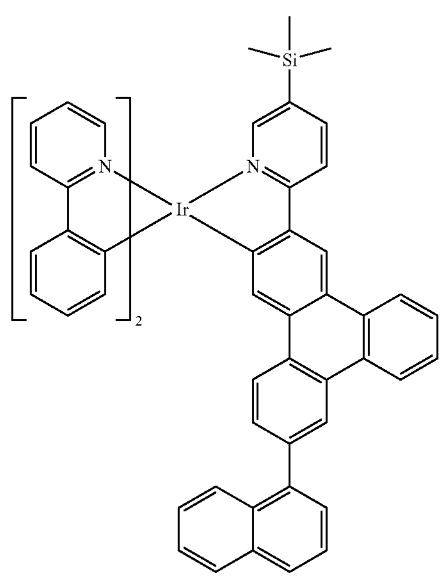

-continued
22
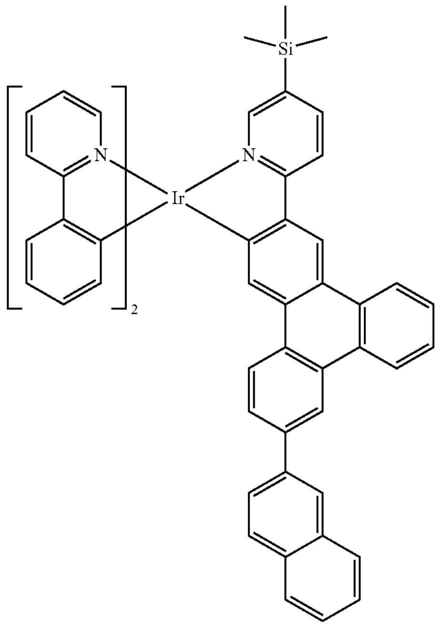
23
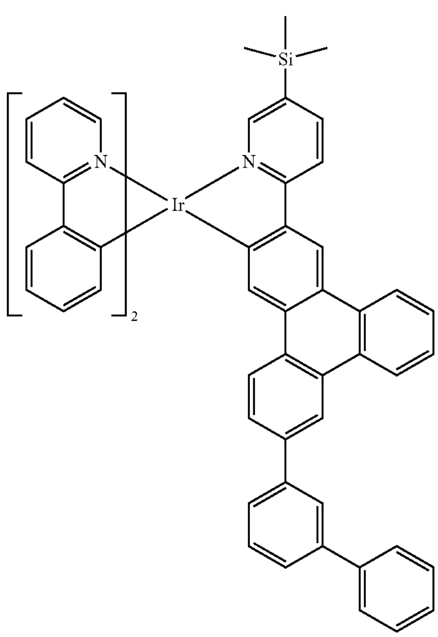
-continued
24
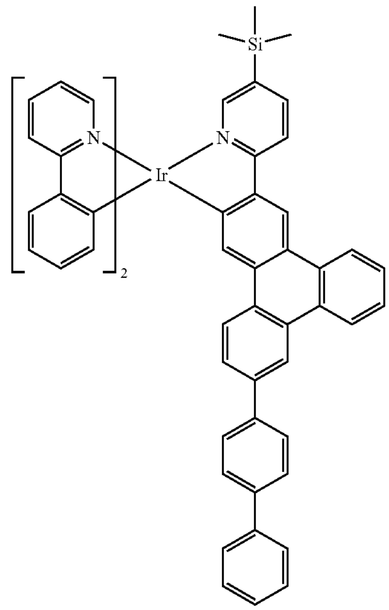
25
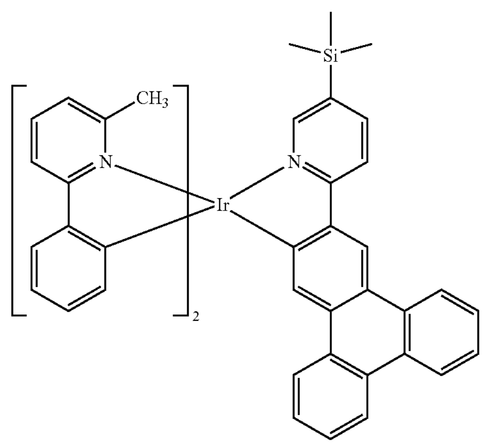
26
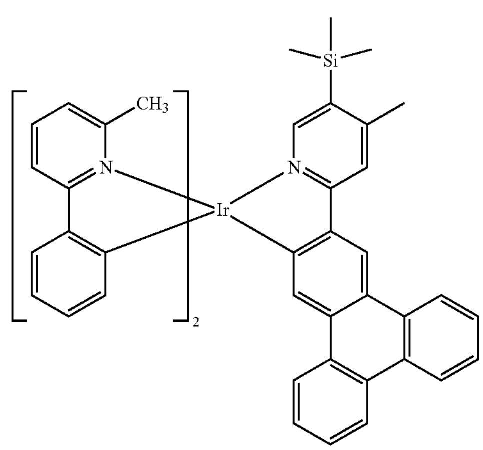

27
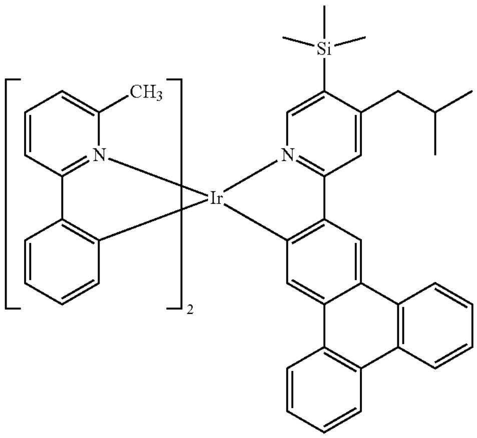
28
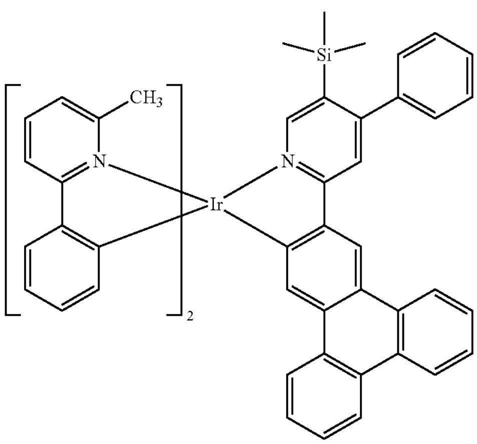
29
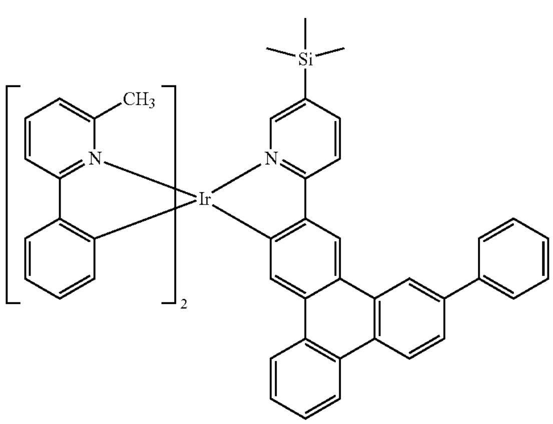
30
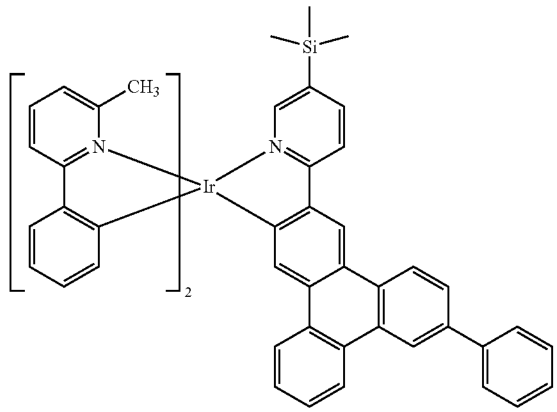
31
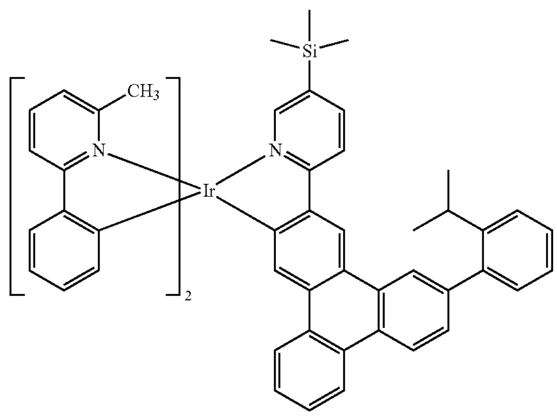
32
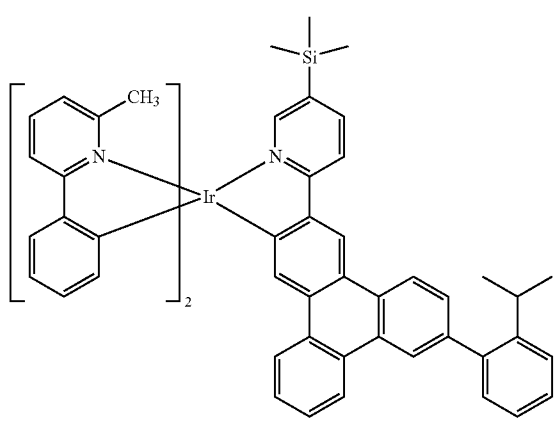

-continued
33
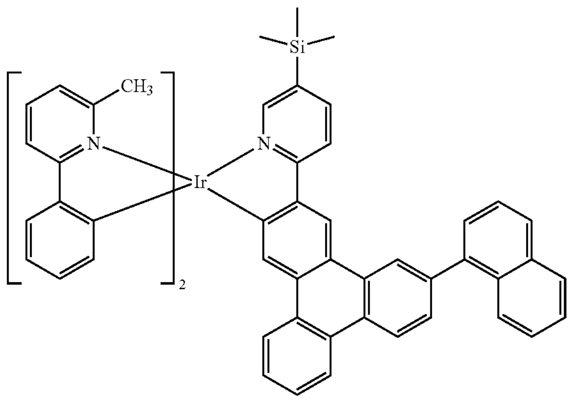
34
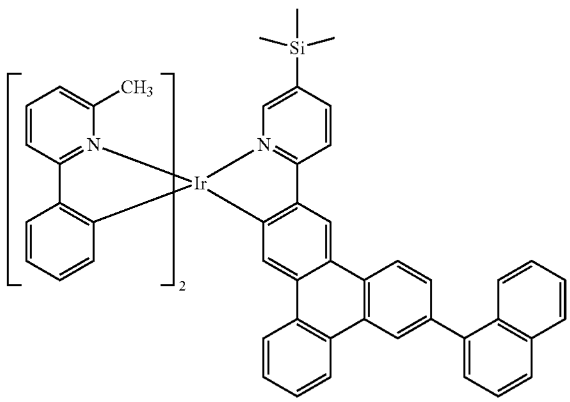
35
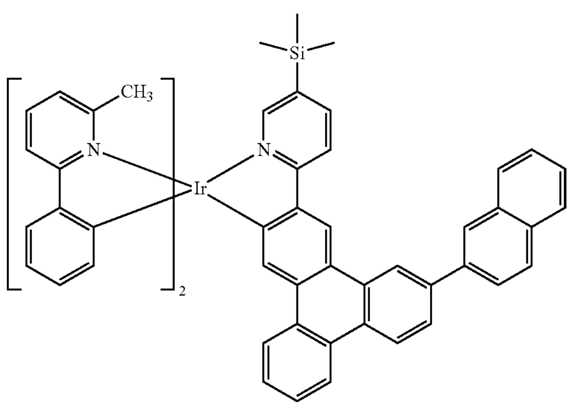
36
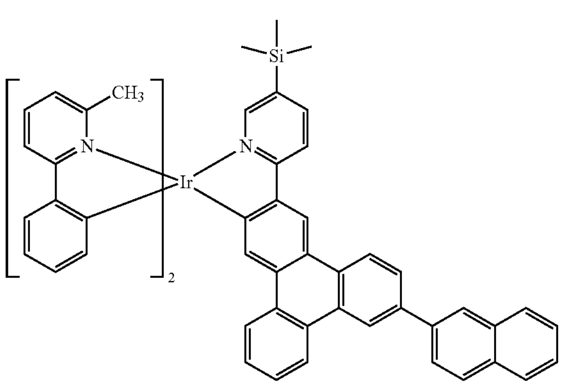
-continued
37
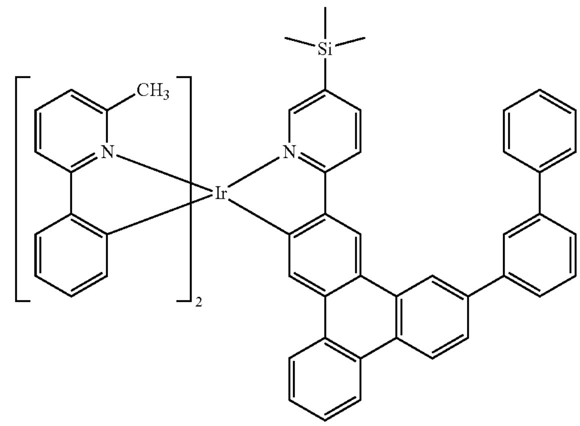
38
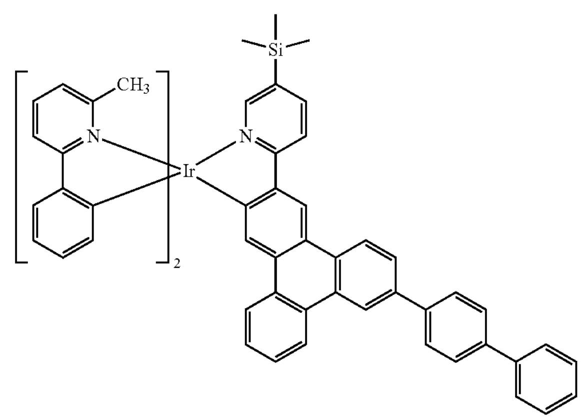
39
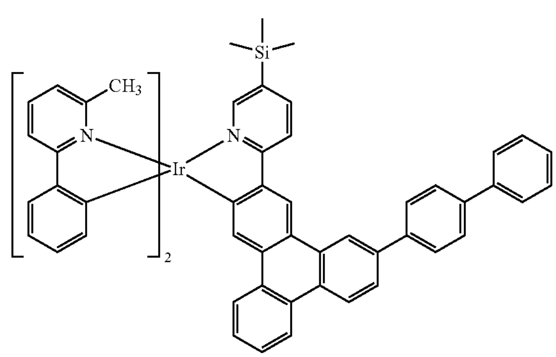

40
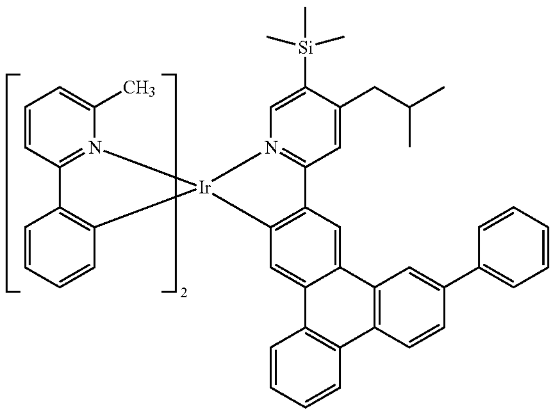
41
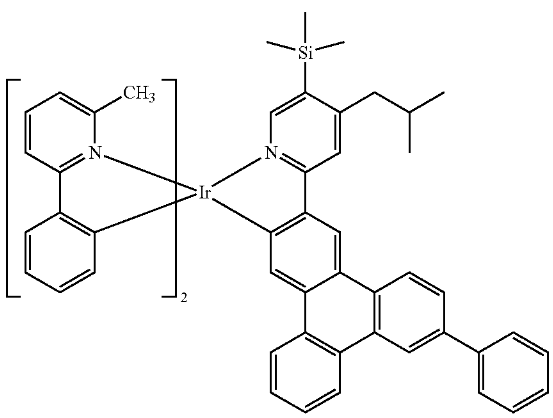
42
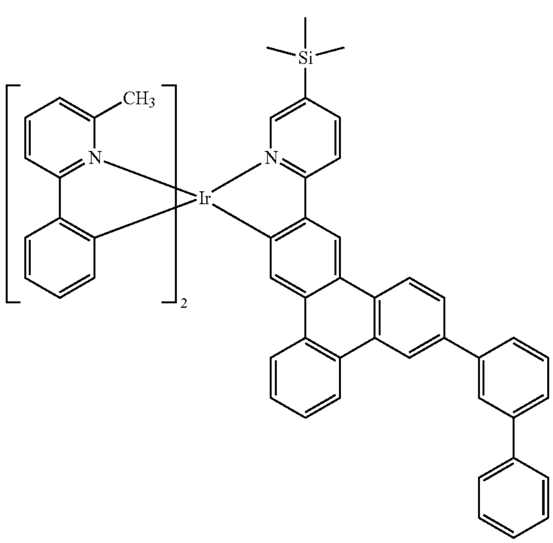
43
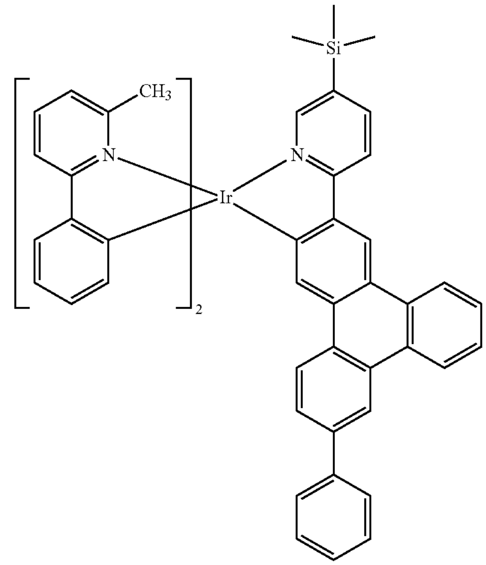
44
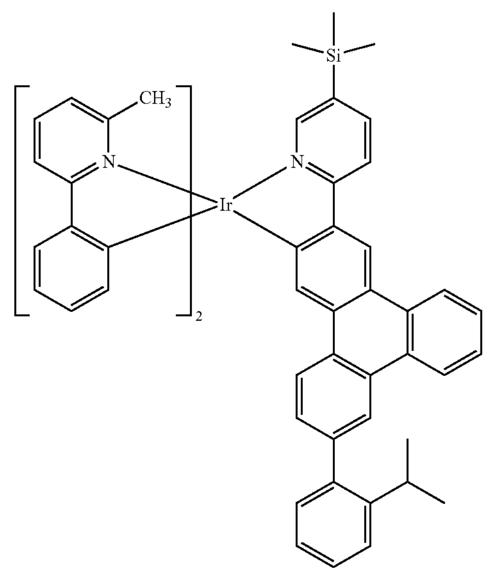

-continued
45
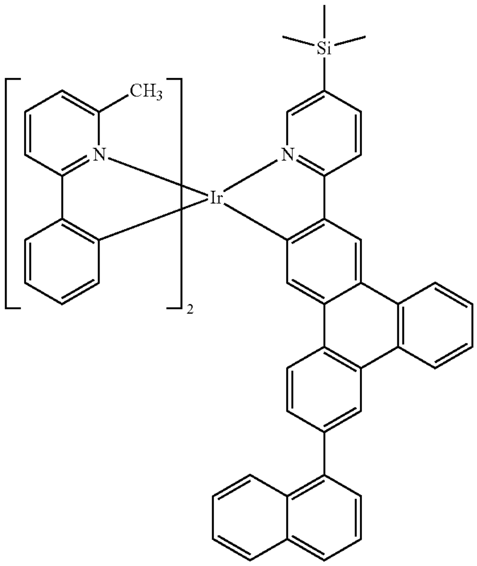
46
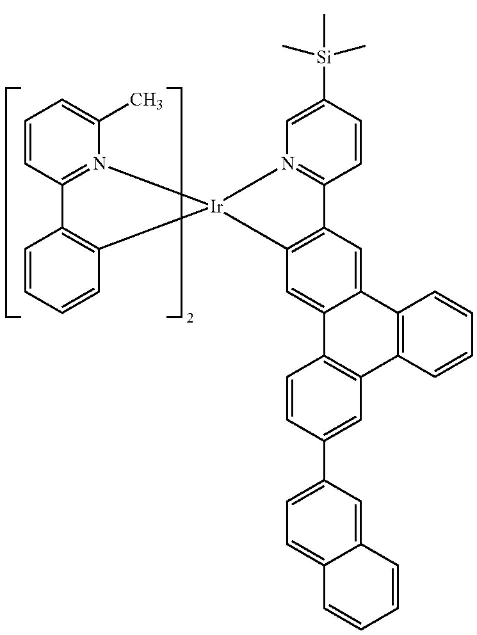
-continued
47
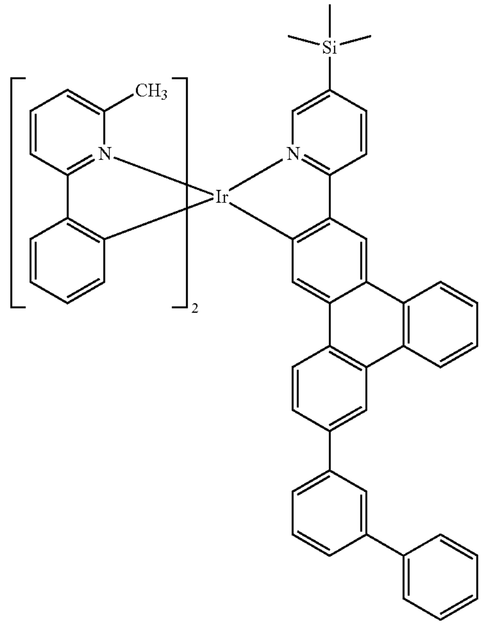
48
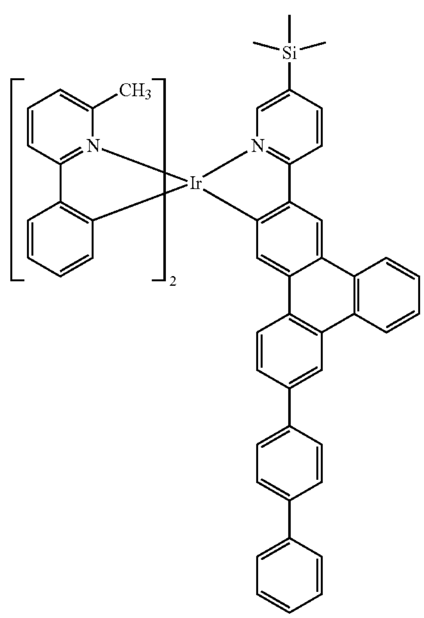

-continued
49
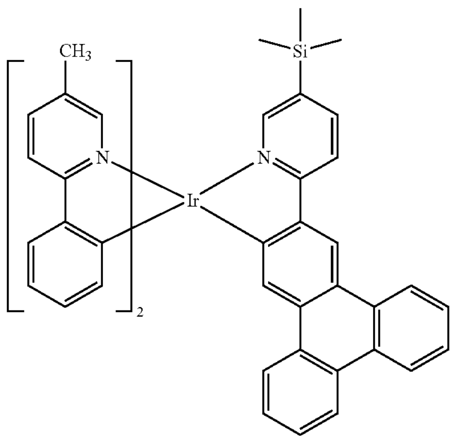
50
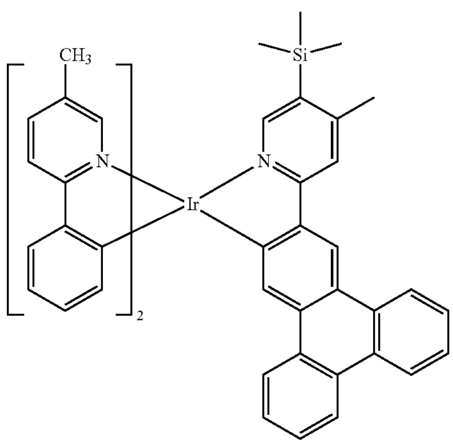
51
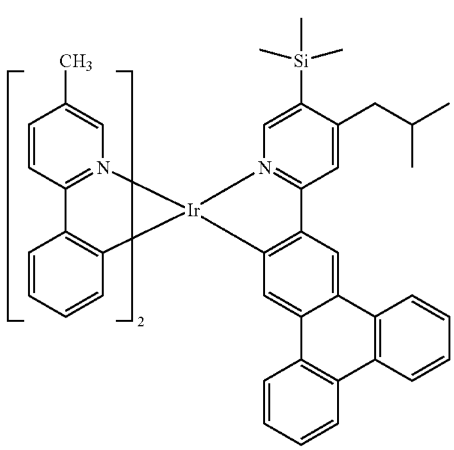
-continued
52
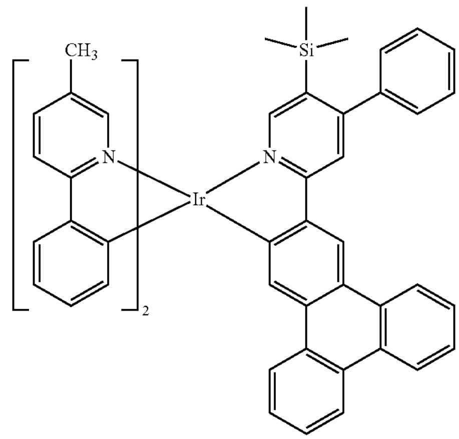
53
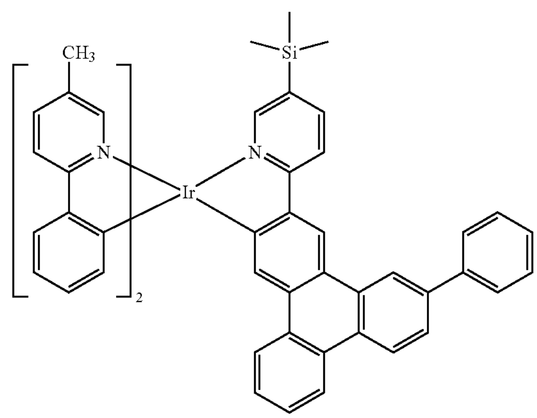
54
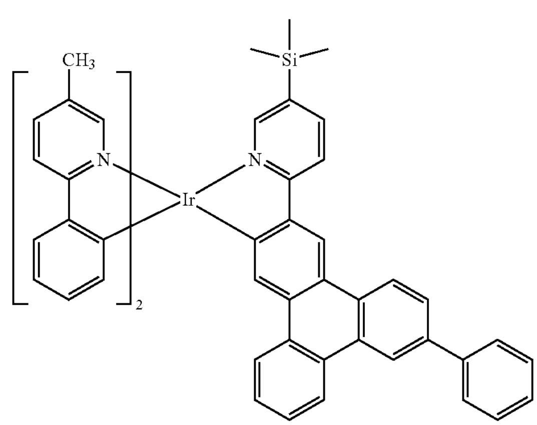

-continued
55
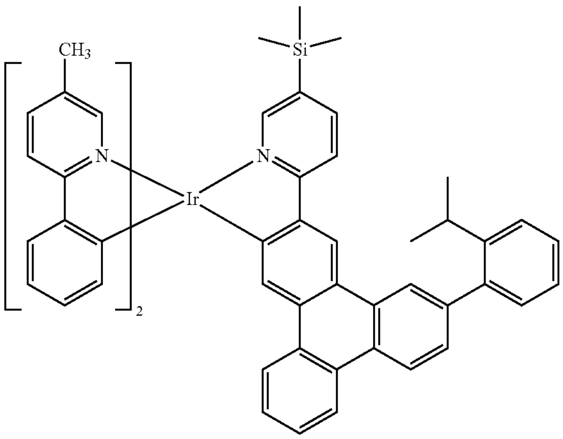
56
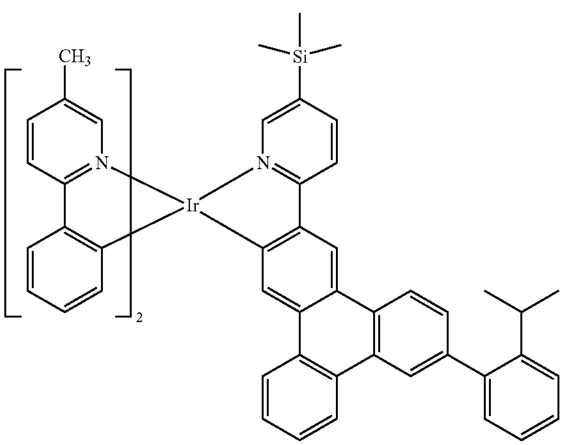
57
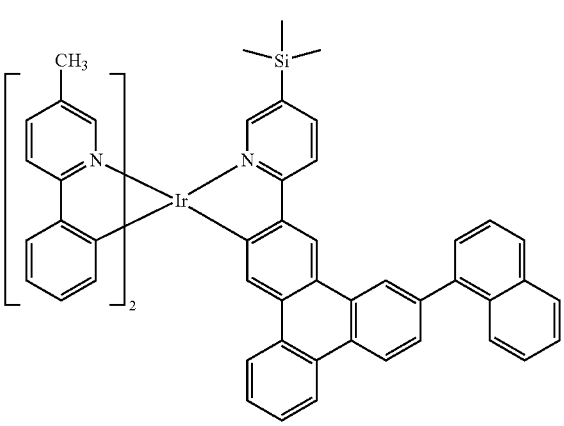
-continued
58
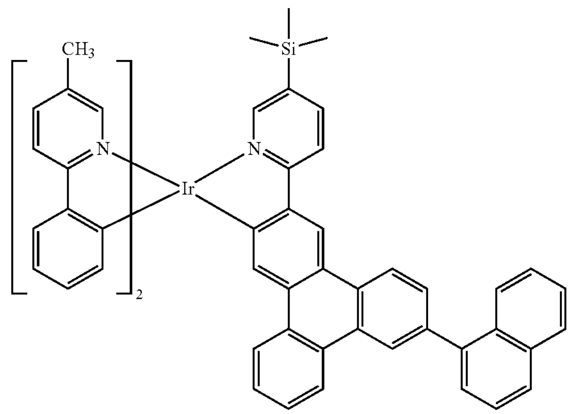
59
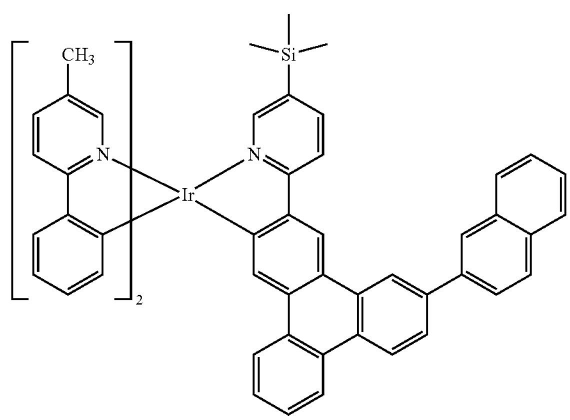
60
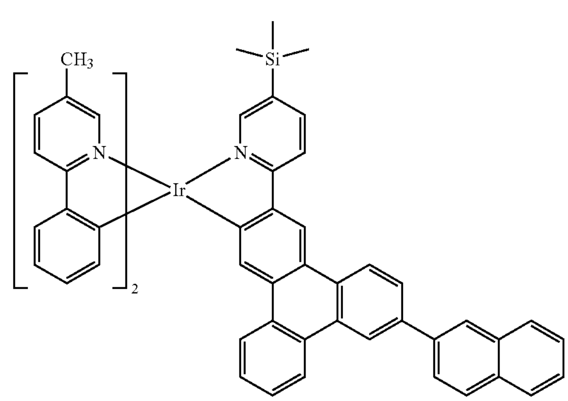

61
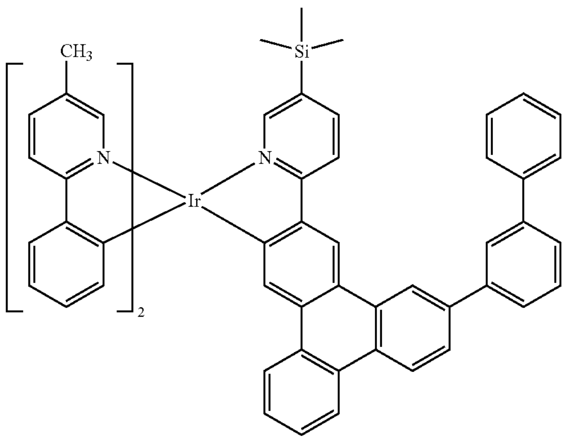
62
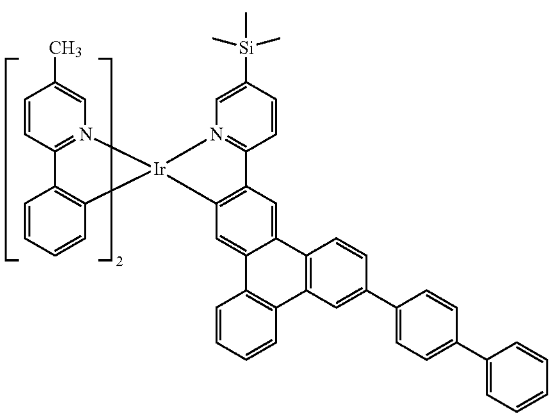
63
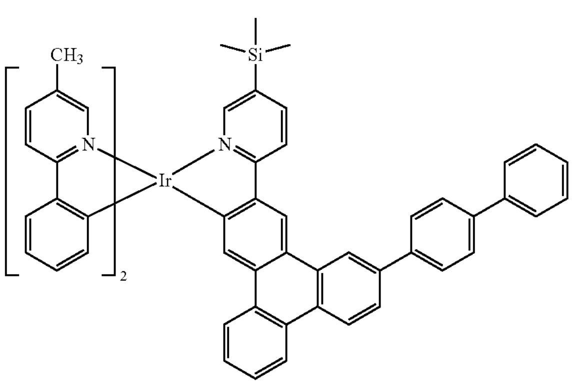
64
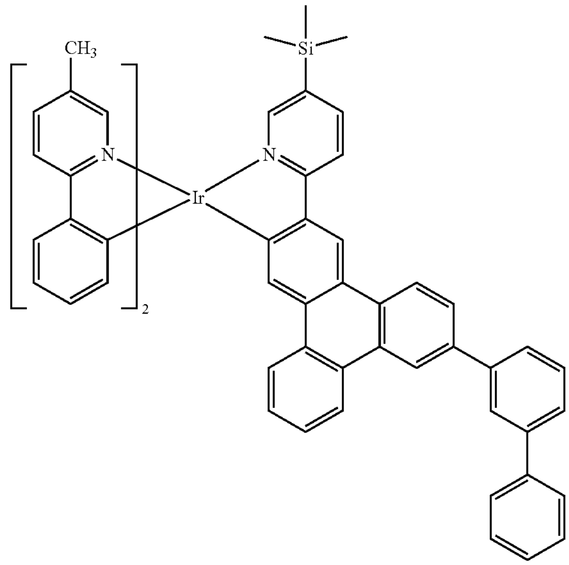
65
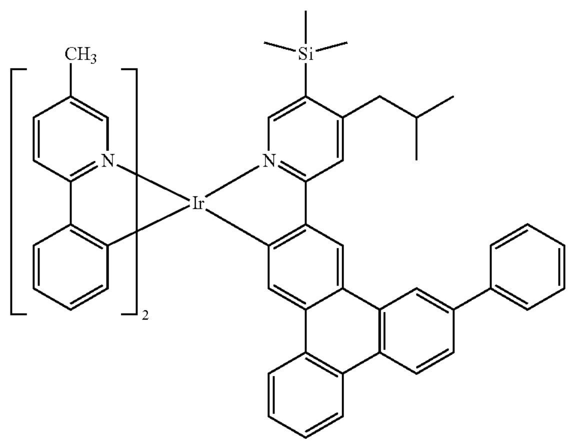
66
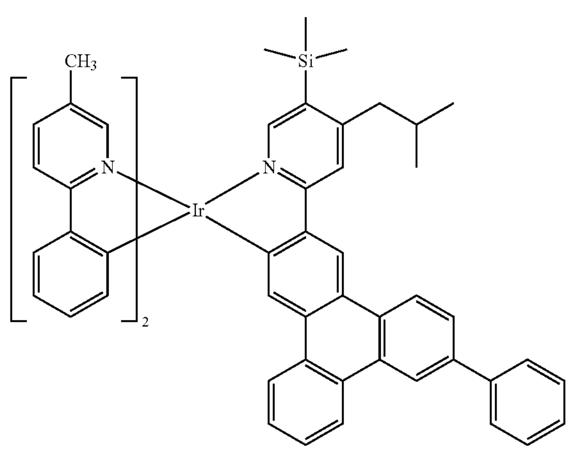

67
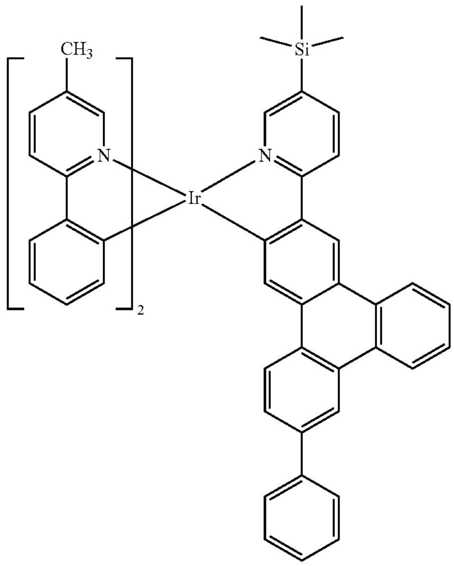
68
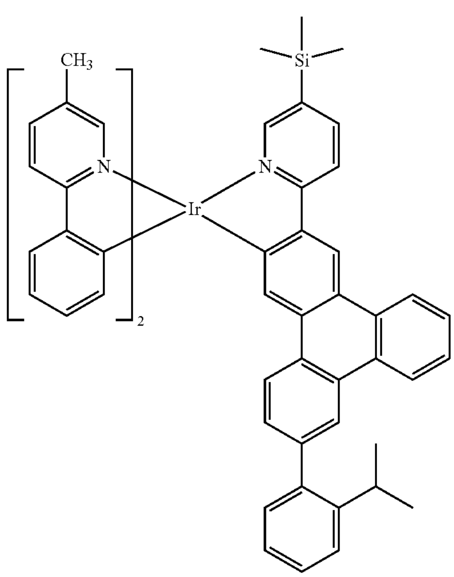
69
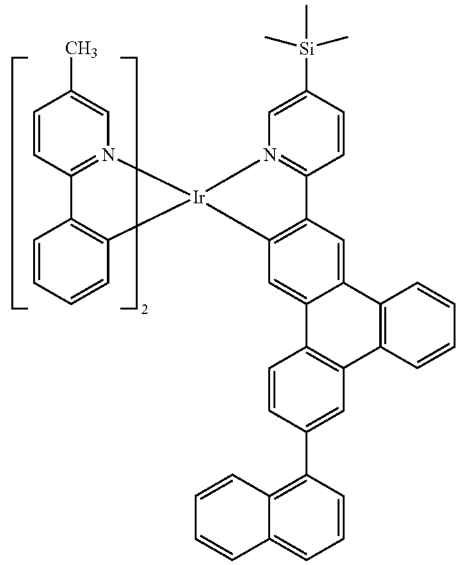
70
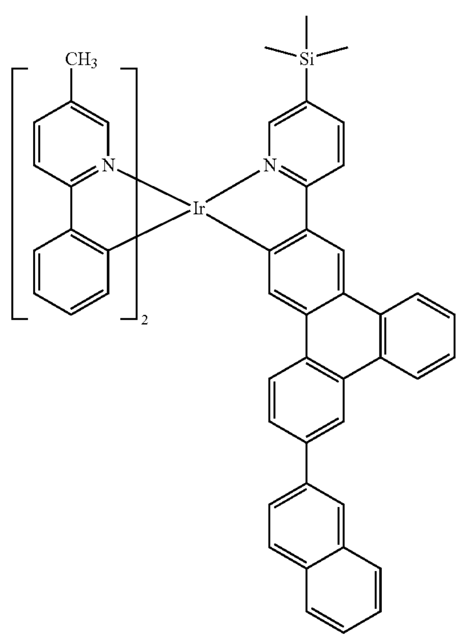

-continued
71
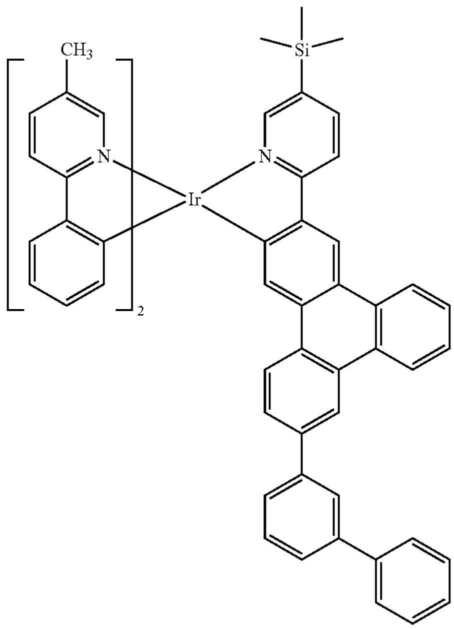
72
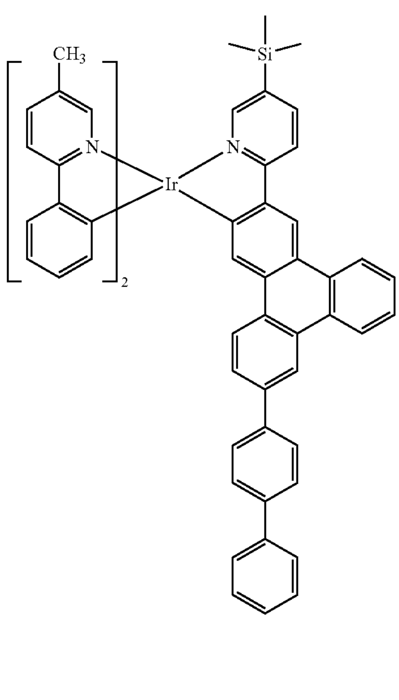
-continued
73
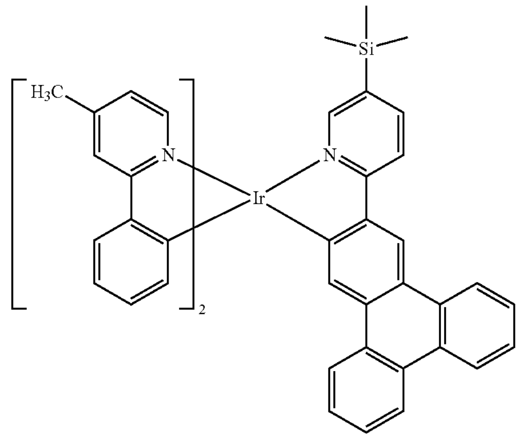
74
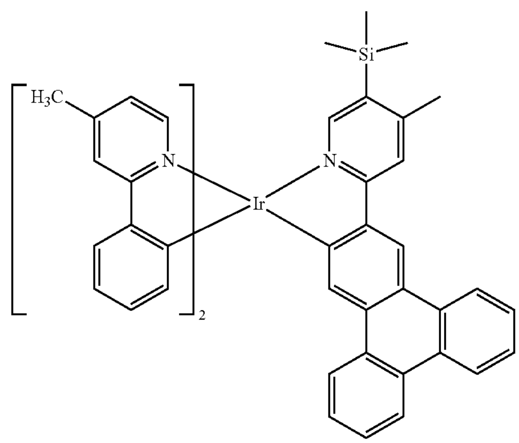
75
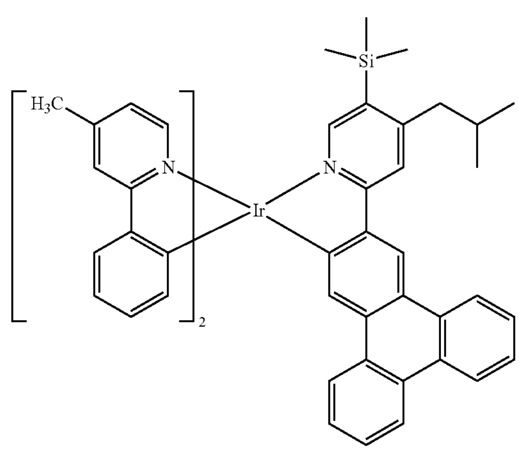

76
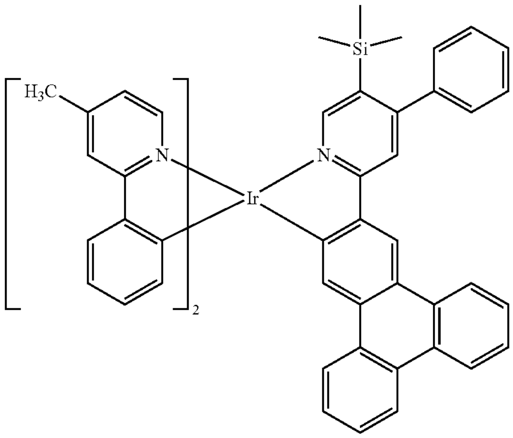
77
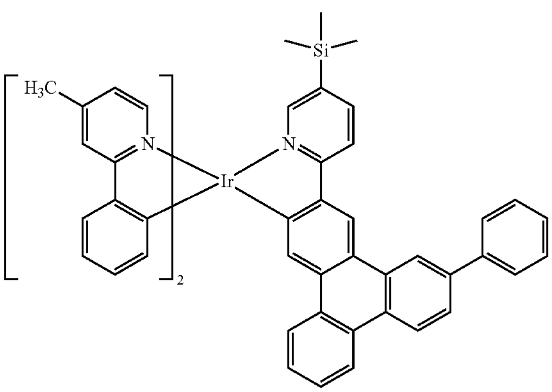
78
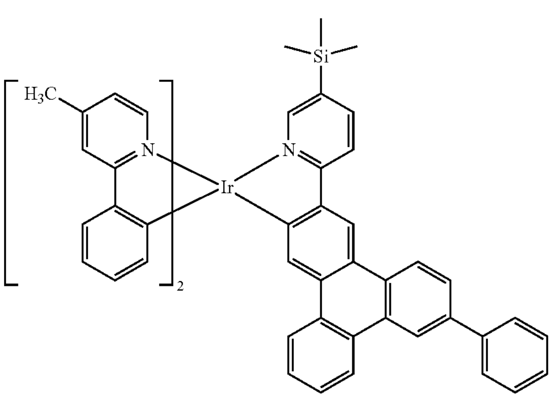
79
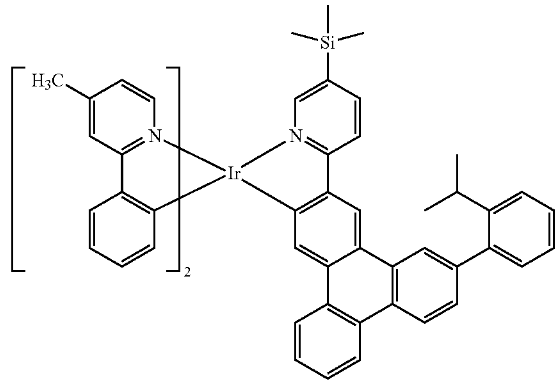
80
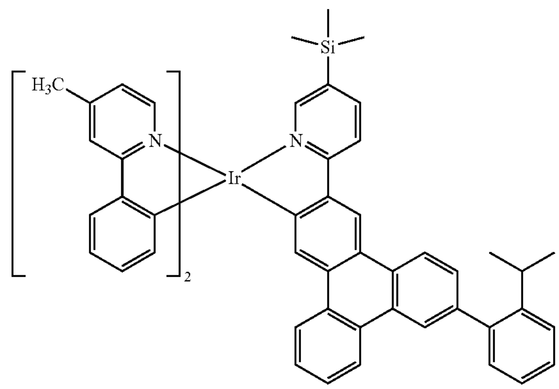
81
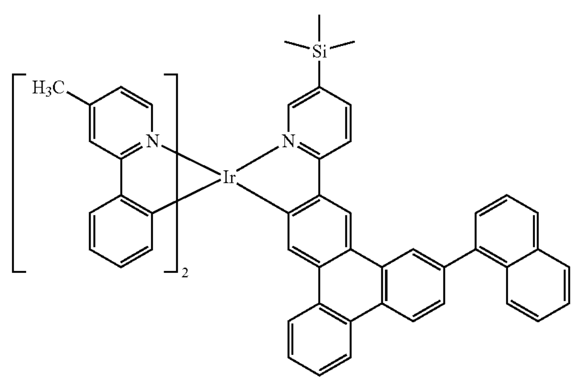
82
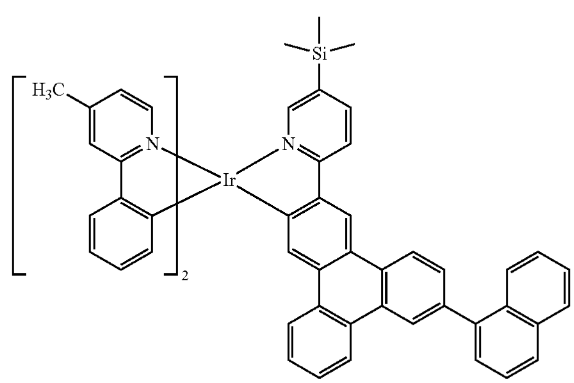

-continued
83
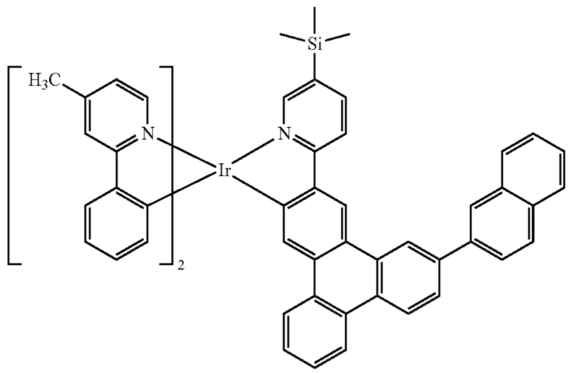
84
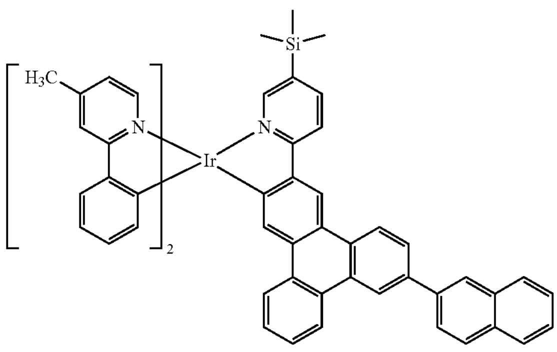
85
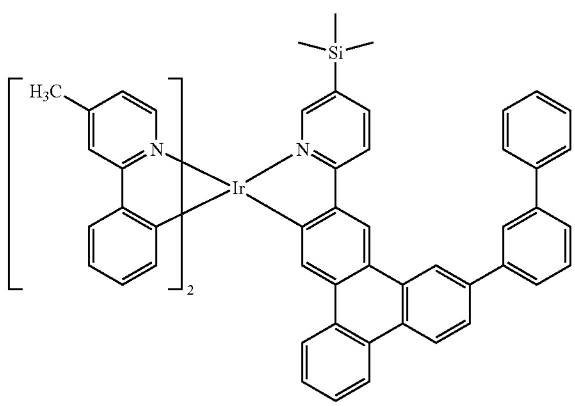
86
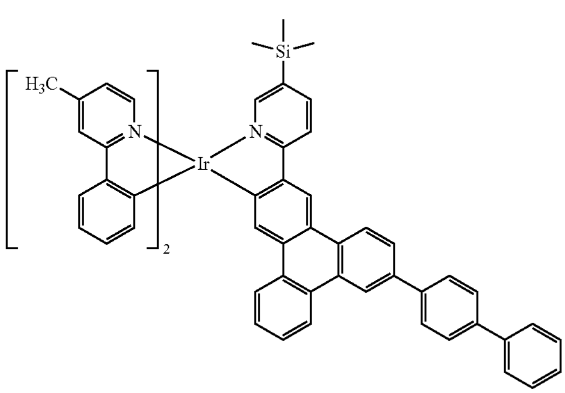
-continued
87
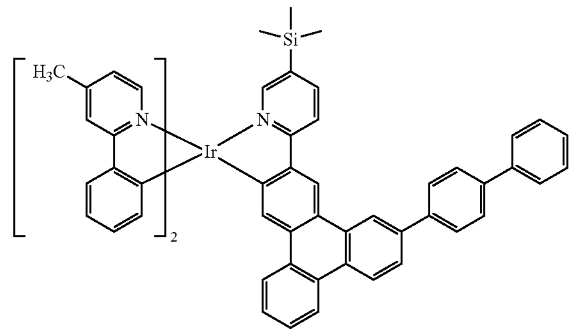
88
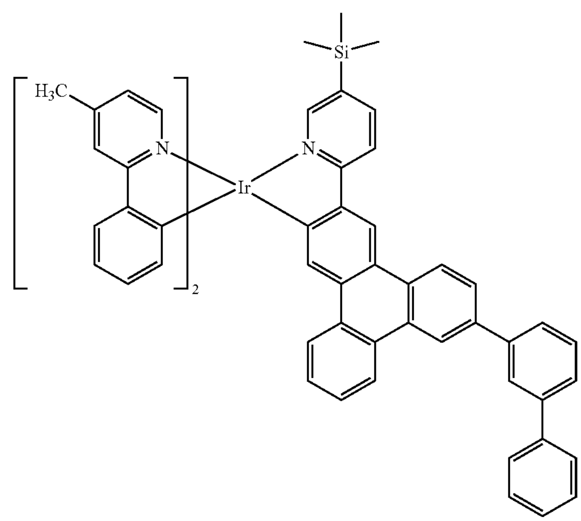
89
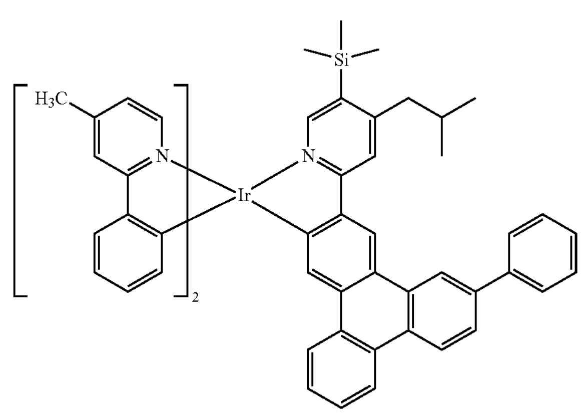

-continued
90
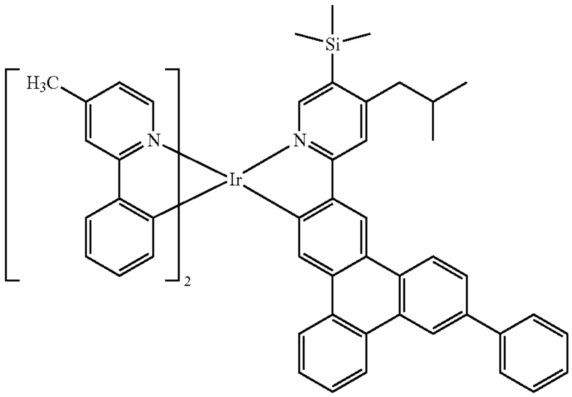
91
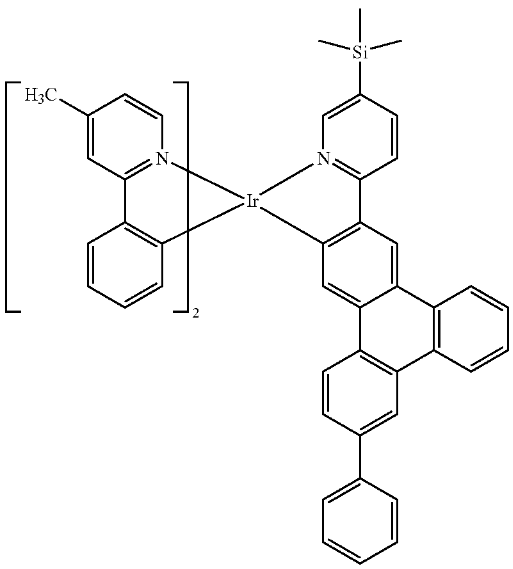
92
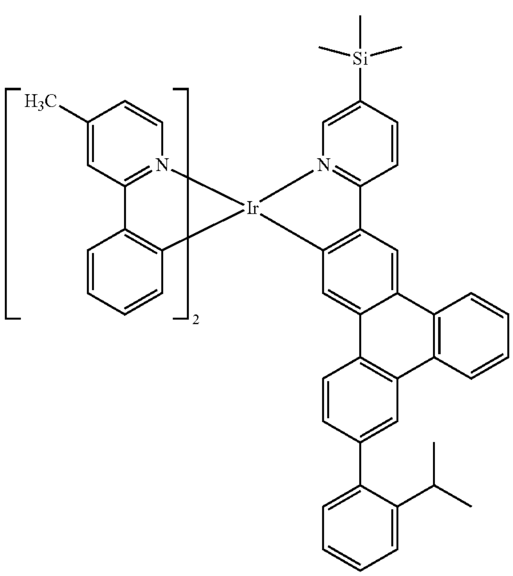
-continued
93
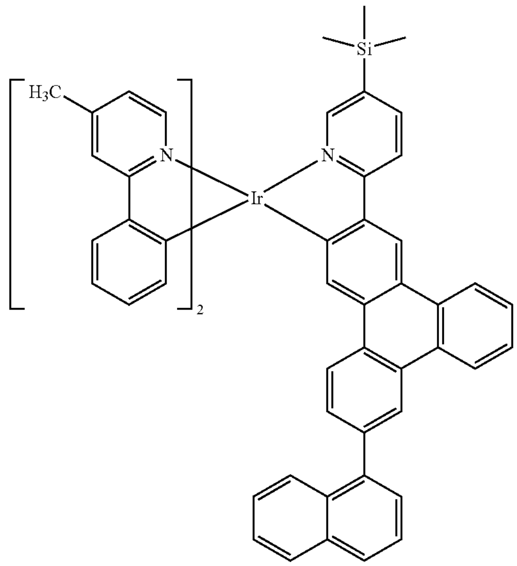
94
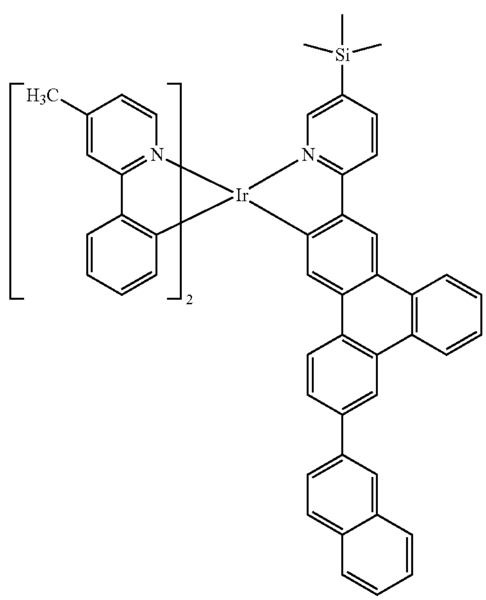

-continued
95
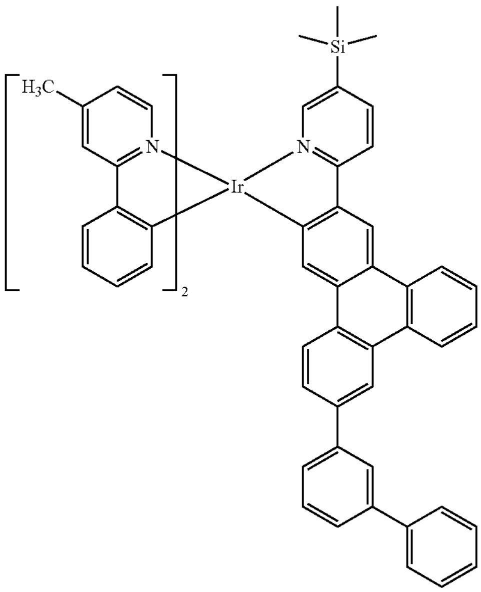
96
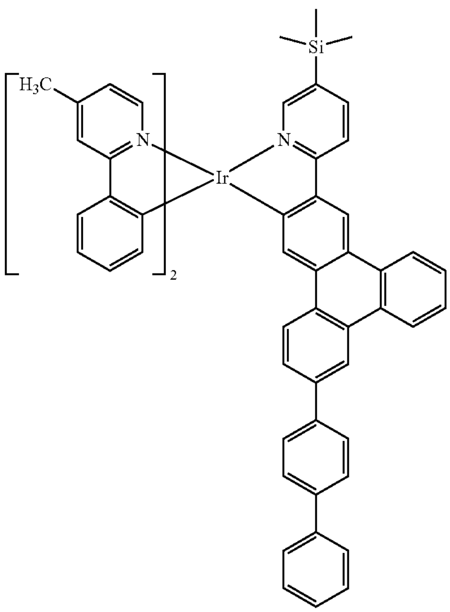
97
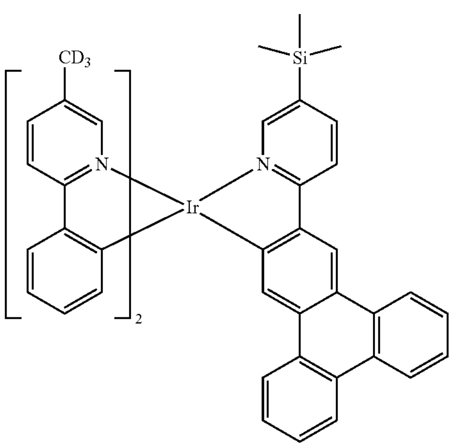
-continued
98
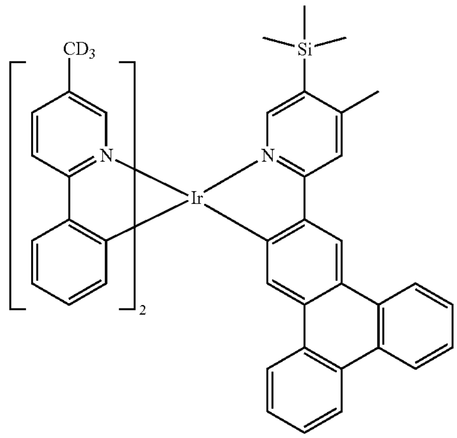
99
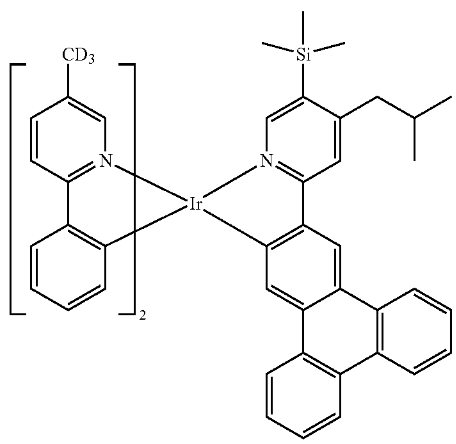
100
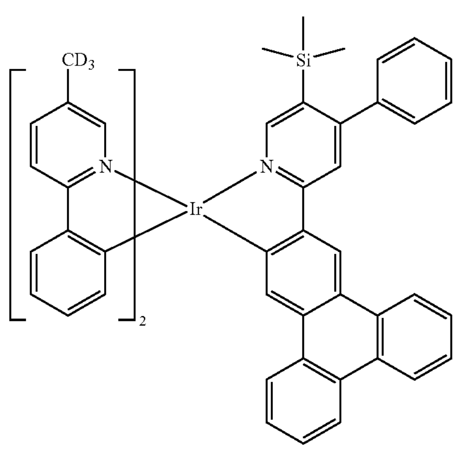

-continued
101
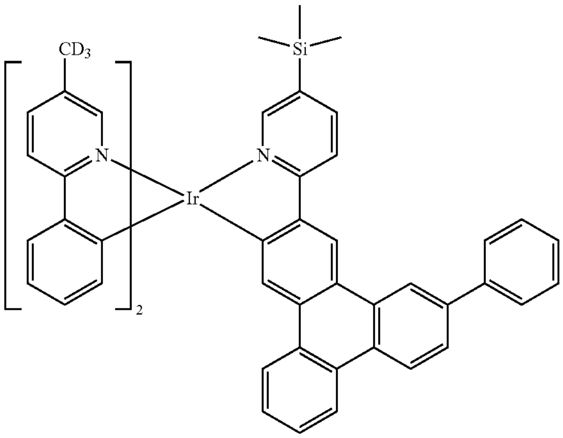
102
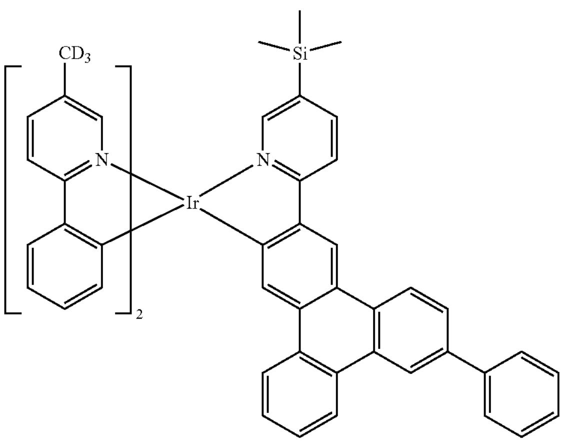
103
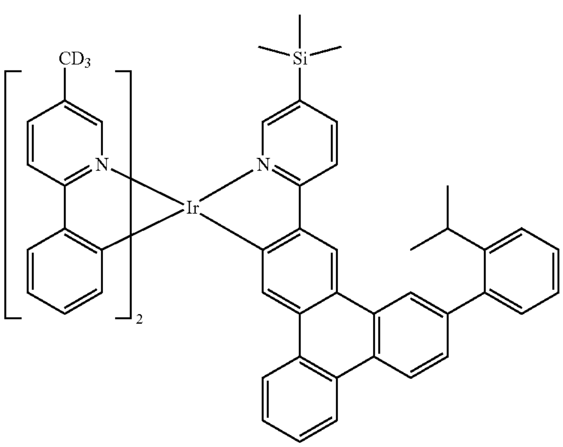
-continued
104
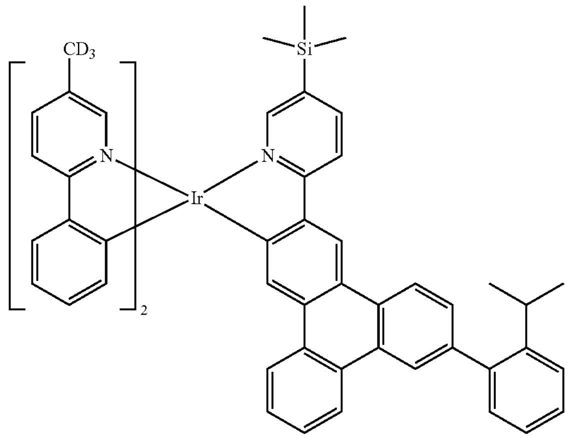
105
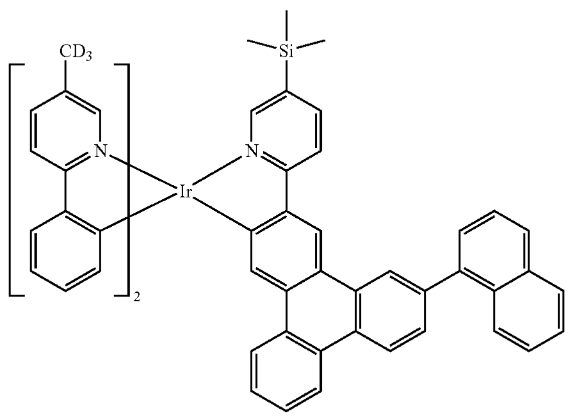
106
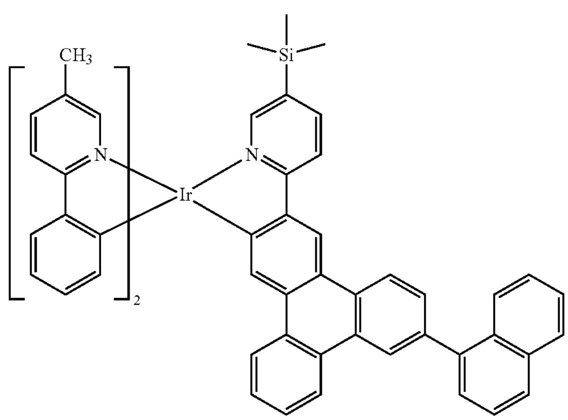

107
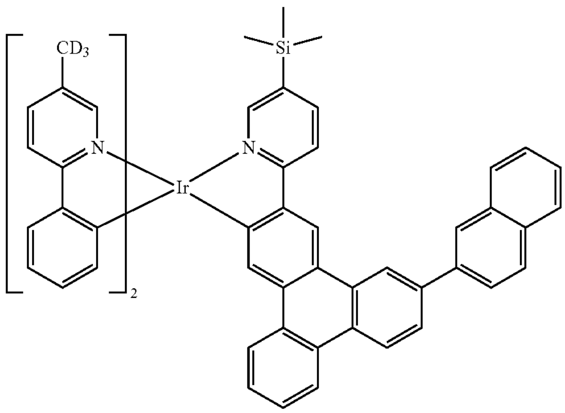
108
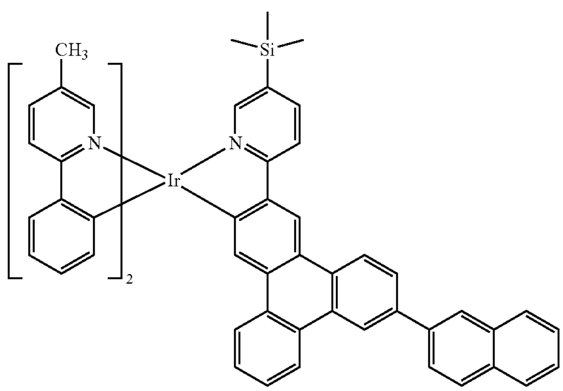
109
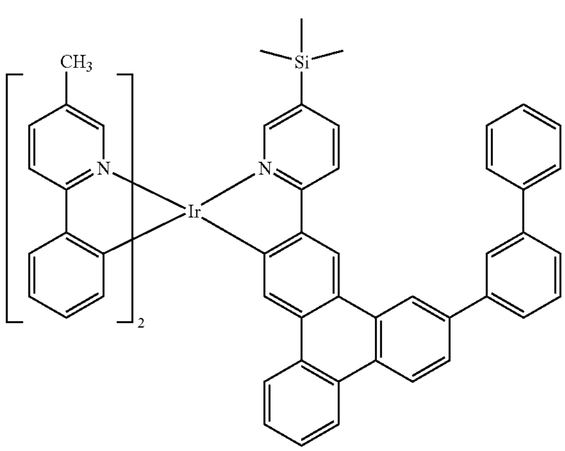
110
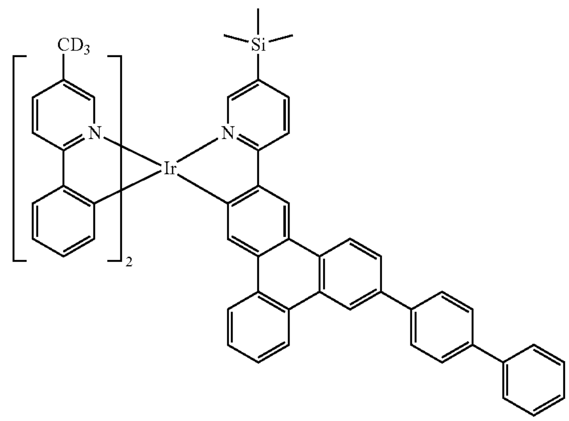
111
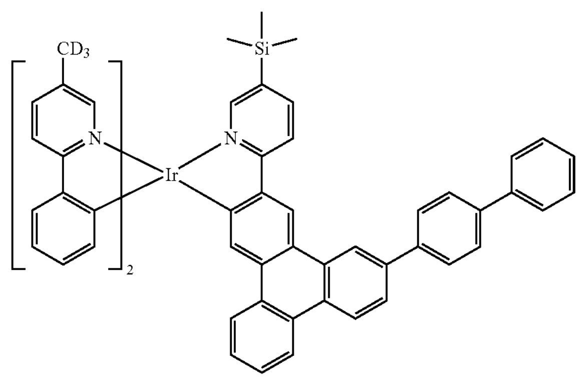
112
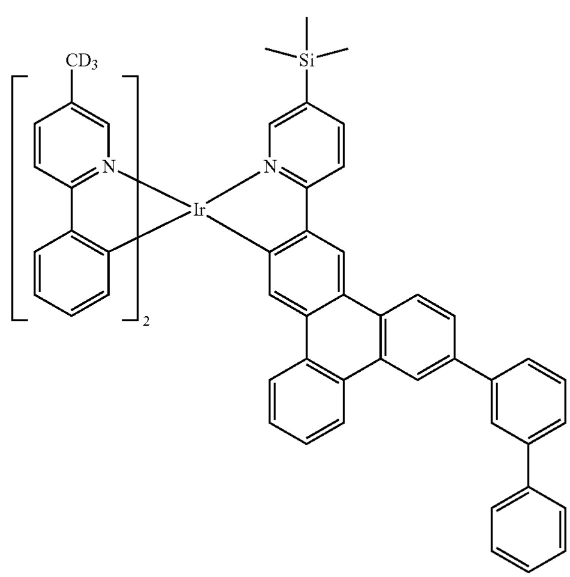

113
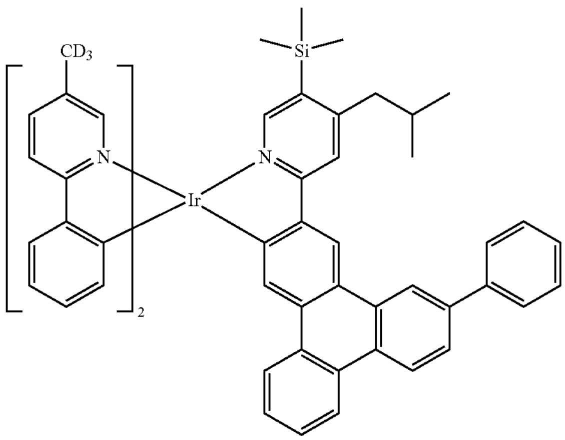
114
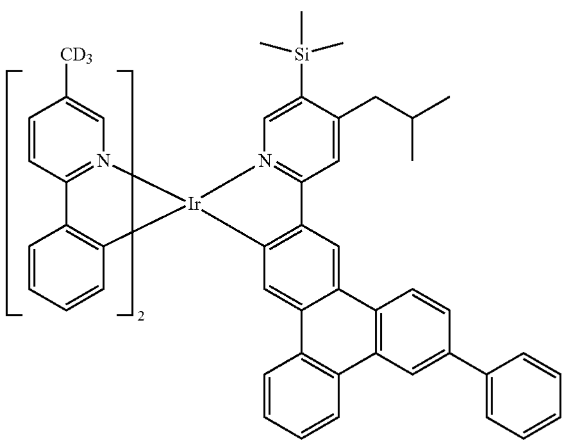
115
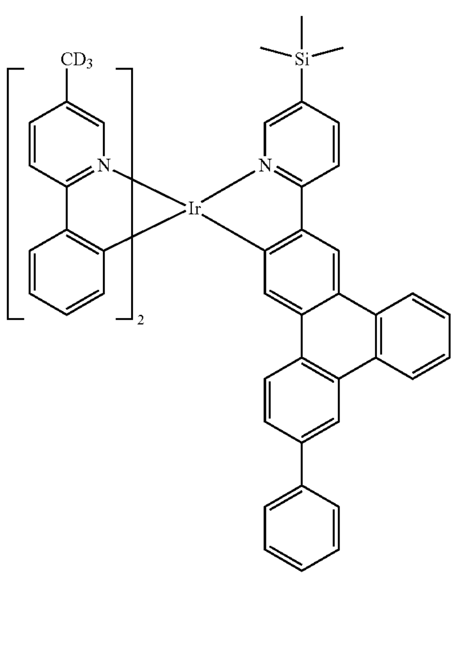
116
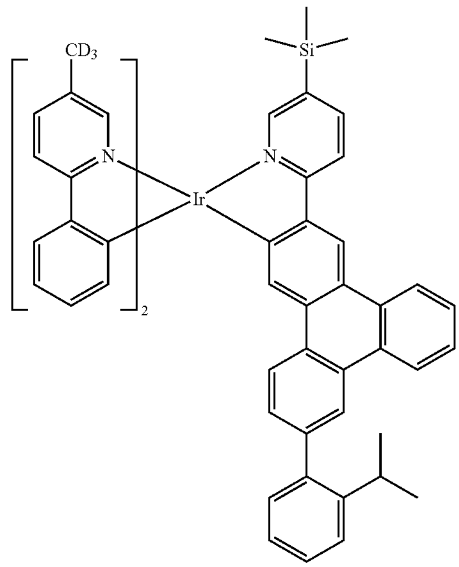
117
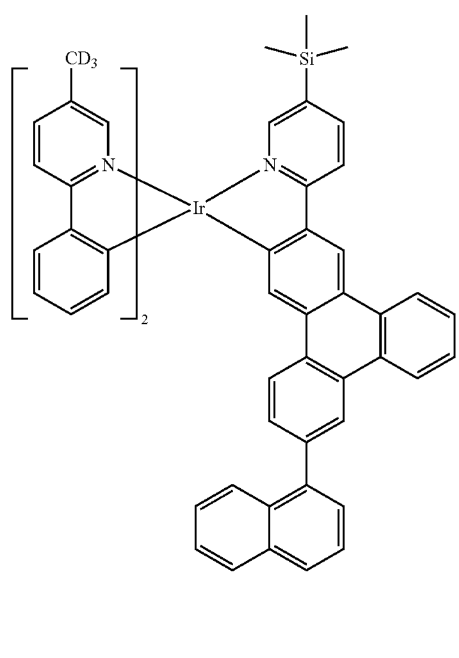

-continued
118
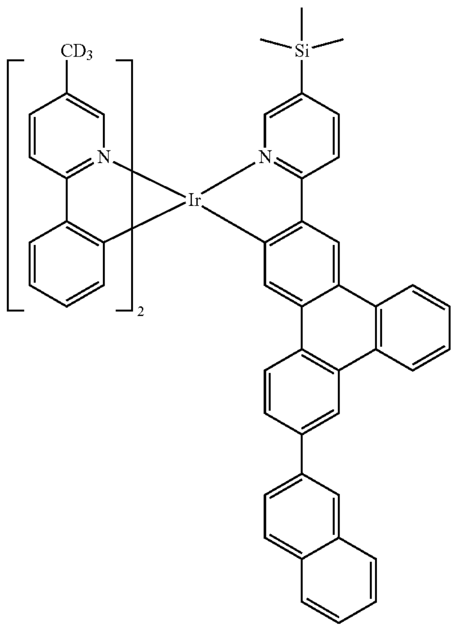
119
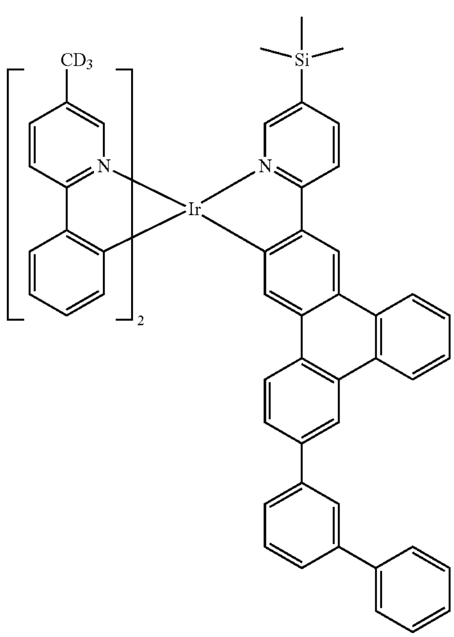
-continued
120
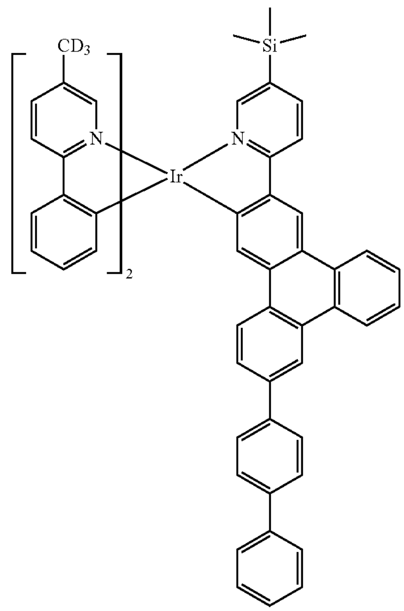
121
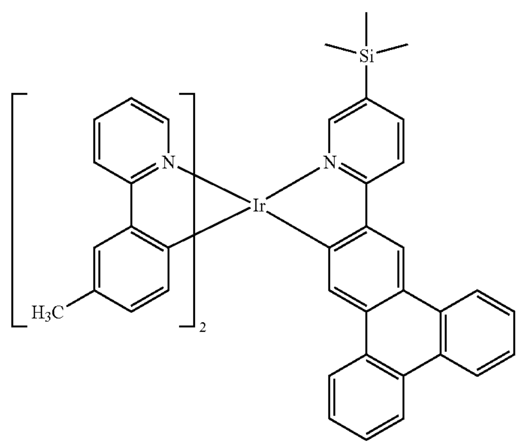
122
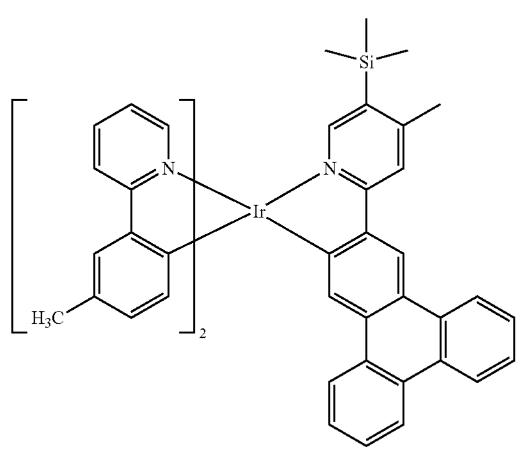

-continued
123
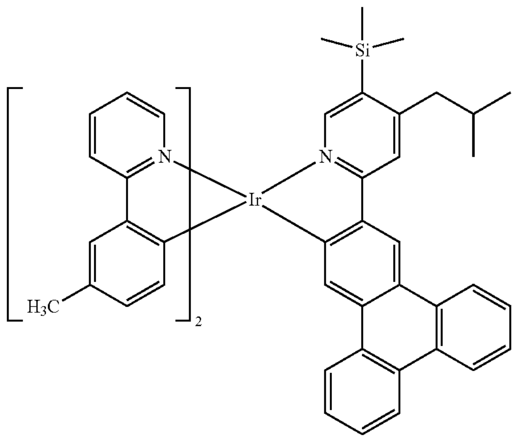
124
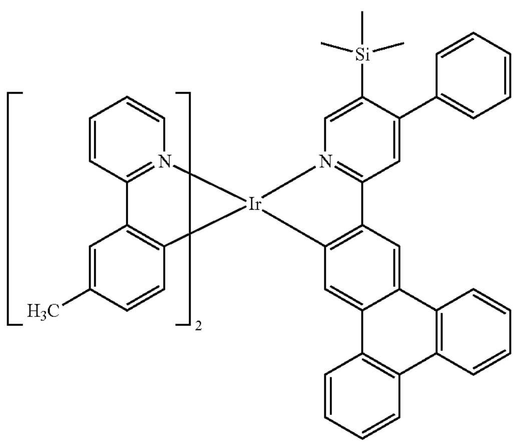
125
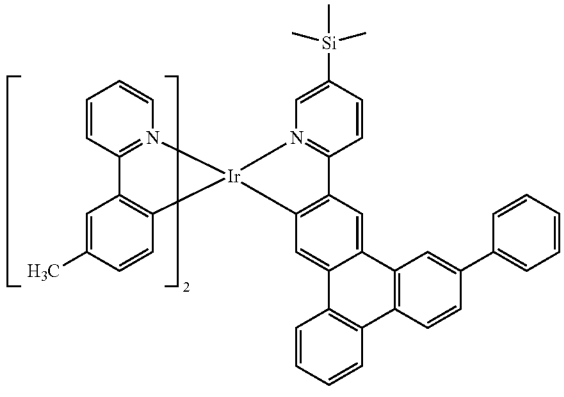
-continued
126
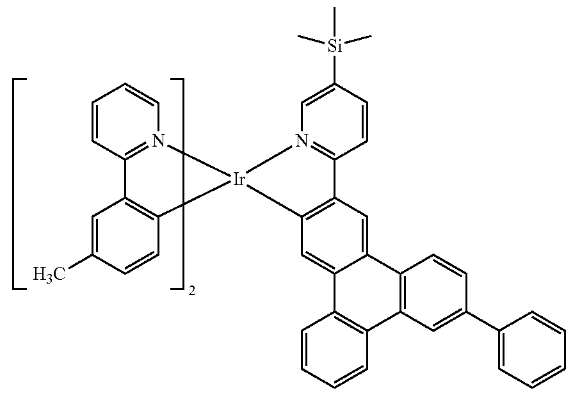
127
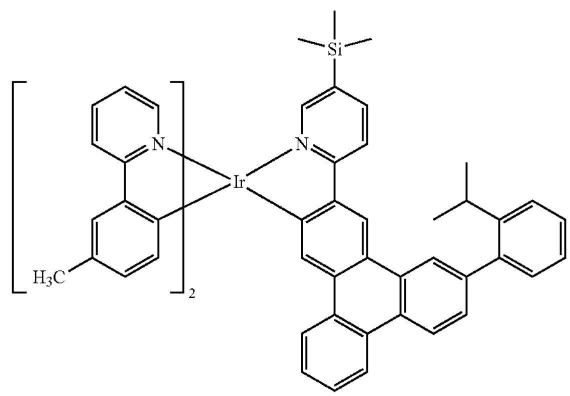
128
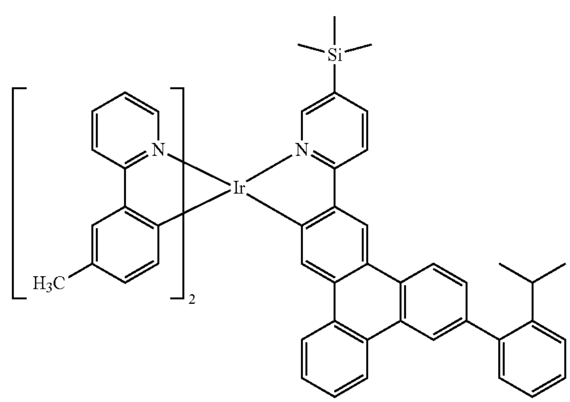
129
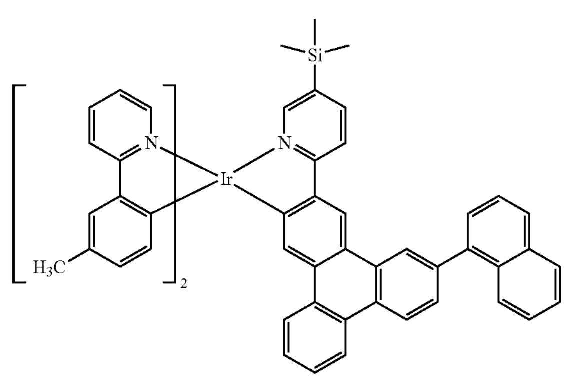

-continued
130
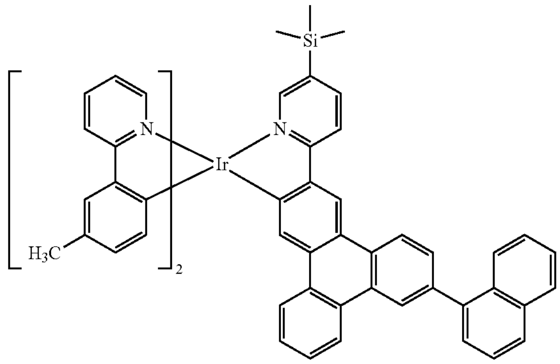
131
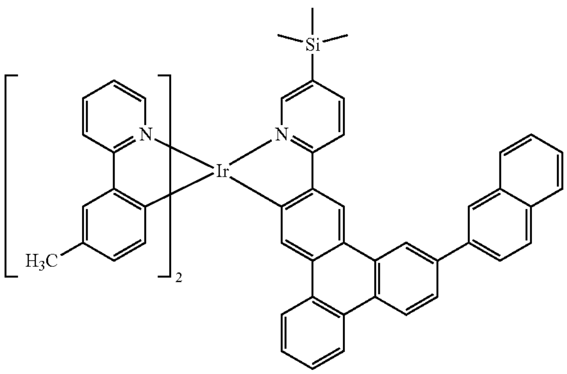
132
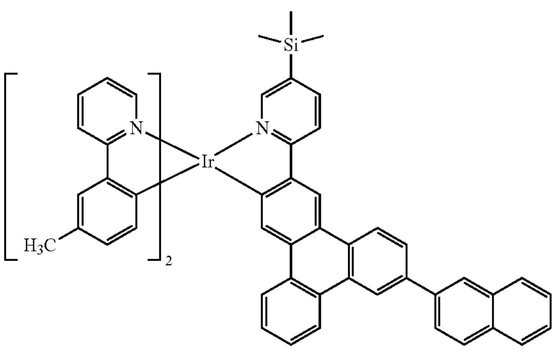
133
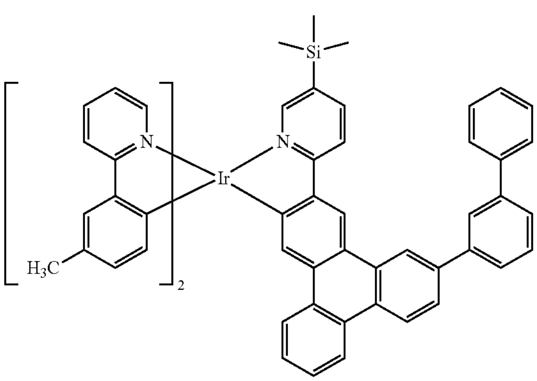
-continued
134
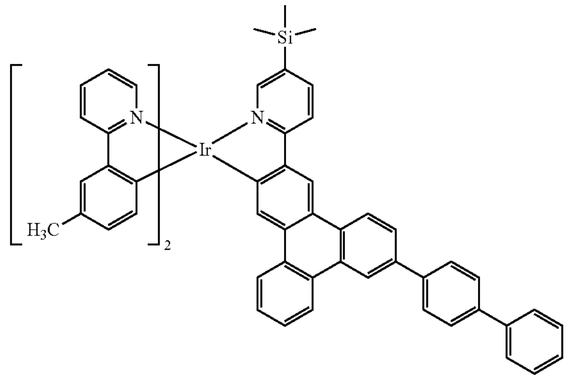
135
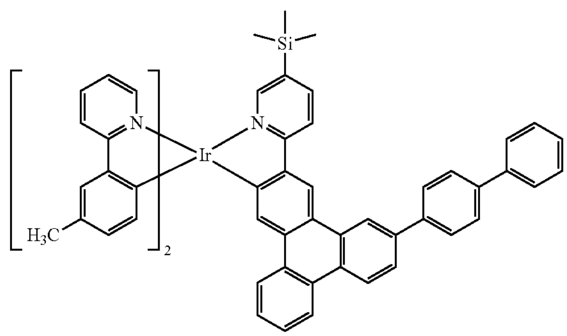
136
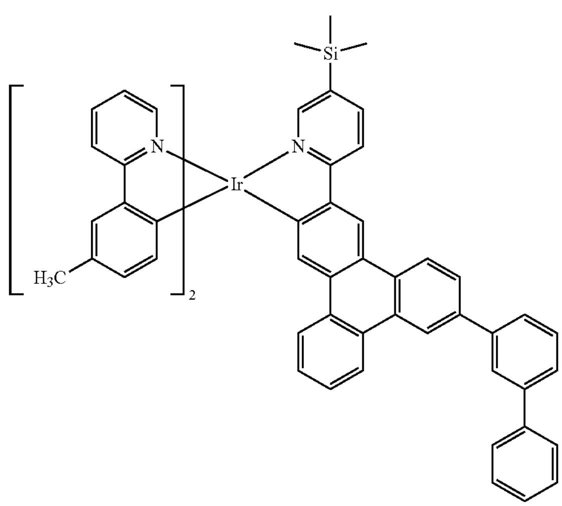

-continued
137
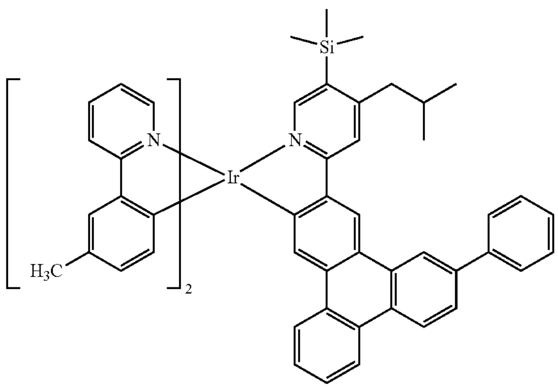
138
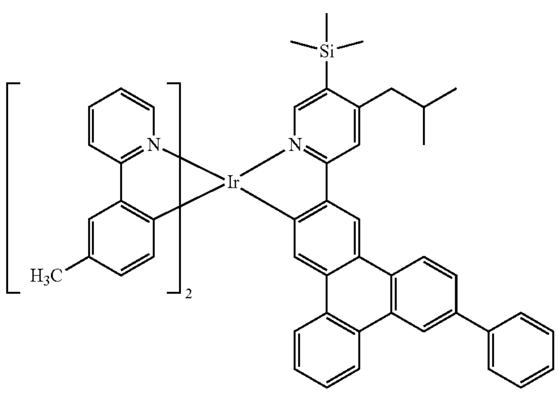
139
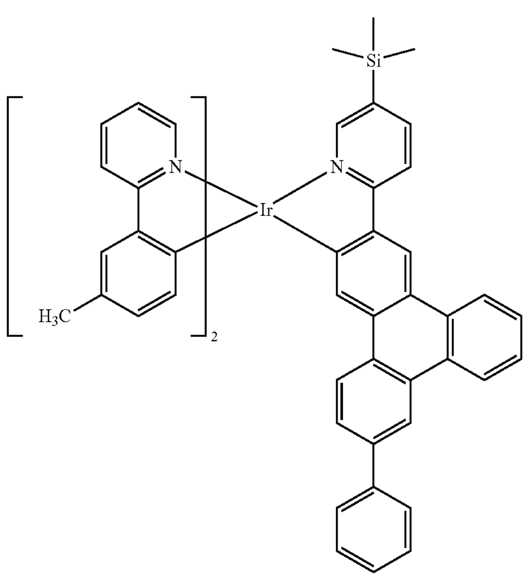
-continued
140
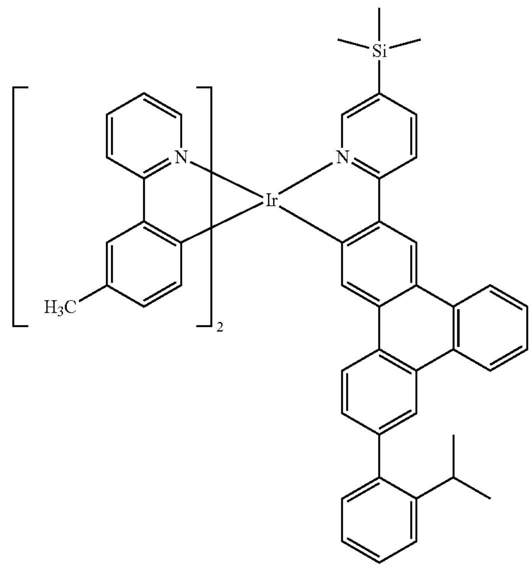
141
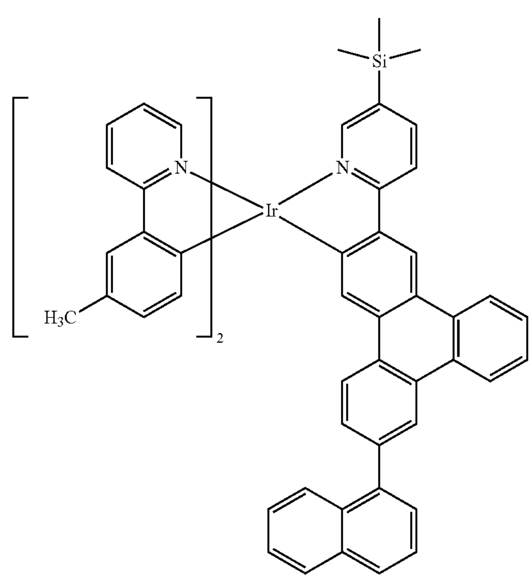

-continued
142
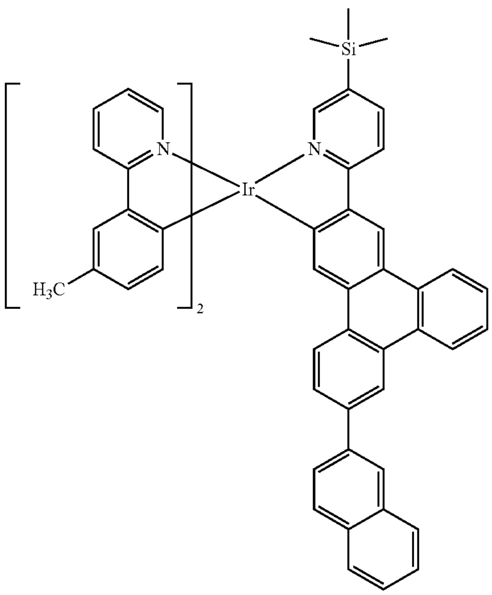
143
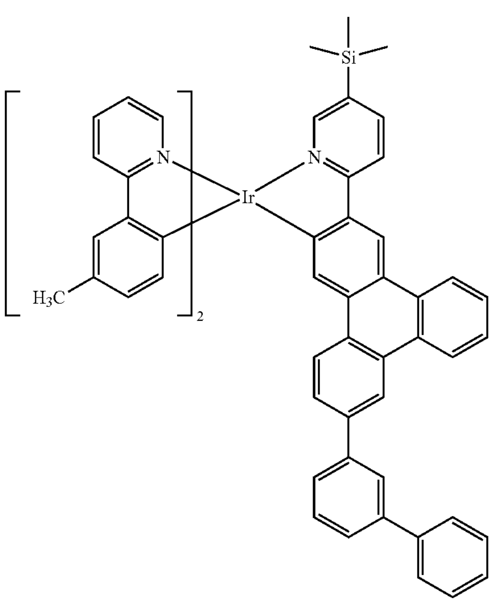
-continued
144
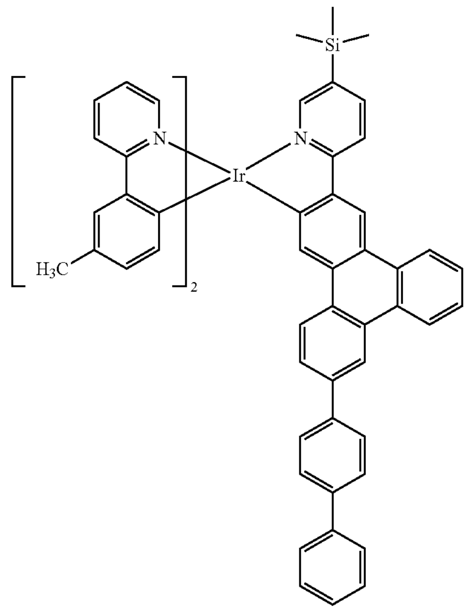
146
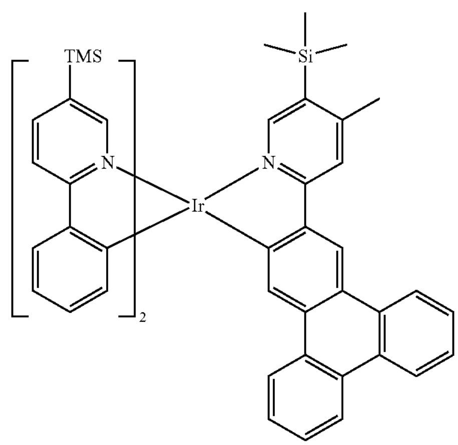
147
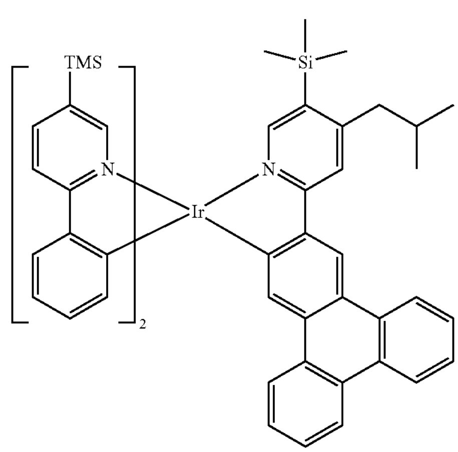

-continued
148
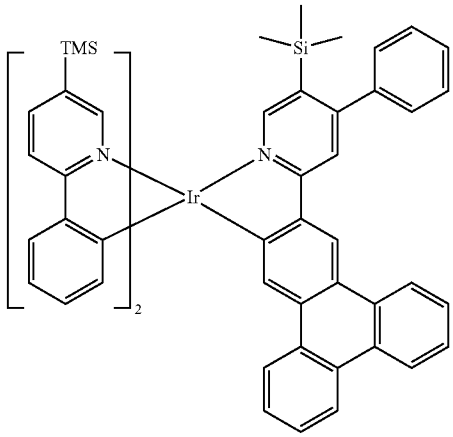
149
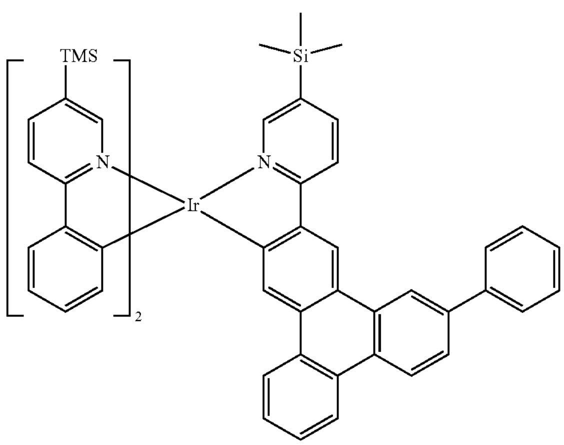
150
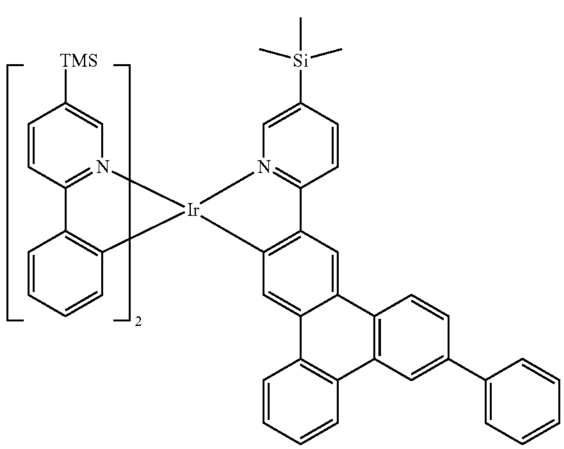
-continued
151
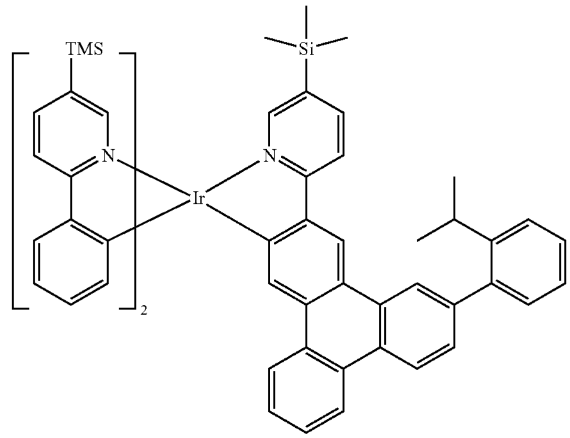
152
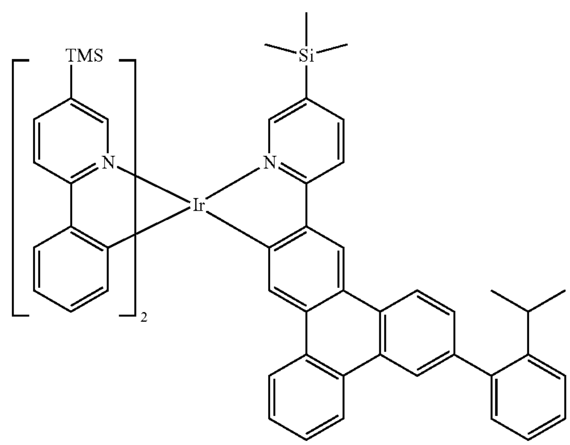
153
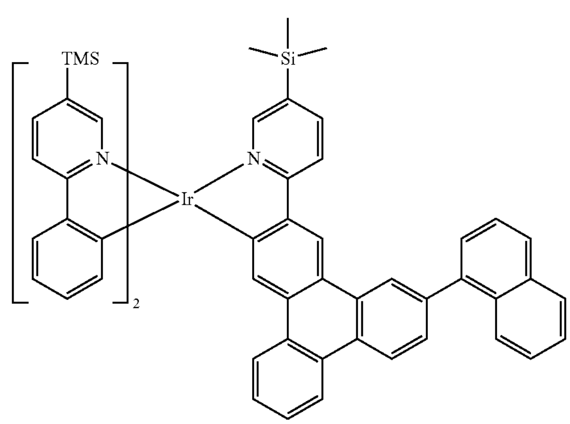

154
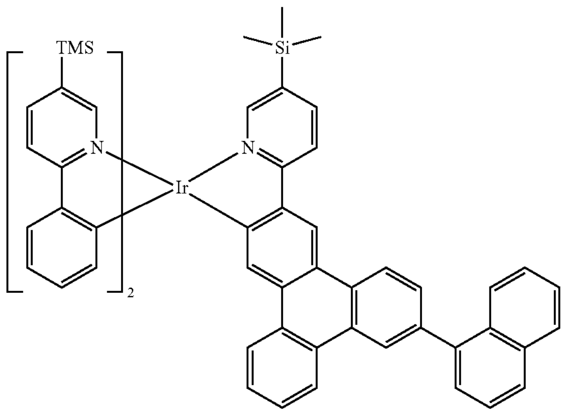
155
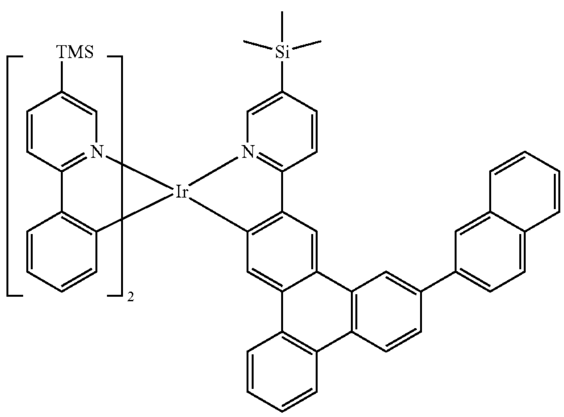
156
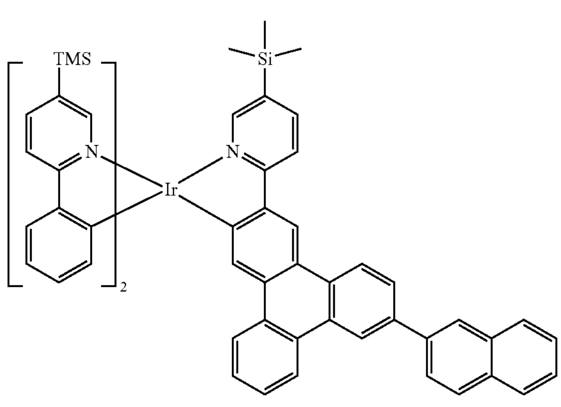
157
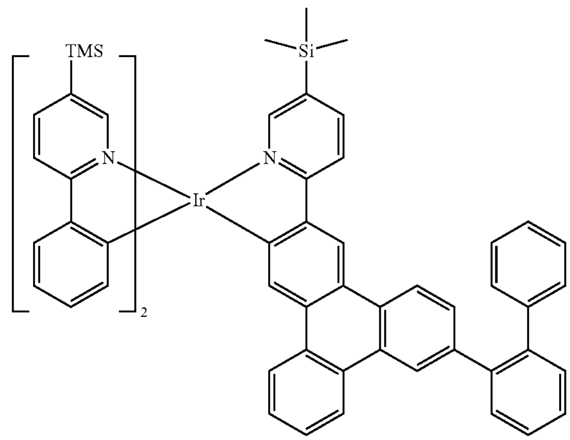
158
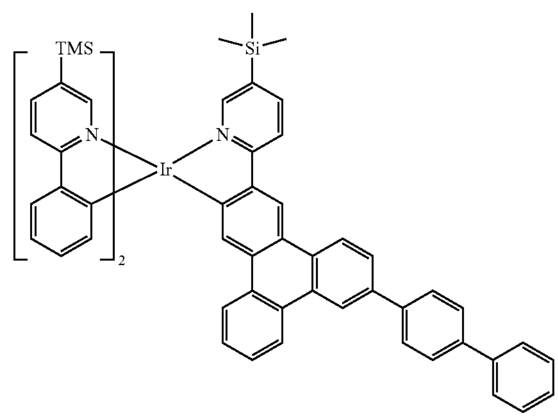
159
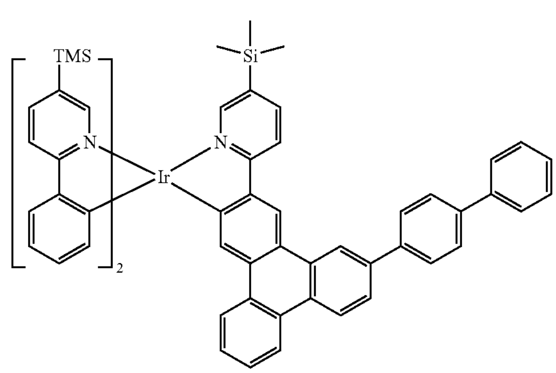

-continued
160
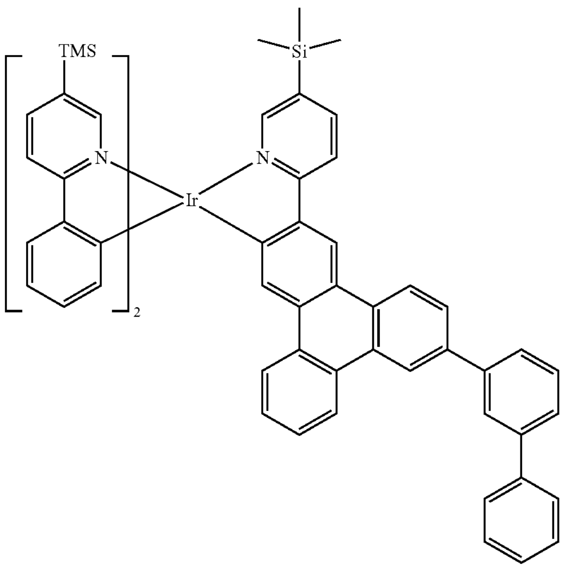
161
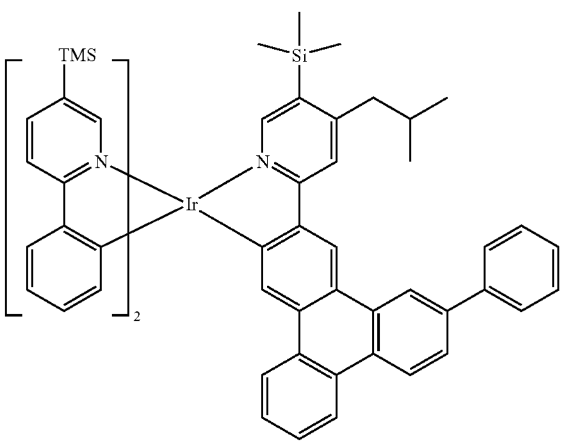
162
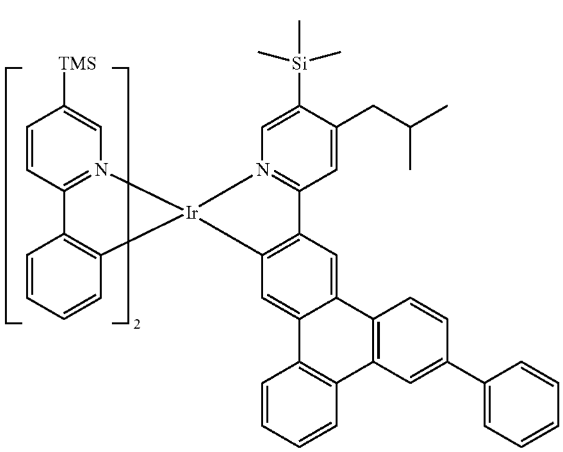
-continued
163
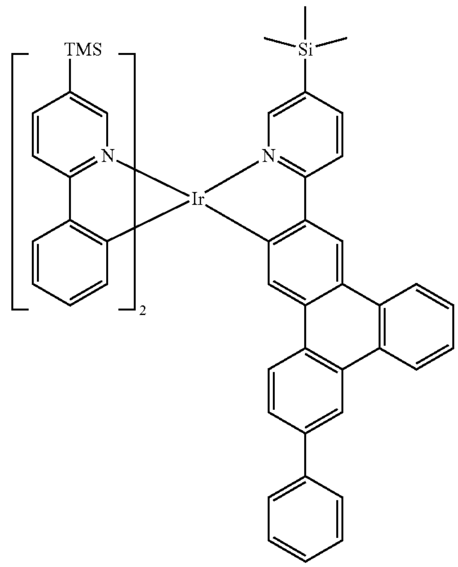
164
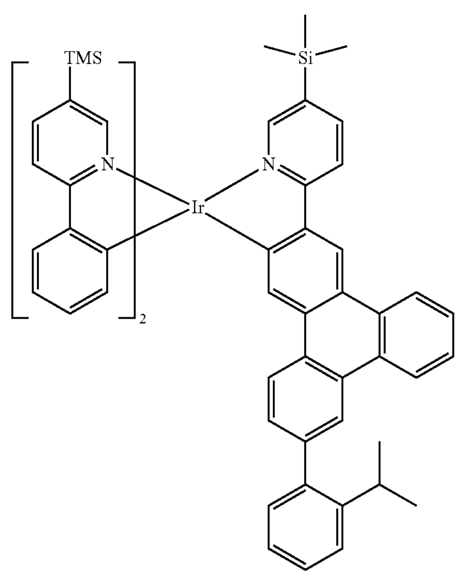

-continued
165
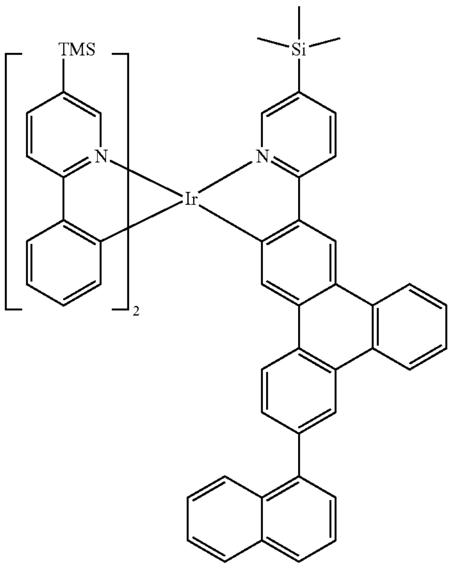
166
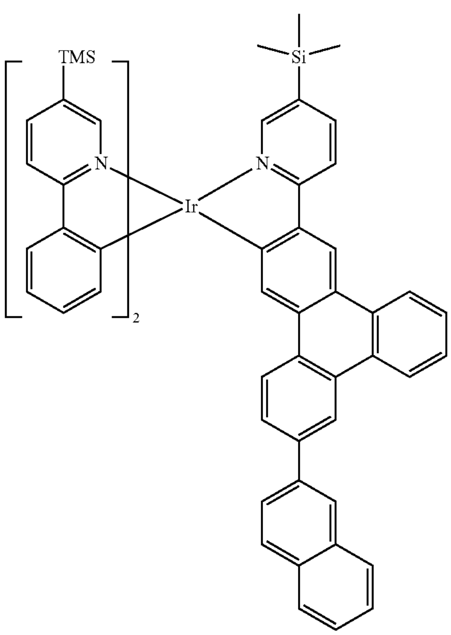
-continued
167
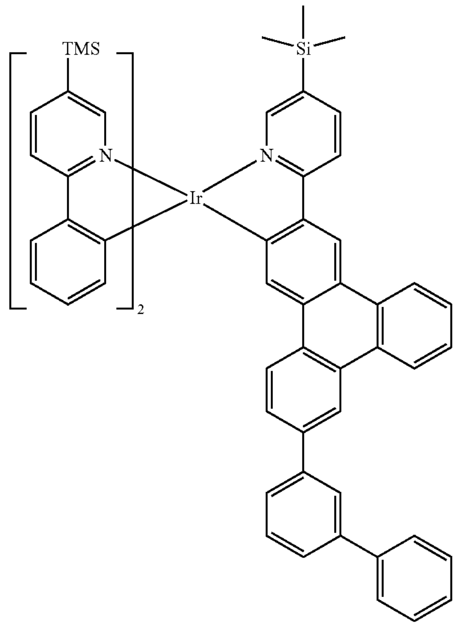
168
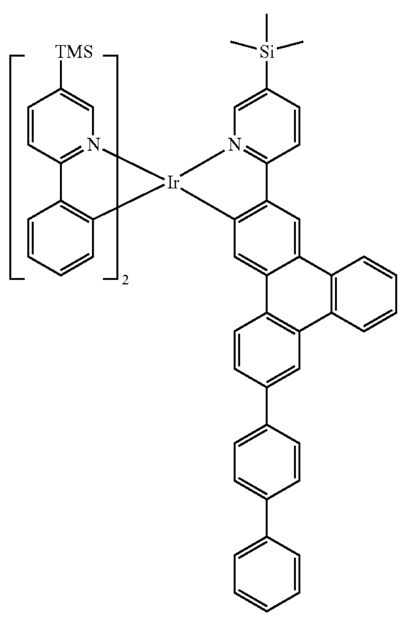

-continued
169
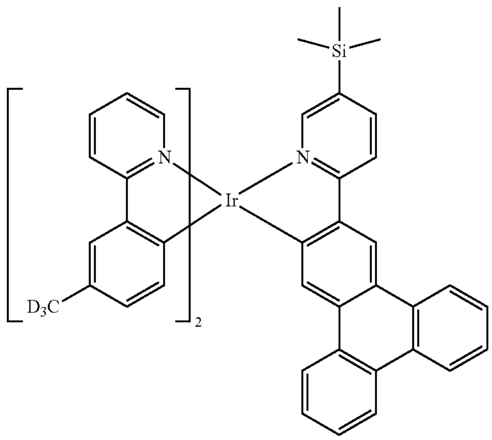
170
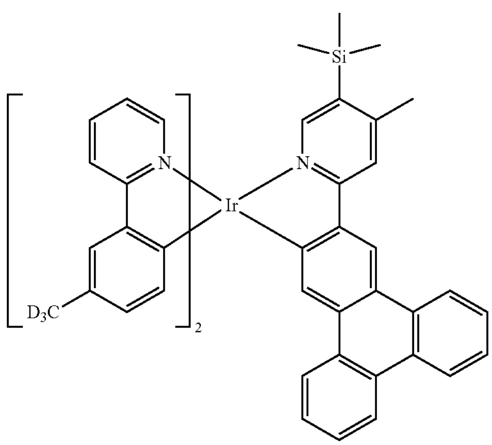
171
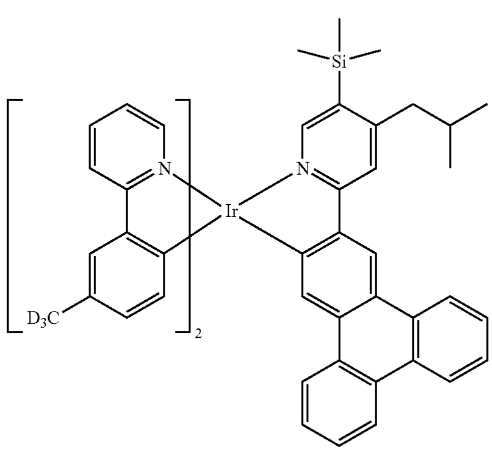
-continued
172
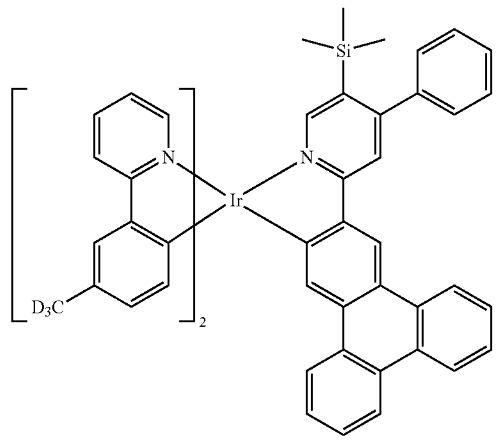
173
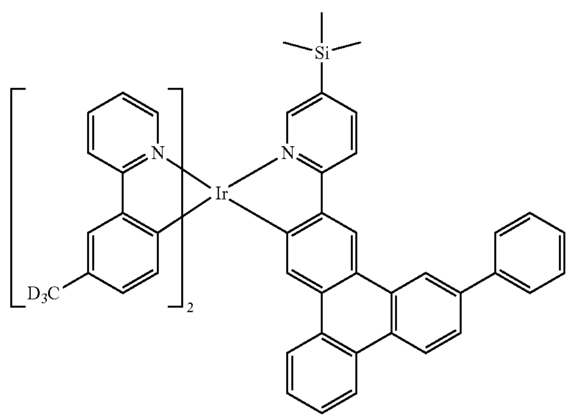
174
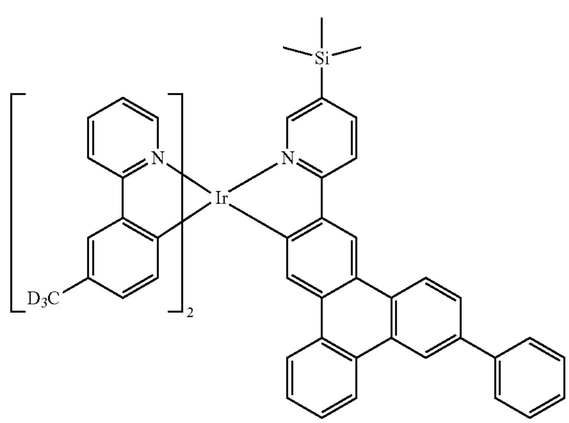

175
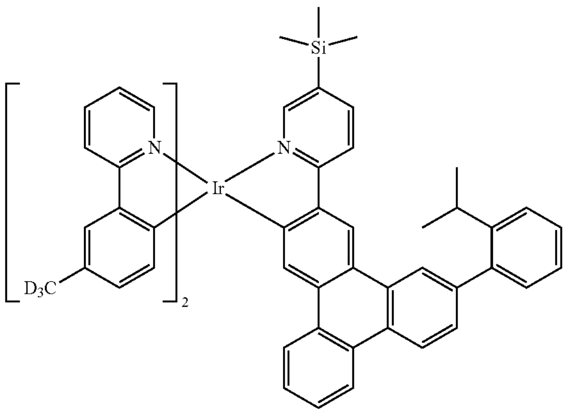
176
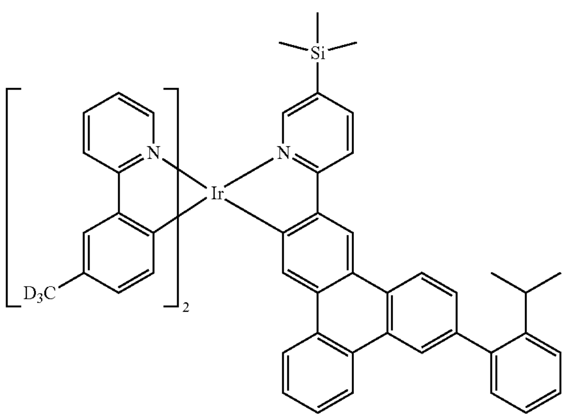
177
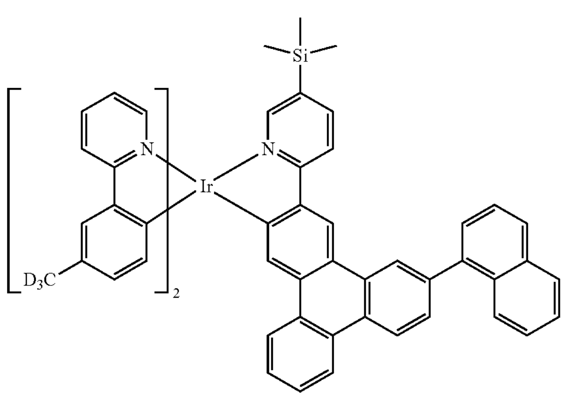
178
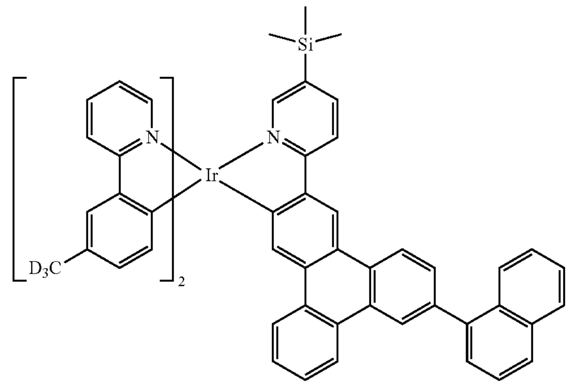
179
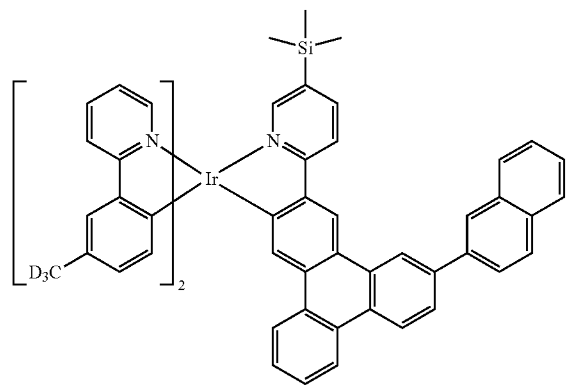
180
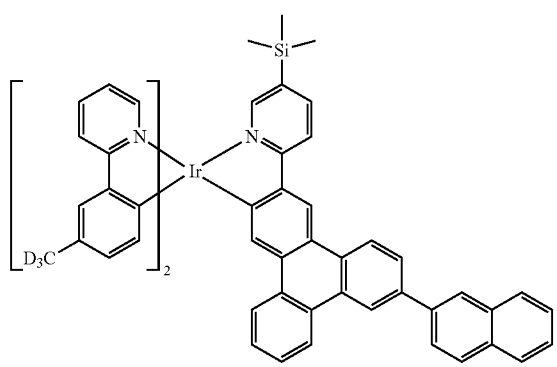
181
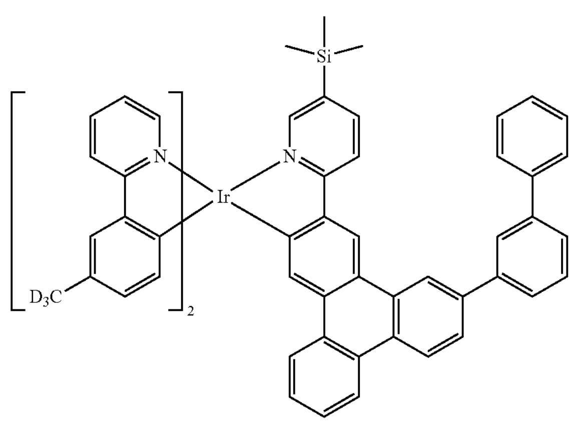

-continued
182
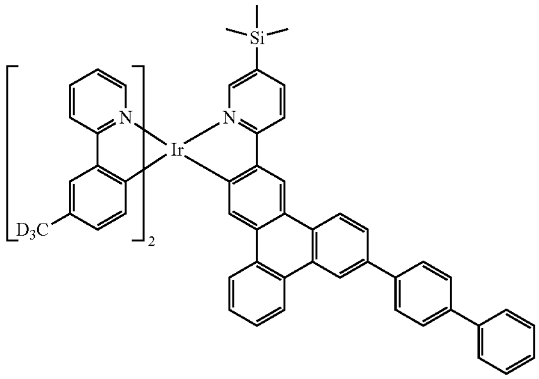
183
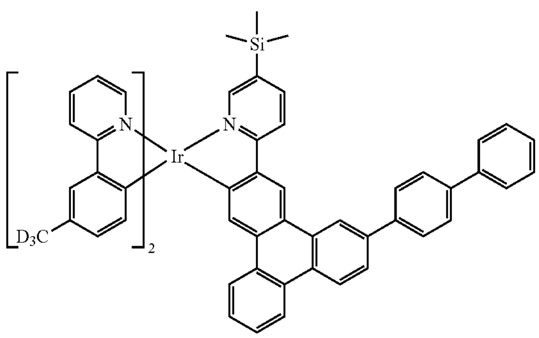
184
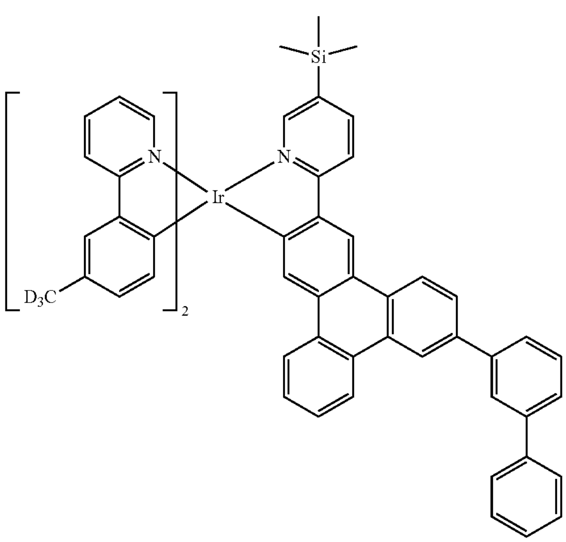
-continued
185
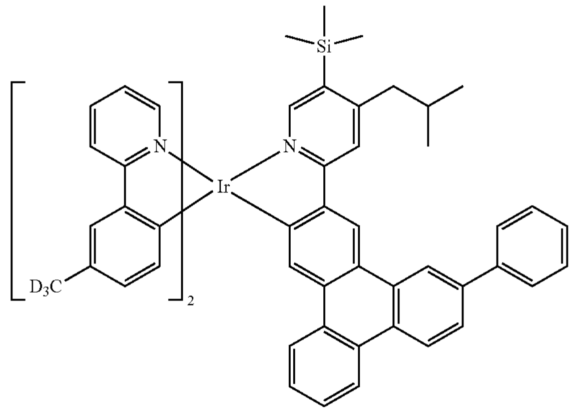
186
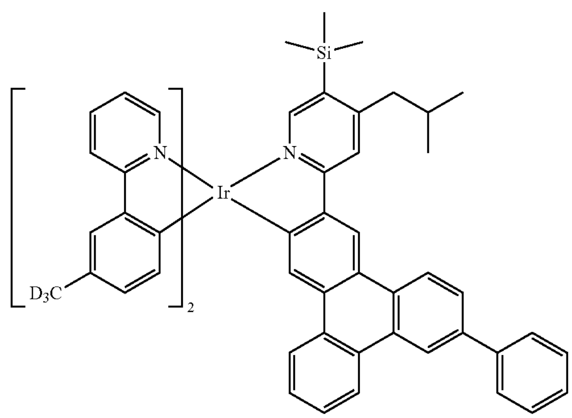
187
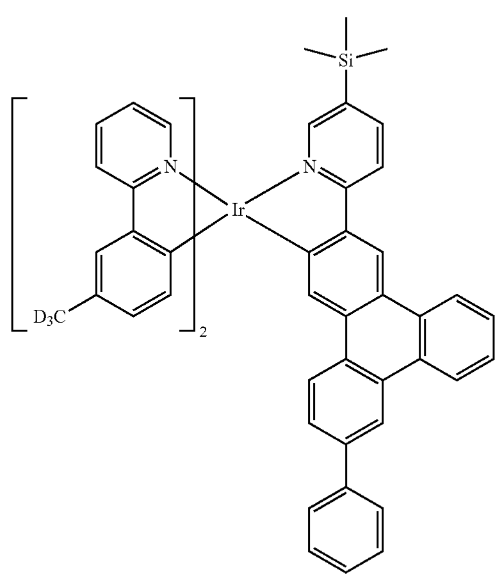

-continued
188
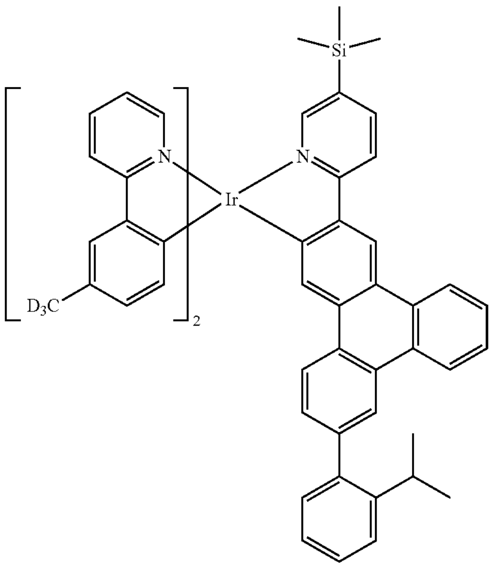
189
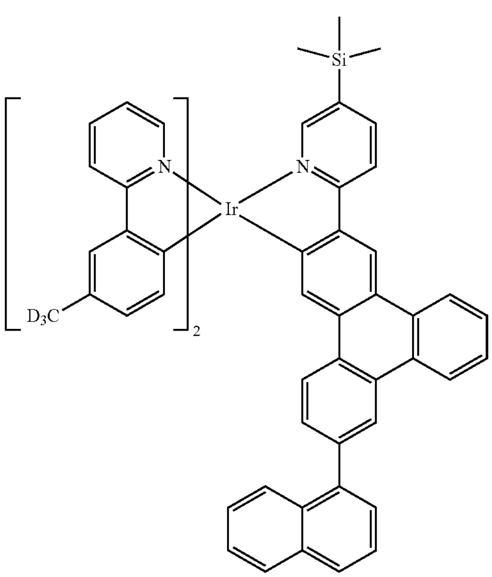
-continued
190
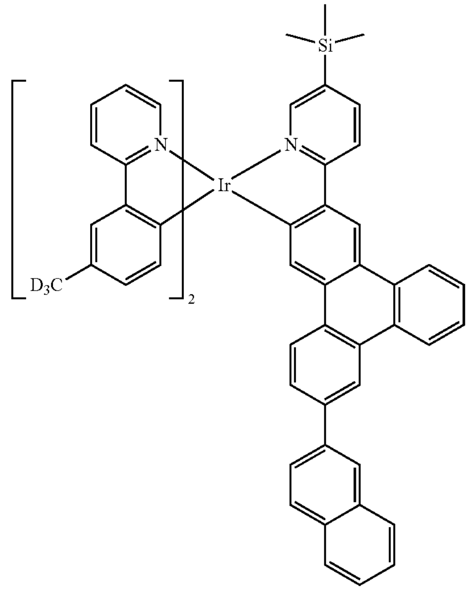
191
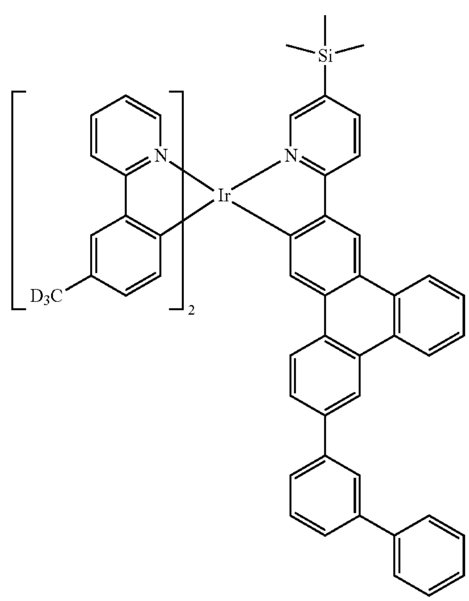

-continued
192
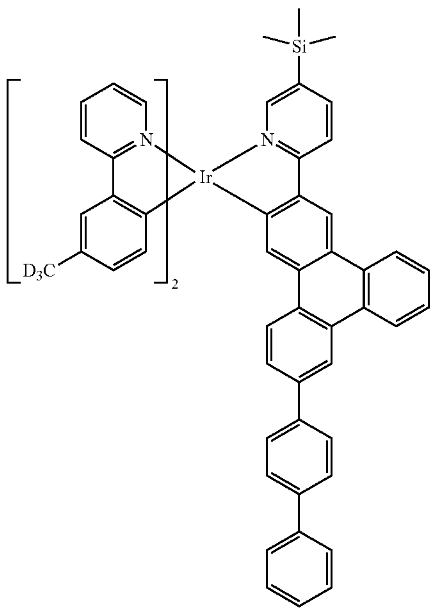
193
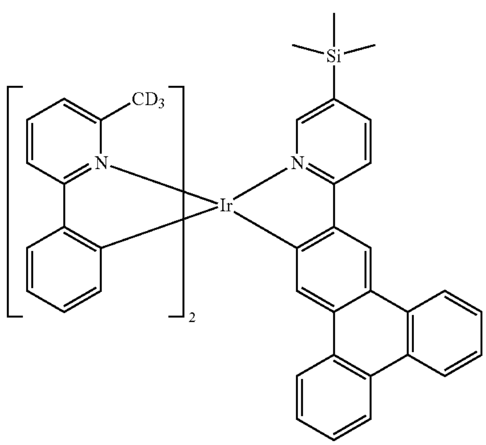
194
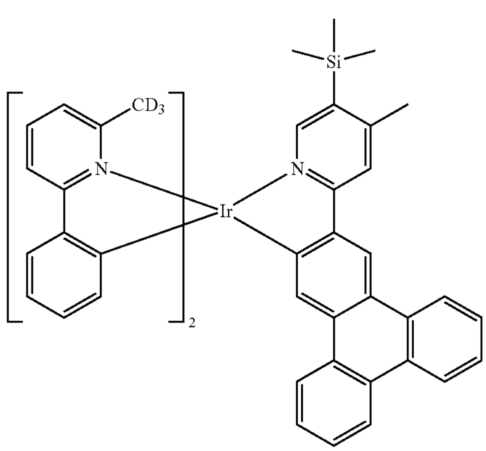
-continued
195
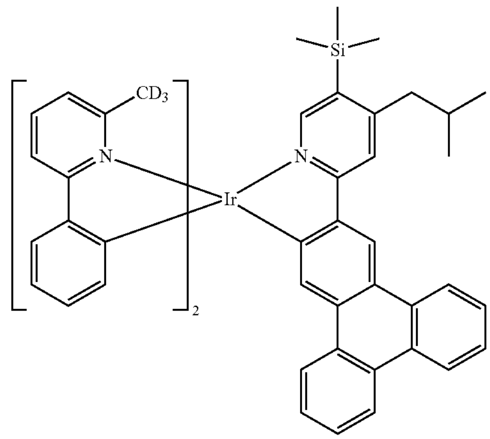
196
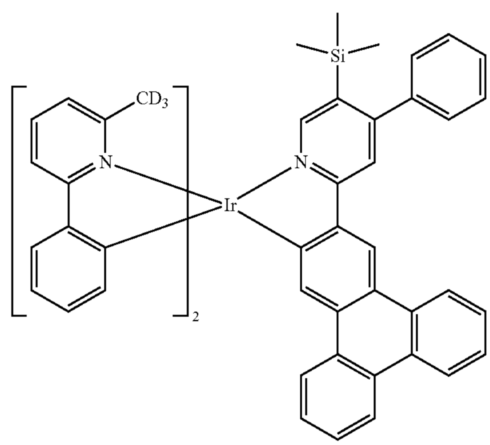
197
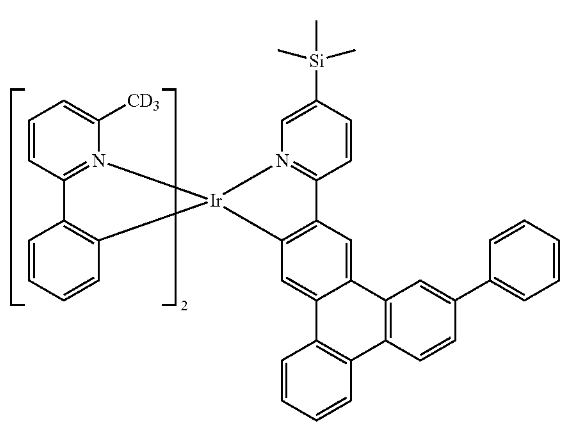

-continued
198
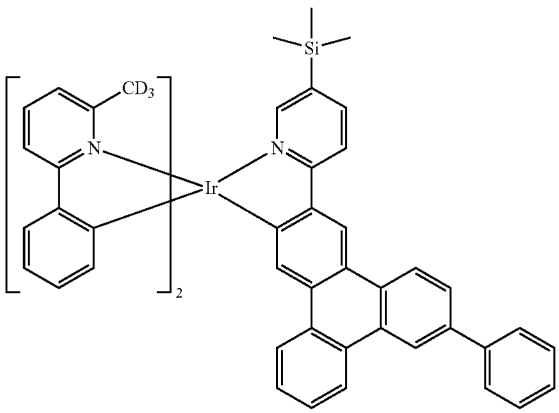
199
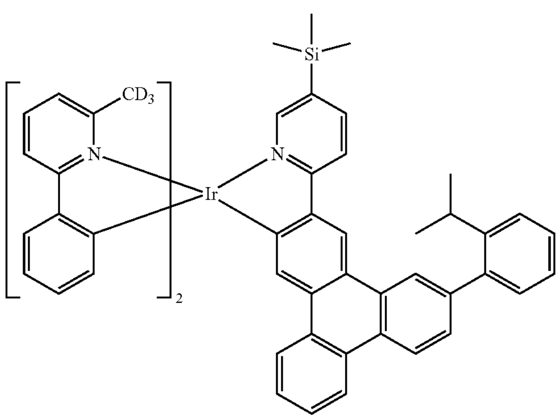
200
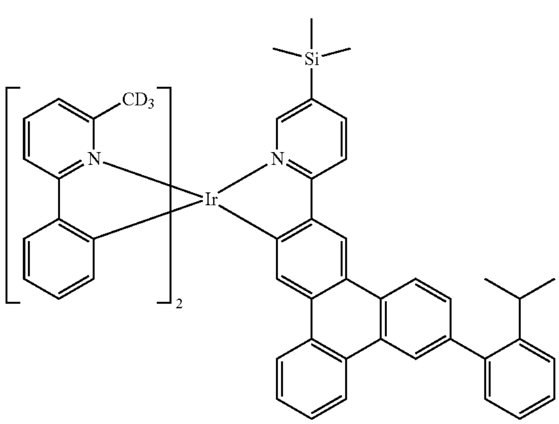
-continued
201
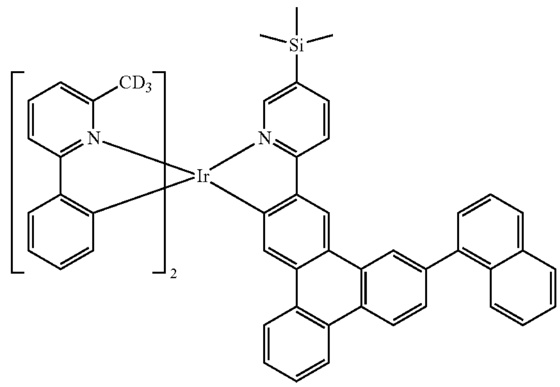
202
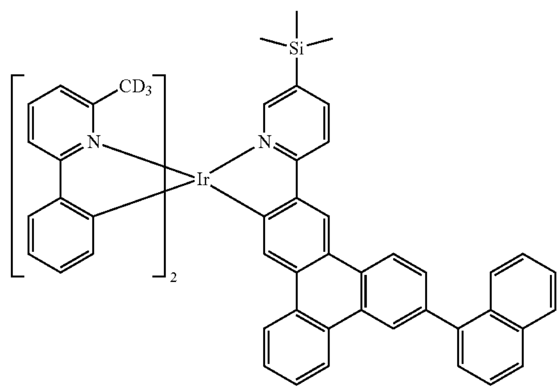
203
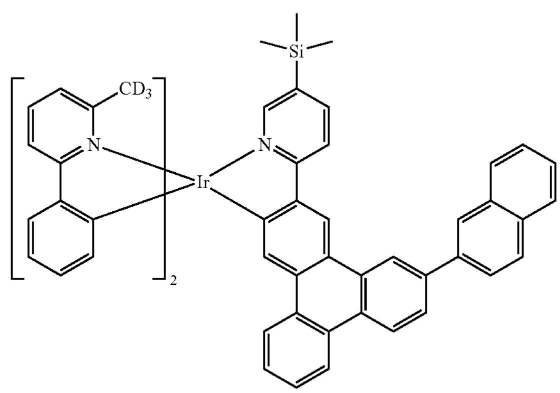
204
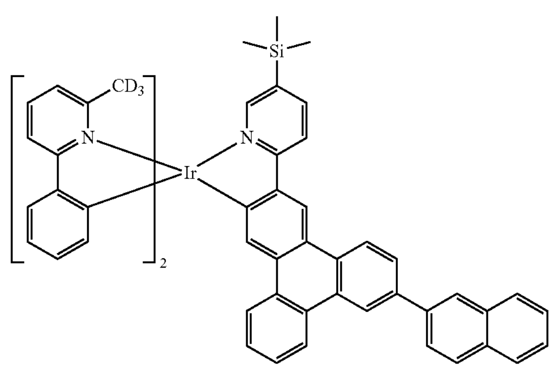

-continued
205
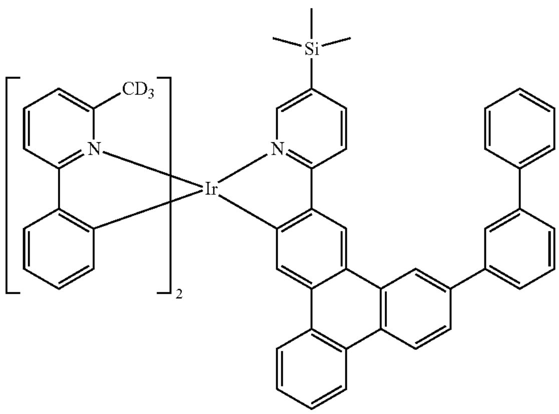
206
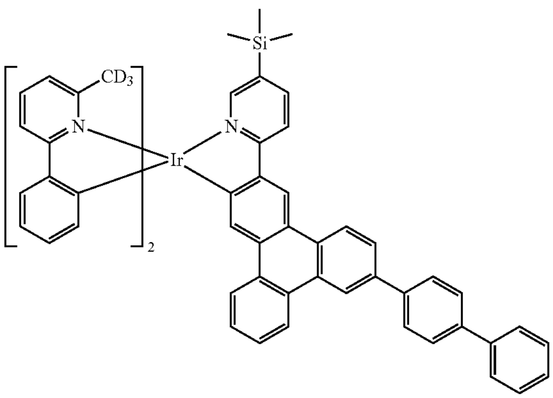
207
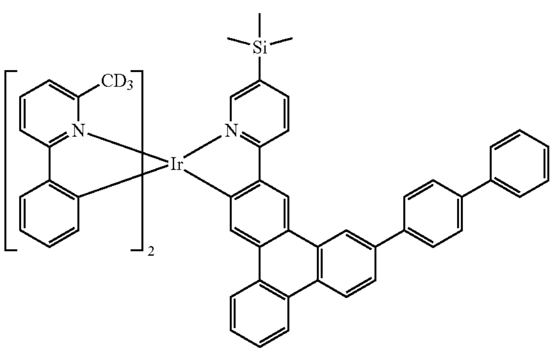
208
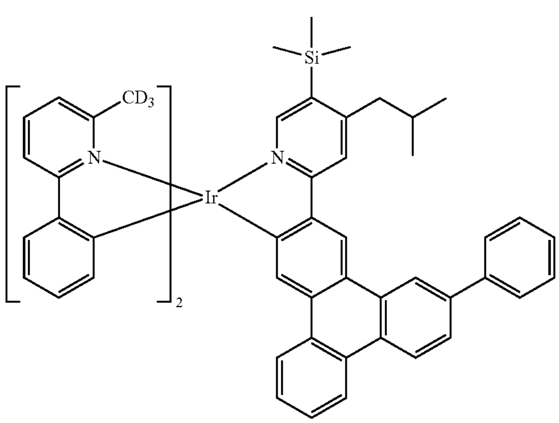
-continued
209
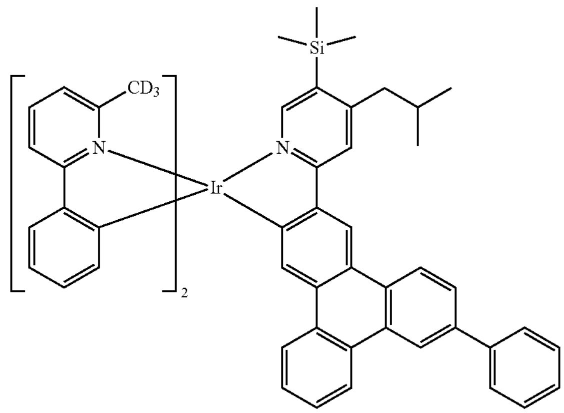
210
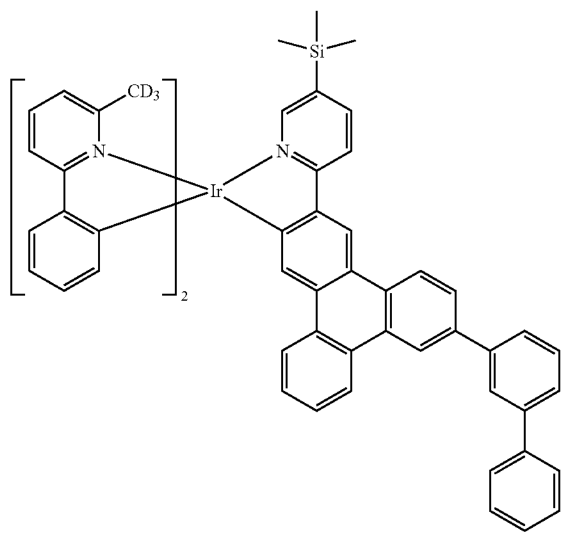
211
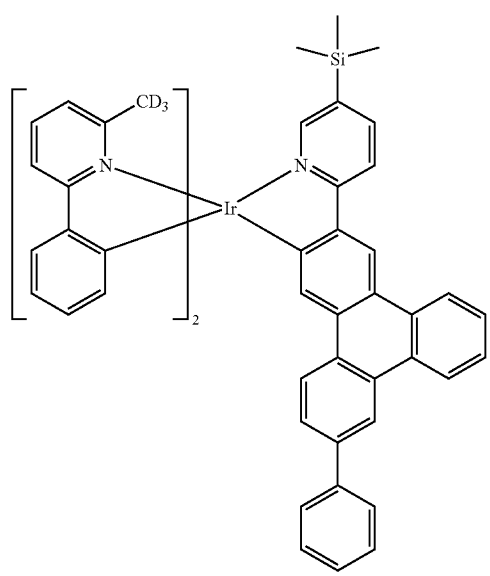

-continued
212
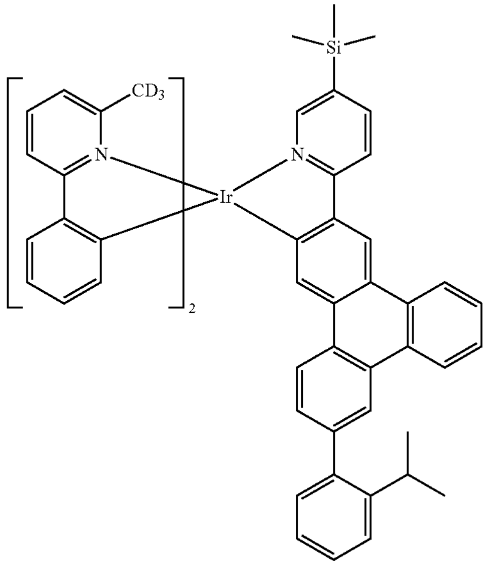
213
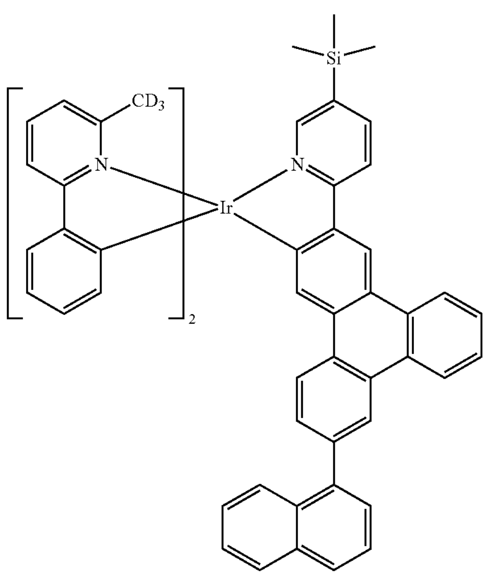
-continued
214
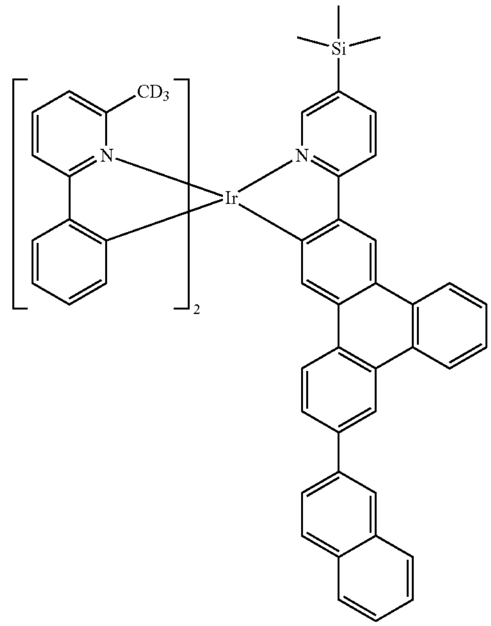
215
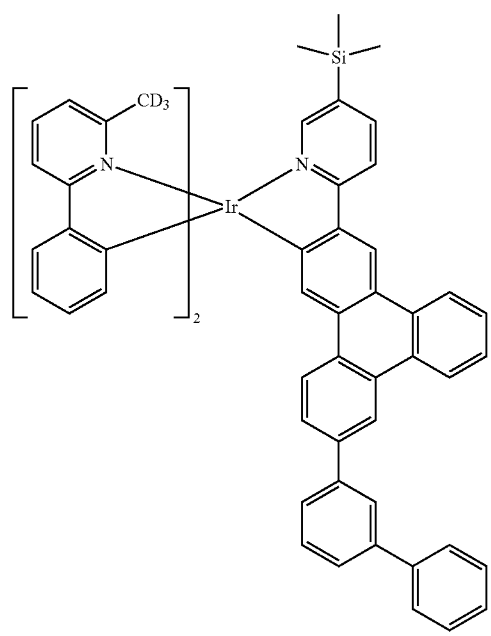

-continued
216
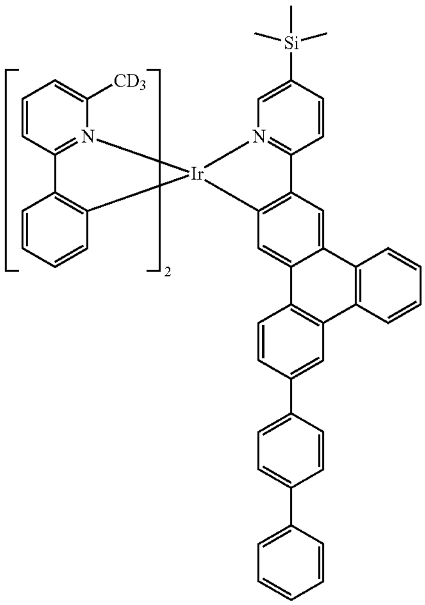
217
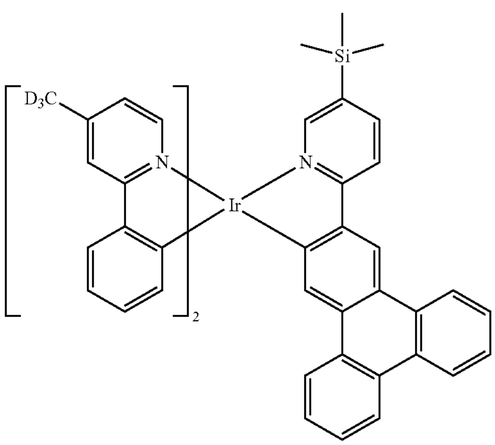
218
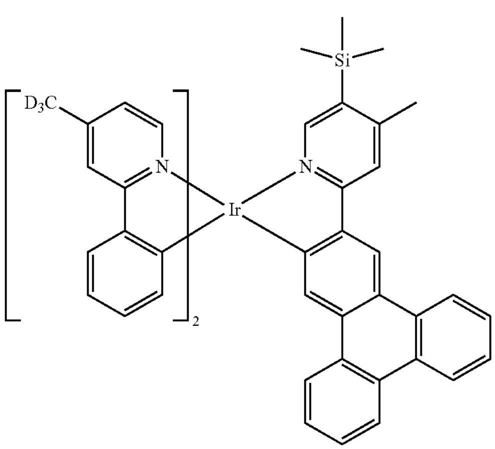
-continued
219
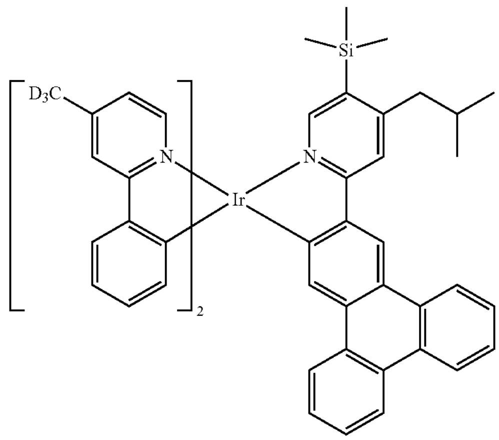
220
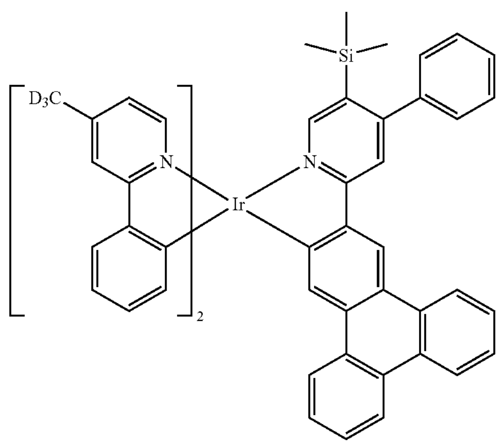
221
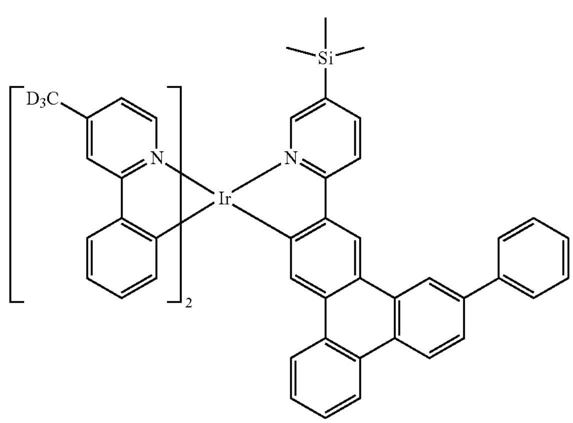

-continued
222
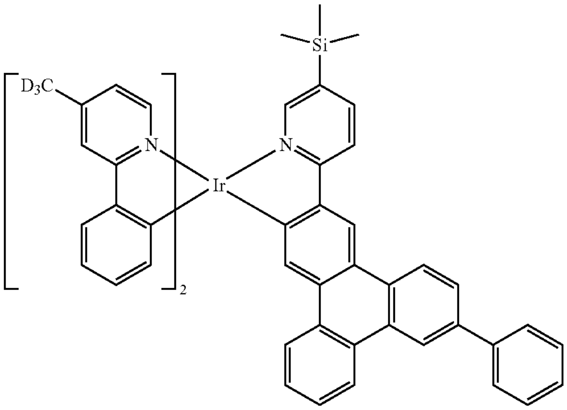
223
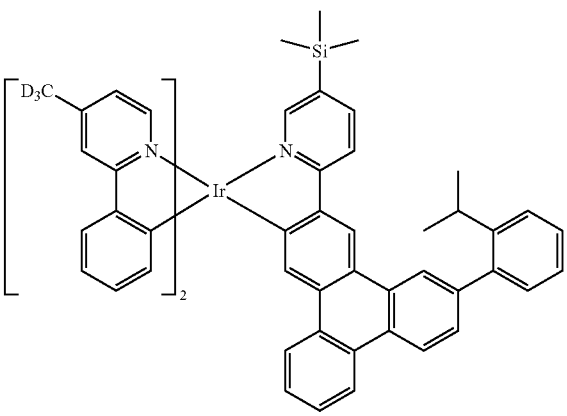
224
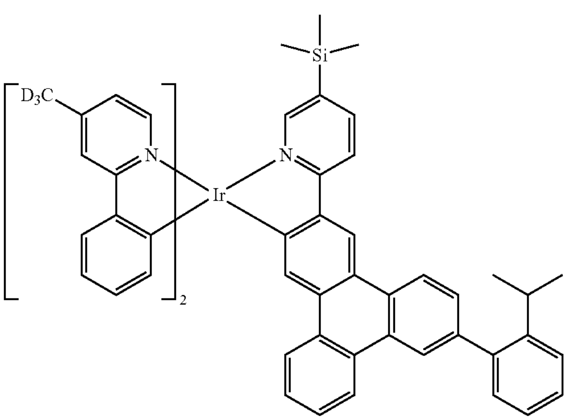
-continued
225
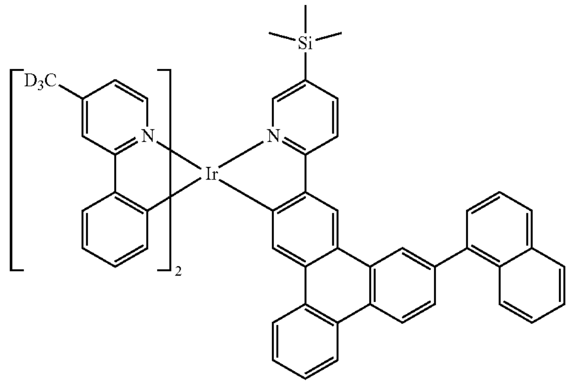
226
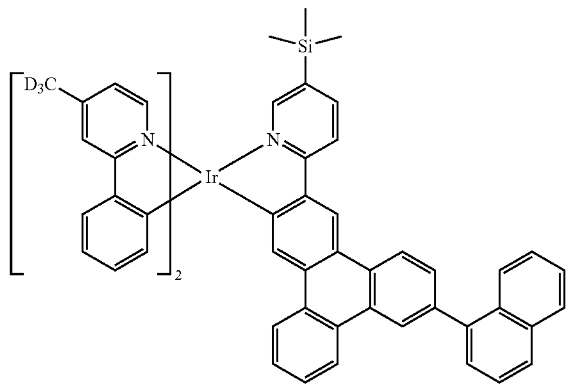
227
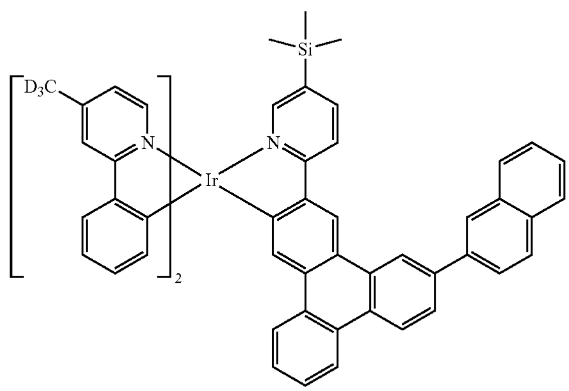
228
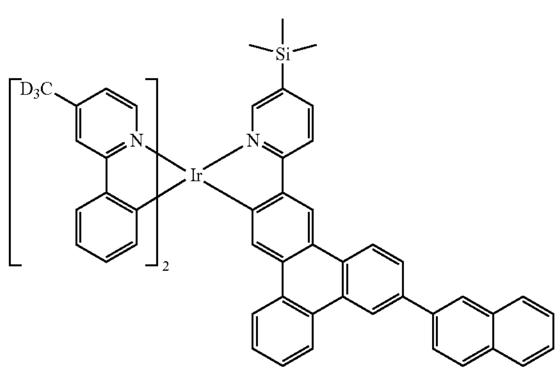

-continued
229
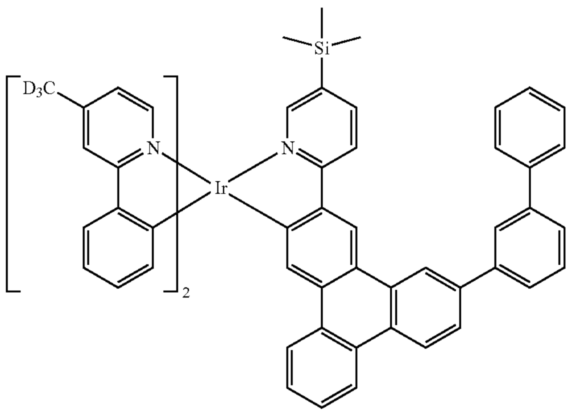
230
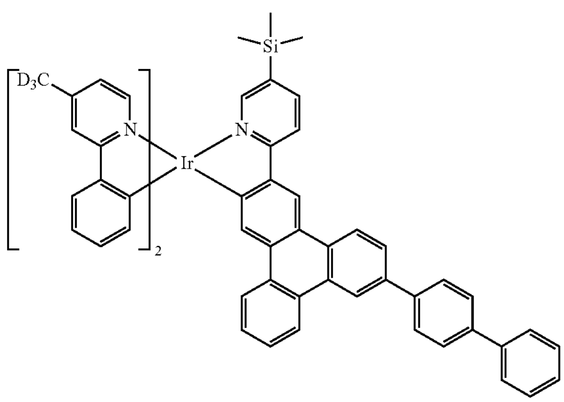
231
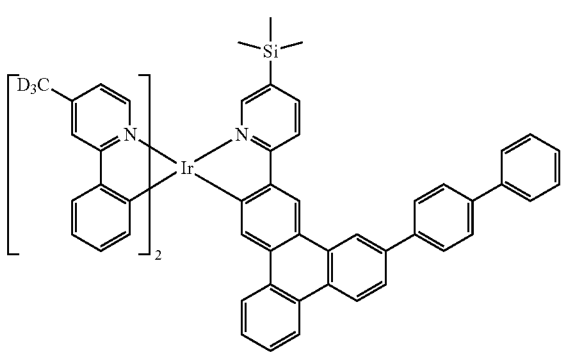
-continued
232
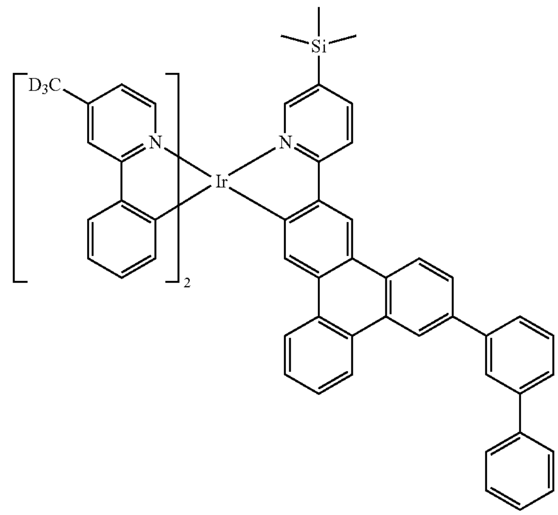
233
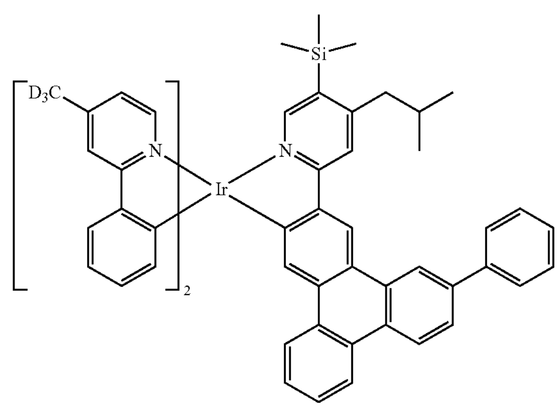
234
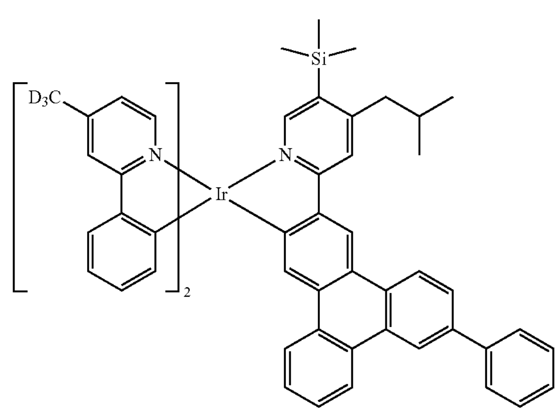

235
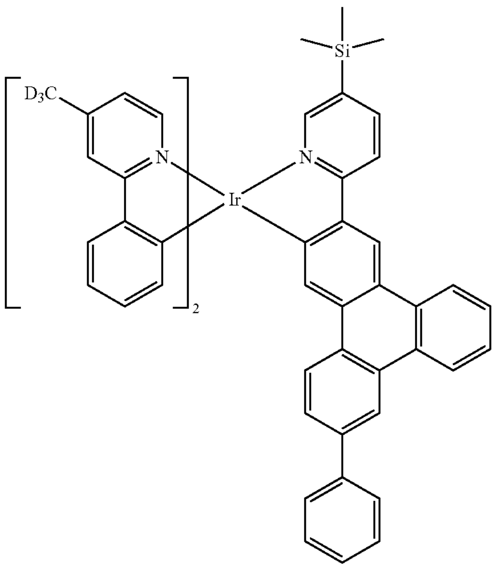
236
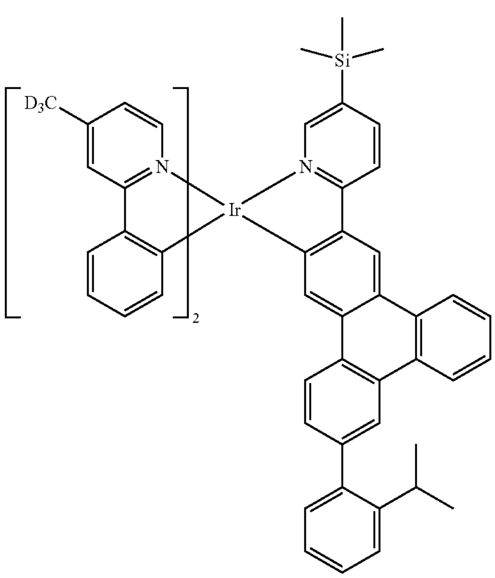
237
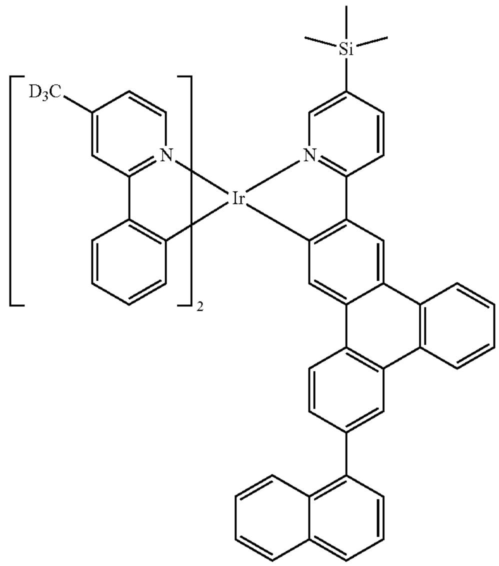
238
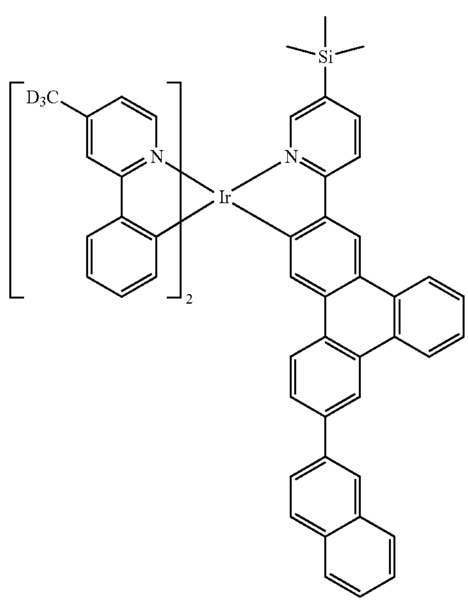

-continued
239
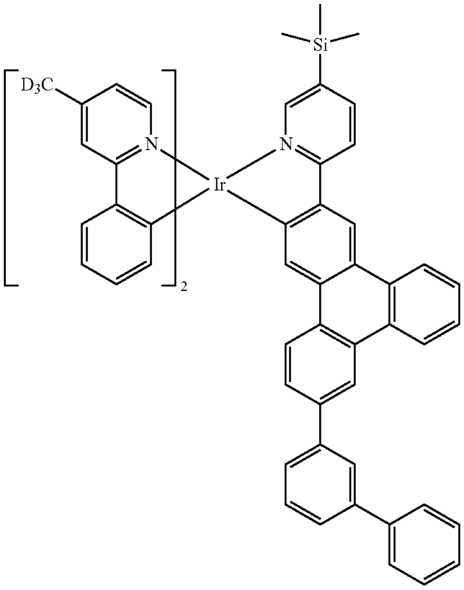
240
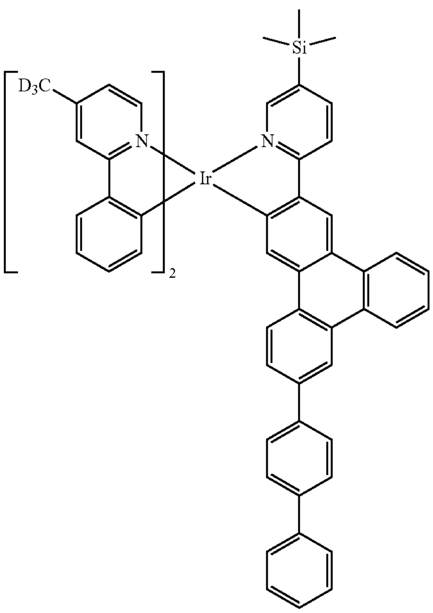
241
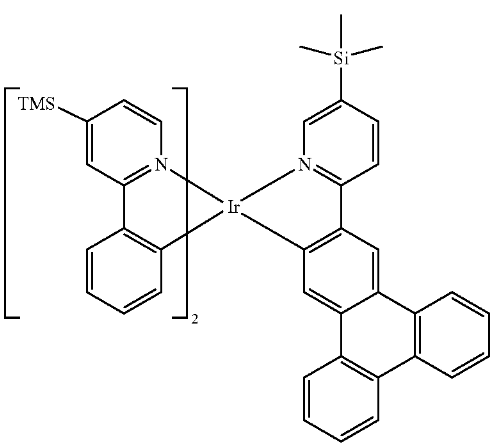
-continued
242
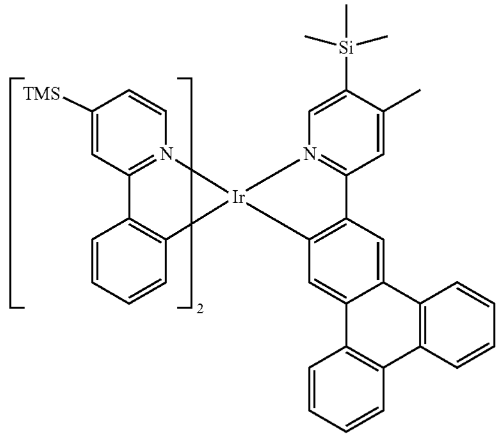
243
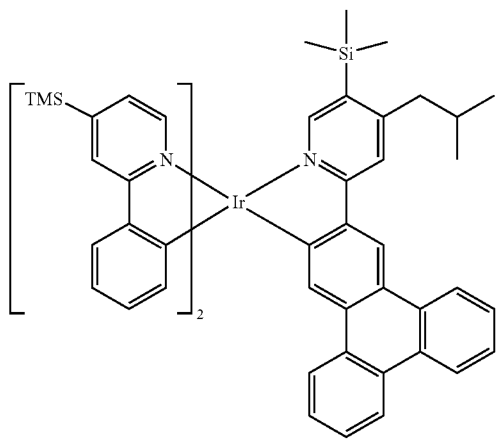
244
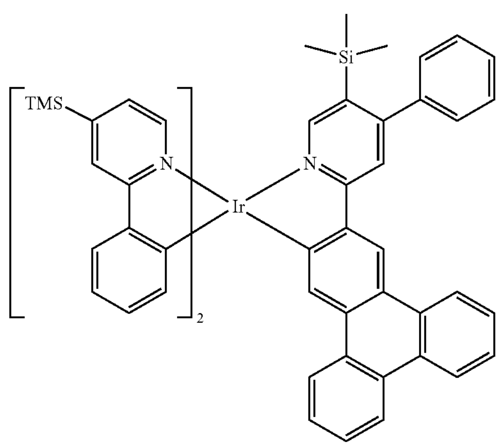

-continued
245
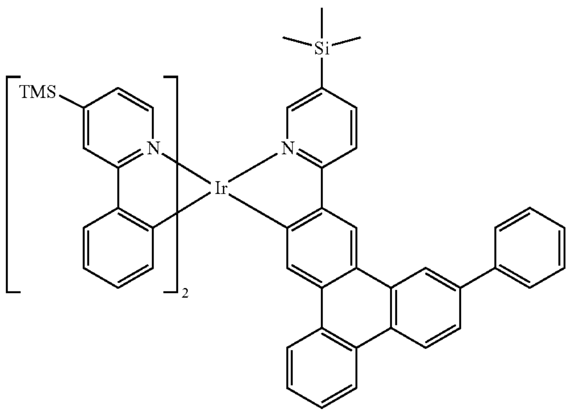
246
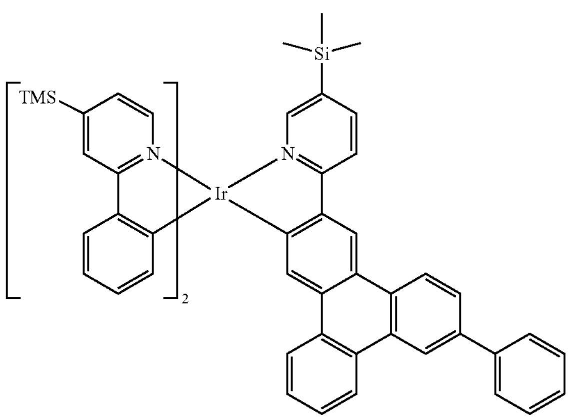
247
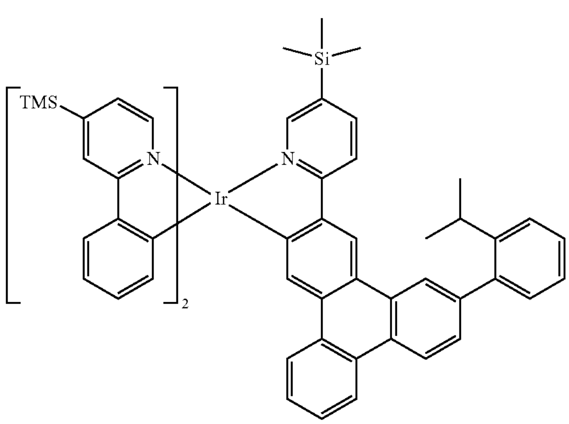
-continued
248
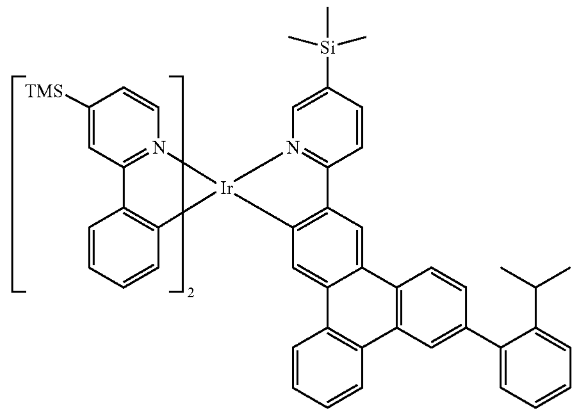
249
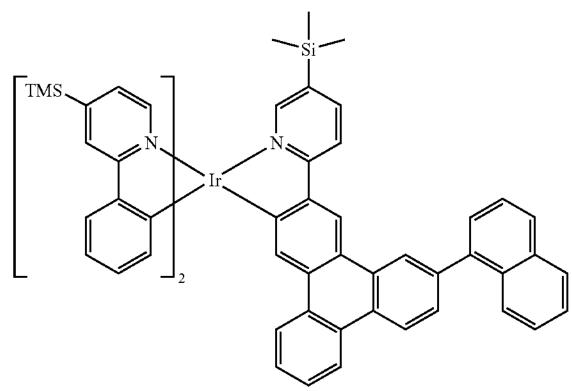
250
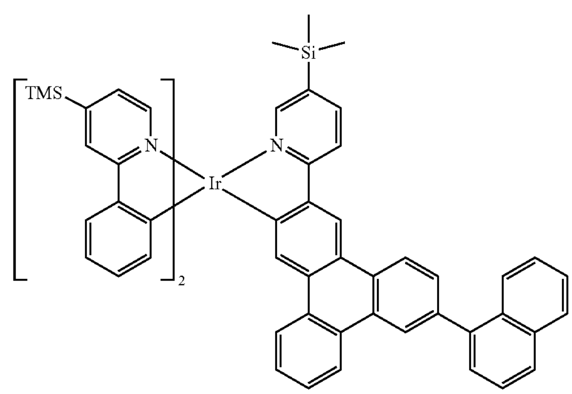
251
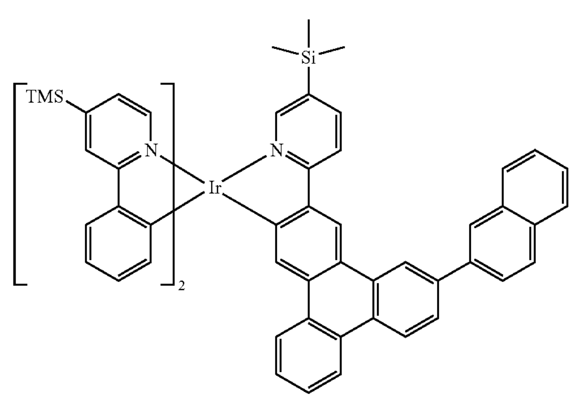

252
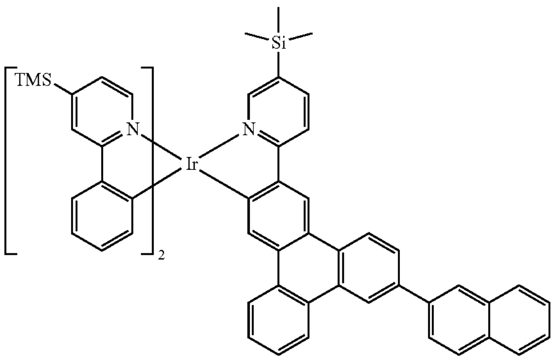
253
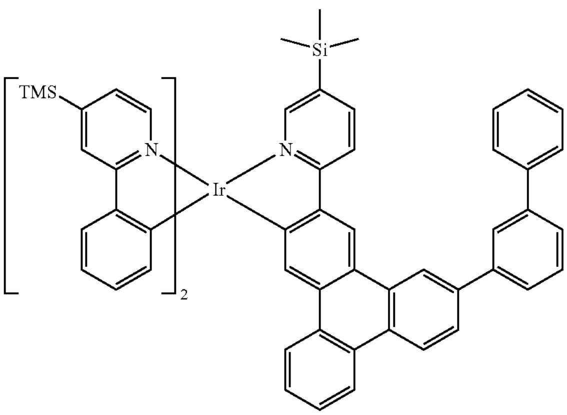
254
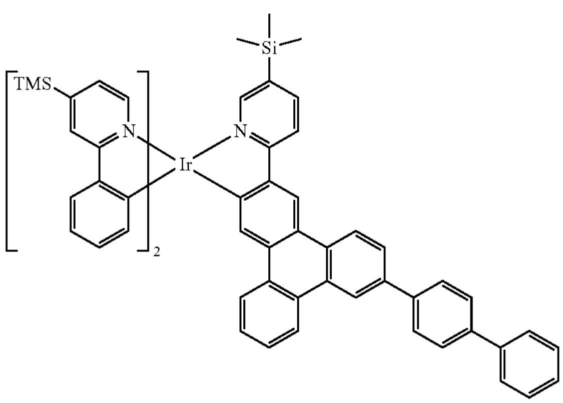
255
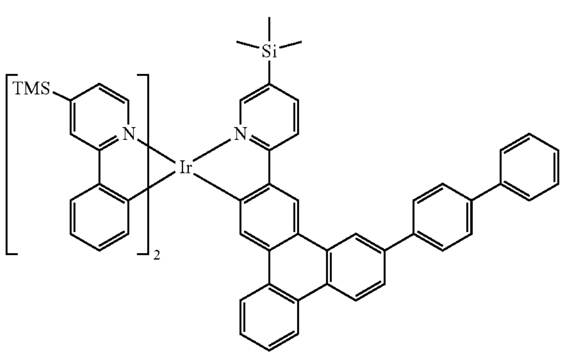
256
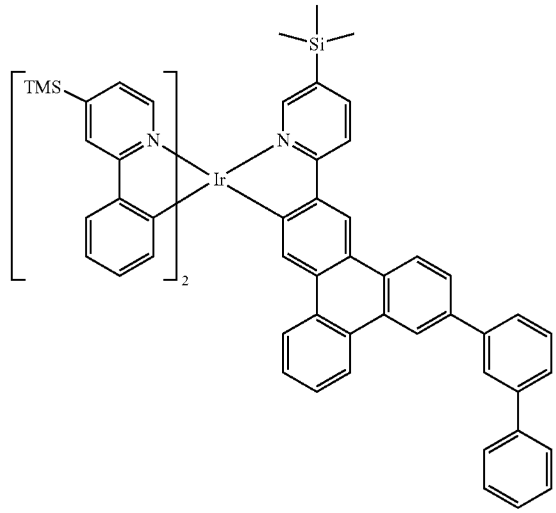
257
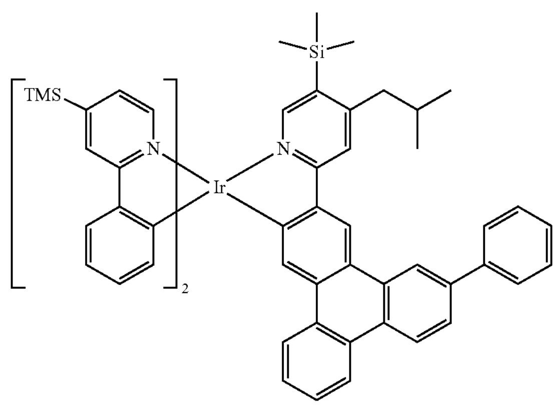
258
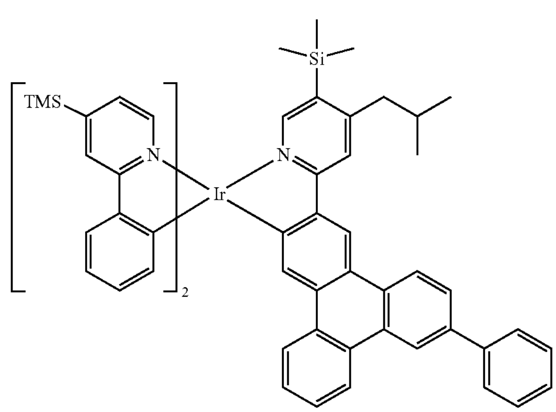

259
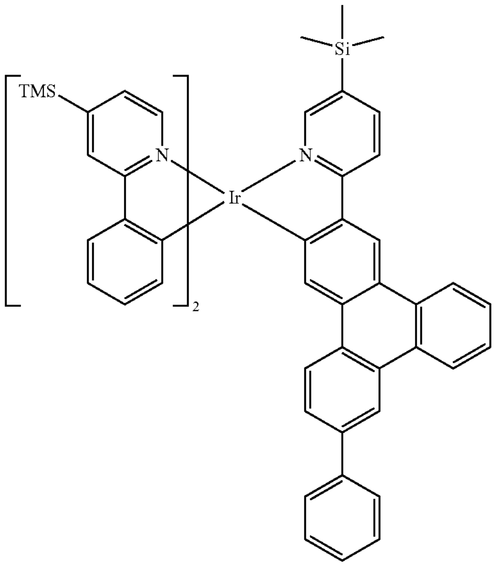
260
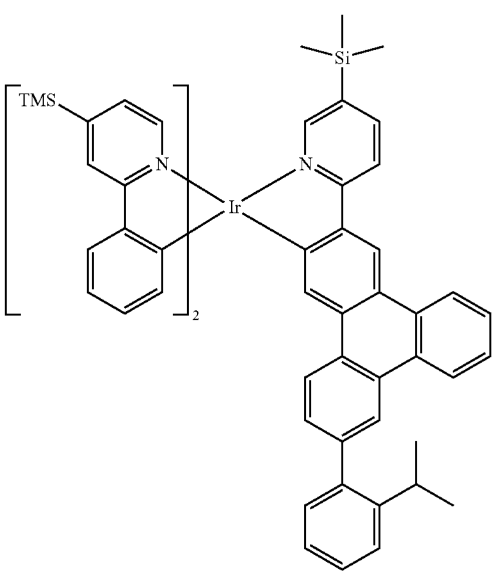
261
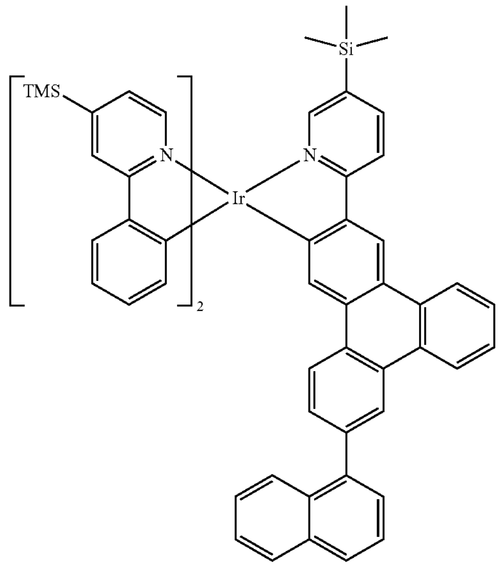
262
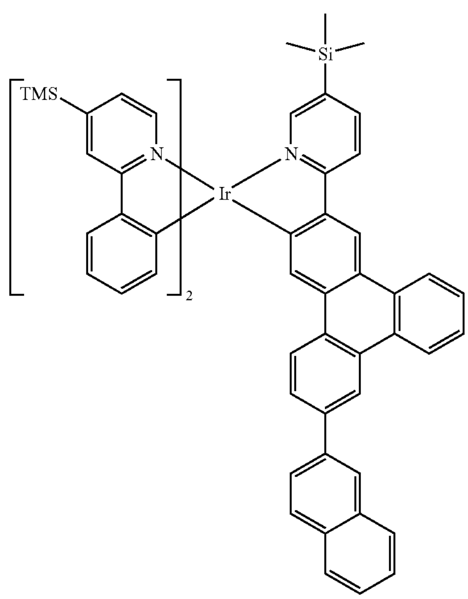

-continued
263
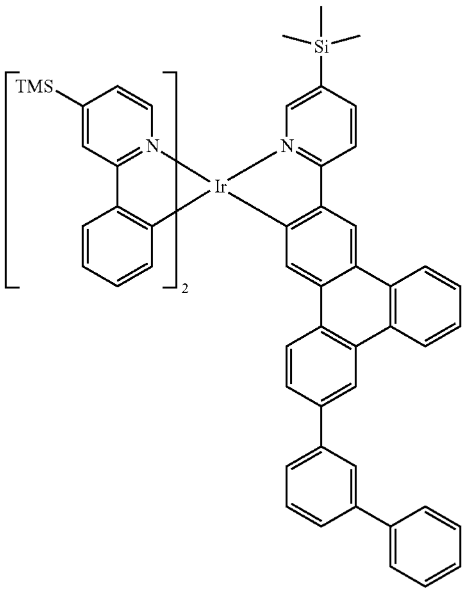
264
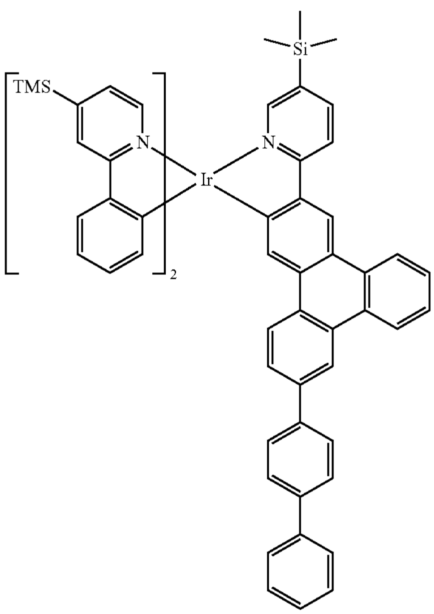
265
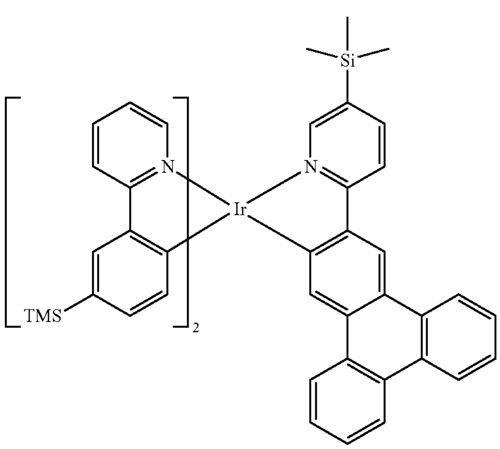
-continued
266
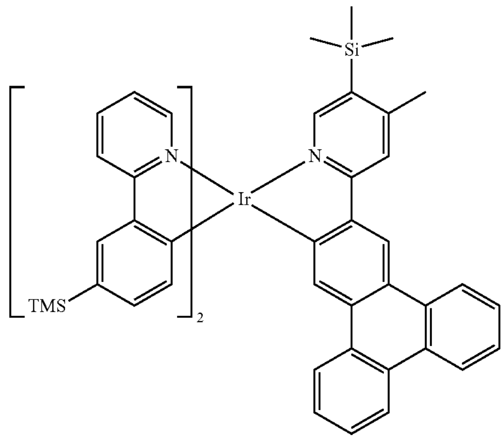
267
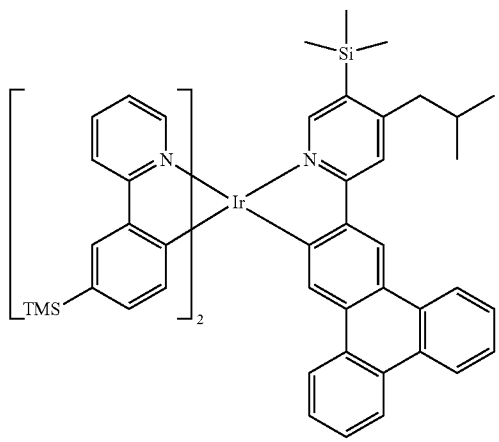
268
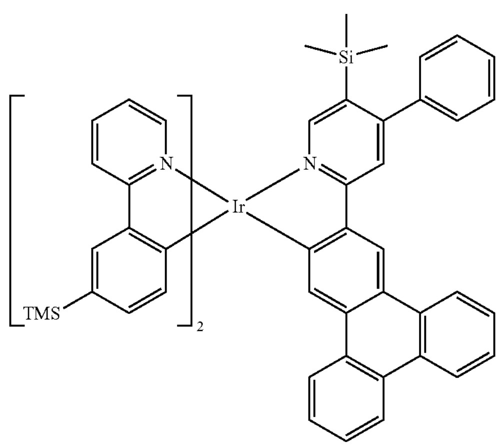

269
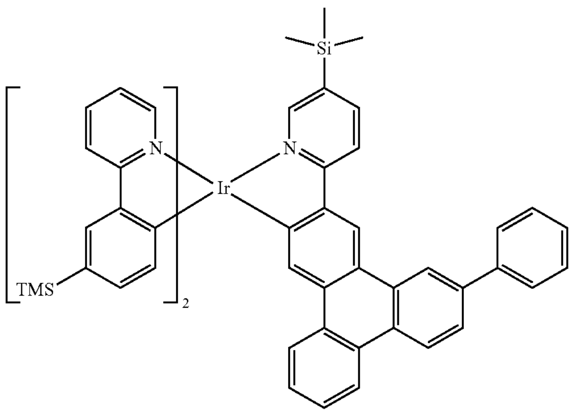
270
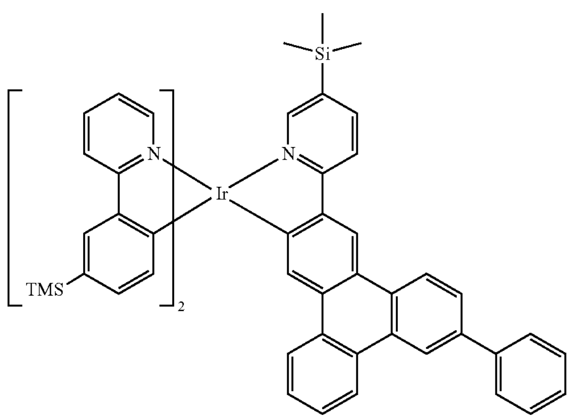
271
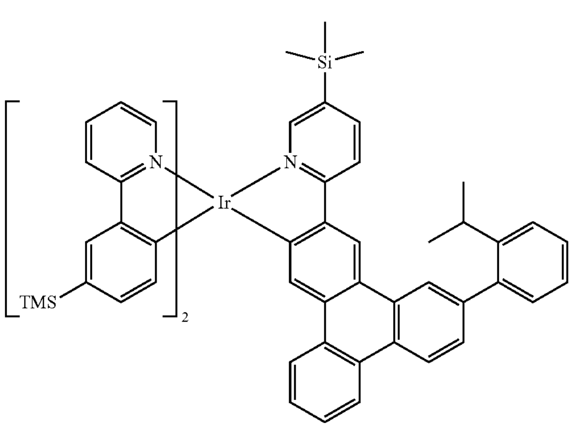
272
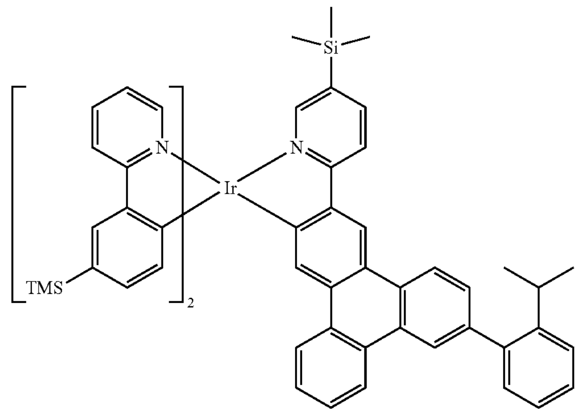
273
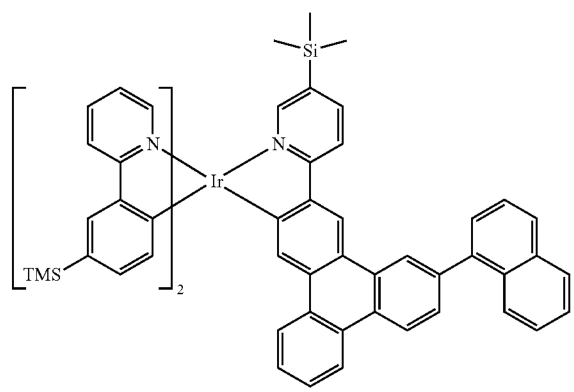
274
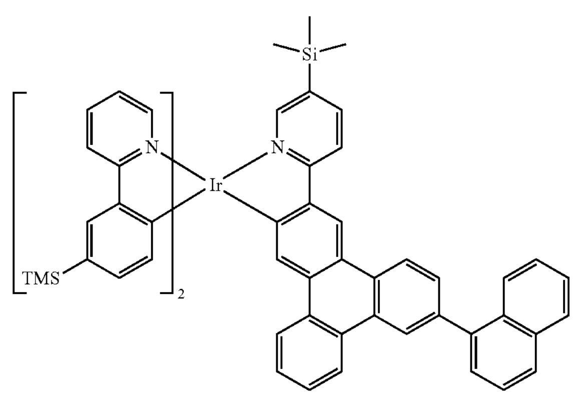
275
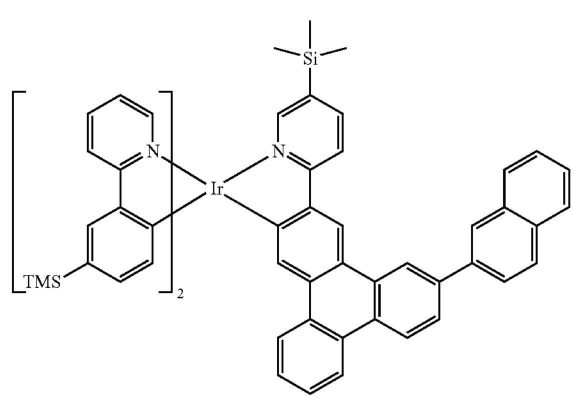

-continued
276
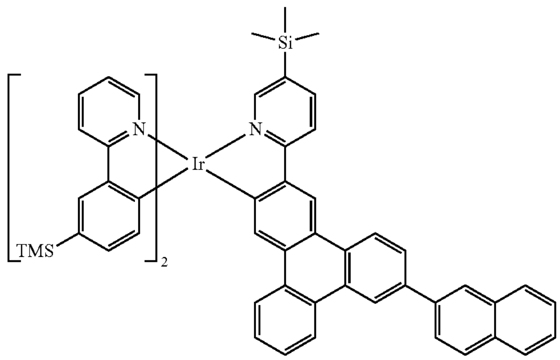
277
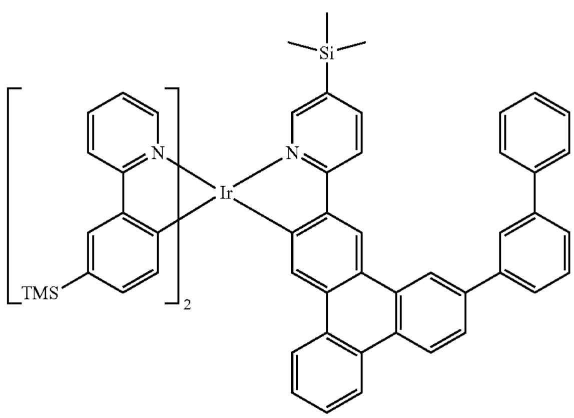
278
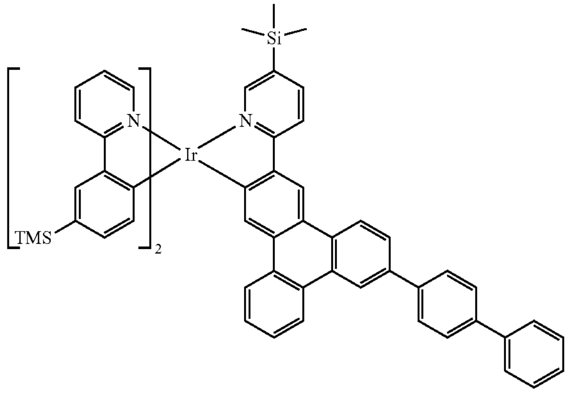
-continued
279
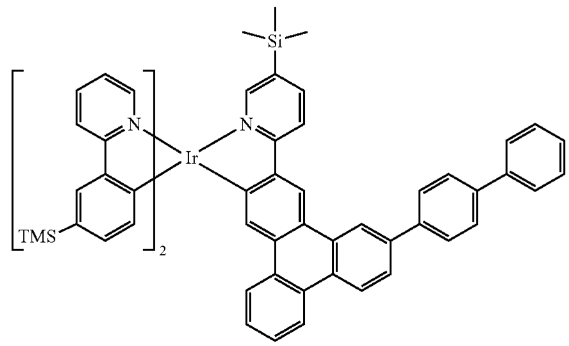
280
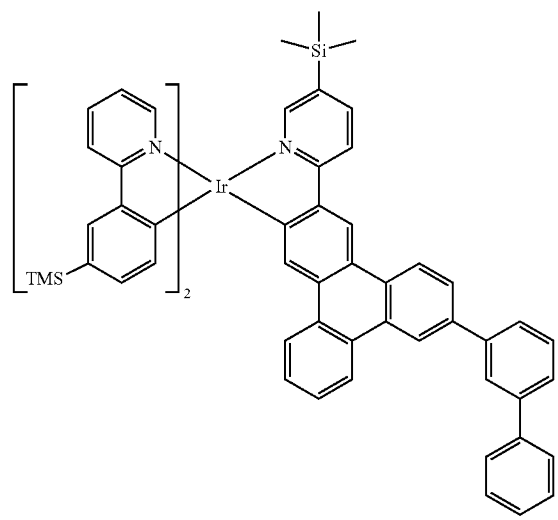
281
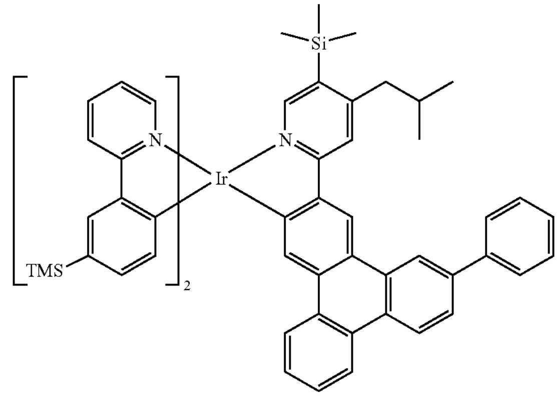

-continued
282
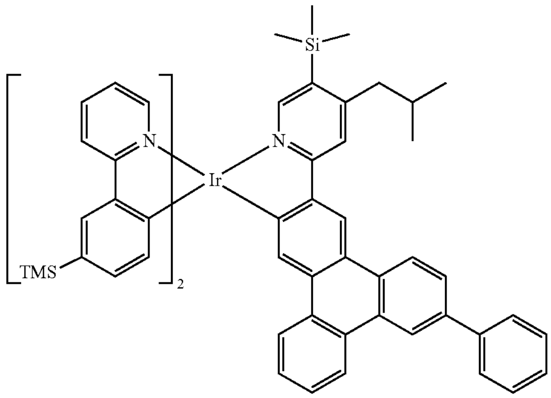
283
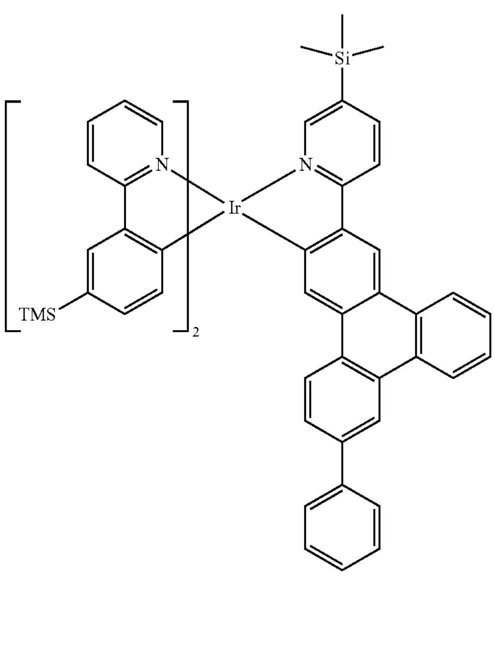
-continued
284
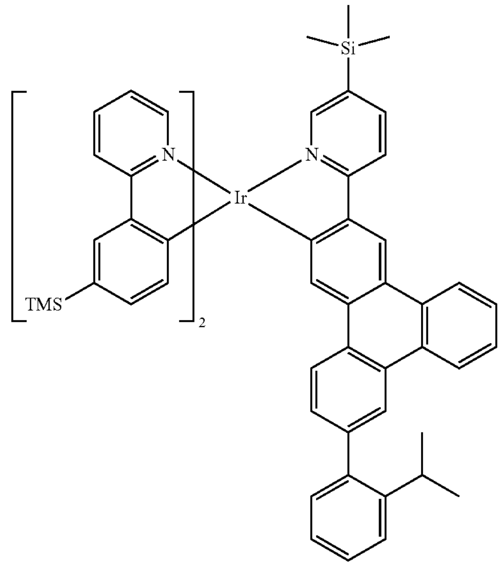
285
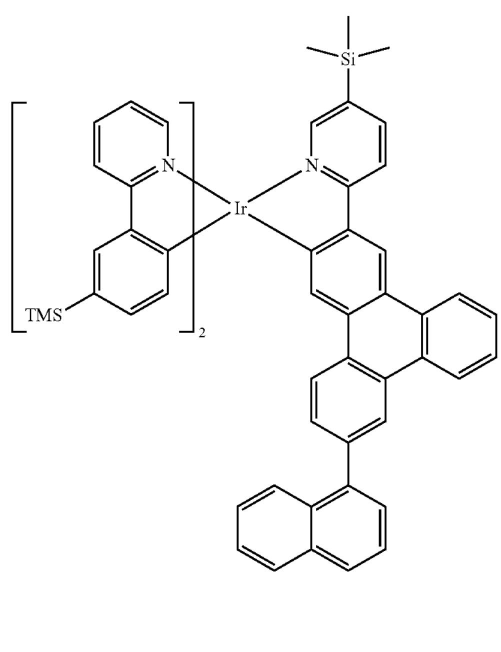

-continued

286

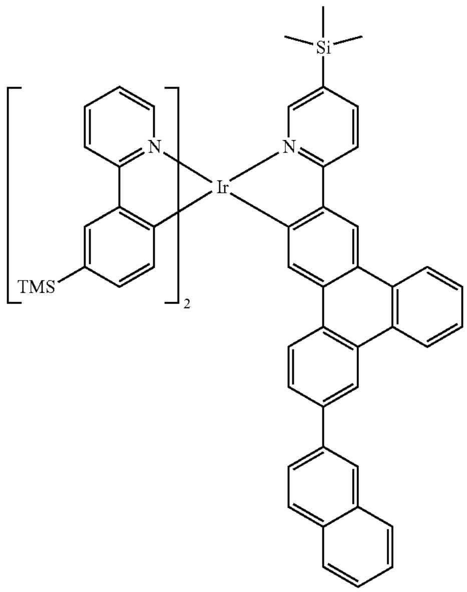

287

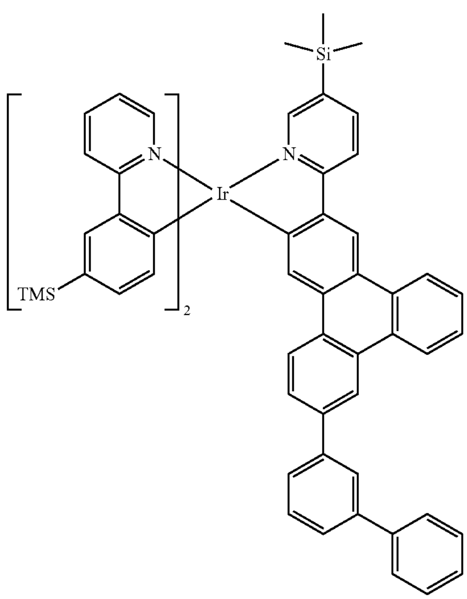

-continued

288

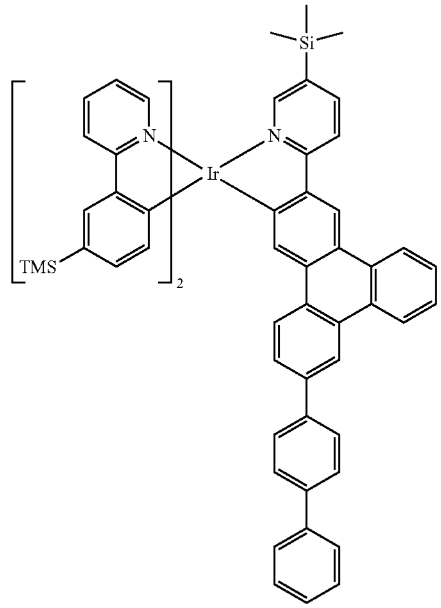

ⓘ indicates text missing or illegible when filed

9. An organic light-emitting device, comprising:

a first electrode;

a second electrode; and an organic layer disposed between the first electrode and the second electrode, wherein the organic layer comprises an emission layer and at least one organometallic compound of claim 1.

10. The organic light-emitting device of claim 9, wherein the first electrode is an anode, the second electrode is a cathode, the organic layer comprises a hole transport region disposed between the first electrode and the emission layer and an electron transport region disposed between the emission layer and the second electrode, wherein the hole transport region comprises at least one selected from a hole injection layer, a hole transport layer, and an electron blocking layer, and wherein the electron transport region comprises at least one selected from a hole blocking layer, an electron transport layer, and an electron injection layer.

11. The organic light-emitting device of claim 9, wherein the emission layer comprises the at least one organometallic compound.

12. The organic light-emitting device of claim 11, wherein the emission layer further comprises a host, and an amount of the host is greater than an amount of the at least one organometallic compound.

* * * * *